US006566719B1

(12) United States Patent
Asakura

(10) Patent No.: US 6,566,719 B1
(45) Date of Patent: May 20, 2003

(54) SEMICONDUCTOR INTEGRATED CIRCUIT

(75) Inventor: Hisao Asakura, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/467,926

(22) Filed: Dec. 21, 1999

Related U.S. Application Data

(62) Division of application No. 08/989,428, filed on Dec. 12, 1997, now Pat. No. 6,020,228.

(30) Foreign Application Priority Data

Dec. 13, 1996 (JP) ........................................... 8-333231

(51) Int. Cl.[7] ........................ H01L 29/76; H01L 29/94; H01L 31/062; H01L 31/113; H01L 31/119

(52) U.S. Cl. ....................................... 257/369; 257/371

(58) Field of Search ................................ 257/350, 369, 257/296, 371; 327/377

(56) References Cited

U.S. PATENT DOCUMENTS

| | | | | |
|---|---|---|---|---|
| 5,126,916 A | | 6/1992 | Tesng | 438/396 |
| 5,281,842 A | * | 1/1994 | Yasuda et al. | 257/296 |
| 5,344,787 A | | 9/1994 | Nagalingam et al. | 438/298 |
| 5,413,945 A | | 5/1995 | Chien et al. | 438/302 |
| 5,736,416 A | | 4/1998 | Johansson | 438/302 |
| 5,757,045 A | | 5/1998 | Tasi et al. | 257/336 |
| 5,759,901 A | | 6/1998 | Loh et al. | 438/305 |
| 5,760,444 A | * | 6/1998 | Okumura | 257/350 |
| 5,796,145 A | | 8/1998 | Sato | 257/336 |
| 6,034,563 A | * | 3/2000 | Mashiko | 327/377 |

FOREIGN PATENT DOCUMENTS

| | | | |
|---|---|---|---|
| JP | 5136404 | 6/1993 | H01L/21/336 |
| JP | 8111461 | 4/1996 | H01L/21/8234 |

* cited by examiner

*Primary Examiner*—William David Coleman
(74) *Attorney, Agent, or Firm*—Antonelli, Terry, Stout, & Kraus, LLP

(57) ABSTRACT

The method of manufacturing a semiconductor integrated circuit device, which has an n-channel MIS transistor and a p-channel MIS transistor formed in the same semiconductor substrate, comprises ion implantation processes using the same photoresist as masks. The ion implantation processes include a step of injecting an impurity ion into the semiconductor substrate 1 to form the source and drain of an n-channel MOSFET 3*n*, a p type semiconductor region 4*p* for suppressing the short channel effect, and an n-well power supply region 10*n*, and a step of injecting an impurity ion into the semiconductor substrate 1 to form the source and drain of a p-channel MOSFET 3*p*, an n type semiconductor region 4*n* for suppressing the short channel effect, and a p-well power supply region 10*p*.

12 Claims, 79 Drawing Sheets

SEMICONDUCTOR INTEGRATED CIRCUIT

CROSS-REFERENCE TO RELATED APPLICATION

This application is a divisional of application Ser. No. 08/989,428, filed on Dec. 12, 1997, which is now U.S. Pat. No. 6,020,228, the entire disclosure of which is hereby incorporated by reference.

BACKGROUND OF THE INVENTION

The present invention relates to a method of manufacturing a semiconductor integrated circuit device and to semiconductor integrated circuit device technology; and, more specifically, the invention relates to a technology suitably applicable to the manufacture of semiconductor integrated circuit devices having a structure in which n-channel MIS (metal insulator semiconductor) transistors and p-channel MIS transistors are provided on the same semiconductor substrate.

An effective way to improve the level of integration and the drive capability of the MIS transistors is miniaturization, which in recent years has progressed rapidly.

With the advancement of miniaturization, however, various problems have surfaced. Because the supply voltage remains constant (i.e. the supply voltage is not decreased) while the MIS transistors are manufactured in increasingly fine patterns, the field intensity in the devices increases, which in turn has adverse effects, such as a short channel effect, on the device characteristics.

The short channel effect is an undesired phenomenon in which, as the channel length decreases, the area affected by a drain voltage increases to cover an area immediately below a gate electrode, pulling down the potential of the semiconductor substrate surface, and resulting in variations (fall) of threshold voltage and reduction in the actual channel length.

When this short channel effect becomes more significant, the drain current can no longer be controlled by the gate voltage-a so-called punch-through phenomenon that will cause an increased leakage current between source and drain. The punch-through thus causes degradation of, for example, the memory retention capability in the transfer gate of a DRAM (dynamic random access memory).

Technologies to avoid these problems have been proposed which, for example, provide at the end portions of the source and the drain of a MIS transistor, on the channel side, a semiconductor region of a high impurity concentration of the same conduction type as the impurity of the channel. Such a punch-through suppression technology is disclosed, for example, in Japanese Patent Laid-Open No. 136404/1993.

For CMOS transistors comprising an n-channel MISFET (hereinafter referred to as nMOS) and a p-channel MISFET (pMOS), a CMOS manufacturing method is disclosed in Japanese Patent Laid-Open No. 111461/1996, which provides a so-called pocket ion-implanted region to suppress the punch-through phenomenon.

This publication discloses the following method of fabrication. After nMOS and pMOS gate electrodes are formed, a first mask is formed that exposes the nMOS formation region and covers the pMOS formation. Using this first mask, ion implantation is performed to form a low impurity concentration diffusion layer in the nMOS region, followed by another ion implantation of p-type impurity to cover the front end of the low impurity concentration diffusion layer. Next, a second mask is formed that exposes the pMOS formation region and covers the nMOS formation region. Using this second mask, an ion implantation is carried out to form a low impurity concentration diffusion layer in the pMOS region, followed by another ion implantation of n-type impurity to cover the front end of the low-impurity concentration diffusion layer. Then, a sidewall spacer is formed on the sidewall of the gate electrode. Next, a third mask is formed that exposes the nMOS formation region and covers the pMOS formation region. Using this third mask, an ion is implanted to form a high impurity concentration diffusion layer in the nMOS region. Next, a fourth mask is formed that exposes the pMOS formation region and covers the nMOS formation region. Using this fourth mask, an ion implantation is performed to form a high impurity concentration diffusion layer in the pMOS region.

With the above fabrication method, a CMOS can be provided that has an LDD structure and a pocket ion-implanted region for prevention of punch-through.

SUMMARY OF THE INVENTION

In studies by the inventor of this invention, it has been found that the above ion implantation requires at least four masks.

This means that a photolithography process must be performed four times, giving rise to a problem of too many photomasks and too many photoresist forming and removing processes.

As the number of processes for forming and removing photoresist increases, the process of making a semiconductor integrated circuit device becomes complex and the chance of foreign matter adhering to the device increases, thereby deteriorating the manufacturing yield and reliability of the semiconductor integrated circuit device.

An object of the present invention is to provide a technology that can reduce the number of manufacturing processes for making a semiconductor integrated circuit device having a structure in which n-channel MIS transistors and p-channel MIS transistors are formed on the same semiconductor substrate.

Another object of this invention is to provide a technology that can reduce the number of photomasks used in the process of making a semiconductor integrated circuit device having a structure in which n-channel MIS transistors and p-channel MIS transistors are formed on the same semiconductor substrate.

Still another object of this invention is to provide a technology that can improve the yield and reliability of a semiconductor integrated circuit device having a structure in which n-channel MIS transistors and p-channel MIS transistors are formed on the same semiconductor substrate.

A further object of this invention is to provide a technology that can reduce the number of processes used in making a semiconductor integrated circuit device, including a DRAM, having memory cells whose memory cell selection MISFETs and capacitors are connected in series.

These and other objects and novel features of this invention will become apparent from the description provided in this specification and the accompanying drawings.

Representative aspects of this invention disclosed in this application may be briefly summarized as follows.

The method of manufacturing a semiconductor integrated circuit device having an n-channel MIS transistor and a p-channel MIS transistor formed in a semiconductor substrate, comprises:

(a) a step of forming a p-well and an n-well in the semiconductor substrate;

(b) a step of forming over the semiconductor substrate a first mask that covers a p-channel MIS transistor formation region and a p-well power supply region and exposes an n-channel MIS transistor formation region and an n-well power supply region;

(c) a step of introducing an n type impurity for making an $n^+$ type semiconductor region into a region of the semiconductor substrate exposed from the first mask;

(d) a step of introducing a p type impurity for making a $p^-$ type semiconductor region into a region of the semiconductor substrate exposed from the first mask in an inclined direction with respect to the principal surface of the semiconductor substrate;

(e) a step of forming over the semiconductor substrate a second mask that covers an n-channel MIS transistor formation region and an n-well power supply region and exposes a p-channel MIS transistor formation region and a p-well power supply region;

(f) a step of introducing a p type impurity for making a $p^+$ type semiconductor region into a region of the semiconductor substrate exposed from the second mask; and (g) a step of introducing an n type impurity for making an $n^-$ type semiconductor region into a region of the semiconductor substrate exposed from the second mask in an inclined direction with respect to the principal surface of the semiconductor substrate.

The method of manufacturing a semiconductor integrated circuit device further comprises:

(a) a step of introducing an n type impurity for making an $n^-$ type semiconductor region into a region of the semiconductor substrate exposed from the first mask; and (b) a step of introducing a p type impurity for making a $p^-$ type semiconductor region into a region of the semiconductor substrate exposed from the second mask.

In the method of manufacturing a semiconductor integrated circuit device of this invention, (a) in the step of forming the first mask, the first mask is so formed as to cover a memory cell area of the semiconductor substrate, too; and (b) in the step of forming the second mask, the second mask is so formed as to cover other than the well power supply region in the memory cell area of the semiconductor substrate.

Further, in the method of manufacturing a semiconductor integrated circuit device having a p type first semiconductor region and an n type second semiconductor region in a semiconductor substrate, in which the p type first semiconductor region has an n-channel MISFET and the n type second semiconductor region has a p-channel MISFET, the manufacturing method of this invention comprises:

(a) a step of forming a gate insulation film over a principal surface of the semiconductor substrate;

(b) a step of forming a gate electrode having a sidewall over the gate insulation film on the principal surface of the p type first semiconductor region and the n type second semiconductor region;

(c) a step of forming a sidewall insulation film over the sidewall of the gate electrode;

(d) a step of forming a first mask over the semiconductor substrate -that exposes the n-channel MISFET formation region and covers the p-channel MISFET formation region;

(e) a step of ion-implanting into regions of the semiconductor substrate exposed from the first mask a p type first impurity for making a third semiconductor region, an n type second impurity for making a fourth semiconductor region, and an n type third impurity for making a fifth semiconductor region;

(f) a step of forming a second mask over the semiconductor substrate that exposes the p-channel MISFET formation region and covers the n-channel MISFET formation region; and (g) a step of ion-implanting into regions of the semiconductor substrate exposed from the second mask an n type fourth impurity for making a sixth semiconductor region, a p type fifth impurity for making a seventh semiconductor region, and a p type sixth impurity for making an eighth semiconductor region.

Further, in the method of manufacturing a semiconductor integrated circuit device having a p type first semiconductor region, an n type second semiconductor region and a p type ninth semiconductor region in a semiconductor substrate, in which the p type first semiconductor region has an n-channel MISFET and a first power supply region for supplying a first fixed voltage to the p type first semiconductor region, in which the n type second semiconductor region has a p-channel MISFET and a second power supply region for supplying a second fixed voltage to the n type second semiconductor region, and in which the p type ninth semiconductor region has a memory cell area and a third power supply region for supplying a third fixed voltage to the p type ninth semiconductor region; the manufacturing method of this invention comprises:

(a) a step of forming a gate insulation film over a principal surface of the semiconductor substrate;

(b) a step of forming a gate electrode having a sidewall over the gate insulation film on the principal surface of the p type first semiconductor region, the n type second semiconductor region and the p type ninth semiconductor region;

(c) a step of forming a sidewall insulation film over the sidewall of the gate electrode;

(d) a step of forming a first mask over the semiconductor substrate that exposes the n-channel MISFET formation region and the second power supply region and covers the p-channel MISFET formation region, the first power supply region, the third power supply region and the memory cell region;

(e) a step of ion-implanting into regions of the semiconductor substrate exposed from the first mask a p type first impurity for making a third semiconductor region, an-n type second impurity for making a fourth semiconductor region, and an n type third impurity for making a fifth semiconductor region;

(f) a step of forming a second mask over the semiconductor substrate that exposes the p-channel MISFET formation region, the first power supply region and the third power supply region and covers the n-channel MISFET formation region, the second power supply region and the memory cell area; and (g) a step of ion-implanting into regions of the semiconductor substrate exposed from the second mask an n type fourth impurity for making a sixth semiconductor region, a p type fifth impurity for making a seventh semiconductor region, and a p type sixth impurity for making an eighth semiconductor region;

wherein the n type third impurity is ion-implanted to a location deeper than the p type first impurity and the p type sixth impurity is ion-implanted to a location deeper than the n type fourth impurity.

Further, in the method of manufacturing a semiconductor integrated circuit device of this invention, the n type third impurity is ion-implanted at a higher concentration than the n type second impurity, and the p type sixth impurity is ion-implanted at a higher concentration than the p type fifth impurity.

Further, in the method of manufacturing a semiconductor integrated circuit device of this invention, the n type third impurity is ion-implanted at a first inclination with respect to a direction perpendicular to the principal surface of the semiconductor substrate, the p type first impurity and the n type second impurity are ion-implanted at a second inclination with respect to the direction perpendicular to the principal surface of the semiconductor substrate, the second inclination is greater than the first inclination, the p type sixth impurity is ion-implanted at a third inclination with respect to the direction perpendicular to the principal surface of the semiconductor substrate, the n type fourth impurity and the p type fifth impurity are ion-implanted at a fourth inclination with respect to the direction perpendicular to the principal surface of the semiconductor substrate, and the fourth inclination is greater than the third inclination.

Further, in the method of manufacturing a semiconductor integrated circuit device of this invention, in the first power supply region and the third power supply region, the eighth semiconductor region is formed to cover the sixth semiconductor region and the seventh semiconductor region, and in the second power supply region the fifth semiconductor region is formed to cover the third semiconductor region and the fourth semiconductor region.

PREFERRED EMBODIMENTS OF THE INVENTION

Preferred embodiments of the present invention will be described in detail by referring to the accompanying drawings (in all the drawings illustrating the preferred embodiments, like reference numbers are assigned to those parts having the identical functions and repeated explanations thereof will be omitted).

(Embodiment 1)

Figure 1:
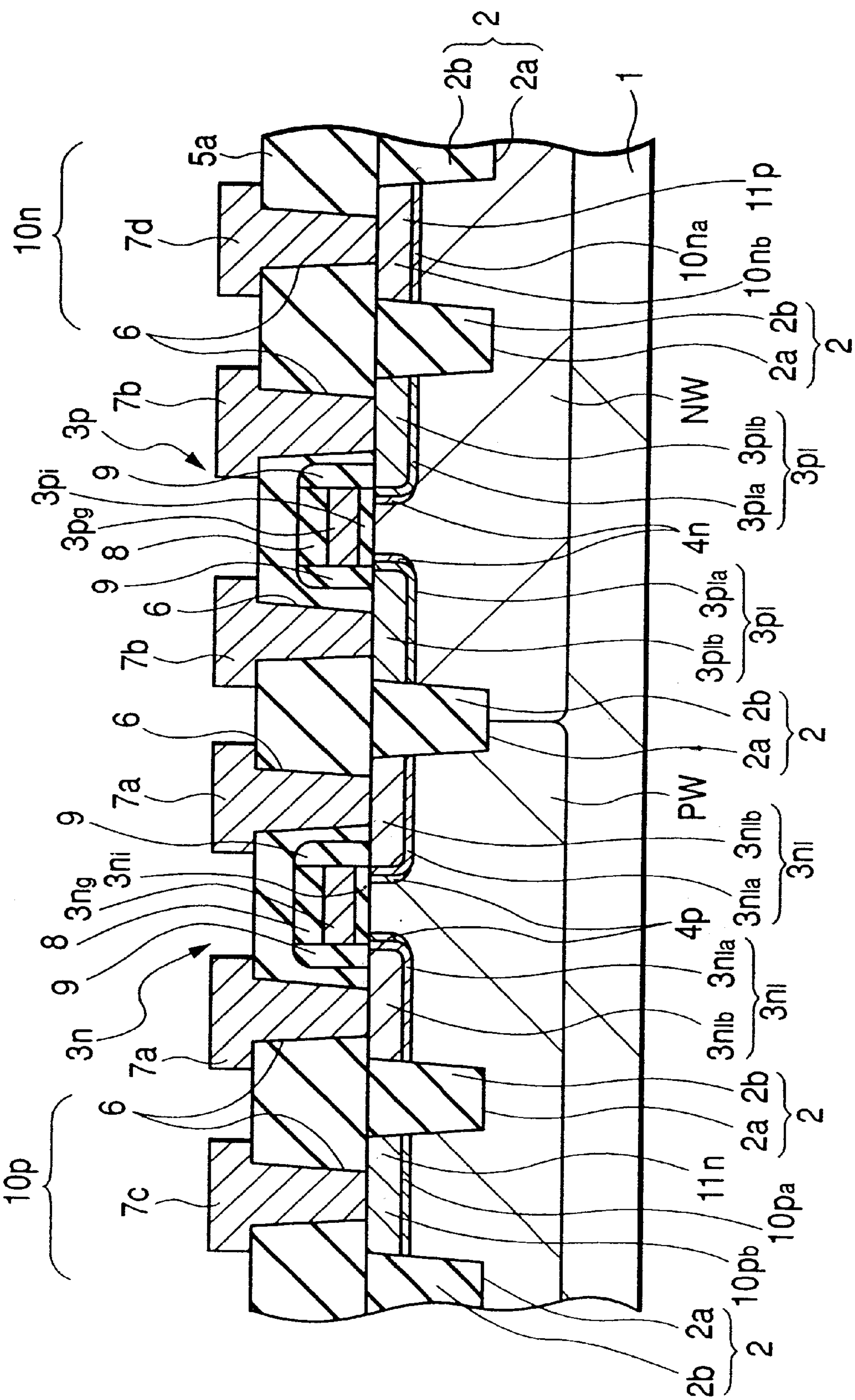
FIG. 1 is a cross section of an essential part of a semiconductor integrated circuit device of this invention.
Figure 2:
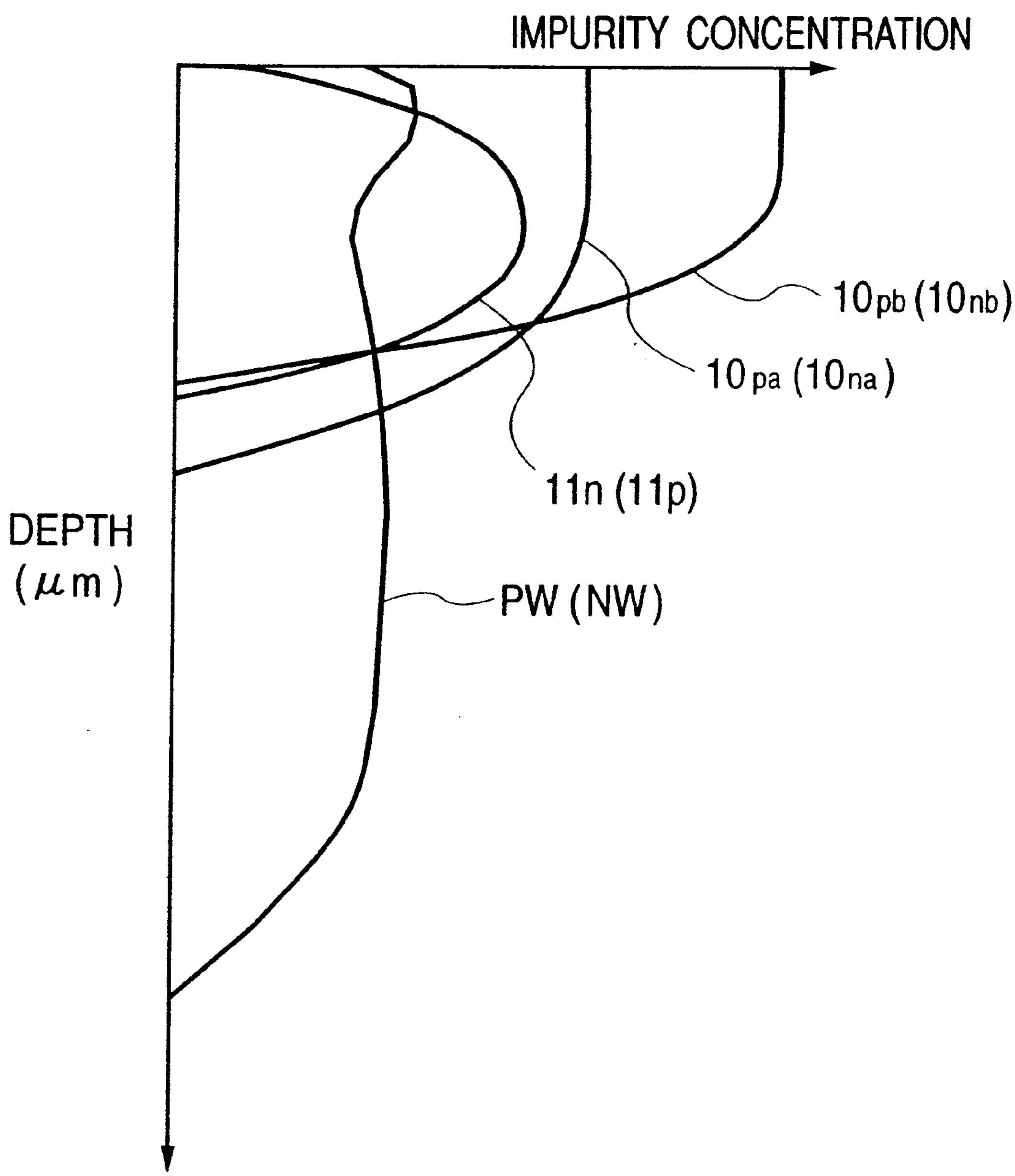
FIG. 2 is a graph showing a semiconductor area distribution in a well power supply region of the semiconductor integrated circuit device of FIG. 1.
Figure 3:
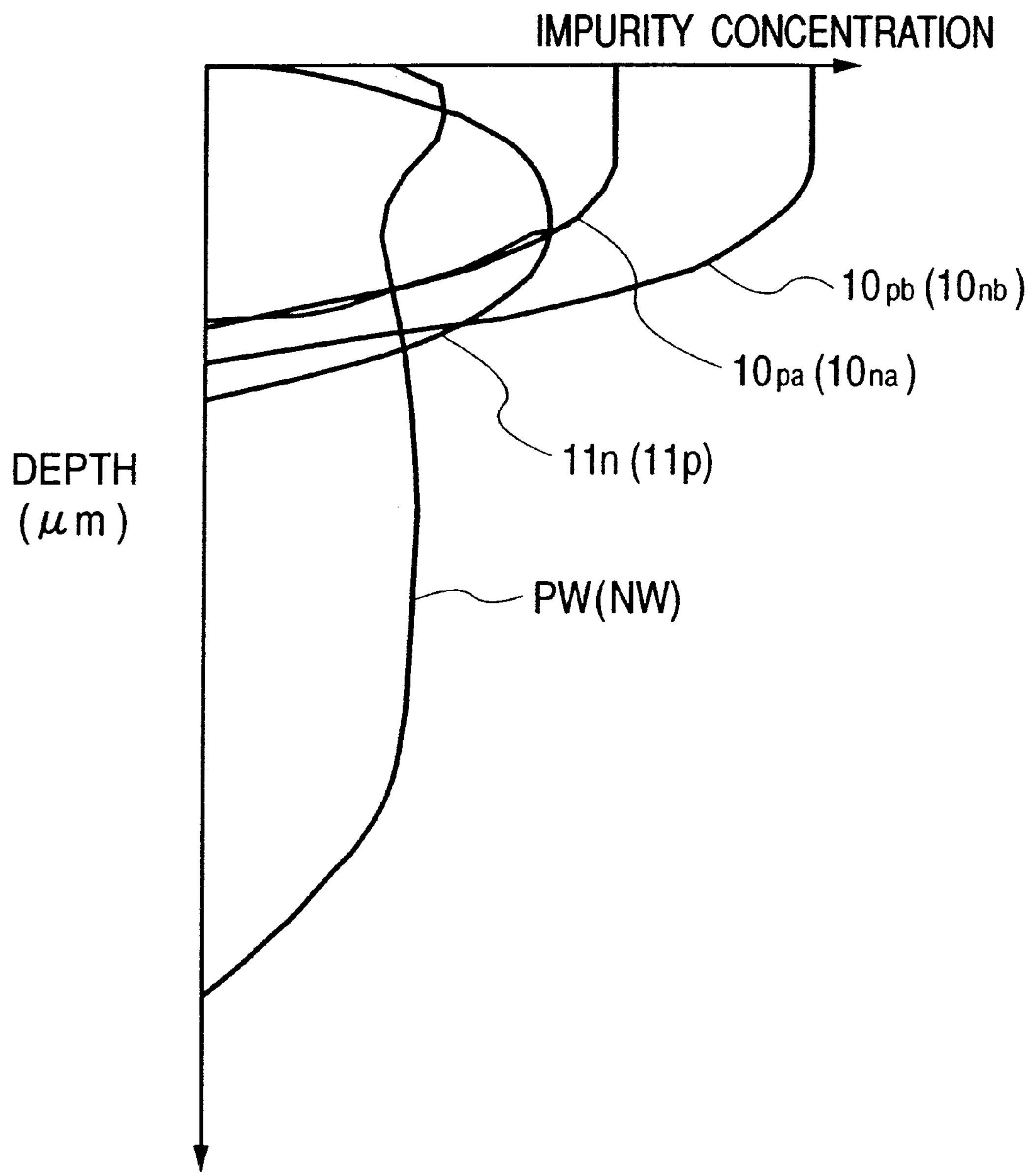
FIG. 3 is a graph showing a semiconductor area distribution in a well power supply region studied by the inventor of this invention.

FIG. 1 is a cross section of a representative portion of a semiconductor integrated circuit device of this invention. FIG. 2 is a graph showing a distribution of the semiconductor region in a well power supply region of the semiconductor integrated circuit device of FIG. 1. FIG. 3 is a graph showing a distribution of the semiconductor region in a well power supply region studied by the inventor of this invention. FIGS. 4 to 11 are cross sections of the semiconductor integrated circuit device of FIG. 1 at respective steps during the process of manufacture.

A semiconductor substrate 1 shown in FIG. 1 is made of, for example, a single crystal of $p^-$ type silicon (Si), over which a p-well PW and an n-well NW are formed.

The p-well PW contains a p type impurity, such as boron. The n-well NW contains an n type impurity such as phosphorus or arsenic (As).

In the upper part of the semiconductor substrate 1, there are formed device isolation portions 2 made of silicon dioxide ($SiO_2$). The device isolation portion 2 is formed by embedding an insulation film (isolation film) 2*b* in a trench 2*a* dug in the upper part of the semiconductor substrate 1. The upper surface of the device isolation portion 2 is planarized to be flush with the principal surface of the semiconductor substrate 1.

In the p-well PW and the n-well NW enclosed by the device isolation portions 2, there are formed, for example, an n-channel MOSFET (hereinafter referred to as nMOS) 3*n* and a p-channel MOSFET (pMOS) 3*p*. The nMOS 3*n* and the pMOS 3*p* constitute a CMOS (complimentary MOS) circuit.

The nMOS 3*n* has a pair of n type semiconductor regions 3*nl* formed in the upper part of the p-well PW with a space being provided between the paired semiconductor regions, a gate insulation film 3*ni* formed on the semiconductor substrate 1, and a gate electrode 3*ng* formed over the gate insulation film 3*ni*. Between the paired n type semiconductor regions 3*nl*, there is formed a channel region of the nMOS 3*n*.

The n type semiconductor regions 3*nl* are regions to form a source and a drain of the nMOS 3*n* and include an $n^-$ type semiconductor region 3*nla* arranged on the channel region side and having a low impurity concentration and an $n^+$ type semiconductor region 3*nlb* arranged on the outer side of the $n^-$ type semiconductor region 3*nla* and having a high impurity concentration.

The $n^-$ type semiconductor region 3*nla* and the $n^+$ type semiconductor region 3*nlb* contain an n type impurity, such as phosphorus or arsenic. The end portions of the n type semiconductor regions 3*nl* on the channel side are formed with a $p^-$ type semiconductor region 4*p* for suppressing the short channel effect. The $p^-$ type semiconductor regions 4*p* contain a p type impurity, such as boron.

The n type semiconductor regions 3*nl* are electrically connected to electrodes 7*a* through connecting holes 6 formed in an interlayer insulation film 5*a* deposited over the semiconductor substrate 1. The interlayer insulation film 5*a* is made, for example, of $SiO_2$. The electrodes 7*a* are made, for example, of a single film of tungsten (W) or a laminated film of Ti, TiN and W (Ti/TiN/W).

The gate insulation film 3*ni* may be formed of $SiO_2$. The gate electrode 3*ng* comprises, for instance, a silicide film, such as tungsten silicide, deposited over a low-resistance polysilicon.

On the upper surface and side surface of the gate electrode 3*ng*, there are formed a cap insulation film 8 and a sidewall 9, both made of $SiO_2$, for example.

The pMOS 3*p* on the other hand includes a pair of p type semiconductor regions 3*pl* formed in the upper part of the n-well NW with a space between the paired semiconductor regions, a gate insulation film 3*pi* formed over the semiconductor substrate 1, and a gate electrode 3*pg* formed over the gate insulation film 3*pi*. Between the pair of p type semiconductor regions 3*pl*, there is formed a channel region of the pMOS 3*p*.

These p type semiconductor regions 3*pl* are the regions to form a source and a drain of the pMOS 3*p* and include a $p^-$ type semiconductor region 3*pla* arranged on the channel region side and having a low impurity concentration and a $p^+$ type semiconductor region 3*plb* arranged on the outer side of the $p^-$ type semiconductor region 3*pla* and having a high impurity concentration.

The $p^-$ type semiconductor region 3*pla* and the $p^+$ type semiconductor region 3*plb* contain a p type impurity, such as boron. The end portions of the p type semiconductor regions 3*pl* on the channel side are formed with an $n^-$ type semiconductor region 4*n* for suppressing the short channel effect. The $n^-$ type semiconductor regions 4*n* contain an n type impurity, such as phosphorus or arsenic.

The p type semiconductor regions 3*pl* are electrically connected to electrodes 7*b* through connecting holes 6 formed in the interlayer insulation film 5*a* deposited over the semiconductor substrate 1. The electrodes 7*b* may be formed of a single film of tungsten or a laminated film of Ti/TiN/W.

The gate insulation film 3*pi* may be formed of $SiO_2$ and the gate electrode 3*pg* may be formed of a silicide film, such as tungsten silicide, deposited over a low-resistance polysilicon.

On the upper and side surfaces of the gate electrode 3*pg* of pMOS 3*p*, there is formed a cap insulation film 5 of $SiO_2$, for example. On the side surfaces of the gate electrodes 3*ng*, 3*pg*, there are formed sidewalls 9 made of, for instance, $SiO_2$.

In a region of the p-well PW enclosed by the device isolation portions 2, there is formed a p-well power supply region 10*p* that supplies a predetermined voltage to the p-well PW.

The p-well power supply region 10*p* includes a $p^-$ type semiconductor region 10*pa* with a low impurity concentration, a $p^+$ type semiconductor region 10*pb* with a high impurity concentration and an $n^-$ type semiconductor region 11*n*.

The $p^-$ type semiconductor region 10*pa* and the $p^+$ type semiconductor region 10*pb* contain a p type impurity, such as boron. The $n^-$ type semiconductor region 11*n* contains an n type impurity, such as phosphorus or arsenic.

The p-well power supply region 10*p* is electrically connected to an electrode 7*c* through connecting holes 6 formed in the interlayer insulation film 5*a* deposited over the semiconductor substrate 1. The electrode 7*c* is formed of a single film of tungsten or a Ti/TiN/W laminated film.

The $p^-$ type semiconductor region 10*pa*, $p^+$ type semiconductor region 10*pb* and $n^-$ type semiconductor region 11*n*, as will be described later, are formed simultaneously with the $p^-$ type semiconductor region 3*pla*, $p^+$ type semiconductor region 3*plb* and $n^-$ type semiconductor region 4*n* of the nMOS 3*n* by ion implantation processes using the same mask.

The distribution of the semiconductor region in the p-well power supply region 10*p* is shown in FIG. 2. The $p^-$ type semiconductor region 10*pa* is distributed to the greatest depth. The $p^+$ type semiconductor region 10*pb* ranges to a depth shallower than the $p^-$ type semiconductor region 10*pa*. The $n^-$ type semiconductor region 11*n* is distributed so as to be shallower than the $p^+$ type semiconductor region 10*pb*.

FIG. 3 shows the semiconductor distribution produced with a technology examined by the inventor of this invention. It is seen that the $n^-$ type semiconductor region 11*n* runs deeper than both the $p^-$ type semiconductor region 10*pa* and $p^+$ type semiconductor region 10*pb* and partly overlaps the p-well PW. This distribution is equivalent to a situation where an insulating layer is formed between the $p^+$ type semiconductor region 10*pb* and the p-well PW, preventing the p-well PW from being supplied.

In the embodiment 1, however, because the $n^-$ type semiconductor region 11*n* is distributed to a shallower area than the $p^+$ type semiconductor region 10*pb*, as shown in FIG. 2, the p-well PW can be supplied.

In a region of the n-well NW enclosed by the device isolation portions 2 in FIG. 1, an n-well power supply region 10*n* is formed that supplies a predetermined voltage to the n-well NW.

The n-well power supply region 10*n* includes an $n^-$ type semiconductor region 10*na* with a low impurity concentration, an $n^+$ type semiconductor region 10*nb* with a high impurity concentration, and a $p^-$ type semiconductor region 11*p*.

The $n^-$ type semiconductor region 10*na* and the $n^+$ type semiconductor region 10*nb* contain an n type impurity, such as phosphorus or arsenic. The $p^-$ type semiconductor region 11*p* contains a p type impurity, such as boron.

The n-well power supply region 10*n* is electrically connected to an electrode 7*d* through connecting holes 6 formed in the interlayer insulation film 5*a* deposited over the semiconductor substrate 1. The electrode 7*d* is made, for example, of a single film of tungsten or a Ti/TiN/W laminated film.

The $n^-$ type semiconductor region 10*na*, $n^+$ type semiconductor region 10*nb* and $p^-$ type semiconductor region 11*p*, as will be described later, are formed simultaneously with the $n^-$ type semiconductor region 3*nla*, $n^+$ type semiconductor region 3*nlb* and $p^-$ type semiconductor region 4*p* of the nMOS 3*n* by ion implantation processes using the same mask.

The distribution of the semiconductor region in the n-well power supply region 10*n* is shown in FIG. 2. The $n^-$ type semiconductor region 10*na* penetrates to the deepest position. The $n^+$ type semiconductor region 10*nb* ranges to a depth shallower than the $n^-$ type semiconductor region 10*na*. The $p^-$ type semiconductor region 11*p* is distributed to a depth shallower than the $n^+$ type semiconductor region 10*nb*.

With the technology of FIG. 3 studied by the inventor of this invention, the $p^-$ type semiconductor region 11*p* ranges deeper than the $n^-$ type semiconductor region 10*na* and the $n^+$ type semiconductor region 10*nb* and partly overlaps the n-well NW, as in the case of the p-well power supply region 10*p* described above. This semiconductor distribution is equivalent to an insulating layer being formed between the $n^+$ type semiconductor region 10*nb* and the n-well NW, making it impossible to supply the n-well NW.

In the embodiment 1, however, because the $p^-$ type semiconductor region 11*p* is distributed so as to be shallower than the $p^+$ type semiconductor region 10*pb*, as shown in FIG. 2, power can be supplied to the n-well.

Next, the process of manufacturing a semiconductor integrated circuit device of the embodiment 1 will be described by referring to FIGS. 4 to 11.

Figure 4:
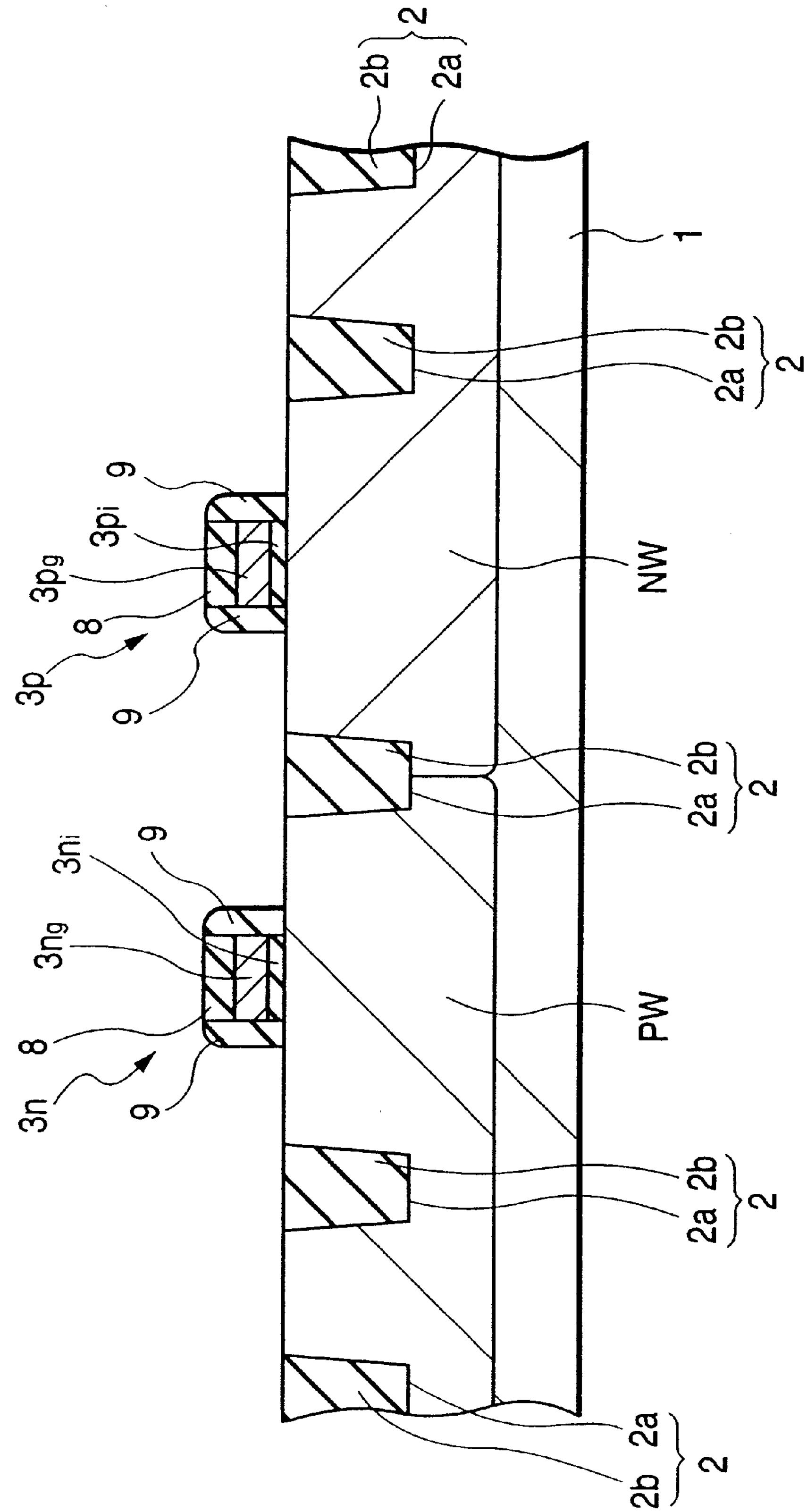
FIG. 4 is a cross section of the semiconductor integrated circuit device of FIG. 1 during the process of manufacture.

FIG. 4 is a cross section showing the semiconductor integrated circuit device of the embodiment 1 during a step of the process of manufacture. The semiconductor substrate 1 is formed of, for example, a single crystal of p type silicon, in the upper part of which the p-well PW and the n-well NW are already formed.

In the upper part of the semiconductor substrate 1, device isolation portions 2 are formed by embedding an insulation film 2*b* of, say, $SiO_2$ into a trench 2*a* formed in the semiconductor substrate 1.

The device isolation portions 2 are formed as follows. First, in the device isolation region of the semiconductor substrate 1, trenches 2*a* are formed by photolithography or a dry etching technique.

Next, on the semiconductor substrate 1 formed with the trenches 2*a*, an insulation film of, for example, $SiO_2$ is deposited by the CVD method, after which the principal surface of the semiconductor substrate 1 is planarized by the CMP (chemical mechanical polishing) technique so that the insulation film 2*b* remains in the trench 2*a*, thus forming the device isolation portion 2. The planarization process is performed such that the principal surface of the semiconductor substrate 1 and the upper surface of the device isolation portion 2 are flush.

On the p-well PW enclosed by the device isolation portion 2 a gate electrode 3*ng* is formed, with a gate insulation film 3*ni* interposed therebetween. The gate insulation film 3*ni* may be made of $SiO_2$ and the gate electrode 3*ng* may be formed of a silicide film of tungsten silicide deposited over a low-resistance polysilicon. The upper and side surfaces of the gate electrode 3*ng* are formed with a cap insulation film 8 and a sidewall 9, both made of, say, $SiO_2$.

On the n-well NW enclosed by the device isolation portion 2 a gate electrode 3*pg* is formed, with a gate insulation film 3*pi* interposed therebetween. The gate insulation film 3*pi* may be made of $SiO_2$ and the gate electrode 3*pg* may be formed of a silicide film of tungsten silicide deposited over a low-resistance polysilicon. The upper and side surfaces of the gate electrode 3*pg* are formed with a cap insulation film 8 and a sidewall 9, both made of, say, $SiO_2$.

The gate insulation films 3*ni*, 3*pi*, gate electrodes 3*ng*, 3*pg*, cap insulation film 8 and sidewall 9 may be formed as follows.

First, the semiconductor substrate 1, after being formed with the device isolation portion 2, is subjected to a thermal oxidation process to form the gate insulation films 3*ni*, 3*pi* over the p-well PW and the n-well NW.

Then, the semiconductor substrate 1 has deposited thereon by the CVD method a conductive film, such as low-resistance polysilicon, over which there is deposited by the CVD method a conductive film such as tungsten silicide, over which an insulation film of, say, $SiO_2$ is deposited by the CVD method.

After this, the insulation film and the two underlying conductive layers are patterned by photolithography and dry etching techniques to form the gate electrodes 3_ng_, 3_pg_ and the cap insulation film 8.

Then, the semiconductor substrate has deposited thereon by the CVD method an insulation film of, say, $SiO_2$, which is then etched back (anisotropic etching) to form the gate electrodes 3_ng_, 3_pg_ and the sidewall 9 on the side surface of the cap insulation film 8.

Figure 5:
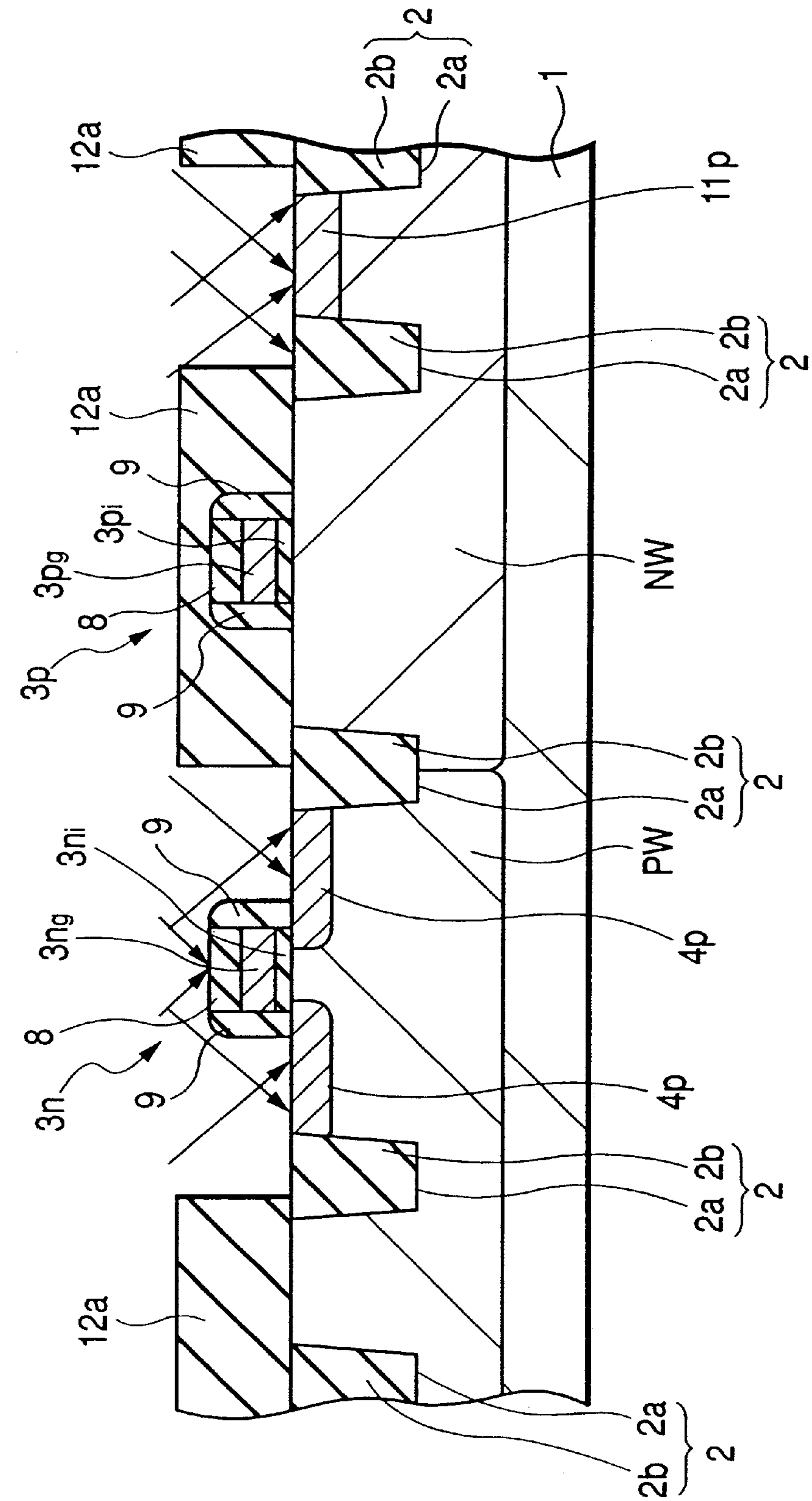
FIG. 5 is a cross section of the semiconductor integrated circuit device of FIG. 1 during the process of manufacture following the step of FIG. 4.

Next, as shown in FIG. 5, the semiconductor substrate 1 has formed thereon, by photolithography, a photoresist (first mask) 12_a_ that covers the pMOS formation region and the p-well power supply region and exposes the nMOS formation region and the n-well power supply region.

Then, using the photoresist 12_a_ as a mask, the semiconductor substrate 1 is ion-implanted with a p type impurity, such as boron. This is a process to form the $p^-$ type semiconductor region 4_p_ for suppressing the short channel effect in the nMOS.

During this process, impurity ions are bombarded at inclined incidence angles from four or more directions. This makes it possible for the impurity to be introduced under the edge of the gate electrode 3_ng_ in the nMOS formation region and, in the n-well power supply region, allows the $p^-$ type semiconductor region 11_p_ to be formed relatively shallow.

In the embodiment 1, the incident angle of the impurity ions with respect to the principal surface of the semiconductor substrate 1 is set relatively moderate. Although the semiconductor regions 4_p_, 11_p_ are not formed yet at this stage of the manufacturing process, since the heat treatment to activate the impurity has not been performed, these semiconductor regions are illustrated to facilitate understanding.

Figure 6:
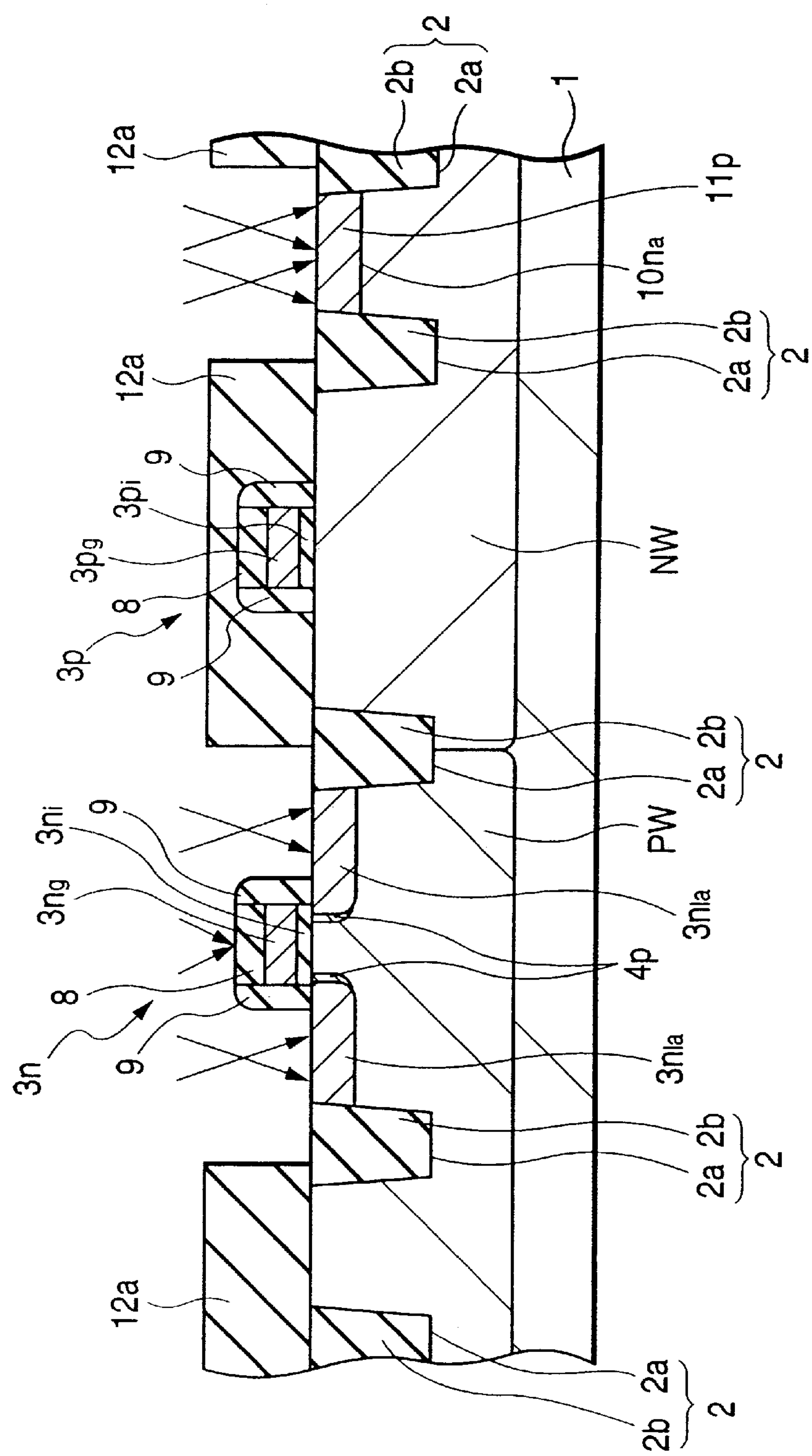
FIG. 6 is a cross section of the semiconductor integrated circuit device of FIG. 1 during the process of manufacture following the step of FIG. 5.

After this, as shown in FIG. 6, with the photoresist 12_a_—which was used to introduce impurity when forming the $p^-$ type semiconductor regions 4_p_, 11_p_—as a mask, the semiconductor substrate 1 is ion-implanted with an n type impurity, such as phosphorus or arsenic. This is the process for making the n type semiconductor region 3_nla_ in the nMOS and the $n^-$ type semiconductor region 10_na_ in the n-well power supply region.

During this process, impurity ions are bombarded at inclined incidence angles from four or more directions. In this case, to ensure that in the nMOS formation region the extent of impurity infiltration under the edge of the gate electrode 3_ng_ is smaller than in the $p^-$ type semiconductor region 4_p_, the implantation of impurity ions is performed in such a way that the incidence angle of the impurity with respect to the principal surface of the semiconductor substrate 1 is set larger than the incidence angle used to form the $p^-$ type semiconductor region 4_p_.

As a result, in the nMOS formation region the $p^-$ type semiconductor region 4_p_ can be left at the end of the $n^-$ type semiconductor region 3_nla_ on the channel side and, in the n-well power supply region, the $n^-$ type semiconductor region 10_na_ can be formed deeper than the $p^-$ type semiconductor region 11_p_.

Although the semiconductor regions 4_p_, 11_p_, 3_nla_, 10_na_ are not formed yet at this stage of the manufacturing process since the heat treatment to activate the impurity has not been performed, these semiconductor regions are illustrated to facilitate understanding.

Figure 7:
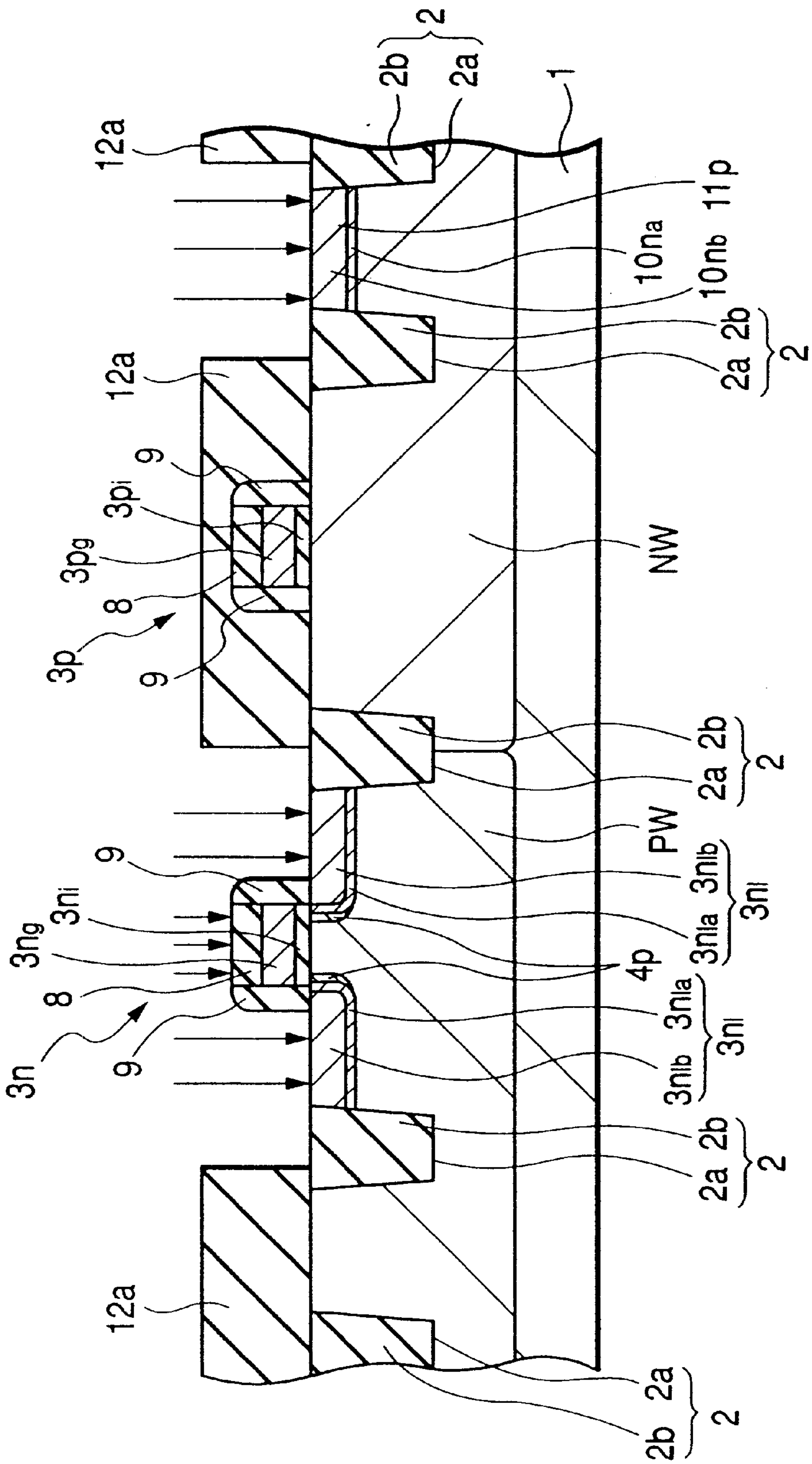
FIG. 7 is a cross section of the semiconductor integrated circuit device of FIG. 1 during the process of manufacture following the step of FIG. 6.

After this, as shown in FIG. 7, with the photoresist 12_a_ as a mask the semiconductor substrate 1 is ion-implanted with an n type impurity, such as phosphorus or arsenic. This is a process for making the $n^+$ type semiconductor region 3_nlb_ in the nMOS and the $n^+$ type semiconductor region 10_nb_ in the n-well power supply region. In this process, the incidence angle of the impurity ions is set perpendicular to the principal surface of the semiconductor substrate 1. Although the semiconductor regions 4_p_, 11_p_, 3_nla_, 3_nlb_, 10_na_, 10_nb_ are not formed yet at this stage of the manufacturing process, since the heat treatment to activate the impurity has not been performed, these semiconductor regions are illustrated to facilitate understanding.

In this way, the embodiment 1 allows the n type semiconductor regions 3_nl_, the $p^-$ type semiconductor region 4_p_ and the n-well power supply region 10_n_, all required by the nMOS 3_n_, to be formed by ion implantation using the same photoresist mask.

Figure 8:
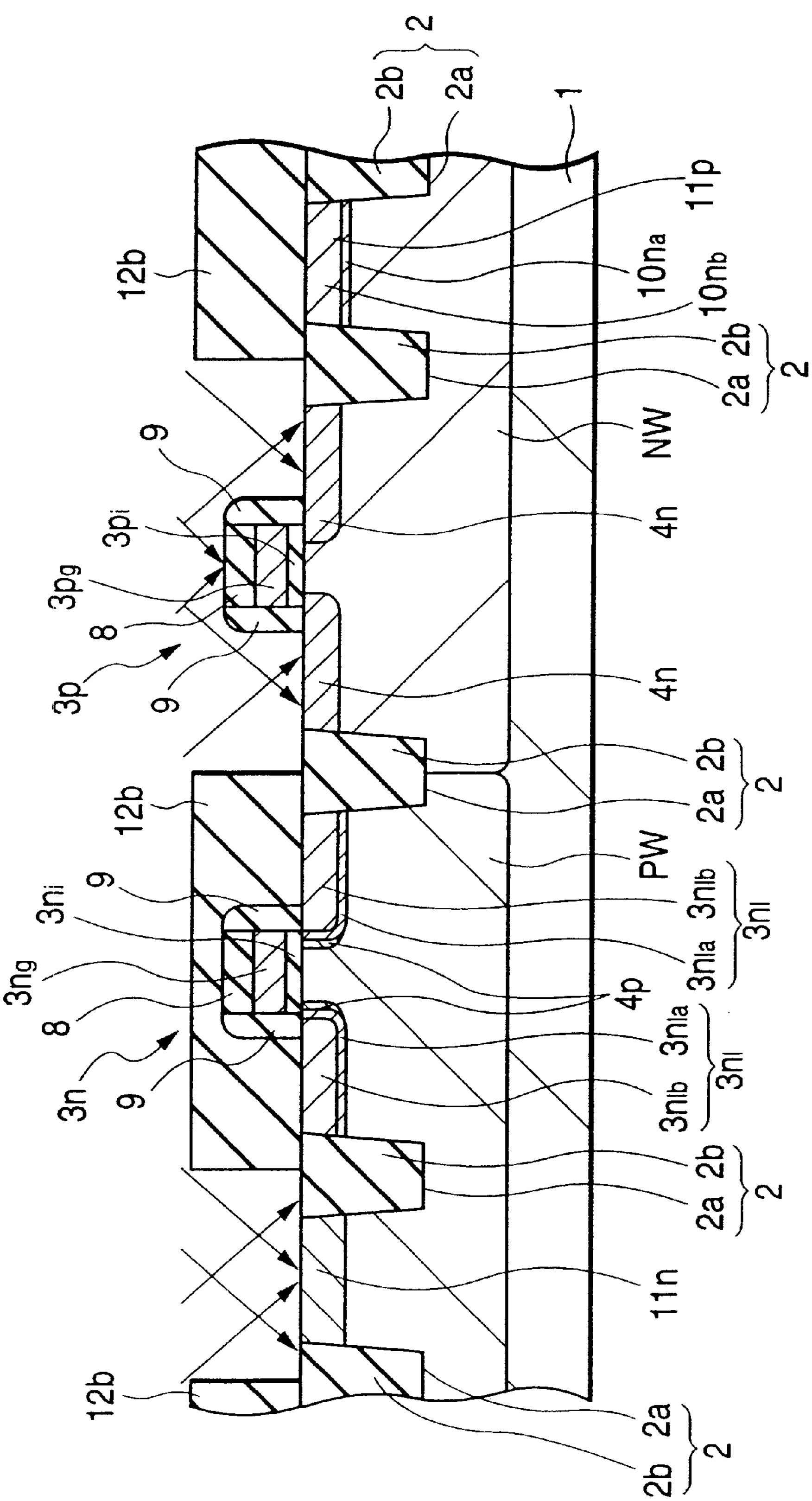
FIG. 8 is a cross section of the semiconductor integrated circuit device of FIG. 1 during the process of manufacture following the step of FIG. 7.

Next, after the photoresist 12_a_ is removed, the semiconductor substrate 1 is provided by photolithography with a photoresist 12_b_ (second mask) that, as shown in FIG. 8, covers the nMOS formation region and the n-well power supply region and exposes the pMOS formation region and the p-well power supply region.

Next, using the photoresist 12_b_ as a mask, the semiconductor substrate 1 is ion-implanted with an n type impurity, such as phosphorus or arsenic. This is a process to form the $n^-$ type semiconductor region 4_n_ for suppressing the short channel effect in the pMOS.

In this process, impurity ions are bombarded at inclined incidence angles from four or more directions. This allows the impurity to be introduced under the edge of the gate electrode 3_pg_ in the pMOS formation region and allows the $n^-$ type semiconductor region 11_n_ to be formed relatively shallow in the p-well power supply region.

In the embodiment 1, the incident angle of the impurity ions with respect to the principal surface of the semiconductor substrate 1 is set relatively moderate. Although the semiconductor regions 4_p_, 4_n_, 11_p_, 11_n_, 3_nla_, 3_nlb_, 10_na_, 10_nb_ are not formed yet at this stage of the manufacturing process, since the heat treatment to activate the impurity has not been performed, these semiconductor regions are illustrated to facilitate understanding.

Figure 9:
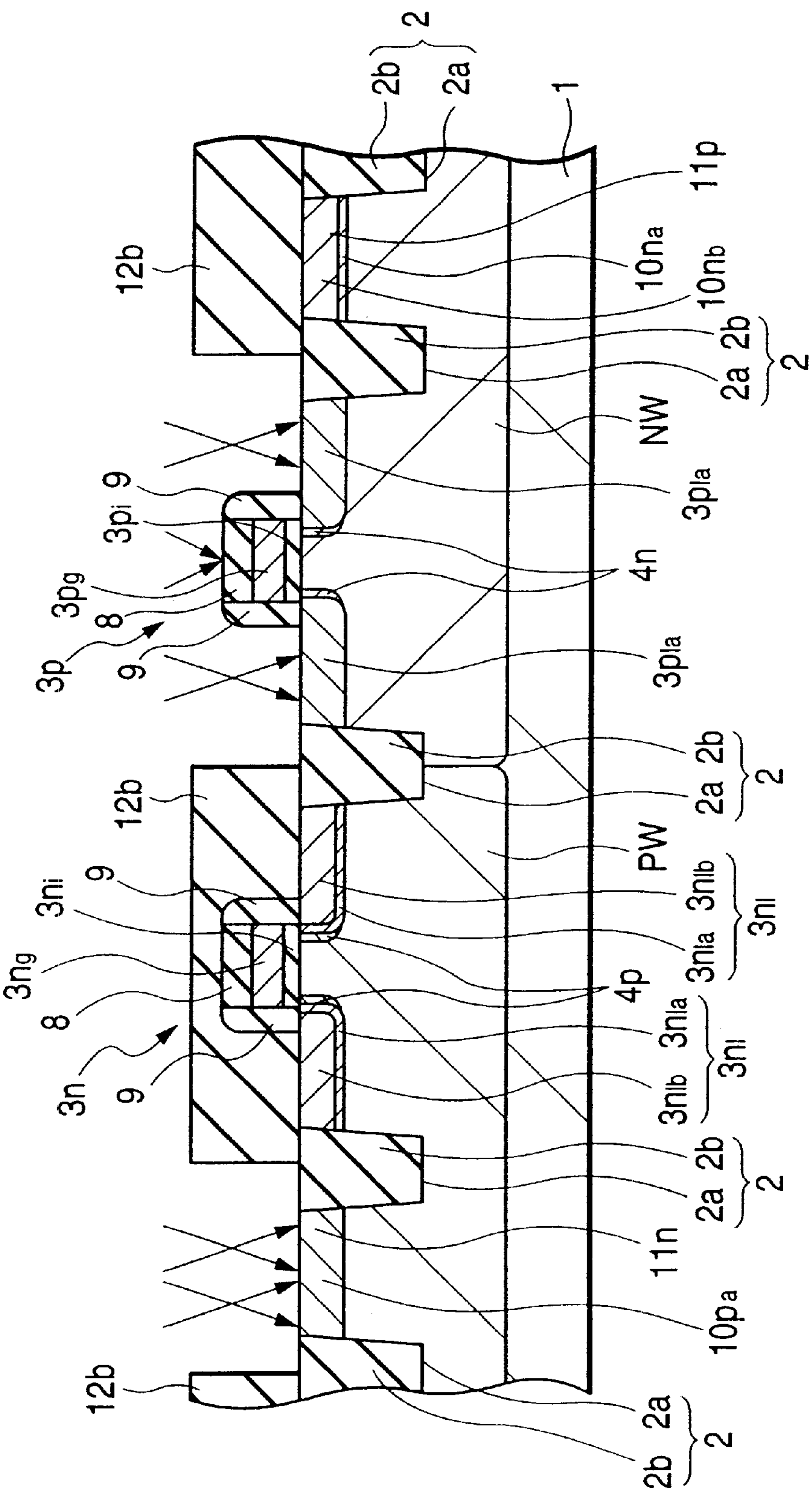
FIG. 9 is is a cross section of the semiconductor integrated circuit device of FIG. 1 during the process of manufacture following the step of FIG. 8.

After this, as shown in FIG. 9, with the photoresist 12_b_ as a mask, the semiconductor substrate 1 is ion-implanted with a p type impurity, such as boron. This is a process to form the $p^-$ type semiconductor region 3_pla_ in the pMOS and the $p^-$ type semiconductor region 10_pa_ in the p-well power supply region.

During this process, impurity ions are bombarded at inclined incidence angles from four or more directions. In this case, to ensure that in the pMOS formation region the extent of impurity infiltration under the edge of the gate electrode 3_pg_ is smaller than in the $n^-$ type semiconductor region 4_n_, the implantation of impurity ions is performed in such a way that the incidence angle of the impurity with respect to the principal surface of the semiconductor substrate 1 is set larger than the incidence angle used to form the $n^-$ type semiconductor region 4_n_.

As a result, in the pMOS formation region, the $n^-$ type semiconductor region 4_n_ can be left at the end of the $p^-$ type semiconductor region 3_pla_ on the channel side and, in the p-well power supply region, the $p^-$ type semiconductor region 10_pa_ can be formed deeper than in the $n^-$ type semiconductor region 11_n_.

Although the semiconductor regions 4_p_, 4_n_, 11_p_, 11_n_, 3_nla_, 3_nlb_, 3_pla_, 10_na_, 10_nb_, 10_pa_ are not formed yet at this stage of the manufacturing process, since the heat treatment to activate the impurity has not been performed, these semiconductor regions are illustrated to facilitate understanding.

Figure 10:
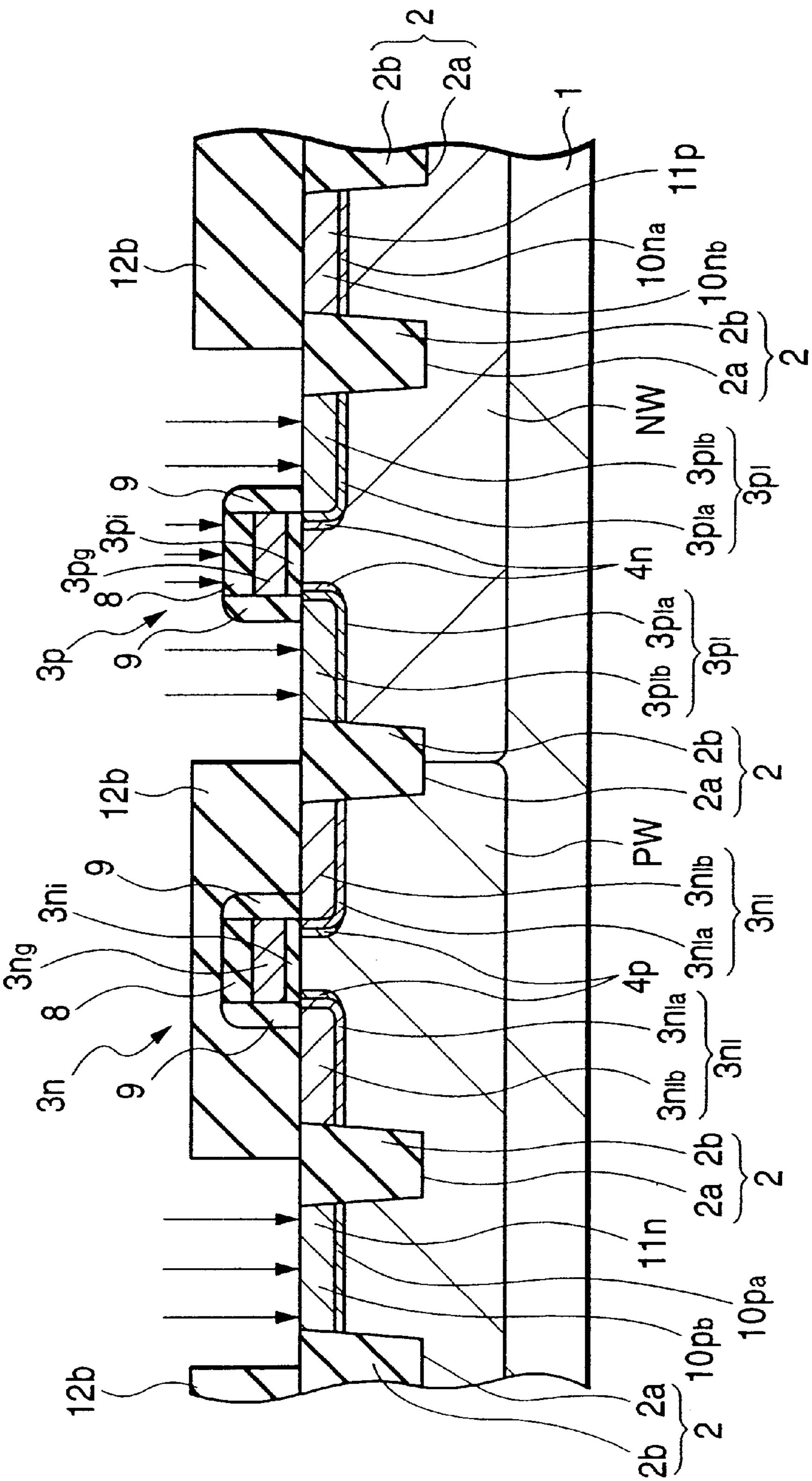
FIG. 10 is a cross section of the semiconductor integrated circuit device of FIG. 1 during the process of manufacture following the step of FIG. 9.

Then, as shown in FIG. 10, with the photoresist 12*b* as a mask, the semiconductor substrate 1 is ion-implanted with a p type impurity, such as boron. This is a process to form the $p^+$ type semiconductor region 3*plb* in the pMOS and the $p^+$ type semiconductor region 10*pb* in the p-well power supply region. In this process, the angle of incidence of the impurity ions is set perpendicular to the principal surface of the semiconductor substrate 1.

Although the semiconductor regions 4*p*, 4*n*, 11*p*, 11*n*, 3*nla*, 3*nlb*, 3*pla*, 3*plb*, 10*na*, 10*nb*, 10*pa*, 10*pb* are not formed yet at this stage of the manufacturing process, since the heat treatment to activate the impurity has not been performed, these semiconductor regions are illustrated to facilitate understanding.

In this way, the embodiment 1 allows the p type semiconductor regions 3*pl*, the $n^-$ type semiconductor region 4*n* and the p-well power supply region 10*p*, all required by the pMOS 3*p*, to be formed by ion implantation using the same photoresist mask.

Figure 11:
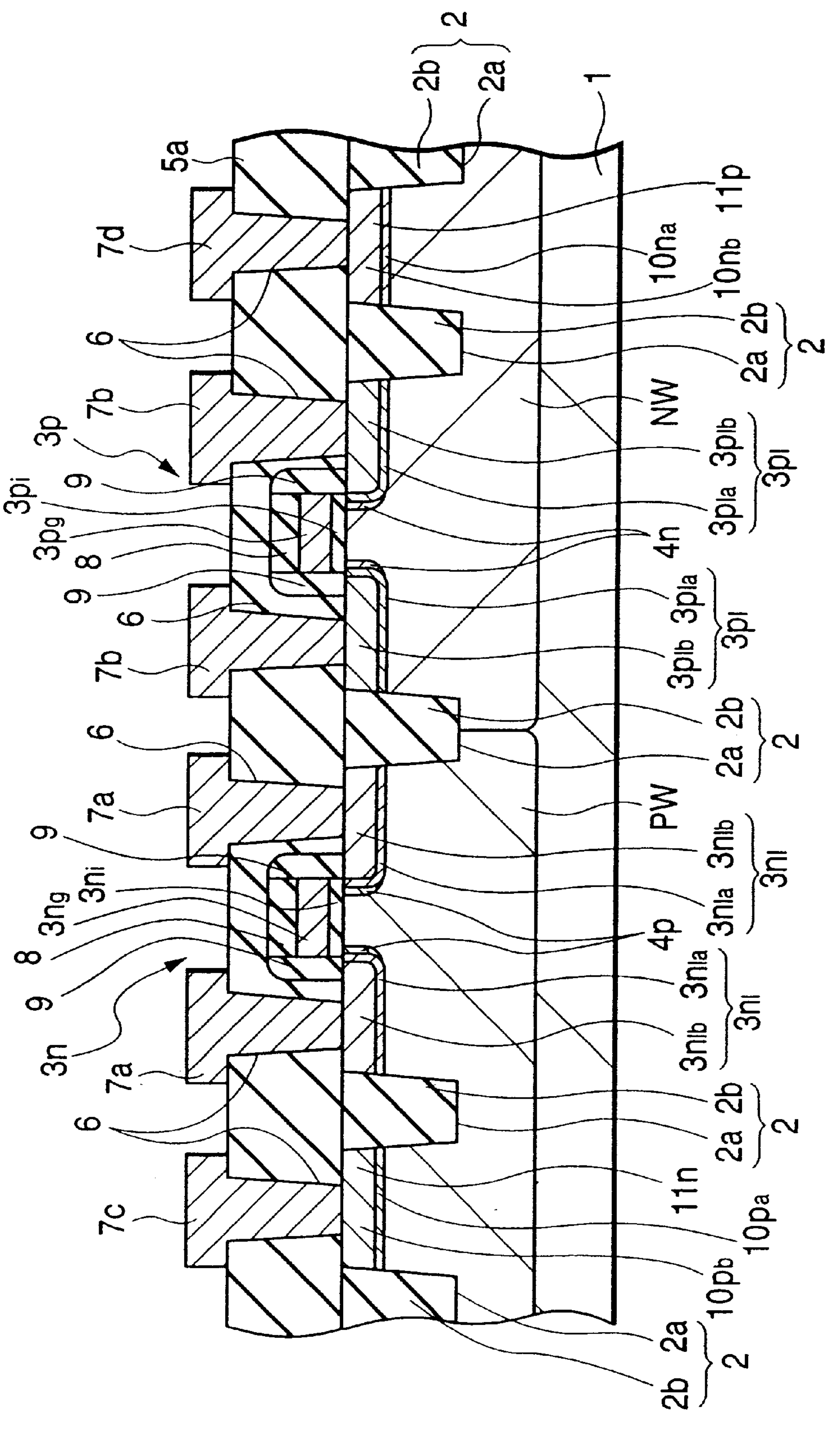
FIG. 11 is a cross section of the semiconductor integrated circuit device of FIG. 1 during the process of manufacture following the step of FIG. 10.

Next, as shown in FIG. 11, the semiconductor substrate 1 is provided with an interlayer insulation film 5*a* of, say, $SiO_2$ by the CVD method, which is then formed by photolithography and dry etching with connecting holes 6 that expose the n type semiconductor regions 3*nl* in the nMOS 3*n*, the p type semiconductor regions 3*pl* in the pMOS 3*p*, the n-well power supply region 10*n* and the p-well power supply region 10*p*.

Then, the semiconductor substrate 1 is provided by sputtering with a Ti/TiN/W laminated conductive film, which is then patterned by photolithography and dry etching to form electrodes 7*a*–7*d*. Here, the p-well well PW is supplied with a first supply voltage (for example, Vss) from the electrode 7*c*, and the n-well NW with a second supply voltage (for example, Vdd) from the electrode 7*d*.

In the subsequent steps, ordinary wiring forming processes for the semiconductor integrated circuit devices may be used, and so explanations of these steps are omitted.

The embodiment 1 therefore offers the following advantages.

(1) Because the $n^-$ type semiconductor region 3*nla* and $n^+$ type semiconductor region 3*nlb*in the nMOS 3*n*, the $p^-$ type semiconductor region 4*p* for suppressing the short channel effect, and the n-well power supply region 10*n* are all formed by ion implantation processes using the same photoresist 12*a* as a mask, the number of photomasks required can be reduced.

(2) Because the $p^-$ type semiconductor region 3*pla* and $p^+$ type semiconductor region 3*plb* in the pMOS 3*p*, the $p^-$ type semiconductor region 4*n* for suppressing the short channel effect, and the p-well power supply region 10*p* are all formed by ion implantation processes using the same photoresist 12*b* as a mask, the number of photomasks required can be reduced.

(3) Because the number of photomasks can be reduced significantly as described in (1) and (2), a substantial cost reduction of the semiconductor integrated circuit device is assured.

(4) Because the $n^-$ type semiconductor region 3*nla* and $n^+$ type semiconductor region 3*nlb*in the nMOS 3*n*, the $p^-$ type semiconductor region 4*p* for suppressing the short channel effect, and the n-well power supply region 10*n* are all formed by ion implantation processes using the same photoresist 12*a* as a mask, the number of processes, such as application, exposure and development of the photoresist film, can be reduced.

(5) Because the $p^-$ type semiconductor region 3*pla* and $p^+$ type semiconductor region 3*plb* in the pMOS 3*p*, the $n^-$ type semiconductor region 4*n* for suppressing the short channel effect, and the p-well power supply region 10*p* are all formed by ion implantation processes using the same photoresist 12*b* as a mask, the number of processes, such as application, exposure and development of the photoresist film, can be reduced.

(6) Because of the above advantages (4) and (5), the rate of trapping of foreign matter during the process of manufacture of a semiconductor integrated circuit device can be reduced, which in turn improves the yield and reliability of the semiconductor integrated circuit device.

(7) Because the number of processes, such as application, exposure and development of the photoresist film, can be reduced significantly as described in (4) and (5), the manufacturing time for a semiconductor integrated circuit device having nMOS 3*n* and pMOS 3*p* on the same semiconductor substrate 1 can be reduced.

(8) The short channel effect of the nMOS 3*n* and pMOS 3*p* can be suppressed.

(9) The current drive capability of the nMOS 3*n* and pMOS 3*p* can be improved.

(10) Because of the above advantages (4) and (5), the nMOS 3*n* and pMOS 3*p* having a short channel effect suppression capability can be formed on the same semiconductor substrate 1 without significantly increasing the number of manufacturing processes of the semiconductor integrated circuit device.

(Embodiment 2)

Figure 12:
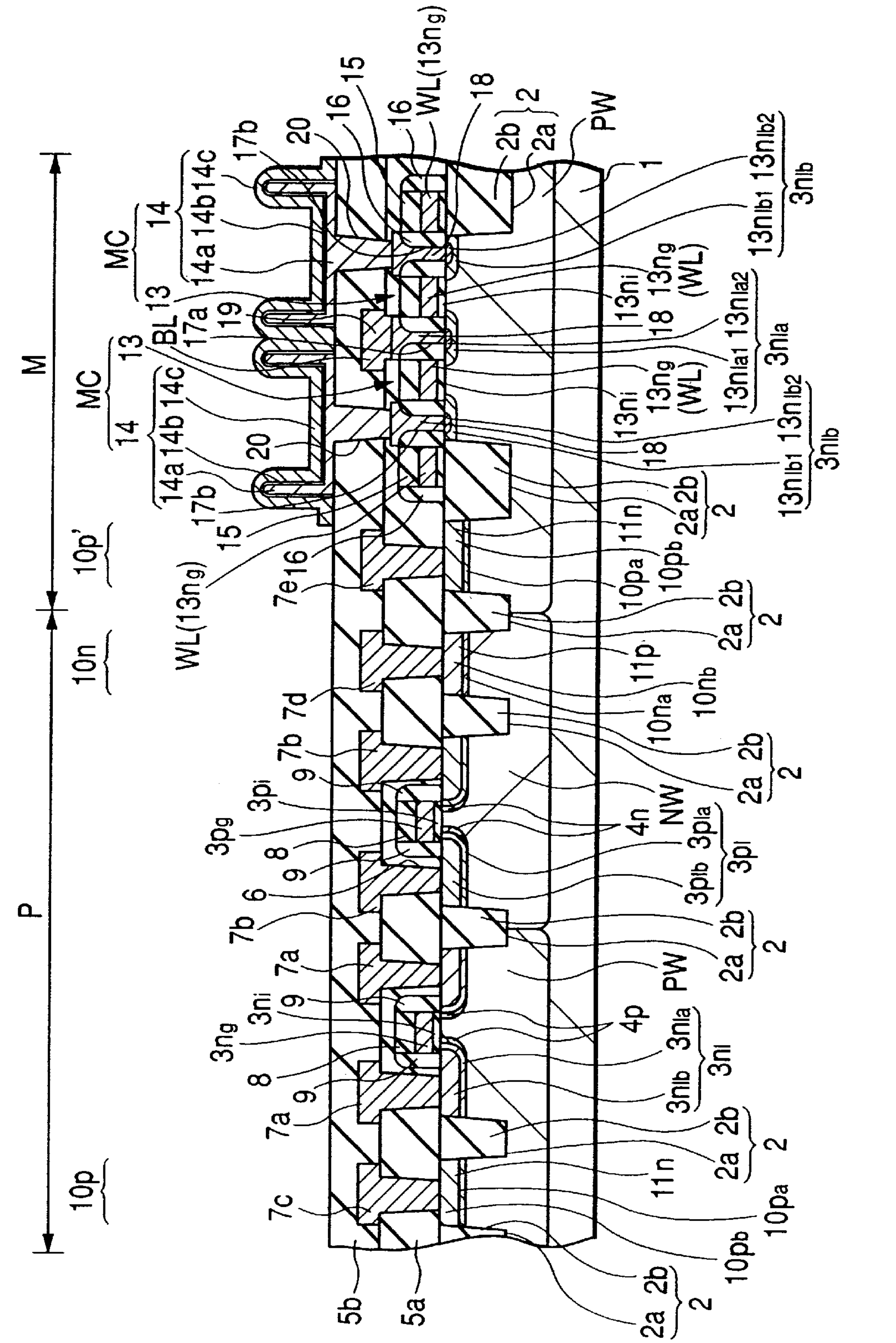
FIG. 12 is a cross section of a semiconductor integrated circuit device of another embodiment of this invention.

FIG. 12 is a cross section of a representative part of a semiconductor integrated circuit device of another embodiment of this invention. FIGS. 13 to 16 are cross sections of the semiconductor integrated circuit device of FIG. 12 during steps of the process of manufacture.

The semiconductor integrated circuit device shown in FIG. 12 as the embodiment 2 is, for example, a DRAM (dynamic random access memory). The left-hand part of FIG. 12 represents a peripheral circuit area P and the right-hand part a memory cell area M.

The peripheral circuit area P is identical with the embodiment 1 and so an explanation thereof is omitted. Here, the memory cell area M will be described.

In the memory cell area M, a p-well PW is formed in the upper part of the semiconductor substrate 1. The p-well PW is formed simultaneously with the p-well PW of the peripheral circuit area P and is doped with a p type impurity, such as boron.

Formed over the p-well PW, there is a memory cell MC, which comprises one memory cell selection MOSFET (hereinafter referred to as a selection MOS) 13 and one capacitor 14.

The selection MOS 13 may be formed of an n-channel MOSFET and includes a pair of semiconductor regions 13*nla*, 13*nlb* formed so as to be spaced apart in the upper part of the semiconductor substrate 1, a gate insulation film 13*ni* formed over the semiconductor substrate 1, and a gate electrode 13*ng* formed over the gate insulation film.

The semiconductor regions 13*nla*, 13*nlb* are regions to form a source and a drain of the selection MOS 13 and are doped with an n type impurity, such as phosphorus or arsenic (As).

The semiconductor region 13*nla* comprises a semiconductor region 13*nla*1 and a semiconductor region 13*nla*2 formed on the inner side of the semiconductor region 13*nla*1 and having a high impurity concentration. The semiconductor region 13*nlb* comprises a semiconductor region 13*nlb*1 and a semiconductor region 13*nlb*2 formed on the inner side of the semiconductor region 13*nlb*1 and having a high impurity concentration. A channel region of the selection MOS 13 is formed between the semiconductor regions 13*nla*, 13*nlb*.

The gate insulation film 13*ni* may be formed of $SiO_2$. The gate electrode 13*ng* is formed by depositing a conductive film of, say, tungsten silicide (WSi2) over a conductive film of, say, low-resistance polysilicon. The upper conductive film reduces the resistance of the gate electrode 13*ng*. The gate electrode 13*ng* may be formed of a single film of low-resistance polysilicon or a specific metal, such as tungsten.

The gate electrode 13*ng* constitutes a part of a word line WL. The word line WL has a predetermined width necessary to produce a threshold voltage of the selection MOS 13.

The upper and side surfaces of the gate electrode 13*ng* (word line WL) are covered with a cap insulation film 15 and a sidewall 16. In the embodiment 2, the cap insulation film 15 and the sidewall 16 are made, for example, of silicon nitride. The cap insulation film 15 and sidewall 16 are covered with the interlayer insulation film 5*a*.

The memory cell area M is formed with connecting holes 17*a*, 17*b* that expose the semiconductor regions 13*nla*, 13*nlb* in the upper part of the semiconductor substrate 1.

The cap insulation film 15 and the sidewall 16 function as etching stoppers when forming the connecting holes 17*a*, 17*b* and work as films to self-aligningly form the connecting holes 17*a*, 17*b* between the adjacent word lines WL.

Hence, if the connecting holes 17*a*, 17*b* are shifted slightly widthwise of the word lines WL, the cap insulation film 15 and the sidewall 16 work as etch stoppers to prevent a part of the word line WL from being exposed through the connecting holes 17*a*, 17*b*. The positioning margin of the connecting holes 17*a*, 17*b* with respect to the word line WL can therefore be reduced.

If the connecting holes 17*a*, 17*b* are shifted in the longitudinal direction of the word line WL, the upper surface of the semiconductor substrate 1 will not be exposed from the connecting holes 17*a*, 17*b* because a certain thickness of the interlayer insulation film is secured.

A conductive film 18 of, say, low-resistance polysilicon is embedded in the connecting holes 17*a*, 17*b*.

Formed over the interlayer insulation film 5*a* are bit lines BL, which are formed of a single film of tungsten or a Ti/TiN/W laminated film and electrically connected to the semiconductor region 13*nla* through the connecting holes 17*a*, 19. The bit lines BL are arranged perpendicular to the word lines WL.

Over the bit line BL, there is formed a capacitor 14 of cylindrical shape, for example. In other words, the DRAM represented by the embodiment 1 has the capacitor 14 over the bit line BL. The capacitor 14 comprises a first electrode 14*a* and a second electrode 14*c* covering the first electrode surface, with a capacitor insulation film 14*b* interposed between.

The first electrode 14*a* may be made of low-resistance polysilicon and is electrically connected to one semiconductor region 13*nla* of the selection MOS 13 through the connecting hole 20 and the conductive film 18 embedded in the connecting hole 17*b*.

The capacitor insulation film 14*b* is formed, for example, by depositing an $SiO_2$ film over a silicon nitride film. The second electrode 14*c* may be formed of low-resistance polysilicon and is electrically connected to a predetermined wire.

In the memory cell area M a region enclosed by the device isolation portion 2, too, is formed with a p-well power supply region 10*p*' to supply a predetermined voltage to the p-well PW.

The p-well power supply region 10*p*' has a $p^-$ type semiconductor region 10*pa* with a low impurity concentration, a $p^+$ type semiconductor region 10*pb* with a high impurity concentration, and $n^-$ type semiconductor region 11*n*.

The $p^-$ type semiconductor region 10*pa* and the $p^+$ type semiconductor region 10*pb* contain a p type impurity, such as boron. The $n^-$ type semiconductor region 11*n* contains an n type impurity, such as phosphorus or arsenic.

The p-well power supply region 10*p*' is electrically connected to an electrode 7*e* through a connecting hole 6 formed in the interlayer insulation film 5*a* deposited over the semiconductor substrate 1. The p-well PW in which the memory cell is formed is supplied with a first supply voltage (for example, Vss) or a third supply voltage (for example, Vbb=−2 V). The electrode 7*e* may be formed of a single film of tungsten or a Ti/TiN/W laminated film.

The $p^-$ type semiconductor region 10*pa*, $p^+$ type semiconductor region 10*pb* and $n^-$ type semiconductor region 11*n*, as will be described later, are formed simultaneously with the $p^-$ type semiconductor region 3*pla*, $p^+$ type semiconductor region 3*plb* and $n^-$ type semiconductor region 4*n* of the nMOS 3*n* in ion implantation processes using the same mask.

Next, the method of manufacturing the semiconductor integrated circuit device representing the embodiment 2 will be described by referring to FIGS. 13 to 16.

Figure 13:
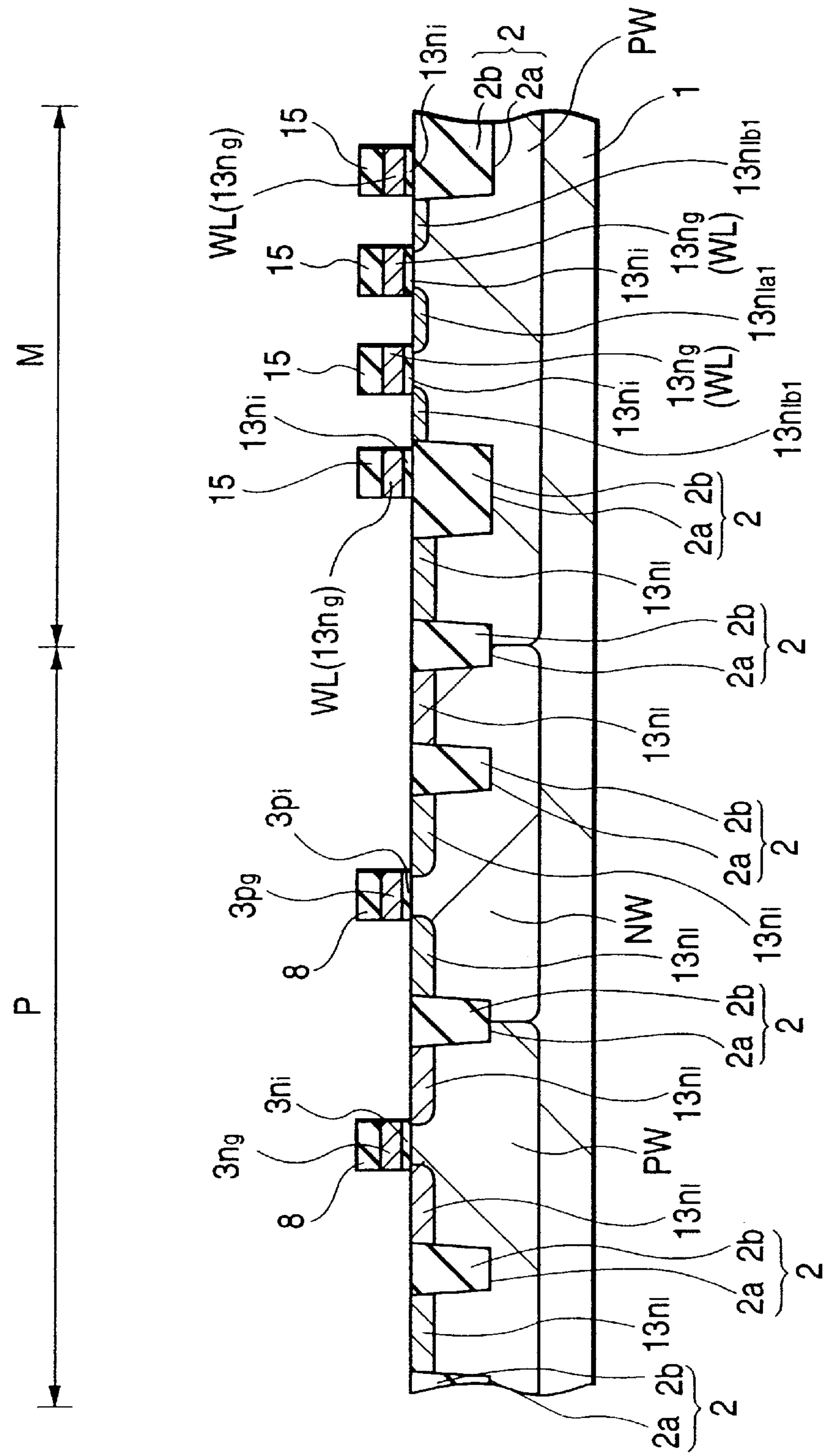
FIG. 13 is a cross section of the semiconductor integrated circuit device of FIG. 12 during the process of manufacture.

FIG. 13 a cross section showing the semiconductor integrated circuit device of Formed in the semiconductor substrate 1 are a p-well PW, an n-well NW, device isolation portions 2, gate electrodes 3*n*g, 3*pg*, 13*ng* and cap insulation films 8, 15.

Such a semiconductor substrate 1 is ion-implanted with an n type impurity, such as phosphorus or arsenic, to form semiconductor regions 13*nla*1, 13*nlb*1 for the memory cell selection MOS. The dose of impurity for the implantation is around $2\times10^{13}$ ions/cm$^2$. The impurity implantation process is carried out by applying ions to the entire principal surface of the semiconductor substrate 1 without a mask. Hence, the n type impurity is also implanted in the peripheral circuit area P (including the pMOS region and p-well power supply region) other than the memory cell area. In the p-well power supply regions in the peripheral circuit area P and the memory cell area M, the semiconductor regions formed in this impurity planting process are shown by the $n^-$ type semiconductor region 13*nl*. Although the $n^-$ type semiconductor regions 13*nl*, 13*nla*1, 13*nlb*1 are not formed yet at this stage of the manufacturing process, since the beat treatment to activate the impurity has not been performed, these semiconductor regions are illustrated to facilitate understanding.

Figure 14:
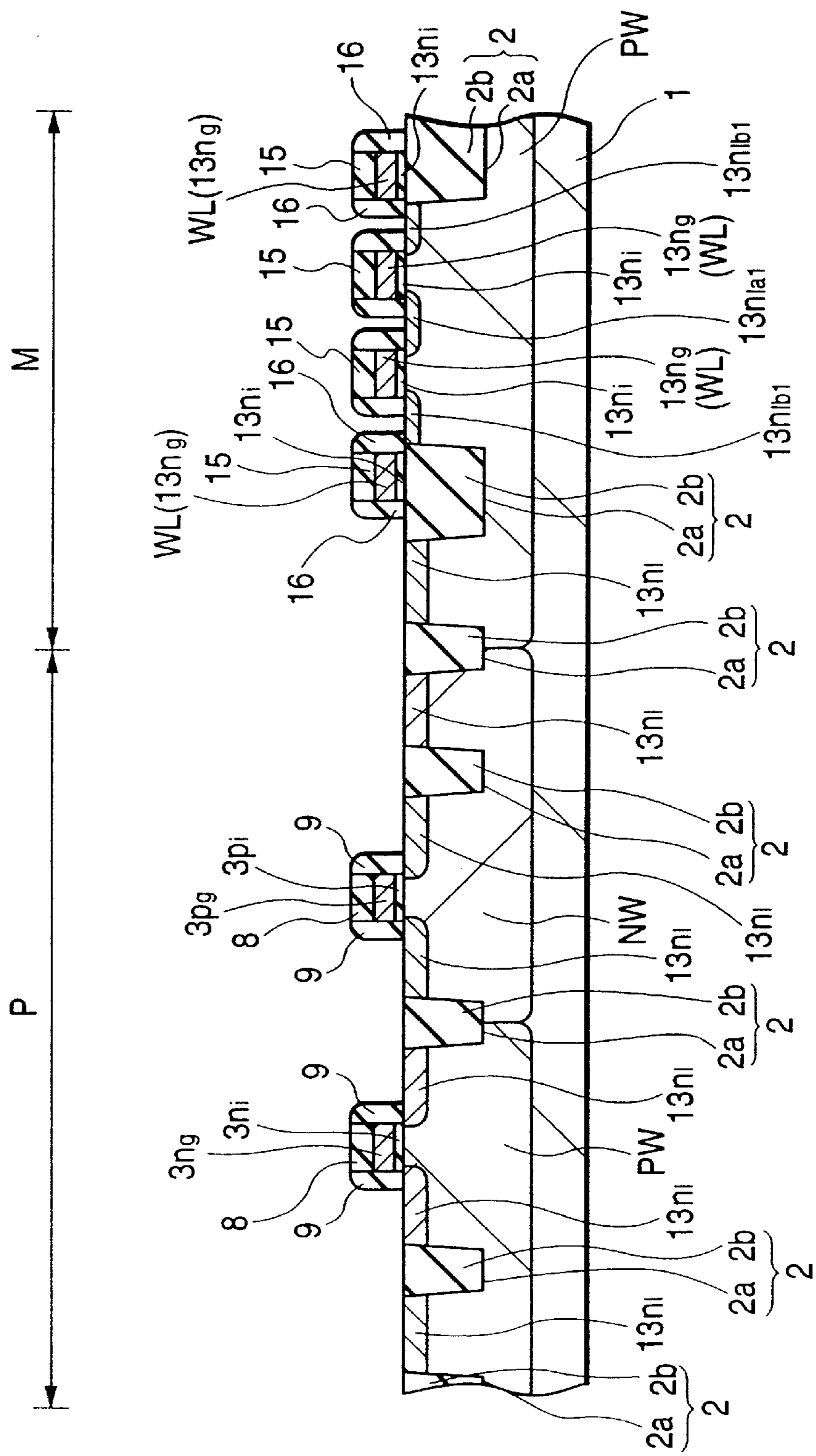
FIG. 14 is a cross section of the semiconductor integrated circuit device of FIG. 12 during the process of manufacture following the step of FIG. 13.

Next, the semiconductor substrate 1 is provided by the CVD method with an insulation film of, say, $SiO_2$, which is then etched back (anisotropic etching) to form sidewalls 9, 16 on the side surfaces of the gate electrodes 3*ng*, 3*pg*, 13*ng*, as shown in FIG. 14. Although the $n^-$ type semiconductor regions 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 15:
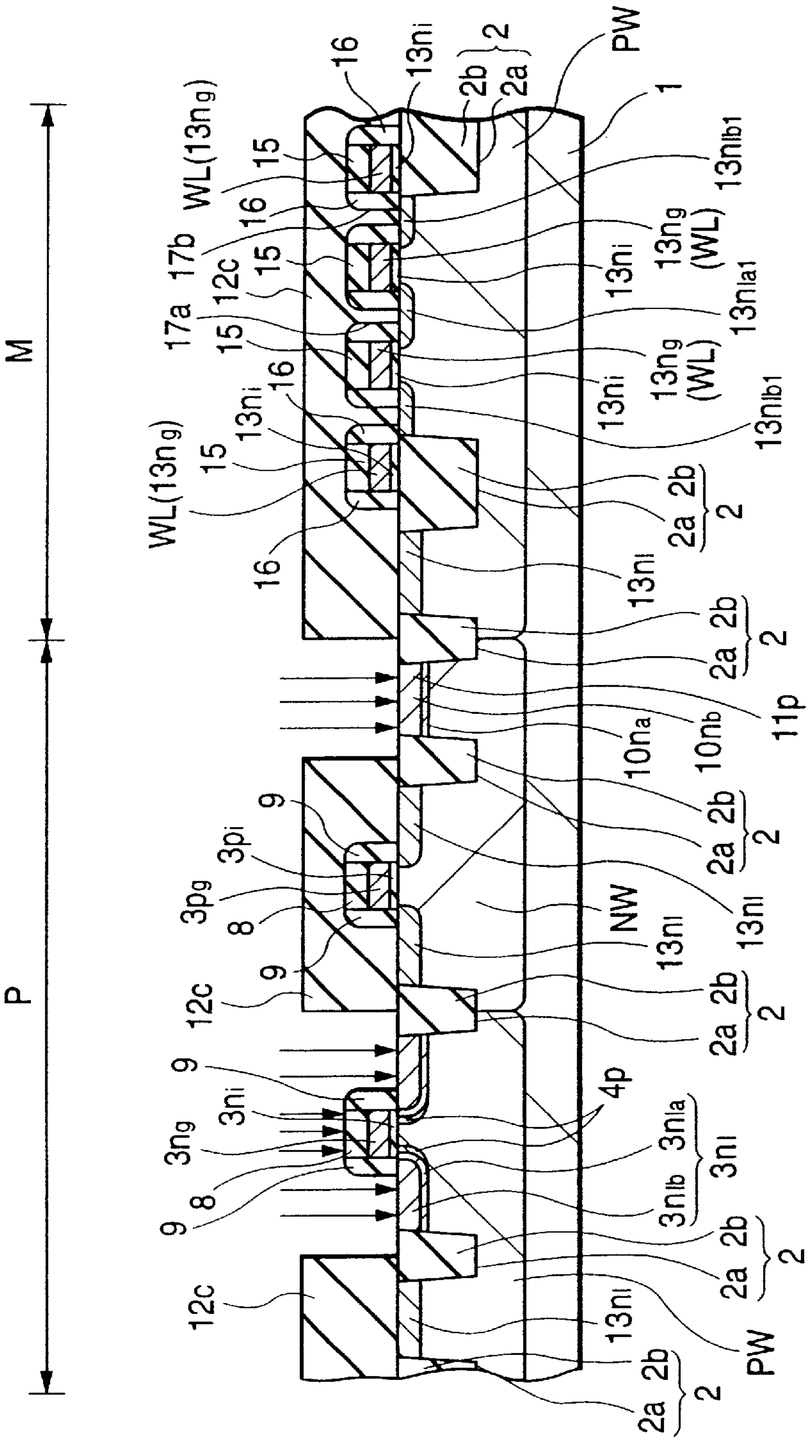
FIG. 15 is a cross section of the semiconductor integrated circuit device of FIG. 12 during the process of manufacture following the step of FIG. 14.

Then, as shown in FIG. 15, the semiconductor substrate 1 is provided by photolithography with a photoresist (first mask) 12*c* that exposes the nMOS formation region and n-well power supply region 10*n* in the peripheral circuit area P and covers the pMOS formation region and p-well power supply region 10*p* in the peripheral circuit area P and the memory cell area M (including the p-well power supply region 10*p*' of the memory cell).

Next, using the photoresist 12*c* as a mask, the impurity ions are implanted, as in the embodiment 1, to form in the peripheral circuit area P the $n^-$ type semiconductor region 3*nla* of the nMOS 3*n*, the $p^-$ type semiconductor region 4*p* for suppressing the short channel effect, the $n^+$ type semiconductor region 3*nlb* and the n-well power supply region 10*n*.

That is, with the photoresist 12*c* functioning as a mask, a p type impurity, such as boron, for making the $p^{--}$ type semiconductor regions 4*p*, 11*p*, is ion-implanted at an inclined angle into the principal surface of the semiconductor substrate 1. The dose of impurity implanted is approximately $4\times10^{12}$ ions/cm$^2$. Next, with the same photoresist 12*c* as a mask, an n type impurity, such as phosphorus or arsenic, for making the $n^-$ type semiconductor regions 3*nla*, 10*na*, is bombarded against the principal surface of the semiconductor substrate 1 at an inclined angle equal to the angle at which the p type impurity was injected to form the $p^-$ type semiconductor region 4*p*. The dose of impurity implanted is around $1\times10^{14}$/cm$^2$. After this, using the same photoresist 12*c* as a mask, an n type impurity, such as phosphorus or arsenic, for making the $n^+$ type semiconductor regions 3*nlb*, 10*nb*, is ion-implanted vertically to the principal surface of the semiconductor substrate 1. The dose of impurity implanted is about $3\times10^{15}$ ions/cm$^2$. The n type impurity for making the $n^+$ type semiconductor regions 3*nlb*, 10*nb* is ion-implanted deep enough so that the $n^+$ type semiconductor regions 3*nlb*, 10*nb* are formed to contact the n-well NW.

Although the semiconductor regions 4*p*, 11*p*, 3*nla*, 3*nlb*, 10*na*, 10*nb*, 13*nl*, 13*nla*1, 13*nlb*1 are not formed yet at this stage of the manufacturing process, since the heat treatment to activate the impurity has not been performed, these semiconductor regions are illustrated to facilitate understanding.

At this time, because the memory cell area M is covered with the photoresist 12*c*, the impurity for making the $n^-$ type semiconductor region 3*nla*, $n^+$ type semiconductor region 3*nlb* and n-well power supply region 10*n* is not injected. Thus, in the memory cell area M the junction field does not increase, nor are defects formed, so that junction leakage can be prevented from increasing and degradation of the refresh characteristic can be suppressed.

Forming the $n^-$ type semiconductor region 3*nla*, the $n^+$ type semiconductor region 3*nlb* and the n-well power supply region 10*n* by the ion implantation processes using the same photoresist 12*c* as a mask can reduce the number of photomasks and the number of processes, such as application, exposure and development of the photoresist.

Figure 16:
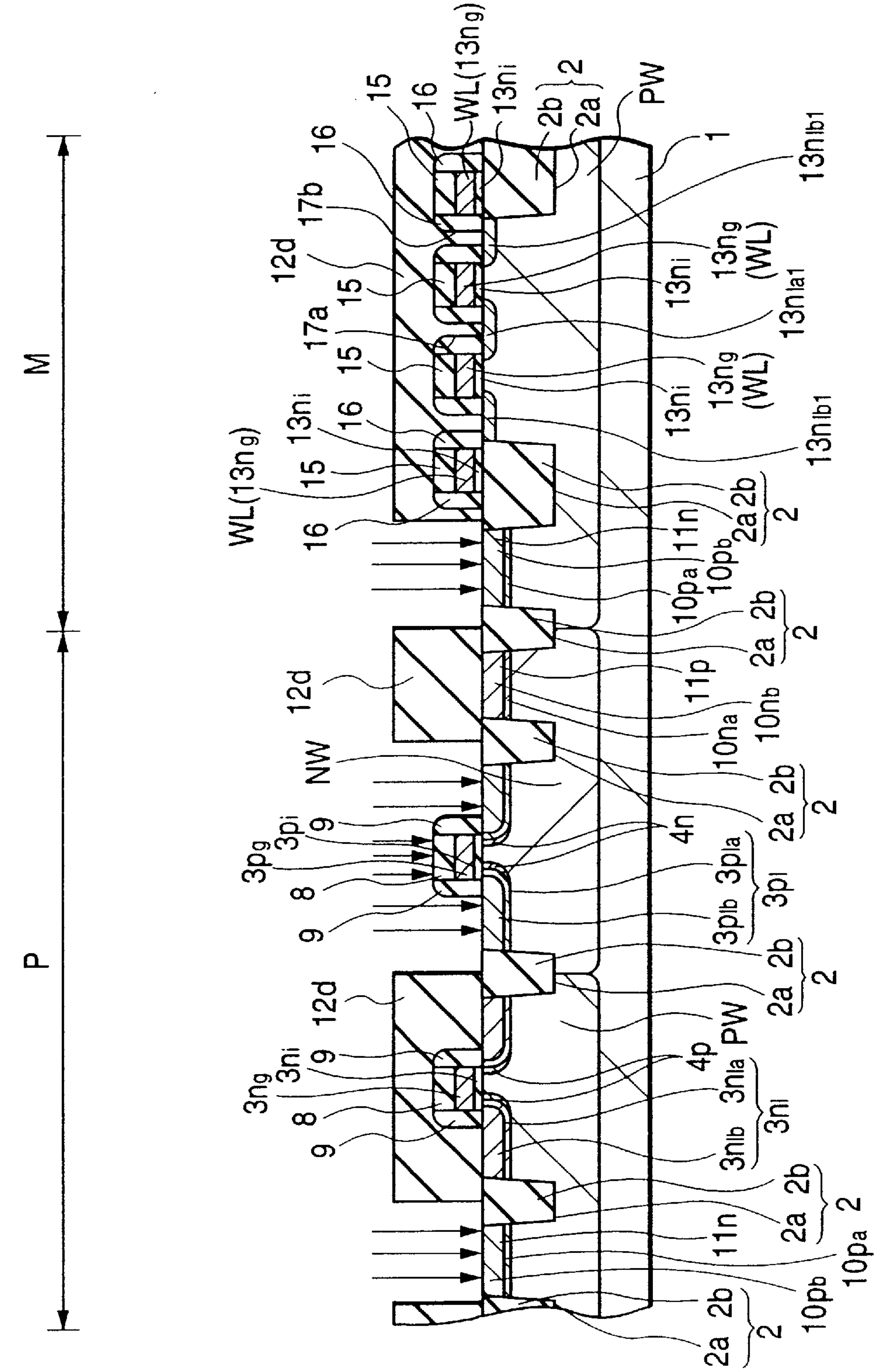
FIG. 16 is a cross section of the semiconductor integrated circuit device of FIG. 12 during the process of manufacture following the step of FIG. 15.

Next, with the photoresist 12*c* removed, the semiconductor substrate 1 is formed by photolithography with a photoresist (second mask) 12*d*, which, as shown in FIG. 16, exposes the p-well power supply region 10*p* and pMOS formation region of the peripheral circuit area P and the p-well power supply region 10*p*' of the memory cell area M and which covers the nMOS formation region and n-well power supply region 10*n* in the peripheral circuit area P and the memory cell area M.

Then, with the photoresist 12*d* as a mask, impurity ions are introduced in a manner similar to the embodiment 1 to form the $p^-$ type semiconductor region 3*pla* and $p^+$ type semiconductor region 3*plb* of the pMOS 3*p*, $n^-$ type semiconductor region 4*n* for suppressing the short-channel effect and the p-well power supply region 10*p* in the peripheral circuit area P.

That is, using the photoresist 12*d* as a mask, an n type impurity, such as phosphorus or arsenic, for making the $n^-$ type semiconductor regions 4*n*, 11*n*, is ion-implanted at an inclined angle to the principal surface of the semiconductor substrate 1. The dose of impurity implanted is approximately $3\times10^{12}$ ions/cm$^2$. Next, with the same photoresist 12*d* functioning as a mask, a p type impurity, such as boron, for making the $p^-$ type semiconductor regions 3*pla*, 10*pa*, is implanted into the principal surface of the semiconductor substrate 1 at an angle equal to the angle at which the n type impurity was injected to form the $n^-$ type semiconductor region 4*n*. The dose of impurity implanted is around $3\times10^{13}$ ions/cm$^2$. This impurity dose is larger than the dose of n type impurity that was used to form the semiconductor regions 13*nla*1, 13*nlb* constituting the source and drain of the memory cell selection MOS. The difference in dose between the p type impurity and the n type impurity is the impurity concentration of the $p^-$ type semiconductor regions 3*pla*, 10*pa*. Then, with the same photoresist 12*d* functioning as a mask, the p type impurity, such as boron, for making the $p^+$ type semiconductor regions 3*plb*, 10*pb*, is ion-implanted vertically to the principal surface of the semiconductor substrate 1. The dose of impurity used is around $3\times10^{15}$ ions/cm$^2$. The p type impurity for making the $p^+$ type semiconductor regions 3*plb*, 10*pa* is ion-implanted deep enough so that the $p^+$ type semiconductor regions 3*plb*, 10*pa* are formed to contact the p-well PW.

Although the semiconductor regions 4*p*, 11*p*, 3*nla*, 3*nlb*, 10*na*, 10*nb*, 4*n*, 11*n*, 3*pla*, 3*plb*, 10*pa*, 10*pb*, 13*nl*, 13*nla*1, 13*nlb*1 are not formed yet at this stage of the manufacturing process, since the heat treatment to activate the impurity has not been performed, these semiconductor regions are illustrated to facilitate understanding.

At this stage, the memory cell area M, because it is covered with the photoresist 12*d*, is not implanted with the impurity for making the $p^-$ type semiconductor region 3*pla*, $p^+$ type semiconductor region 3*plb* and p-well power supply region 10*p*.

Further, forming the $p^-$ type semiconductor region 3*pla*, $p^+$ type semiconductor region 3*plb* and p-well power supply region 10*p* by ion implantation processes using the same photoresist 12*d* as a mask can reduce the number of photomasks and the number of processes, such as application, exposure and development of the photoresist film.

Next, the photoresist 12*d* is removed and the semiconductor substrate 1 is heat-treated to activate and diffuse the impurity implanted in the semiconductor substrate 1. After this, as shown in FIG. 12, with the sidewall 16 used as an etch stopper, connecting holes 17*a*, 17*b* are formed in the memory cell area M by photolithography and dry etching. The connecting holes 17*a*, 17*b* are embedded with a conductive film 18.

This is followed by deposition by CVD method of the interlayer insulation film 5*a* of, say, $SiO_2$ over the semiconductor substrate 1 and the forming of connecting holes 6, 19 in a part of the interlayer insulation film 5*a* by photolithography and dry etching.

Then, a conductive film, such as a single film of tungsten or a Ti/TiN/W laminated film, is deposited by sputtering over the interlayer insulation film 5*a* and is patterned by photolithography and dry etching to form the electrodes 7*a*–7*e* and the bit line BL.

Then, the semiconductor substrate 1 is deposited by CVD method with an interlayer insulation film of $SiO_2$, for instance, and then a capacitor 14 is formed by an ordinary. DRAM forming method.

In addition to the advantages of the embodiment 1, the embodiment 2 can thus provide the following advantages.

(1) Because the impurity ions used to make the $n^-$ type semiconductor region 3*nla* and $n^+$ type semiconductor region 3*nlb* of the nMOS 3*n*, the n-well power supply region 10*n* and the $p^-$ type semiconductor region 4*p* for suppressing the short channel effect are not injected into the memory cell area M, the junction field in the memory cell area M does not increase nor are defects formed. The junction leakage therefore does not increase, minimizing degradation of the refresh characteristics.

(2) Because the ion implantation to form the semiconductor regions 13*nla*1, 13*nlb*1 that constitute the source and the drain of the memory cell selection MOS is carried out without using a photomask, the number of manufacturing processes can be reduced.

(Embodiment 3)

Figure 17:
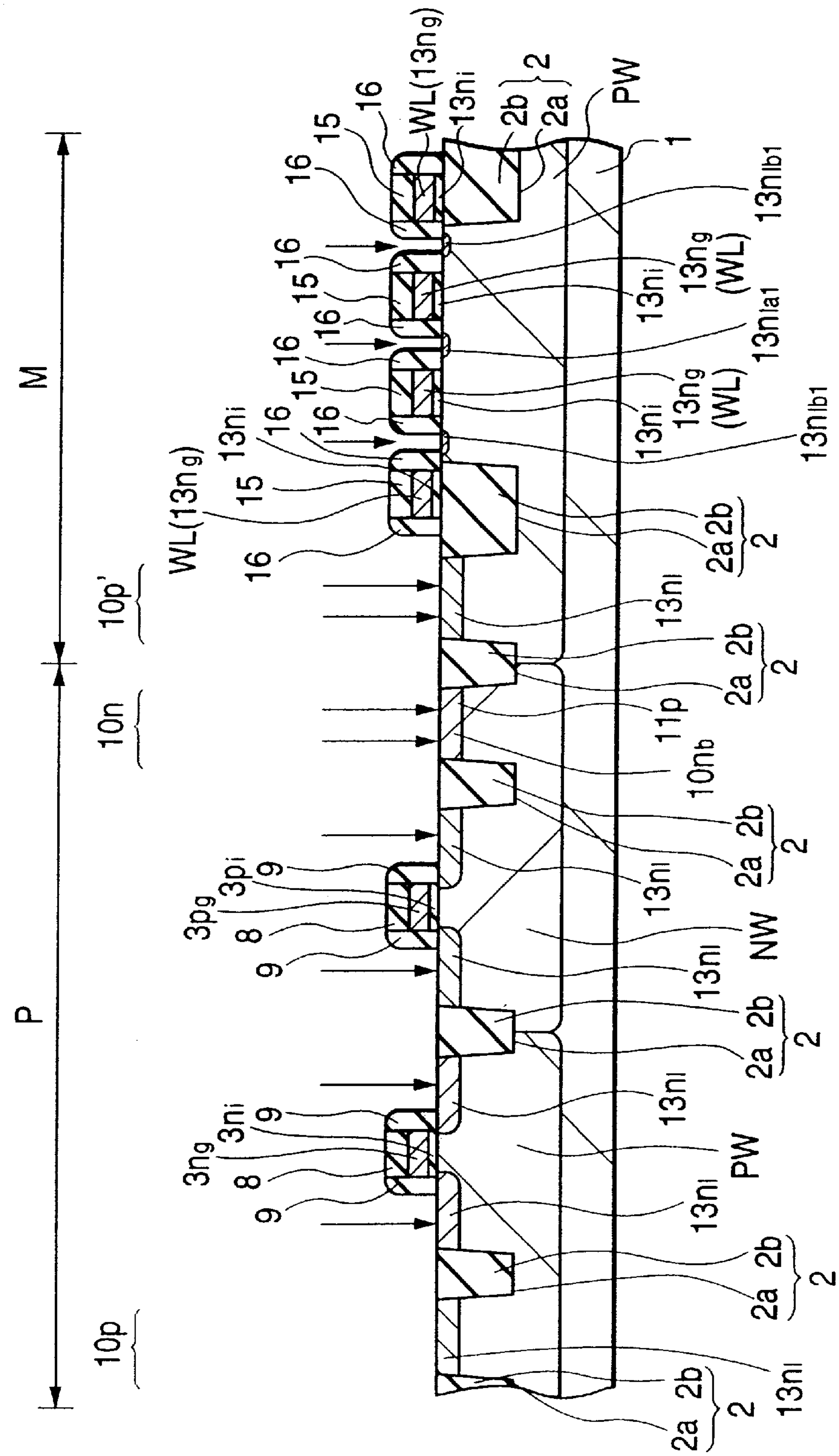
FIG. 17 is a cross section of a semiconductor integrated circuit device of still another embodiment of this invention during the process of manufacture.

FIG. 17 shows an essential-part cross section showing a semiconductor integrated circuit device of a further embodiment of this invention during the process of manufacture.

The semiconductor substrate 1 is already formed with a p-well PW, an n-well NW, device isolation portions 2, gate electrodes 3*ng*, 3*pg*, 13*ng*, cap insulation films 8, 15 and sidewalls 9, 16.

The semiconductor substrate 1 is ion-implanted with an n type impurity, such as phosphorus or arsenic, to form the semiconductor regions 13*nla*1, 13*nlb*1 for the memory cell selection MOS. The dose of impurity to be implanted is set at $2\times10^{13}$ $cm^{-2}$.

The impurity is ion-implanted without a mask on the entire principal surface of the semiconductor substrate 1. Hence, this n type impurity is also injected into the peripheral circuit area P (including the pMOS region and p-well power supply region) in addition to the memory cell area. In the p-well power supply regions in the peripheral circuit area P and the memory cell area M, the semiconductor regions formed by this impurity implanting process are represented by $n^-$ type semiconductor regions 13*nl*. Although the $n^-$ type semiconductor regions 13*nl*, 13*nla*1, 13*nlb*1 are not formed yet at this stage of the manufacturing process, since the heat treatment to activate the impurity has not been performed, these semiconductor regions are illustrated to facilitate understanding.

In the embodiment 3, as described above, the impurity implantation to form the semiconductor regions 13*nla*1, 13*nlb*1 for the memory cell selection MOS is carried out after the sidewalls 9, 16 are formed.

In this case, the sidewalls 9, 16 are formed to have widths such that punch-through will not result due to the diffusion by subsequent heat treatment of the impurity in the semiconductor regions 13*nla*1, 13*nlb*1 and that the semiconductor regions 13*nla*1, 13*nlb*1 will not separate from the ends of the gate electrode 13*ng* after the heat treatment.

Figure 18:
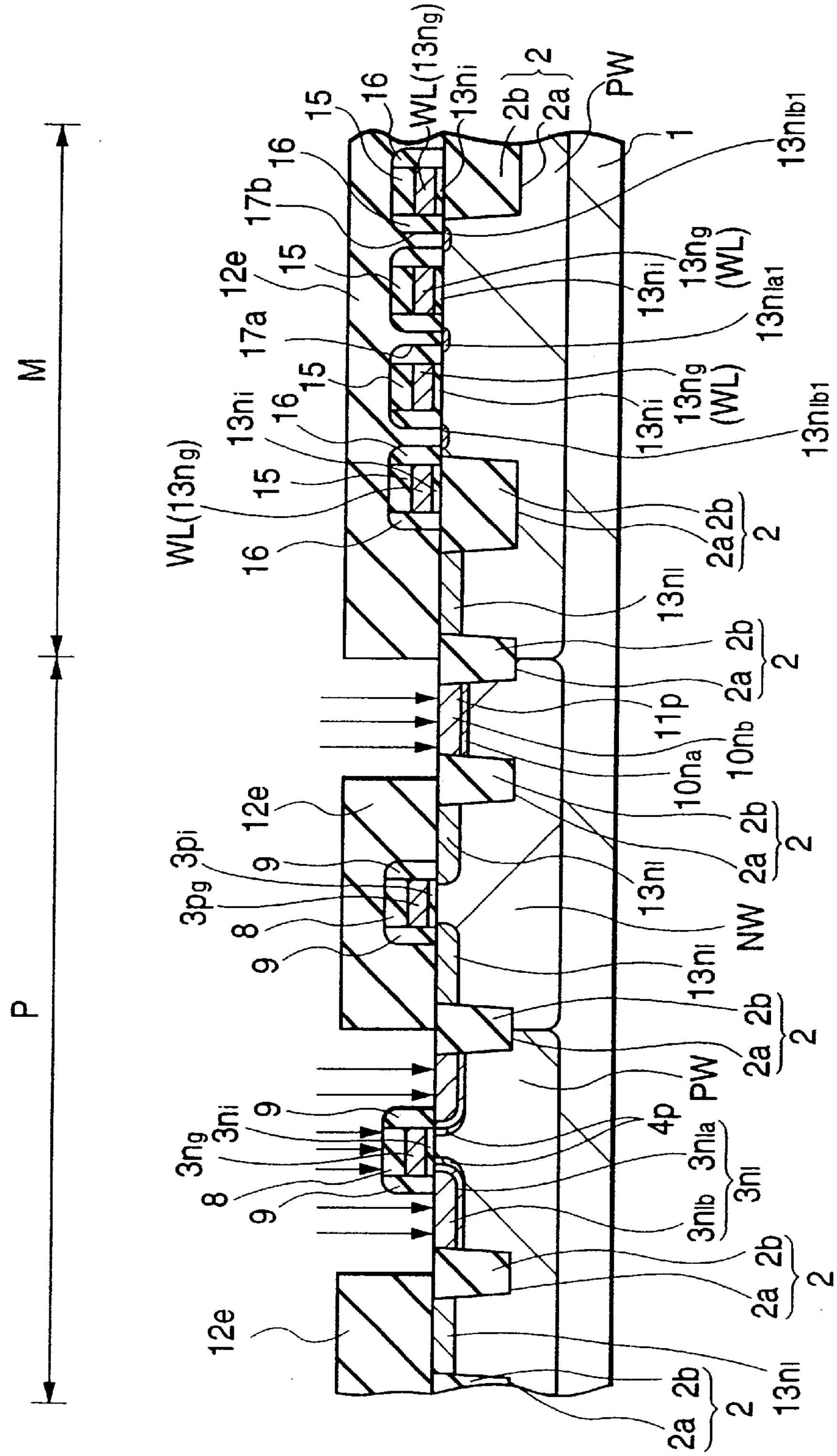
FIG. 18 is a cross section of the semiconductor integrated circuit device during the process of manufacture following the step of FIG. 17.

Next, as shown in FIG. 18, the semiconductor substrate 1 is formed by photolithography with a photoresist (first mask) 12*e* that exposes the nMOS formation region and n-well power supply region 10*n* in the peripheral circuit area P and covers the pMOS formation region and p-well power supply region 10*p* in the peripheral circuit area P and also the whole memory cell area M (including the p-well power supply region 10*p*').

Next, with the photoresist 12*e* as a mask, impurity ions are implanted in the same way as in the embodiment 1 to form the n type semiconductor regions 3*nl* ($n^-$ type semiconductor region 3*nla* and $n^+$ type semiconductor region 3*nlb*) of the nMOS 3*n* and the $p^+$ type semiconductor region 4*p* for suppressing the short channel effect and the n-well power supply region 10*n* in the peripheral circuit area P.

In more detail, using the photoresist 12*e* as a mask, a p type impurity, such as boron, for making the $p^-$ type semiconductor regions 4*p*, 11*p* is ion-implanted at an inclined angle to the principal surface of the semiconductor substrate 1. The dose of impurity is set at around $4\times10^{12}$ ions/$cm^2$.

Then, with the same photoresist 12*e* employed as a mask, an n type impurity, such as phosphorus or arsenic, for making the $n^-$ type semiconductor regions 3*nla*, 10*n* a is bombarded against the principal surface of the semiconductor substrate 1 at an inclined angle equal to the angle at which the p type impurity was injected to form the $p^-$ type semiconductor region 4*p*. The dose of impurity implanted is around $1\times10^4$ ions/$cm^2$. In this case, too, because the p type impurity has a greater diffusion coefficient than the n type impurity, the $p^-$ type semiconductor region 4*p* can be formed at the end of the $n^-$ type semiconductor region 3*nla* on the channel side.

After this, using the same photoresist 12*e* as a mask, an n type impurity, such as phosphorus or arsenic, for making the $n^+$ type semiconductor regions 3*nlb*, 10*nb* is ion-implanted vertically to the principal surface of the semiconductor substrate 1. The dose of impurity implanted is about $3\times10^{15}$ ions/$cm^2$. The n type impurity for making the $n^+$ type semiconductor regions 3*nlb*, 10*nb* is ion-implanted deep enough so that the $n^+$ type semiconductor regions 3*nlb*, 10*nb* will contact the n-well NW.

Although the semiconductor regions 4*p*, 11*p*, 3*nla*, 3*nlb*, 10*na*, 10*nb*, 13*nl*, 13*nla*1, 13*nlb*1 are not formed yet at this stage of the manufacturing process, since the heat treatment to activate the impurity has not been performed, these semiconductor regions are illustrated to facilitate understanding.

At this time, because the memory cell area M is covered with the photoresist 12*e*, the impurity to make the $n^-$ type semiconductor region 3*nla*, $n^+$ type semiconductor region 3*nlb* and n-well power supply region 10*n* is not injected. Thus, in the memory cell area M, the junction field does not increase, nor are defects formed, so that junction leakage can be prevented from increasing and degradation of the refresh characteristic is suppressed.

Forming the $n^-$ type semiconductor region 3*nla*, the $n^+$ type semiconductor region 3*nlb* and the n-well power supply region 10*n* by ion implantation processes using the same photoresist 12*e* as a mask can reduce the number of photomasks and the number of processes, such as application, exposure and development of the photoresist.

Figure 19:
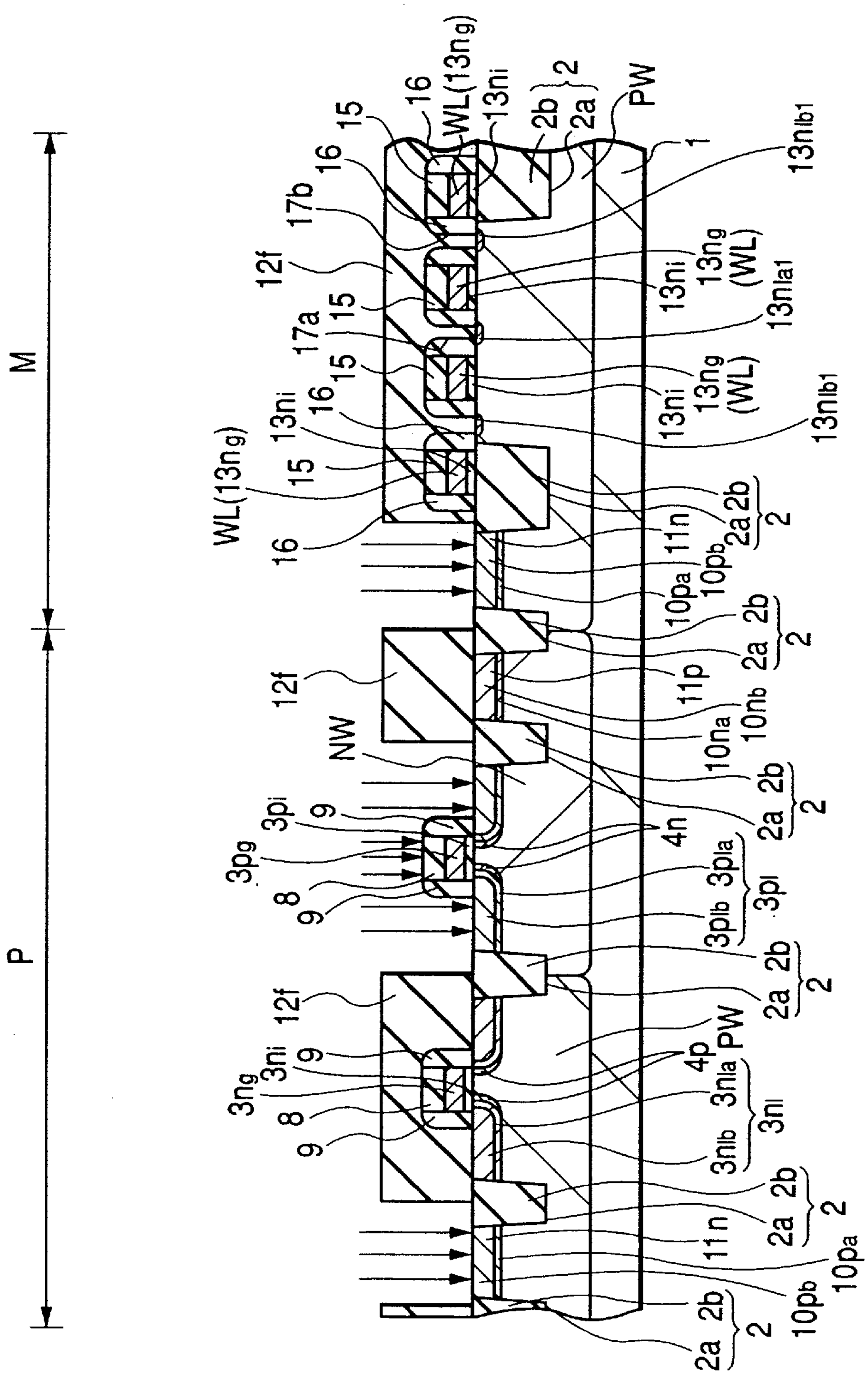
FIG. 19 is a cross section of the semiconductor integrated circuit device during the process of manufacture following the step of FIG. 18.

Next, with the photoresist 12*e* removed, the semiconductor substrate 1 is formed by photolithography with a photoresist (second mask) 12*f* which, as shown in FIG. 19, exposes the pMOS formation region and the p-well power supply region 10*p* of the peripheral circuit area P and the p-well power supply region 10*p*' of the memory cell area M and which covers the nMOS formation region and n-well power supply region 10_n_ of the peripheral circuit area P and also the memory cell area M.

Then, using the photoresist 12_f_ as a mask, impurity ions are introduced in a manner similar to the embodiment 1 to form the $p^-$ type semiconductor region 3_pl_ ($p^-$ type semiconductor region 3_pla_ and $p^+$ type semiconductor region 3_plb_) of the pMOS 3_p_, to form the $n^-$ type semiconductor region 4_n_ for suppressing the short channel effect and to form the p-well power supply region 10_p_ in the peripheral circuit area P.

That is, with the photoresist 12_f_ employed as a mask, an n type impurity, such as phosphorus or arsenic, for making the $n^-$ type semiconductor regions 4_n_, 11_n_ is ion-implanted at an inclined angle to the principal surface of the semiconductor substrate 1. The dose of the impurity which is implanted is approximately $3\times10^{12}$ ions/cm$^2$.

Next, using the same photoresist 12_f_ as a mask, a p type impurity, such as boron, for making the $p^-$ type semiconductor regions 3_pla_, 10_p_ a is implanted into the principal surface of the semiconductor substrate 1 at an inclined angle equal to the angle at which the n type impurity was injected to form the $n^-$ type semiconductor region 4_n_. The dose of the impurity which is implanted is around $3\times10^{13}$ ions/cm$^2$. In this case, the implanting energy of the p type impurity should be set to ensure that the $n^-$ type semiconductor region 4_n_ is left at the end of the $p^-$ type semiconductor region 3_pla_ on the channel side. With this energy setting, the $n^-$ type semiconductor region 4_n_ can be formed at the end of the $p^-$ type semiconductor region 3_pla_ on the channel side.

Then, using the same photoresist 12_f_ as a mask, the p type impurity, such as boron, for making the $p^+$ type semiconductor regions 3_plb_, 10_pb_ is ion-implanted vertically to the principal surface of the semiconductor substrate 1. The dose of the impurity which is used is around $3\times10^{15}$ ions/cm$^2$. The $p^+$ type semiconductor regions 3_plb_, 10_pa_ are formed deep enough so that they can contact the p-well PW, as in the case of the embodiment 2.

Although the semiconductor regions 4_p_, 11_p_, 3_nla_, 3_nlb_, 10_na_, 10_nb_, 10_nb_, 4_n_, 11_n_, 3_pla_, 3_plb_, 10_pa_, 10_pb_, 13_nl_, 13_nla_1, 13_nlb_1 are not formed yet at this stage of the manufacturing process, since the heat treatment to activate the impurity has not been performed, these semiconductor regions are illustrated to facilitate understanding.

At this stage, the memory cell area M, because it is covered with the photoresist 12_f_, is not implanted with the impurity for making the $p^-$ type semiconductor region 3_pla_, $p^+$ type semiconductor region 3_plb_ and p-well power supply region 10_p_.

Further, forming the $p^-$ type semiconductor region 3_pla_, the $p^+$ type semiconductor region 3_plb_ and the p-well power supply region 10_p_ by ion implantation processes using the same photoresist 12_f_ as a mask can reduce the number of photomasks and the number of processes, such as application, exposure and development of the photoresist film.

Figure 20:
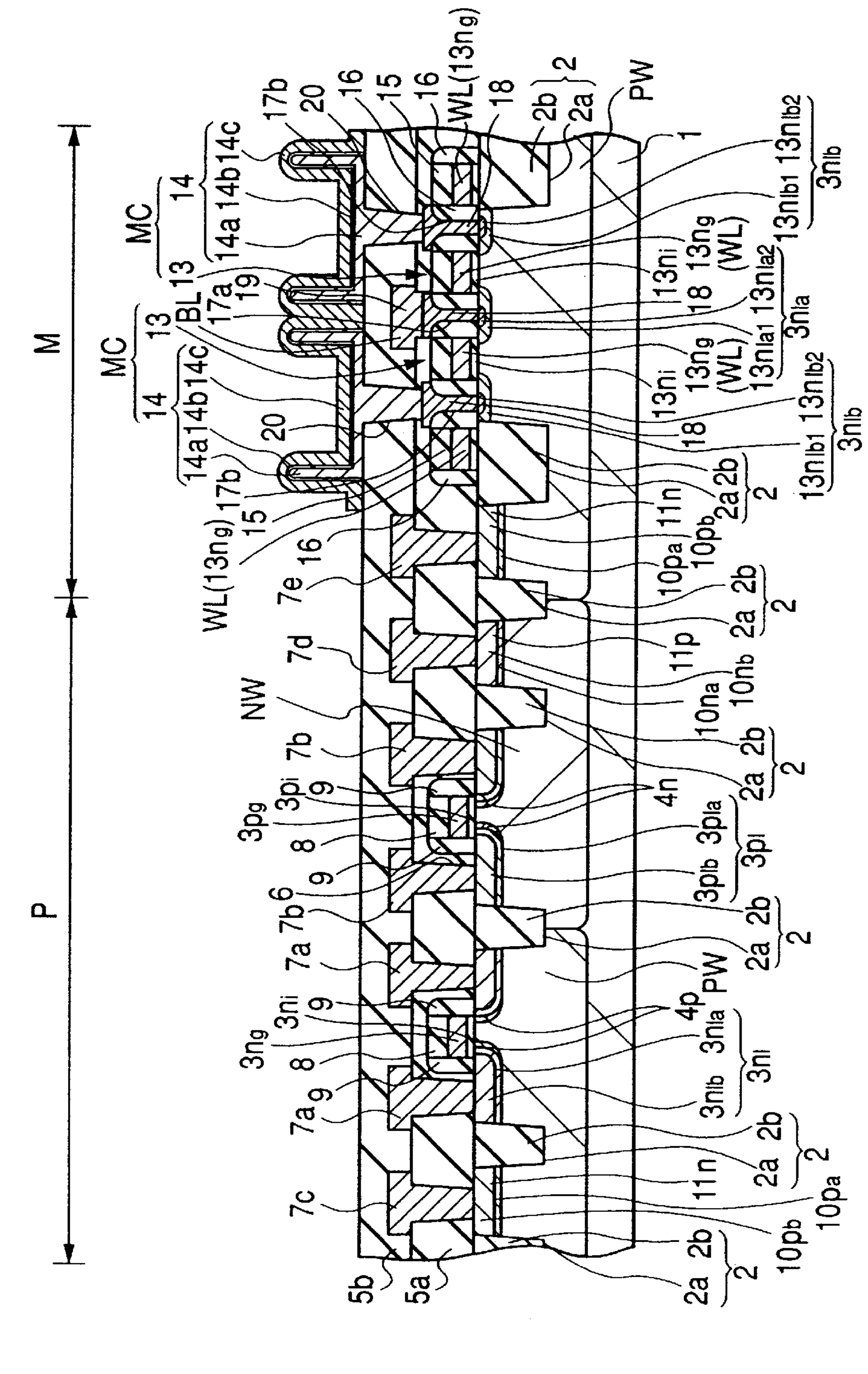
FIG. 20 is a cross section of the semiconductor integrated circuit device during the process of manufacture following the step of FIG. 19.

Next, with the photoresist 12_f_ removed, the semiconductor substrate 1 is subjected to heat treatment to activate and diffuse the impurity implanted in the semiconductor substrate 1. After this, as shown in FIG. 20, with the sidewalls 16 as etch stoppers, the memory cell area M is formed with connecting holes 17_a_, 17_b_ by photolithography and dry etching. The connecting holes 17_a_, 17_b_ are embedded with a conductive film 18 of low-resistance polysilicon containing an n type impurity, such as phosphorus. Then, the semiconductor substrate 1 is heat-treated to diffuse the impurity contained in the conductive film 18 into the semiconductor substrate 1 to form $n^+$ type semiconductor regions 13_nla_2, 13_nlb_2.

Then, the semiconductor substrate 1 is deposited by CVD method with an interlayer insulation film 5_a_ of, say, $SiO_2$, a part of which is then formed with connecting holes 6, 19 by photolithography and dry etching.

After this, the interlayer insulation film 5_a_ has deposited thereon, by sputtering, a conductive film, such as a single layer of tungsten or a Ti/TiN/W laminated film, which is then patterned by photolithography and etching to form electrodes 7_a_–7_e_ and the bit line BL.

Next, the semiconductor substrate 1 is provided by CVD method with an interlayer insulation film of, say, $SiO_2$, after which a capacitor 14 is formed by an ordinary DRAM forming process.

In addition to the advantages of the embodiments 1 and 2, the embodiment 3 can offer the following advantages.

(1) The short channel effect on the selection MOS 13 of the memory cell MC can be suppressed.

(2) Because the n type impurity used to make the $n^+$ type semiconductor region 13_nla_ of the selection MOS 13, and which is also implanted in the nMOS 3_n_, is injected after the sidewalls 9, 16 are formed, the characteristics of the pMOS 3_p_ are prevented from being affected by variations in the thickness of the sidewalls 9, 16.

(Embodiment 4)

Figure 38:
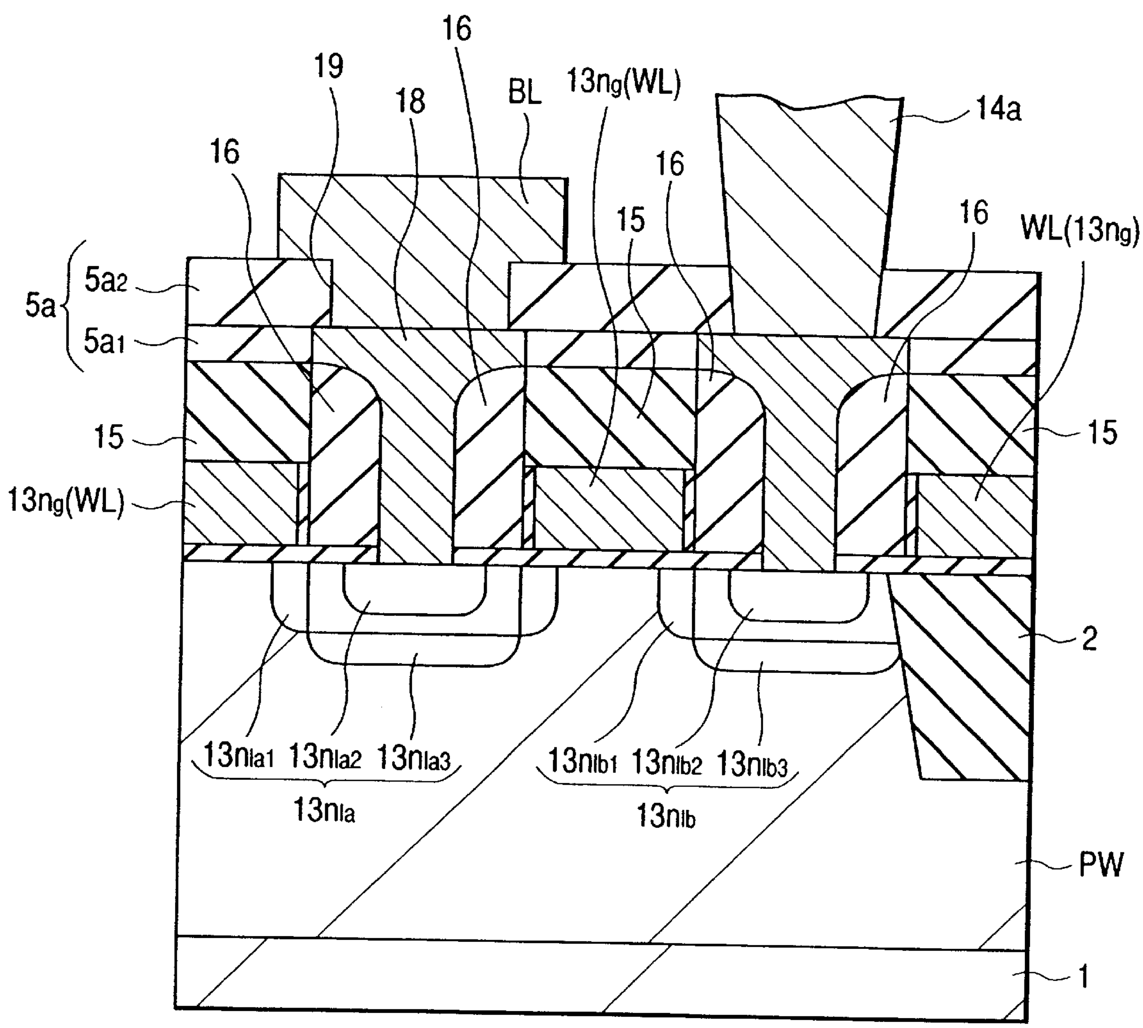
FIG. 38 is an enlarged cross section showing a memory cell region of the semiconductor integrated circuit device of this embodiment.
Figure 39:
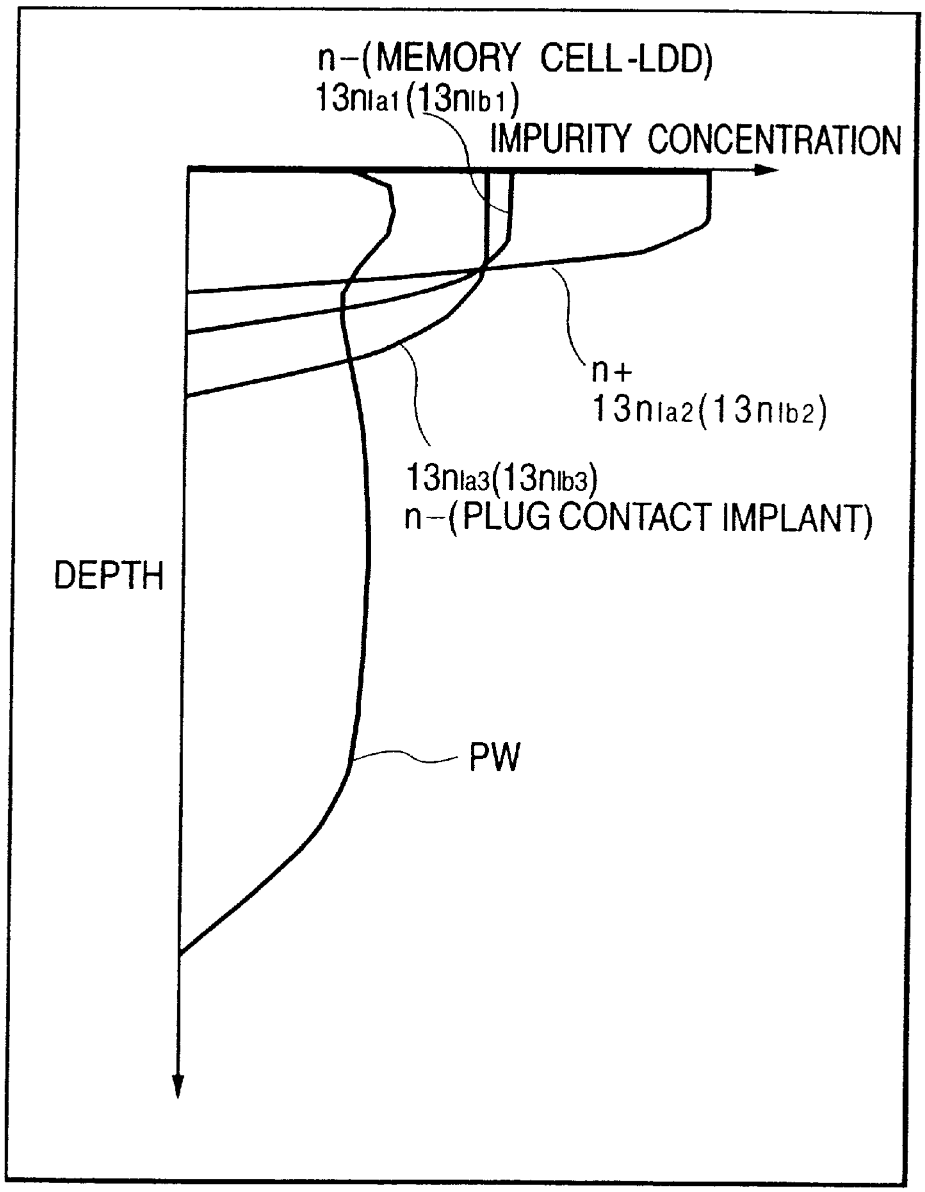
FIG. 39 is a graph showing an impurity concentration distribution in the source and drain of the memory cell selection MOSFET of FIG. 38.

FIGS. 21 to 33 are cross sections showing a semiconductor integrated circuit device of a further embodiment of this invention during the process of manufacture. FIGS. 34 to 37 show impurity concentration distributions in various parts of the semiconductor integrated circuit device of this embodiment. FIG. 38 is an enlarged cross section of the memory cell area of the semiconductor integrated circuit device of this embodiment. FIG. 39 shows an impurity concentration distribution in the source and drain of the memory cell selection MOSFET of FIG. 38.

Figure 21:
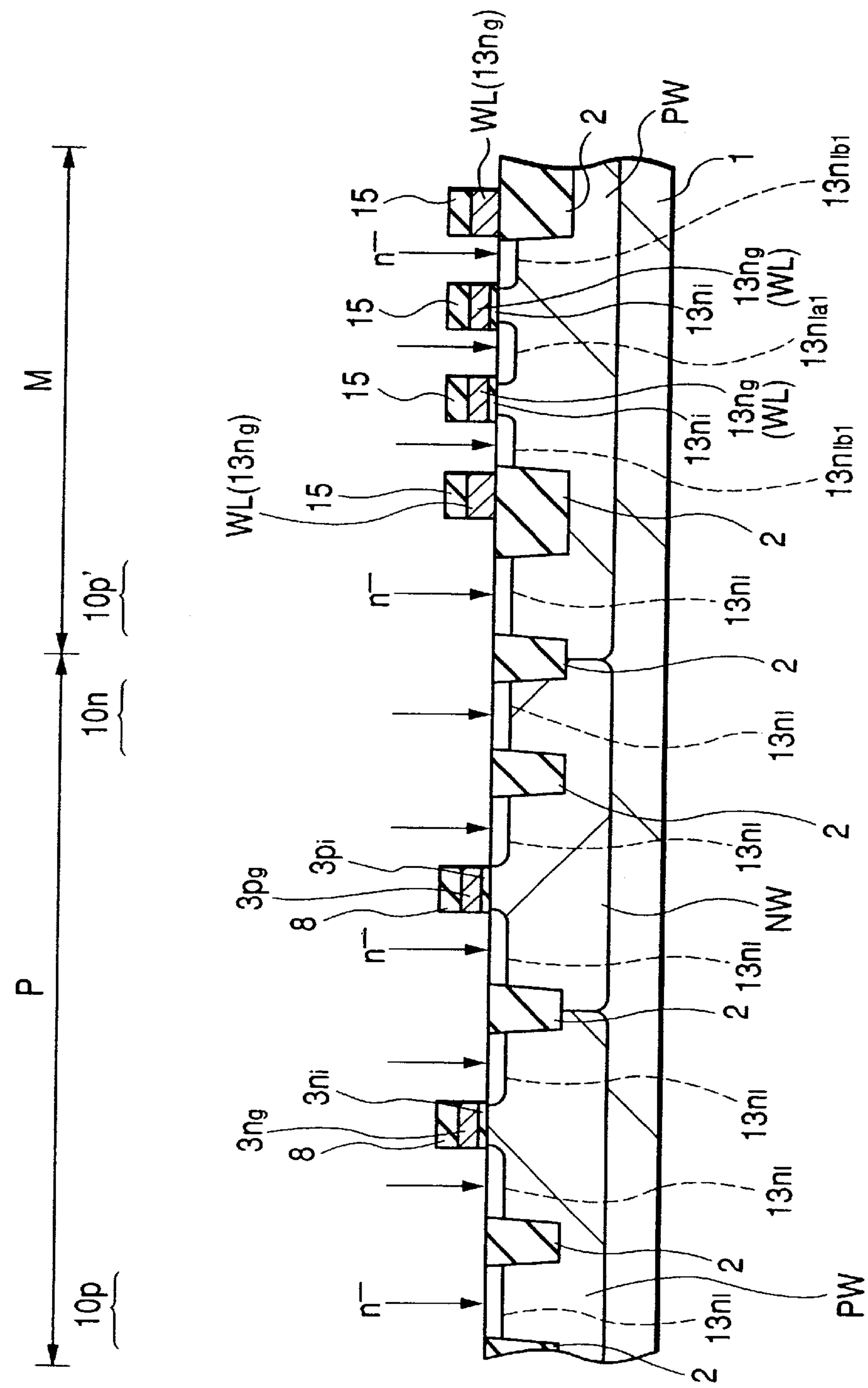
FIG. 21 is a cross section of a semiconductor integrated circuit device of a further embodiment of this invention during the process of manufacture.

FIG. 21 shows a cross section of the semiconductor integrated circuit device of the embodiment 4. The semiconductor substrate 1 is already formed with a p-well PW, an n-well NW, device isolation portions 2, gate electrodes 3_ng_, 3_pg_, 13_ng_, and cap insulation films 8, 15. The gate electrodes 3_ng_, 3_pg_, 13_ng_ are formed of a single film of, say, low-resistance polysilicon. Alternatively, they may also be formed in a so-called polycide structure having a silicide film of, say, tungsten silicide laminated over the low-resistance polysilicon film, or in a so-called polymetal structure in which a metal film, such as a tungsten film, is laminated over the low-resistance polysilicon film with a barrier metal film of titanium nitride or tungsten nitride interposed therebetween. The cap insulation film 8 may be formed of silicon nitride.

First, the semiconductor substrate 1 described above is ion-implanted with an n type impurity, such as phosphorus or arsenic, by using the gate electrodes 3_ng_, 3_pg_, 13_ng_ and the cap insulation films 8, 15 as a mask. The dose of the impurity is around $2\times10^{13}$ ions/cm$^2$. This impurity injection process is a process to form the $n^-$ type semiconductor regions (10th semiconductor regions) 13_nla_1, 13_nlb_1 for the memory cell selection MOSFET and is carried out over the entire principal surface of the semiconductor substrate 1 without using a mask. Hence, this n type impurity is injected also into the peripheral circuit area P (including pMOS region and p-well power supply region) as well as the memory cell area. In the p-well power supply regions in the peripheral circuit area P and the memory cell area M, the semiconductor regions formed by this impurity implantation process are represented as the $n^-$ type semiconductor region 13*nl*. Although the $n^-$ type semiconductor regions 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 22:
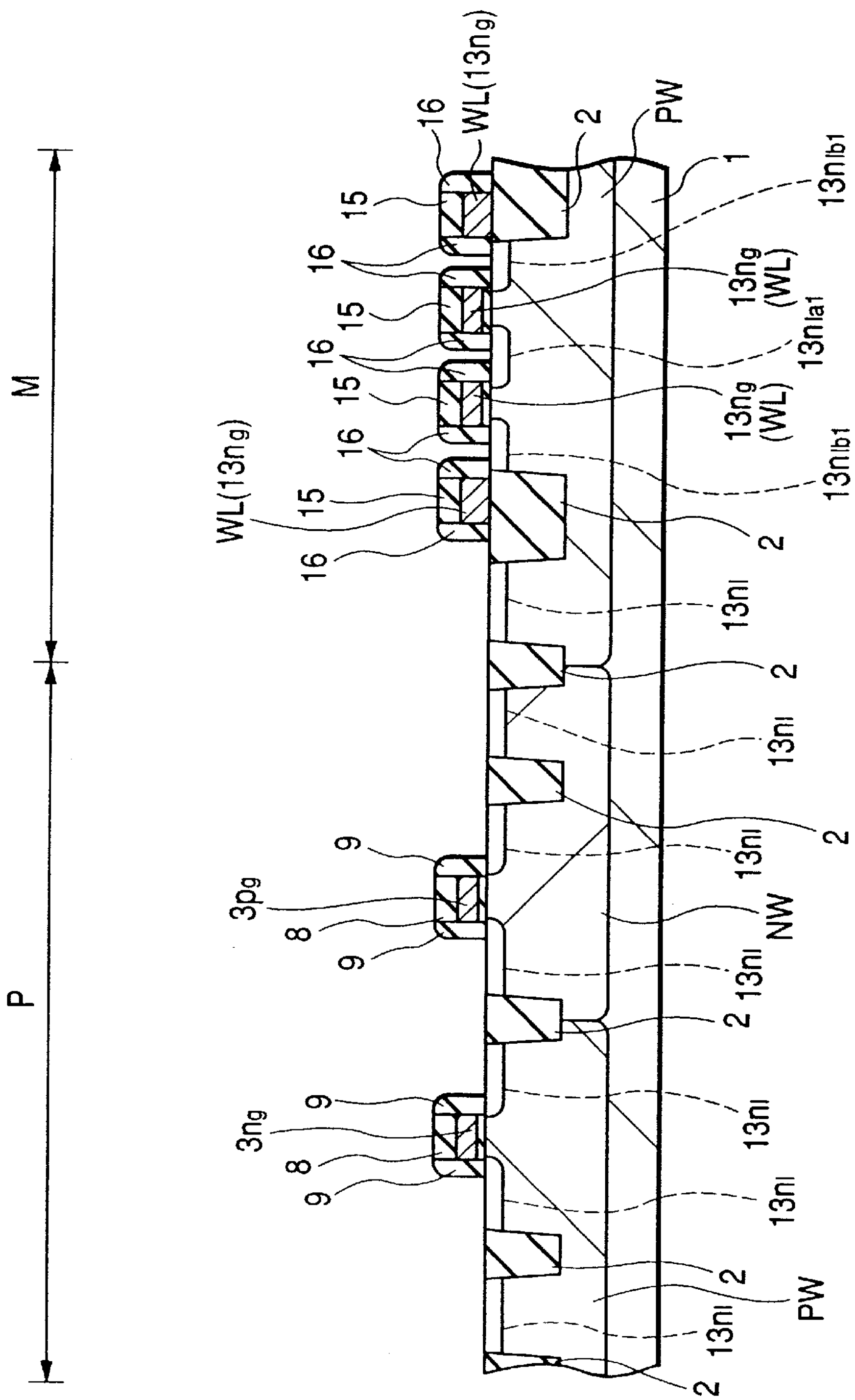
FIG. 22 is a cross section of the semiconductor integrated circuit device of FIG. 21 during the process of manufacture.

Then, an insulation film of $SiO_2$ or silicon nitride is deposited over the semiconductor substrate 1 by the CVD method and the film is then etched back by anisotropic dry etching to form sidewalls 9, 16 on the side surfaces of the gate electrodes 3*ng*, 3*pg*, cap insulation film 8, gate electrode 13*ng* (word line WL) and cap insulation film 15, as shown in FIG. 22.

Figure 23:
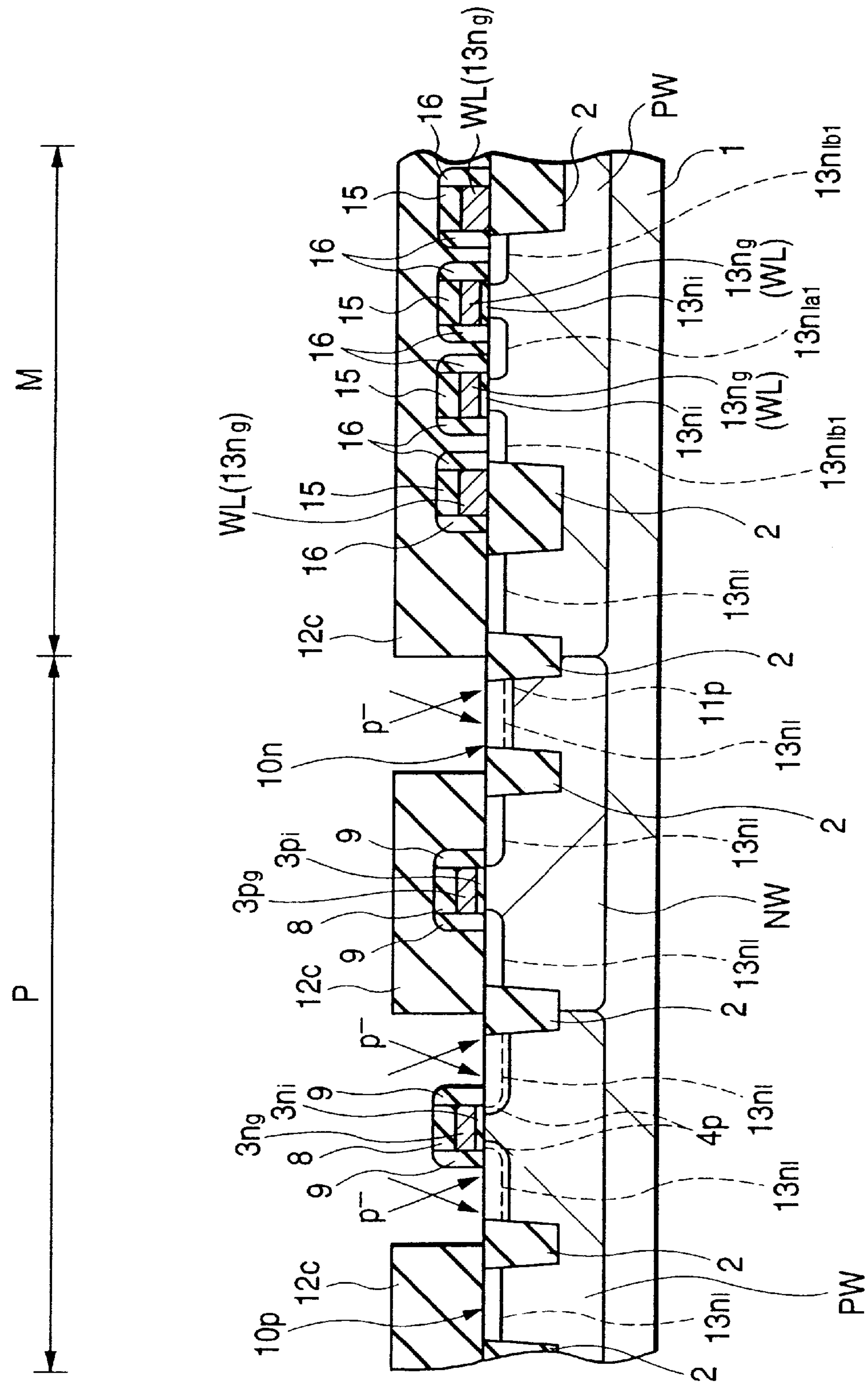
FIG. 23 is a cross section of the semiconductor integrated circuit device during the process of manufacture following the step of FIG. 22.

Then, as shown in FIG. 23, the semiconductor substrate 1 is provided with a photoresist (first mask) 12*c* by photolithography that exposes the nMOS formation region and n-well power supply region 10*n* in the peripheral circuit area P and covers the pMOS formation region in the peripheral circuit area P, the p-well power supply regions 10*p*, 10*p*' in the peripheral circuit area P and memory cell area M, and also the memory cell area M.

Next, as in the case of the embodiment 1, a p type impurity, such as boron, is ion-implanted into the semiconductor substrate 1 with the photoresist 12*c* as a mask. The dose of the impurity which is implanted is around $4\times10^{12}$ ions/cm$^2$. This impurity introducing process is a process to form the $p^-$ type semiconductor region (third semiconductor region) 4*p* for suppressing the short channel effect on the nMOS in the peripheral circuit area P.

During this process, the semiconductor substrate 1 is tilted to bombard the impurity at an angle onto the principal surface of the semiconductor substrate 1. This ensures that the impurity can reach the edge of the gate electrode and prevents the shadowing effect from being produced by the photoresist 12*c* and the gate electrode. As a result, the impurity can be introduced under the edge of the gate electrode 3*ng* in the nMOS formation region and the $p^-$ type semiconductor region (third semiconductor region) 11*p* can be formed relatively shallow in the n-well power supply region 10*n*. The impurity may be injected in four or more directions.

Although the semiconductor regions 4*p*, 11*p*, 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 24:
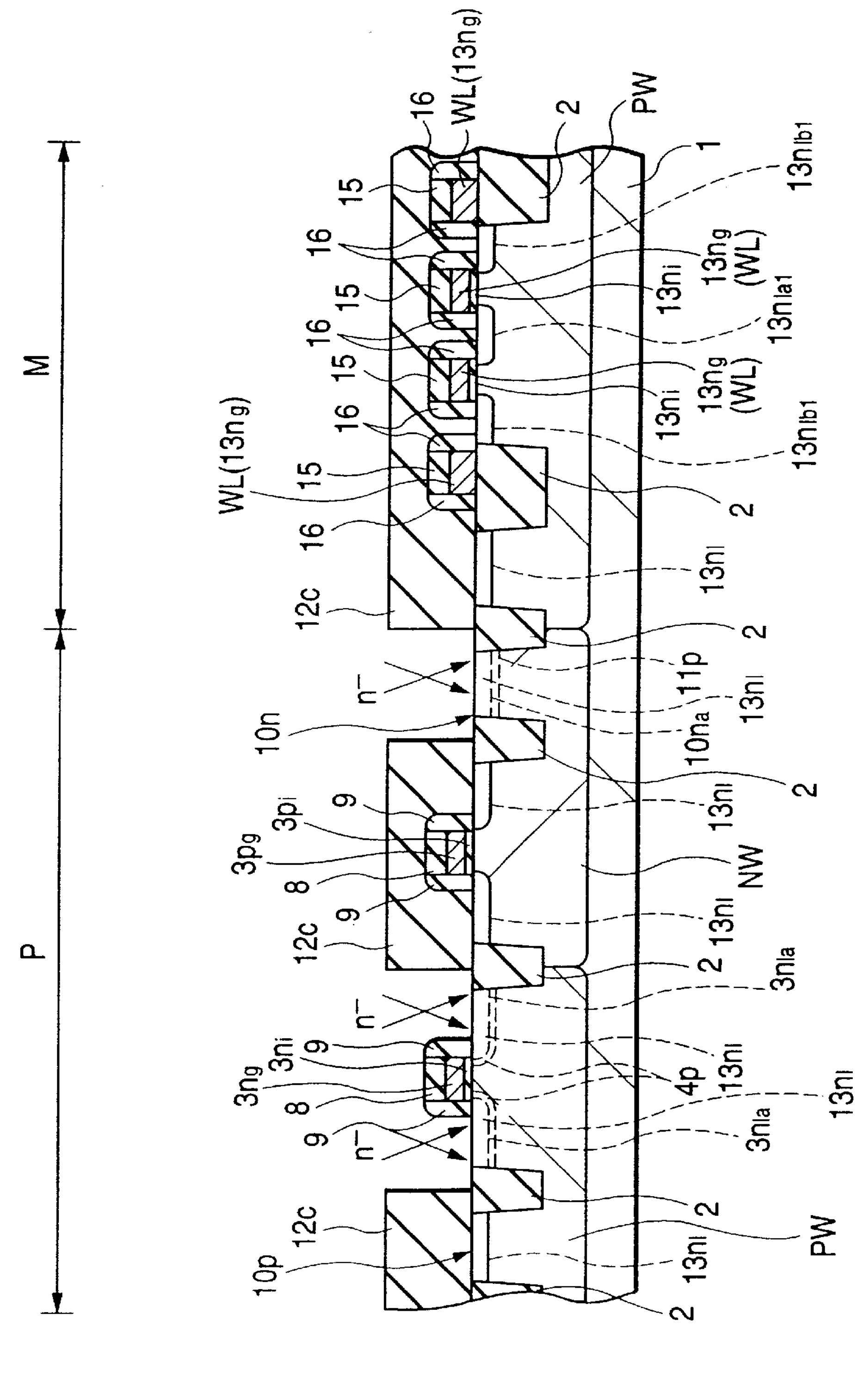
FIG. 24 is a cross section of the semiconductor integrated circuit device during the process of manufacture following the step of FIG. 23.

Then, as shown in FIG. 24, with the photoresist 12*c*, which was used when introducing the impurity for making the $p^-$ type semiconductor regions 4*p*, 11*p*, used as a mask, the semiconductor substrate 1 is ion-implanted with an n type impurity such as phosphorus or arsenic. The dose of the impurity is around $1\times10^{14}$ ions/cm$^2$. This impurity introducing process is a process to form the $n^-$ type semiconductor region (fourth semiconductor region) 3*nla* of the nMOS and the $n^-$ type semiconductor region (fourth semiconductor region) 10*na* of the n-well power supply region.

In this process the n type impurity is implanted at an inclined angle to the principal surface of the semiconductor substrate 1 to ensure that the n type impurity reaches the edge of the gate electrode, to prevent the shadowing effect from being produced by the photoresist 12*c* and the gate electrode, and to ensure that the implanted n type impurity remains at the end of the $n^+$ type semiconductor region for the source and drain (described later) on the channel side. The impurity injection angle in this case is set equal to the angle at which the impurity for making the $p^-$ type semiconductor regions 4*p*, 11*p* was injected. That is, when the n type impurity is injected (to form a low impurity concentration region), the semiconductor substrate 1 is kept at the same inclination angle as that when the p type impurity (for suppressing the short channel effect) was injected. The n type impurity may be injected in four or more directions.

With such an ion implantation, the $p^-$ type semiconductor region 4*p* can be formed at the end of the $n^-$ type semiconductor region 3*nla* on the channel side because, in the nMOS formation region, the $p^-$ type impurity has a greater diffusion coefficient than the n type impurity. In the n-well power supply region, the $n^-$ type semiconductor region 10*na* is formed shallower than the $p^-$ type semiconductor region 11*p*.

Although the semiconductor regions 4*p*, 11*p*, 13*nla*, 10*na*, 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 25:
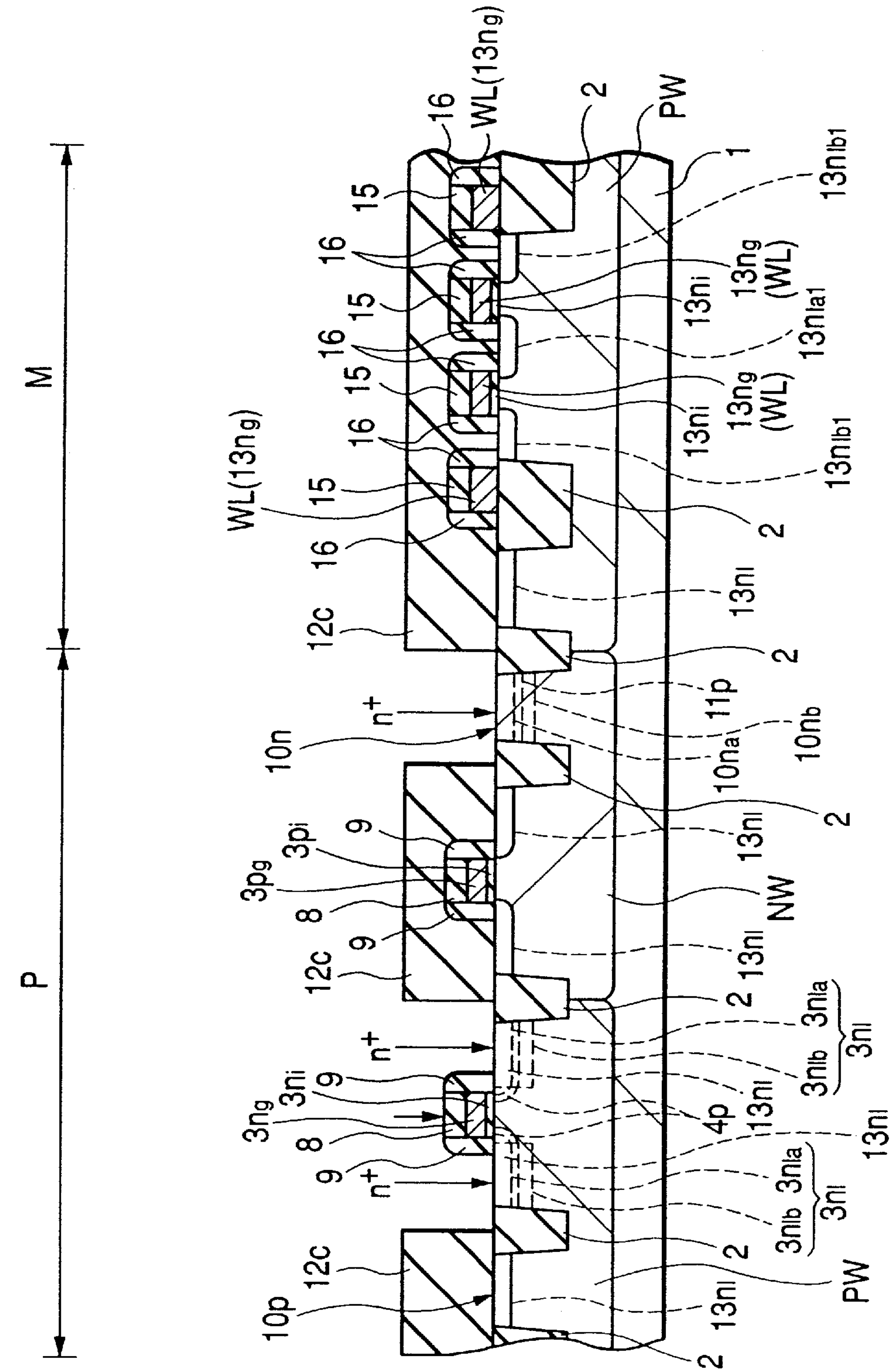
FIG. 25 is a cross section of the semiconductor integrated circuit device during the process of manufacture following the step of FIG. 24.

Then, as shown in FIG. 25, the semiconductor substrate 1 is ion-implanted with an n type impurity, such as phosphorus and arsenic, by using as a mask the same photoresist 12*c* that was used when introducing the impurity for making the $p^-$ type semiconductor regions 4*p*, 11*p* and when introducing the impurity for making the $n^-$ type semiconductor regions 3*nla*, 10*na*. The dose of this impurity is approximately $3\times10^5$ ions/cm$^2$. This impurity injection process is a process to form the $n^+$ type semiconductor region (fifth semiconductor region) 3*nlb* of the nMOS and the $n^+$ type semiconductor region (fifth semiconductor region) 10*nb* of the n-well power supply region.

In this process, the n type impurity is implanted vertically to the principal surface of the semiconductor substrate 1. Furthermore, the n type impurity is also implanted to a depth greater than that of the $p^-$ type semiconductor region 11*p* of the n-well power supply region 10*n* and to a depth that allows separation from the adjoining devices. The reason that the n type impurity is injected deeper than the $p^-$ type semiconductor region 11*p* is as follows. In the n-well power supply region 10*n* the $p^-$ type semiconductor region 11*p*, whose conduction type is inverse to that of the n-well NW, is formed deeper than the $n^-$ type semiconductor region 10*na*, which makes satisfactory well connection impossible. Thus, injecting the n type impurity deeper than the $p^-$ type semiconductor region 11*p* prevents the $p^-$ type semiconductor region 11*p* from being formed in the n-well power supply region 10*n* when introducing the n type impurity and, therefore, enables a good well connection.

Although the semiconductor regions 4*p*, 11*p*, 3*nla*, 3*nlb*, 10*na*, 10*nb*, 13*nl*, 13*nla*1, 13*nlb*1 are not formed yet at this stage of the manufacturing process, since the heat treatment to activate the impurity has not been performed, these semiconductor regions are illustrated to facilitate understanding.

With this embodiment 4, the n type semiconductor regions 3*nl* and $p^-$ type semiconductor region 4*p* required by the nMOS 3*n* and the n-well power supply region 10*n* can be formed by ion implantation processes that use the same photoresist as a mask. This greatly reduces the number of photolithographic processes, such as application, exposure and development of the photoresist film and the number of photomasks used.

Further, the memory cell area M, because it is covered with the photoresist 12*c*, is not injected with an impurity for making the $n^-$ type semiconductor region 3*nla*, $n^+$ type semiconductor region 3*nlb* and n-well power supply region 10*n*. Hence, in the memory cell area M, the junction field does not increase, nor are defects formed, thereby preventing an increase in the junction leakage and degradation of the refresh characteristic.

Figure 26:
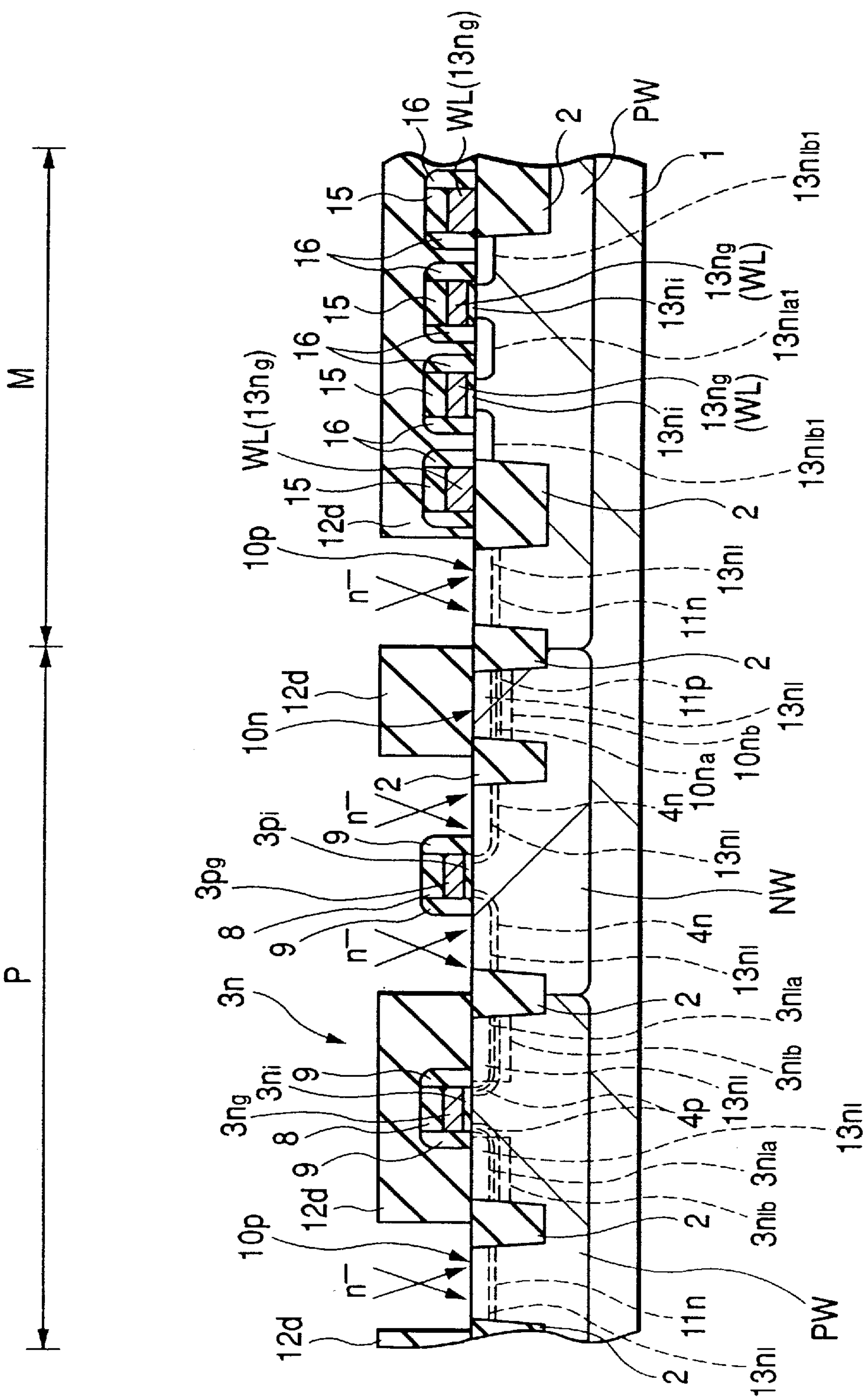
FIG. 26 is a cross section of the semiconductor integrated circuit device during the process of manufacture following the step of FIG. 25.

Next, with the photoresist 12*c* removed, the semiconductor substrate 1 is formed, by photolithography, with a photoresist (second mask) 12*d* that exposes the pMOS formation region and p-well power supply region 10*p* in the peripheral circuit area P and the p-well power supply region 10*p*' in the memory cell area M and which covers the nMOS formation region and the n-well power supply region 10*n* in the peripheral circuit area P, as shown in FIG. 26.

Next, as in the embodiment 1, using the photoresist 12*d* as a mask, the semiconductor substrate 1 is ion-implanted with an n type impurity, such as phosphorus or arsenic. The dose of this impurity is around $3\times10^{12}$ ions/$cm^2$. This impurity introducing process is a process to form the $n^-$ type semiconductor region (sixth semiconductor region) 4*n* for suppressing the short channel effect on the pMOS in the peripheral circuit area P.

In this process, the semiconductor substrate 1 is inclined to inject the impurity at an angle into the principal surface of the semiconductor substrate 1. This is to ensure that the impurity reaches the edge of the gate electrode and that the shadowing effect by the photoresist 12*d* and the gate electrode is eliminated. As a result, the impurity can be introduced under the edge of the gate electrode 3*pg* in the pMOS formation region and the $n^-$ type semiconductor region (sixth semiconductor region) 11*n* can be formed relatively shallow in the p-well power supply region 10*p*. The impurity may be injected in four or more directions.

Although the semiconductor regions 4*p*, 11*p*, 4*n*, 11*n*, 3*nla*, 3*nlb*, 10*na*, 10*nb*, 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 27:
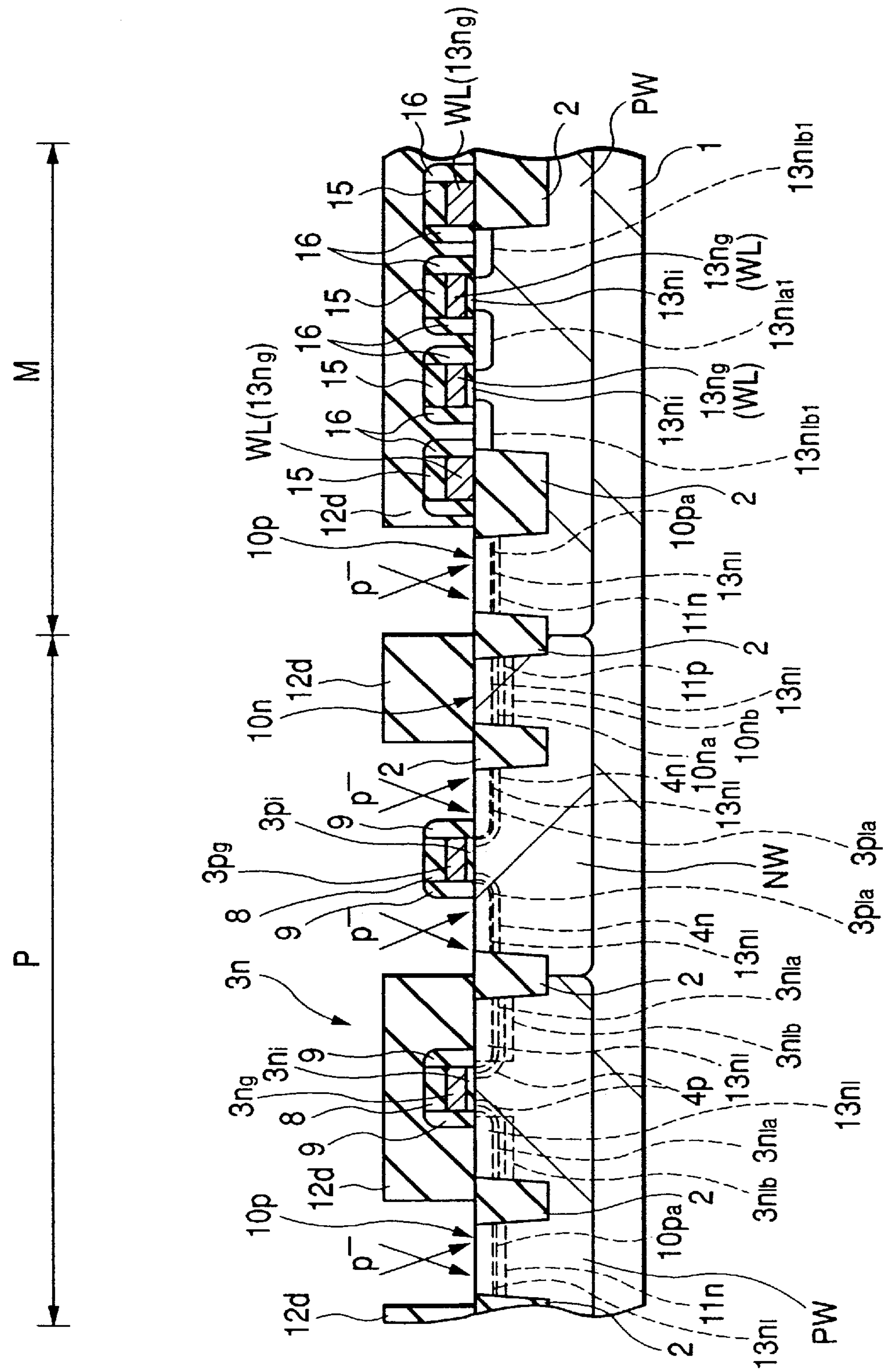
FIG. 27 is a cross section of the semiconductor integrated circuit device during the process of manufacture following the step of FIG. 26.

After this, as shown in FIG. 27, by using as a mask the photoresist 12*d* that was used when introducing the impurity for making the $n^-$ type semiconductor regions 4*n*, 11*n*, the semiconductor substrate 1 is ion-implanted with a p type impurity, such as boron. The dose of this impurity is set to be greater than the dose of the impurity for the $n^-$ type semiconductor region 13*nl* in order to cancel the conduction type of the $n^-$ type semiconductor region 13*nl*, and is set at about $3\times10^{13}$ ions/$cm^2$. This impurity introducing process is a process to form the p type semiconductor region (seventh semiconductor region) 3*pla* of the pMOS and the $p^-$ type semiconductor region (seventh semiconductor region) 10*pa* of the p-well power supply region.

In this process, the p type impurity is bombarded at an inclined angle against the principal surface of the semiconductor substrate 1 to ensure that the p type impurity can reach the edge of the gate electrode, that the shadowing effect caused by the photoresist 12*d* and the gate electrode is eliminated, and that the p type impurity remains at the end of the $p^+$ type semiconductor region for the source and drain (described later) on the channel side. The angle of injection of the impurity is set equal to that at which the impurity was injected to form the $n^-$ type semiconductor regions 4*n*, 11*n*. That is, when the p type impurity is injected (to form a low impurity concentration region), the semiconductor substrate 1 is kept at the same inclination angle as that when the n type impurity (for suppressing the short channel effect) was injected. The p type impurity may be injected in four or more directions.

Here, the energy of ion implantation is so set that in the pMOs formation region the extent of infiltration of the p type impurity under the edge of the gate electrode 3*pg* is smaller than the $n^-$ type semiconductor region 4*n*. Therefore, in the pMOS formation region the $n^-$ type semiconductor region 4*n* remains at the end of the $p^-$ type semiconductor region 3*pla* on the channel side and, in the p-well power supply region, the $p^-$ type semiconductor region 10*pa* is formed shallower than the $n^-$ type semiconductor region 11*n*.

Although the semiconductor regions 4*p*, 4*n*, 11*p*, 11*n*, 3*nla*, 3*nlb*, 3*pla*, 10*na*, 10*nb*, 10*pa*, 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 28:
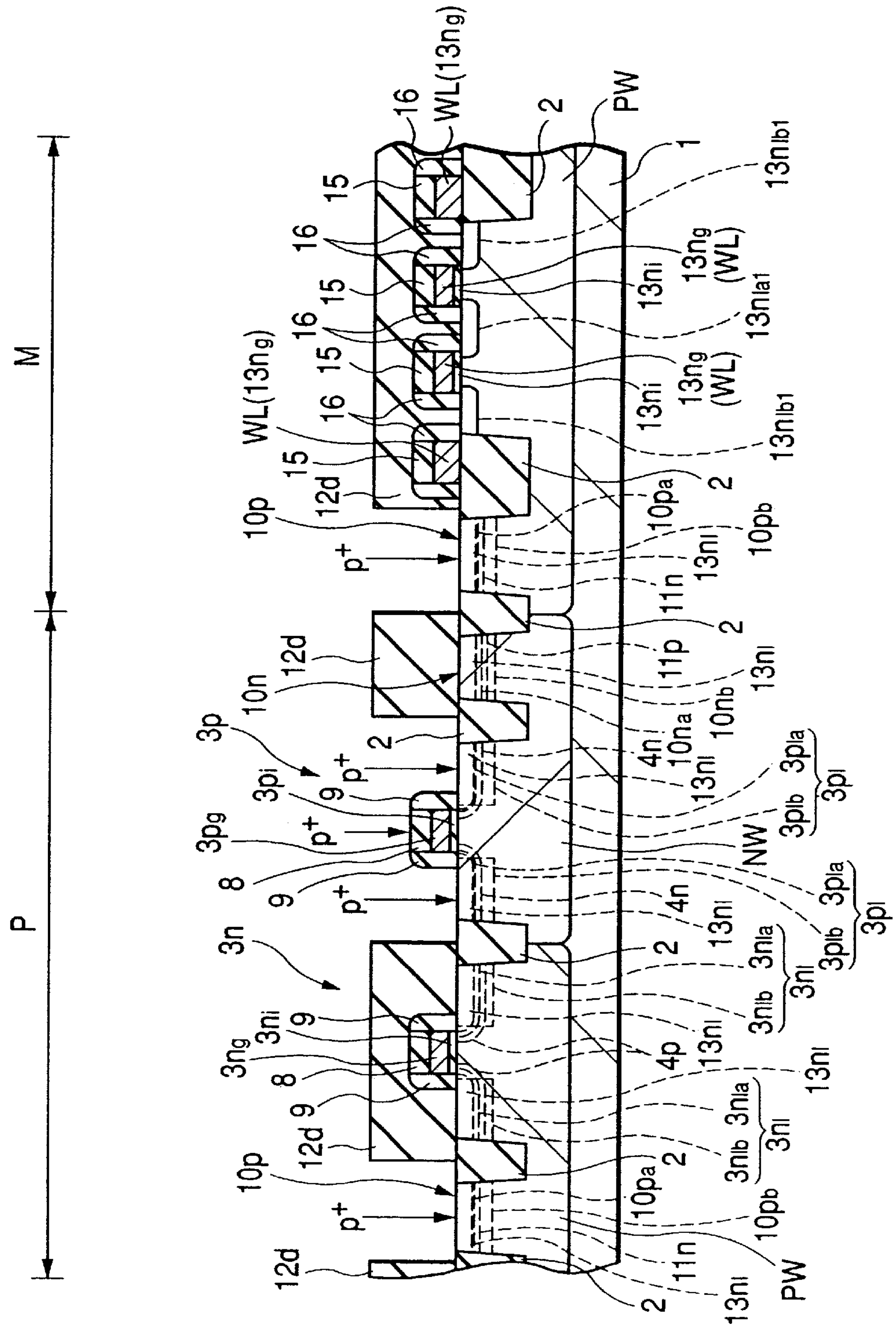
FIG. 28 is a cross section of the semiconductor integrated circuit device during the process of manufacture following the step of FIG. 27.

Then, as shown in FIG. 28, the semiconductor substrate 1 is ion-implanted with a p type impurity, such as boron, by using as a mask the same photoresist 12*d* that was used when introducing the impurity for making the $n^-$ type semiconductor regions 4*n*, 11*n* and when introducing the impurity for making the $p^-$ type semiconductor regions 3*pla*, 10*pa*. The dose of this impurity is approximately $3\times10^{15}$ ions/$cm^2$. This impurity injection process is a process to form the $p^+$ type semiconductor region (eighth semiconductor region) 3*plb* of the pMOS 3*p* and the $p^+$ type semiconductor region (eighth semiconductor region) 10*pb* of the p-well power supply region.

In this process, the p type impurity is injected vertically to the principal surface of the semiconductor substrate 1. Furthermore, the ion implantation is performed so that the p type impurity is injected to a depth that is greater than the $n^-$ type semiconductor region 11*n* of the p-well power supply region 10*p* and is sufficient to isolate the device from the adjacent devices. The reason that the p type impurity is injected deeper than the $n^-$ type semiconductor region 11*n* is as follows. In the p-well power supply region 10*p*, the n-type semiconductor region 11*n*, whose conduction type is inverse to that of the p-well PW, is formed deeper than the $p^-$ type semiconductor region 10*pa*, which makes satisfactory well connection impossible. Thus, injecting the p type impurity deeper than the $n^-$ type semiconductor region 11*n* prevents the $n^-$ type semiconductor region 11*n* from being formed in the p-well power supply region 10*p* when introducing the p type. impurity and therefore enables a good well connection.

Although the semiconductor regions 4*p*, 4*n*, 11*p*, 11*n*, 3*nla*, 3*nlb*, 3*pla*, 3*plb*, 10*na*, 10*nb*, 10*pa*, 10*pb*, 13*nl*, 13*nla*1, 13*nlb*1 are not formed yet at this stage of the manufacturing process, since the heat treatment to activate the impurity has not been performed, these semiconductor regions are illustrated to facilitate understanding.

With this embodiment 4, the p type semiconductor regions 3*pl* and n type semiconductor region 4*n* required by the pMOS 3*p* and the p-well power supply region 10*p* can be formed by ion implantation processes that use the same photoresist as a mask. This greatly reduces the number of photolithographic processes, such as application, exposure and development of the photoresist film and the number of photomasks used.

Further, the memory cell area M, because it is covered with the photoresist 12*d*, is not injected with an impurity for making the $p^-$ type semiconductor region 3*pla*, the $p^+$ type semiconductor region 3*plb* and the p-well power supply region 10*p*. Hence, in the memory cell area M, the junction field does not increase, nor are defects formed, thereby preventing an increase in the junction leakage and a degradation of the refresh characteristic.

Figure 29:
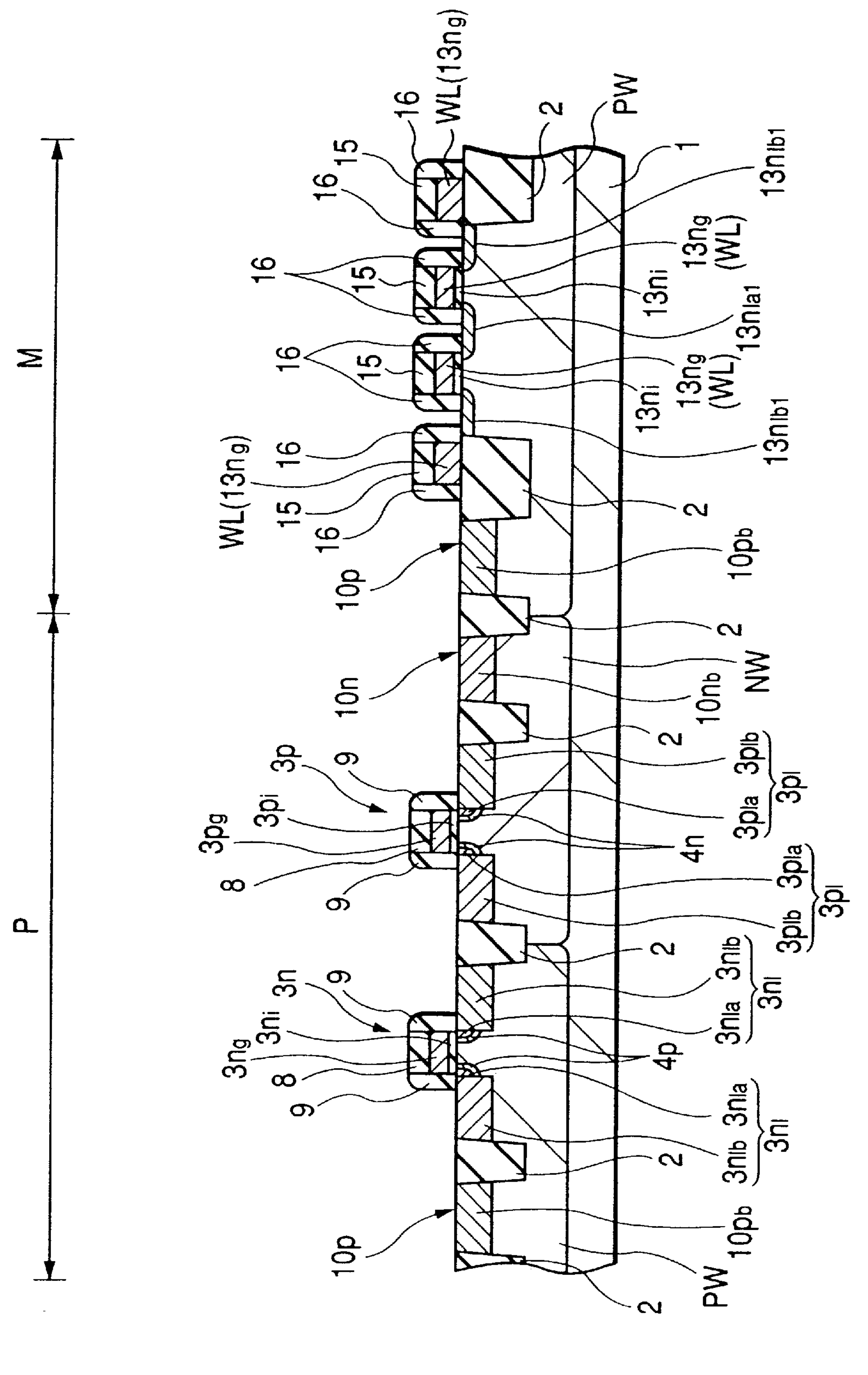
FIG. 29 is a cross section of the semiconductor integrated circuit device during the process of manufacture following the step of FIG. 28.

Next, with the photoresist 12*d* removed, the semiconductor substrate 1 is heat-treated to activate and diffuse the impurity introduced into the semiconductor substrate 1 to form, as shown in FIG. 29, the $n^-$ type semiconductor region 3*nla*, the $n^+$ type semiconductor region 3*nlb* and the $p^-$ type semiconductor region 4p, together constituting the nMOS 3*n*; the $p^+$ type semiconductor region 3*pla*, the $p^+$ type semiconductor region 3*plb* and the $n^-$ type semiconductor region 4*n*, together constituting the pMOS 3*p*; the $p^+$ type semiconductor region 10*pb* in the p-well power supply region 10*p*; the $N^+$ type semiconductor region 10*nb* in the n-well power supply region 10*n;* and the semiconductor regions 13*nla*1, 13*nlb*1 in the memory cell area M.

Figure 30:
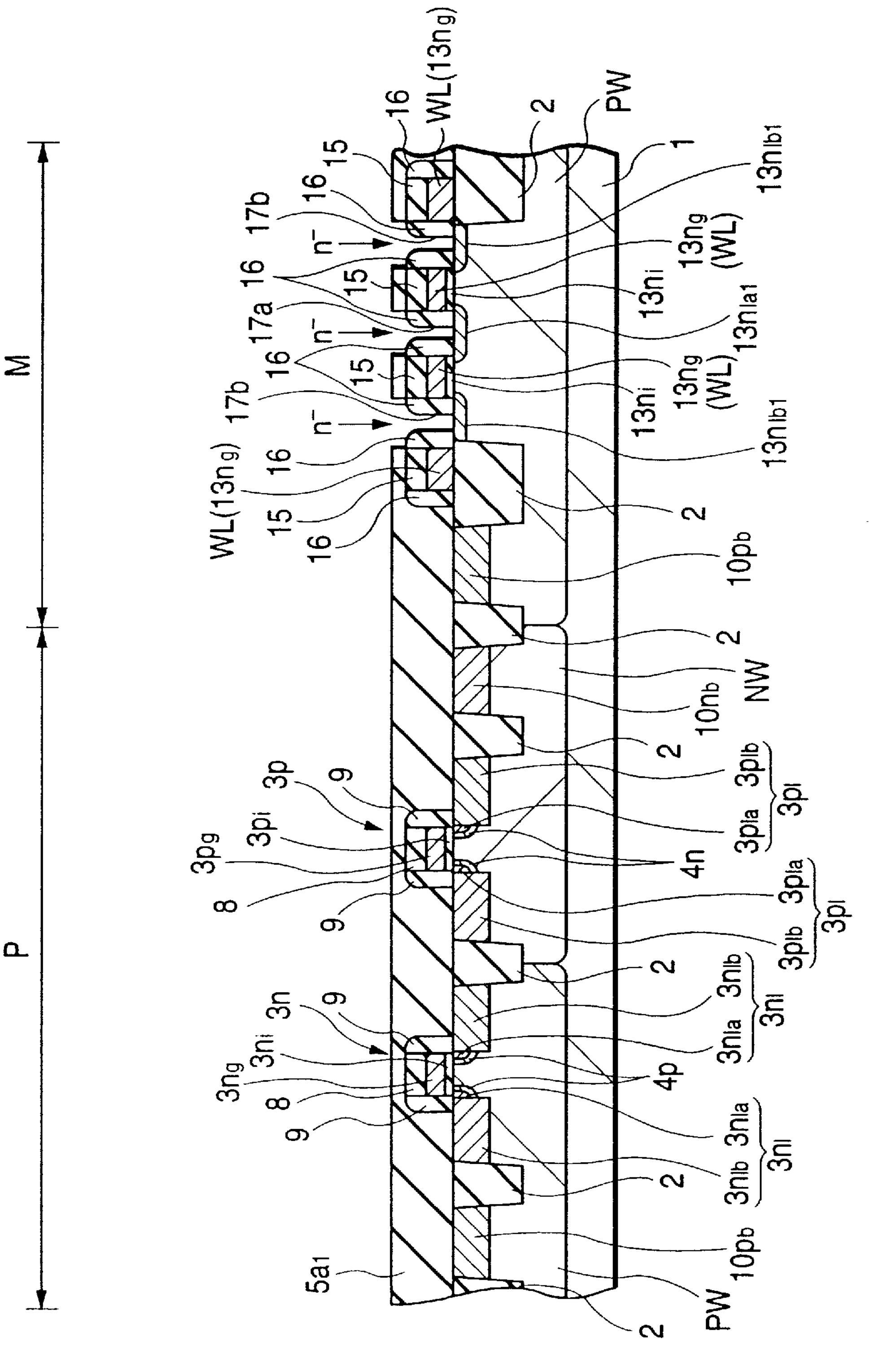
FIG. 30 is a cross section of the semiconductor integrated circuit device during the process of manufacture following the step of FIG. 29.

Next, as shown in FIG. 30, the semiconductor substrate 1 is provided by the CVD method with an interlayer insulation film 5*a*1 of, say, $SiO_2$, which is then formed with connecting holes 17*a*, 17*b* in the memory cell area M by photolithography with the sidewall 16 and the cap insulation film 15 used as etch stoppers.

After this, the semiconductor substrate 1 is ion-implanted through these connecting holes 17*a*, 17*b* with an n type impurity, such as phosphorus or arsenic. This process introduces an impurity that forms an $n^-$ type semiconductor region for alleviating the intensity of an electric field between the source and drain of the memory cell selection MOS and the p-well PW. In this process, this impurity is implanted vertically to the principal surface of the semiconductor substrate 1 at a low concentration to a depth slightly deeper than the $N^+$ type semiconductor regions 13*nla*1, 13*nlb*1.

Figure 31:
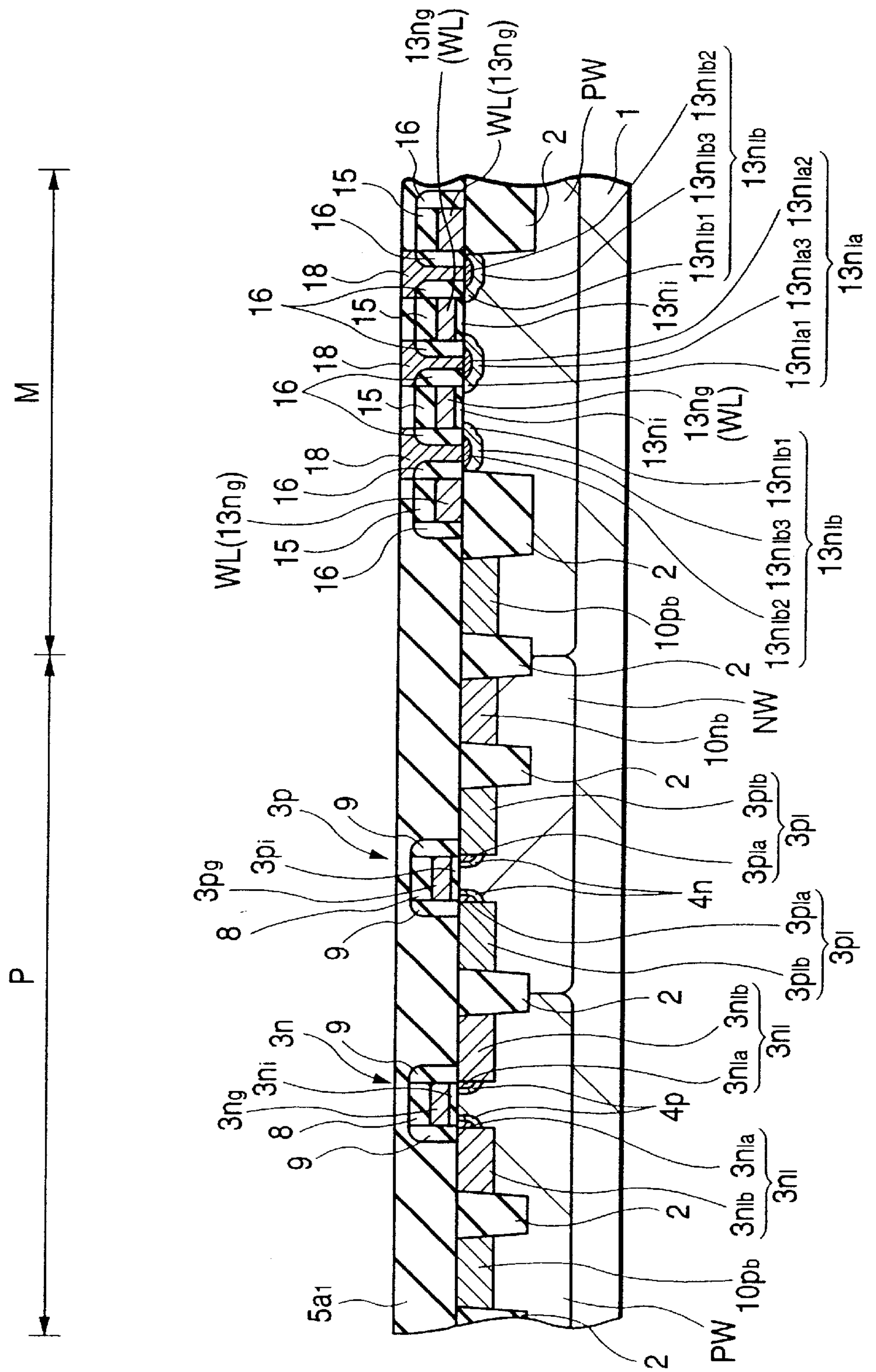
FIG. 31 is a cross section of the semiconductor integrated circuit device during the process of manufacture following the step of FIG. 30.

Next, the semiconductor substrate 1 is provided by the CVD method with a low-resistance polysilicon containing an n type impurity, such as phosphorus, which is then etched back by anisotropic dry etching or chemical mechanical polishing to embed a conductive film 18 of a low-resistance polysilicon containing an n type impurity such as phosphorus in the connecting holes 17*a*, 17*b,* as shown in FIG. 31. Then, the semiconductor substrate 1 is heat-treated to activate and diffuse the n type impurity injected into the semiconductor substrate 1 to form the $n^+$ type semiconductor regions (11th semiconductor region) 13*nla*3, 13*nlb*3 and also to diffuse the n type impurity, phosphorus, contained in the conductive film 18 into the semiconductor substrate 1 to form $N^+$ type semiconductor regions 13*nla* 2, 13*nlb*2. Now, the selection MOS 13 is formed.

The method of forming the conductive film 18 is not limited to the above method, since the following method may be used, for example. First, the connecting holes 17*a*, 17*b* are formed and then the semiconductor substrate 1 is provided by CVD method with a non-doped polysilicon, the upper part of which is then etched back in a manner described above to embed a non-doped polysilicon film in the connecting holes 17*a*, 17*b.* Next, an n type impurity, such as phosphorus or arsenic, is ion-implanted into the non-doped polysilicon film. Then, the semiconductor substrate 1 is heat-treated to activate the impurity implanted in the non-doped polysilicon film to thereby form the conductive film 18.

Figure 32:
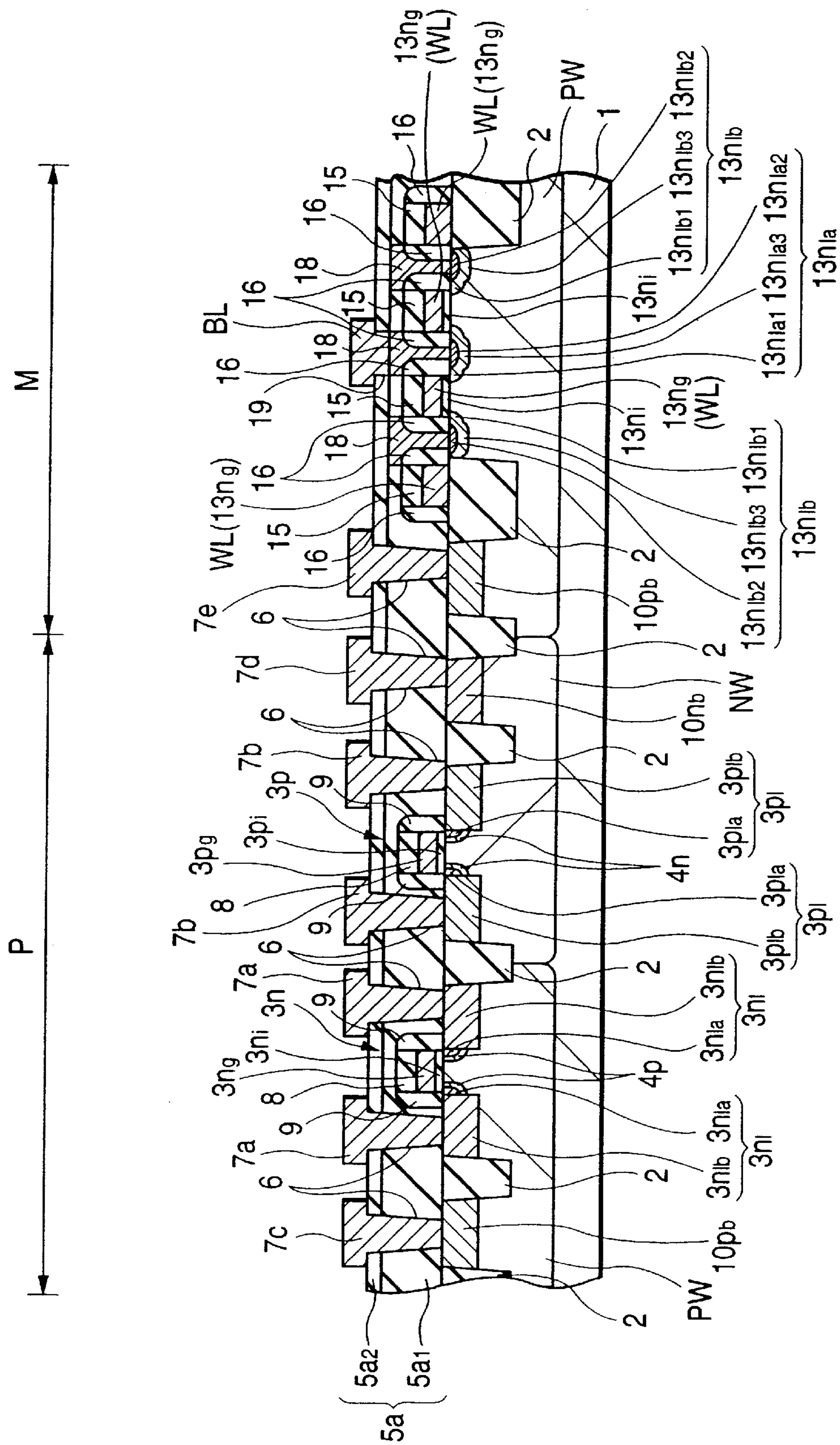
FIG. 32 is a cross section of the semiconductor integrated circuit device during the process of manufacture following the step of FIG. 31.

Next, as shown in FIG. 32, the semiconductor substrate 1 is provided by the CVD method with an interlayer insulation film 5*a*2 of, say, $SiO_2$. Then, a part of the interlayer insulation film 5*a* (5*a*1, 5*a*2) is formed by photolithography with the connecting holes 6 that reach the principal surface of the semiconductor substrate 1 and with the connecting holes 19 that reach the upper part of the conductive film 18.

After this, the interlayer insulation film 5*a* is provided by sputtering with a conductive film. such as a single layer of tungsten or a Ti/TiN/W laminated film, which is then patterned by photolithography and dry etching to form electrodes 7*a*–7*e* and the bit line BL.

Figure 33:
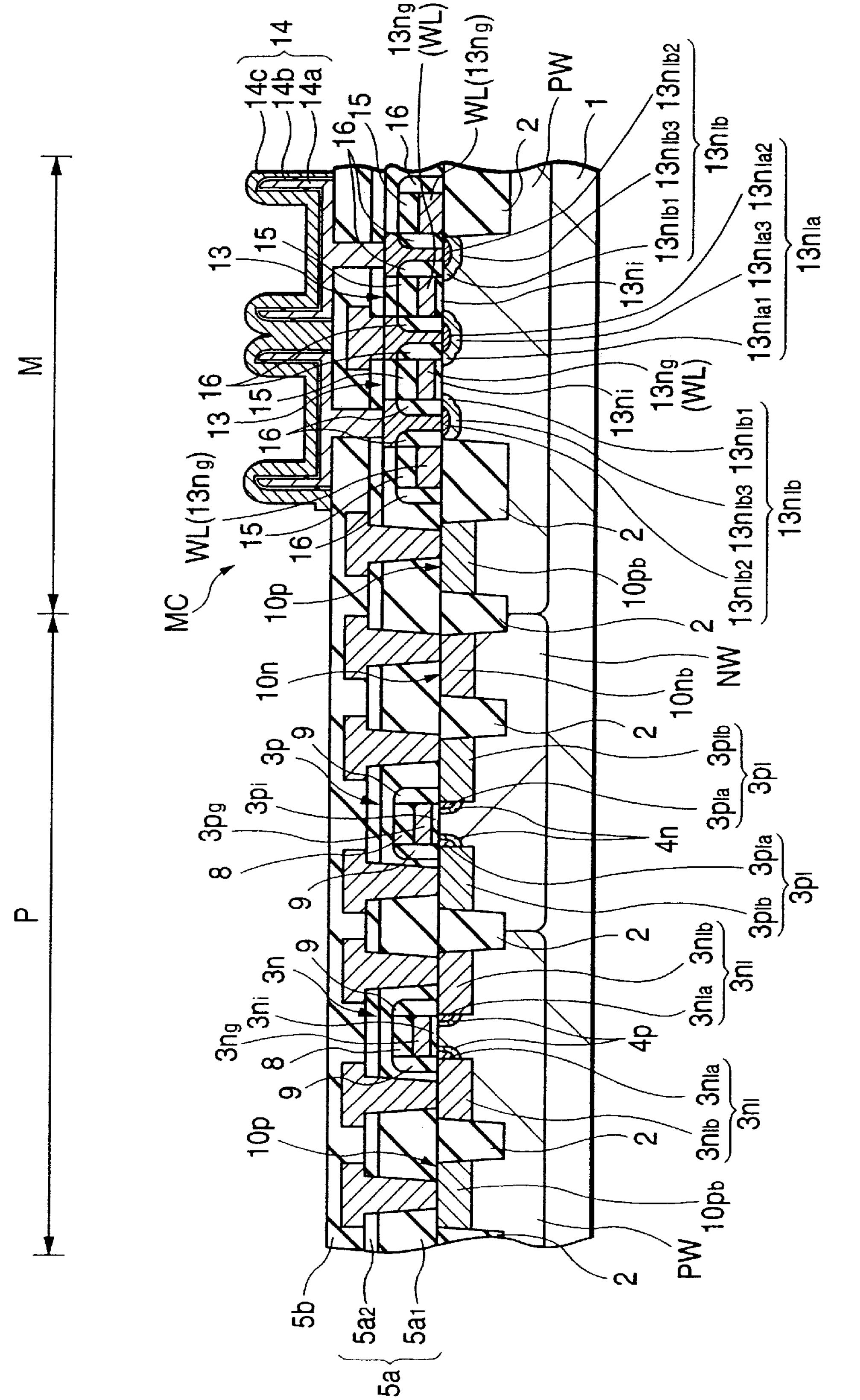
FIG. 33 is a cross section of the semiconductor integrated circuit device during the process of manufacture following the step of FIG. 32.

Then, as shown in FIG. 33, the semiconductor substrate 1 is provided by the CVD method with an interlayer insulation film 5*b* of, say, $SiO_2$ to cover the electrodes 7*a*–7*e* and the bit line BL, after which a crown-shaped capacitor 14 is formed.

Next, the impurity concentration distributions in various parts of the semiconductor integrated circuit device of the embodiment 4 will be explained by referring to FIGS. 34 to 39.

Figure 34:
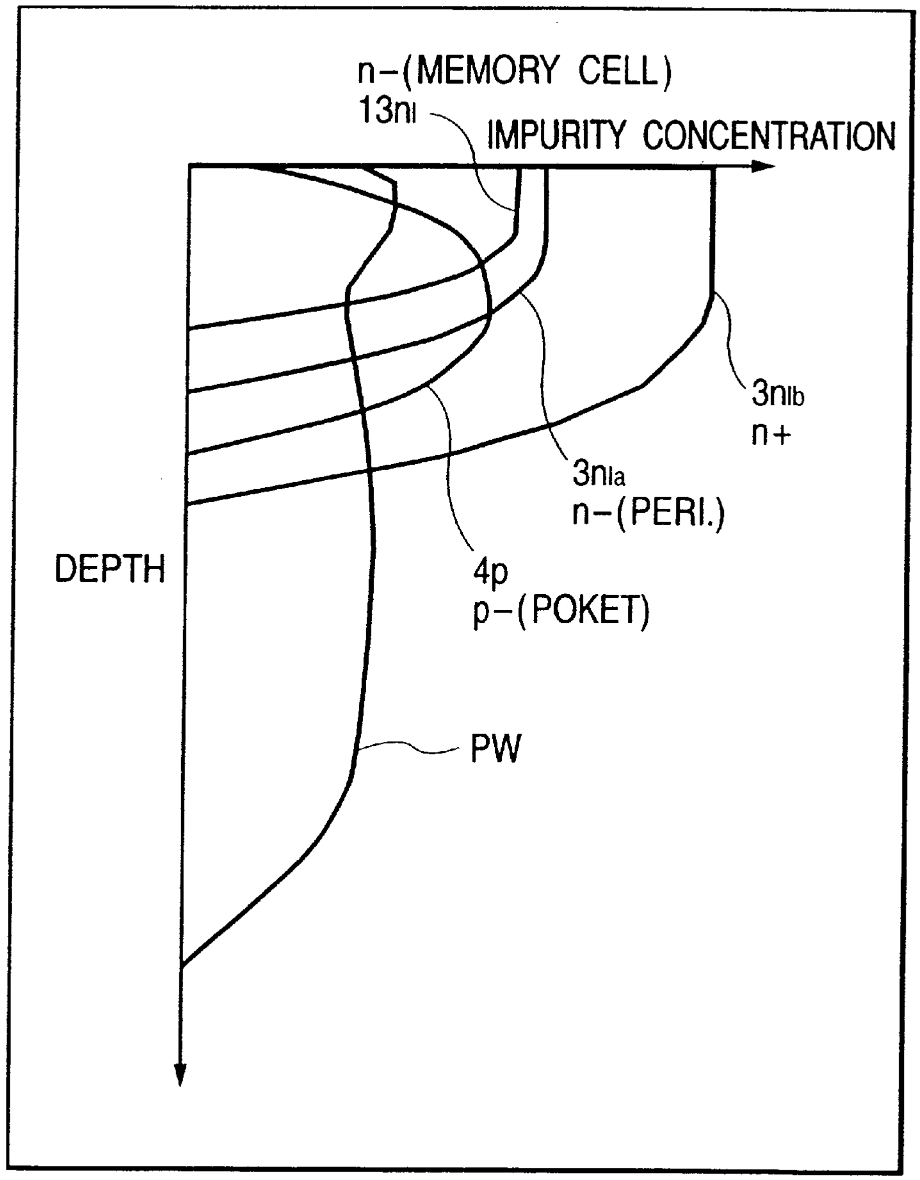
FIG. 34 is a graph showing an impurity concentration distribution in an essential part of the semiconductor integrated circuit device of this embodiment.

FIG. 34 shows impurity concentration distributions in the source and drain regions of the nMOS 3*n* in the peripheral circuit area P. The impurity concentration distribution in the $n^-$ type semiconductor region 3*nla* extends to a greater depth and has a higher concentration than the impurity distribution of the $n^-$ type semiconductor region 13*nl* of the memory cell. The impurity concentration distribution of the $p^-$ type semiconductor region 4*p* for suppressing the short channel effect extends to a greater depth than the impurity concentration distribution of the $n^-$ type semiconductor region 3*nla*. Further, the $N^+$ type semiconductor region 3*nlb* has a higher concentration and extends deeper than the impurity concentration distributions of the $n^-$ type semiconductor region 3*nla* and the $p^-$ type semiconductor region 4*p.*

Figure 35:
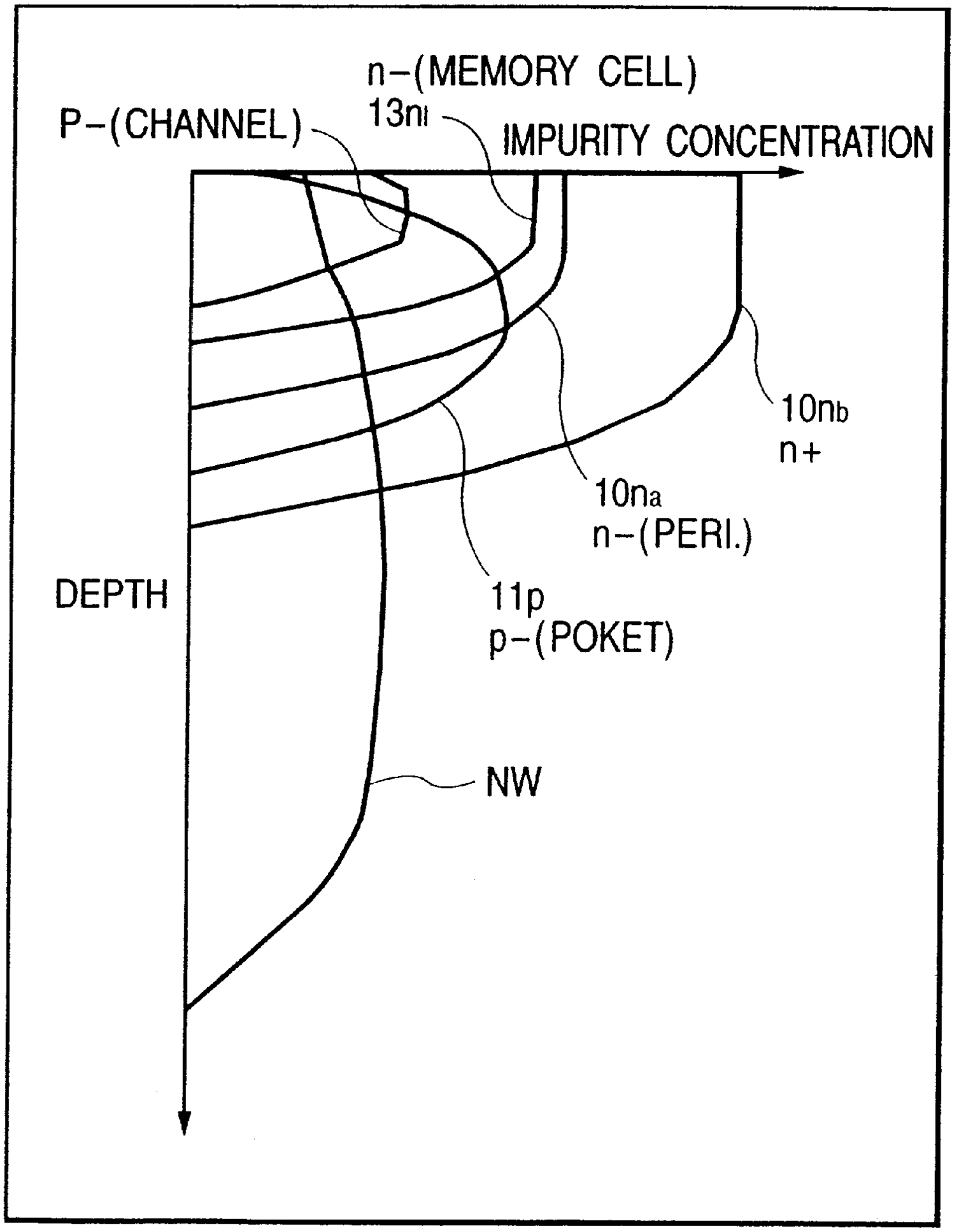
FIG. 35 is a graph showing an impurity concentration distribution in an essential part of the semiconductor integrated circuit device of this embodiment.

FIG. 35 shows impurity concentration distributions in the n-well power supply region 10*n.* The impurity distribution of the $p^-$ type semiconductor region 11*p* extends deeper than the impurity distribution of the $n^-$ type semiconductor region 10*na*. The $N^+$ type semiconductor region 10*nb* has a higher concentration and extends deeper than the $p^-$ type semiconductor region 11*p.* Thus, it is possible to supply the well voltage to the n-well NW in a satisfactory condition. The $p^-$ (Channel) represents the concentration distribution of the impurity introduced into the channel to set the threshold voltage of the pMOS 3*p.*

Figure 36:
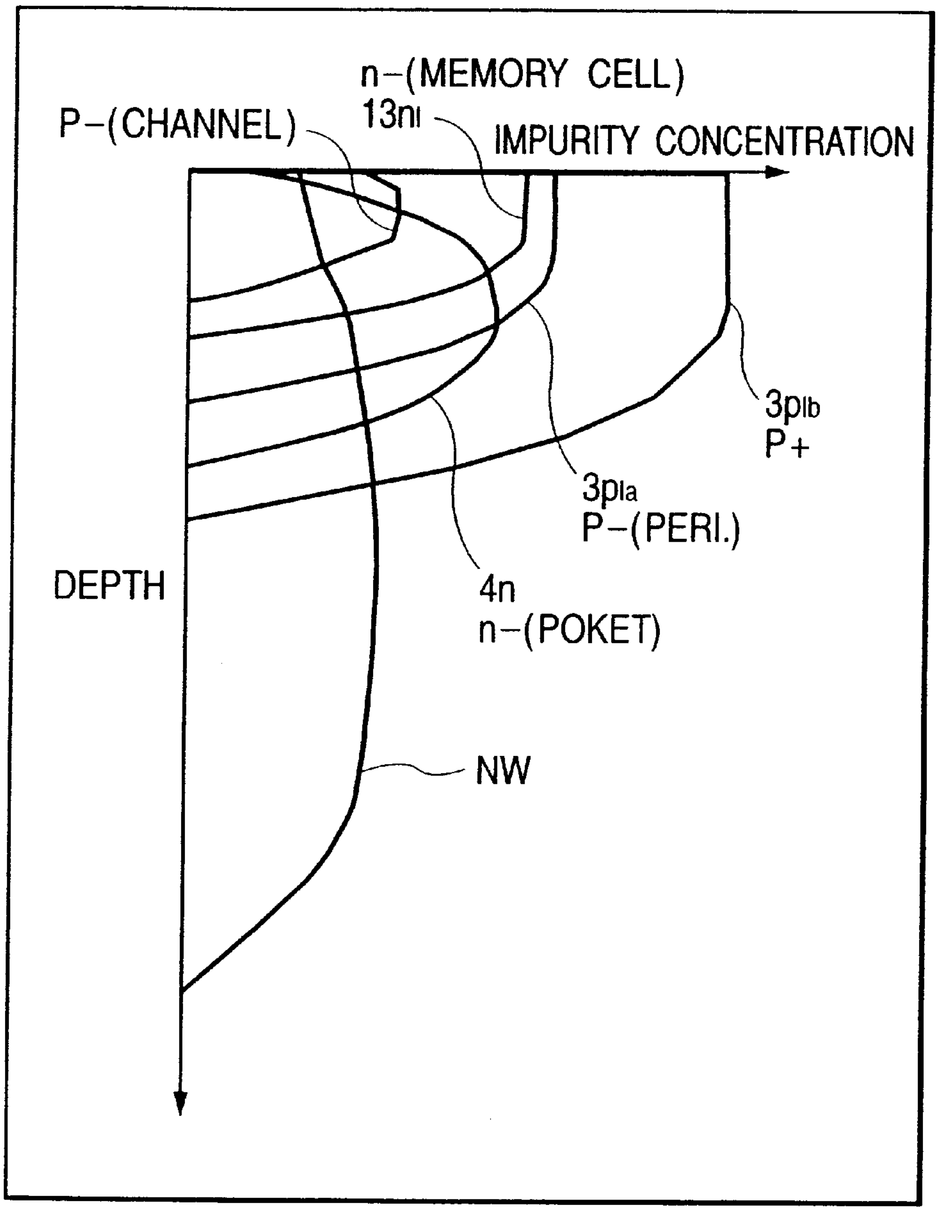
FIG. 36 is a graph showing an impurity concentration distribution in an essential part of the semiconductor integrated circuit device of this embodiment.

FIG. 36 shows impurity concentration distributions in the source and drain of the pMOS 3*p*. The impurity concentration distribution of the $p^-$ type semiconductor region 3*pla* has a higher concentration and extends deeper than the impurity distribution of the $n^-$ type semiconductor region 13*nl* of the memory cell. The impurity concentration distribution of the n type semiconductor region 4*n* for suppressing the short channel effect extends deeper than the impurity concentration distribution of the $p^-$ type semiconductor region 3*pla*. Further, the $p^+$ type semiconductor region 3*plb* has a higher concentration and extends deeper than the impurity concentration distribution of the $n^+$ type semiconductor region 4*n*. The $p^-$ (Channel) represents the concentration distribution of the impurity introduced into the channel to set the threshold voltage of the pMOS 3*p.*

Figure 37:
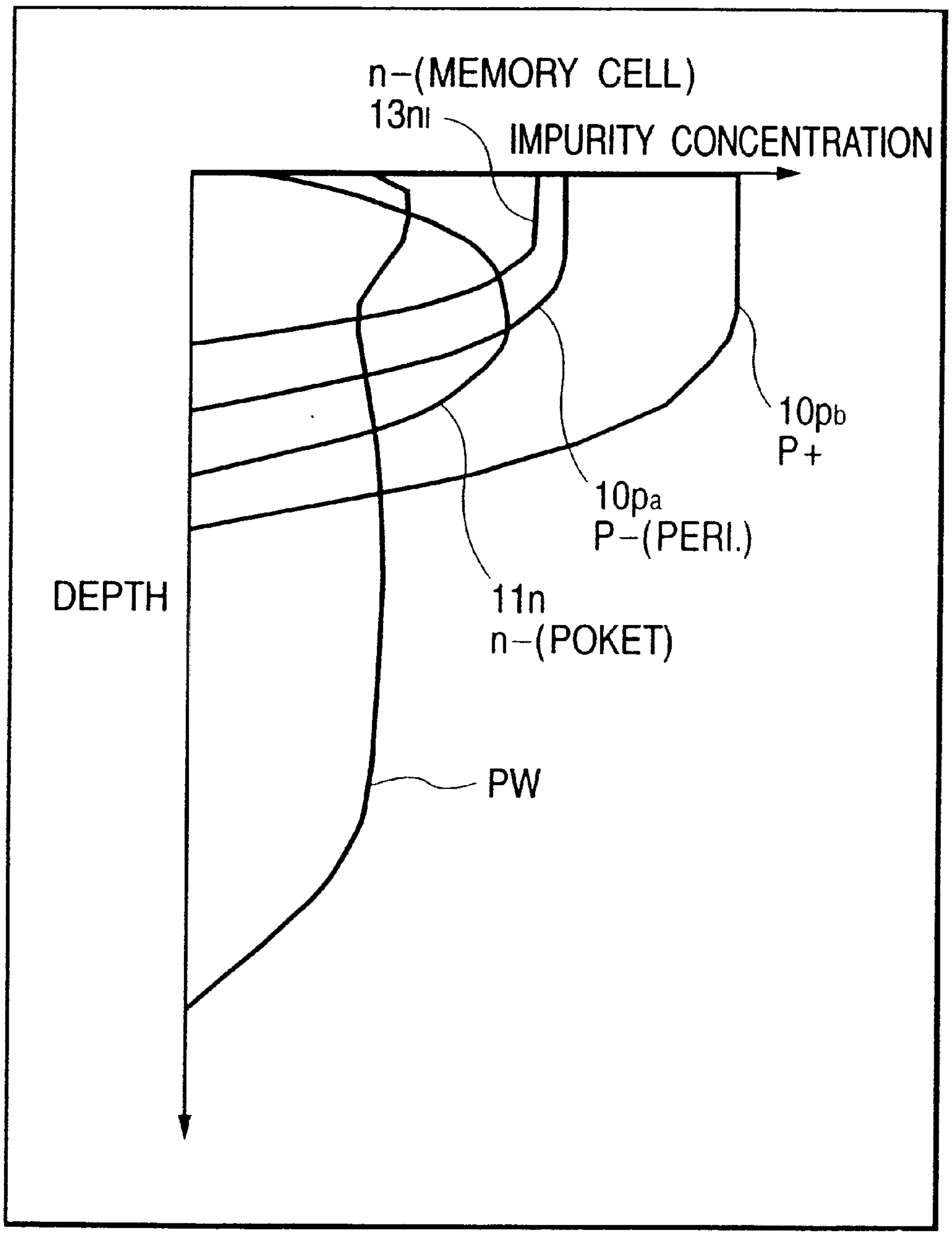
FIG. 37 is a graph showing an impurity concentration distribution in an essential part of the semiconductor integrated circuit device of this embodiment.

FIG. 37 shows impurity concentration distributions in the p-well power supply region 10*p*. The impurity distribution of the $n^-$ type semiconductor region 11*n* extends deeper than the impurity distribution of the $p^-$ type semiconductor region 10*pa*. The $p^+$ type semiconductor region 10*pb* has a higher concentration and extends deeper than the impurity distribution of the $n^-$ type semiconductor region 11*n*. Thus, the p-well PW, too, can be supplied with a well voltage in good condition.

FIG. 38 is an schematic, enlarged cross section showing essential parts of the memory cell area M of FIG. 33. FIG. 39 shows impurity concentration distributions in the source and drain of the selection MOS 13 of FIG. 38. For easy understanding of FIG. 38, the semiconductor regions 13*nla*, 13*nlb* are not hatched.

The $n^-$ type semiconductor region 13*nla*1 (13*nlb*1), as shown in FIG. 38, has an impurity concentration distribution extending horizontally relative to the semiconductor substrate 1. The $N^+$ type semiconductor region 13*nla*2 (13*nlb*2) has a higher impurity concentration than the $n^-$ type semiconductor region 13_nla_1 (13_nlb_1). Further, the $n^-$ type semiconductor region 13_nla_3 (13_nlb_3) has a lower impurity concentration than that of the $N^+$ type semiconductor region 13_nla_2 (13_nlb_2), but extends to a greater depth. That is, the $n^+$ type semiconductor region 13_nla_2 (13_nlb_2),with a relatively high impurity concentration, is entirely enclosed by the $n^-$ type semiconductor region 13_nla_1 (13_nlb_1) and $n^-$ type semiconductor region 13_nla_3 (13_nlb_3), which have relatively low impurity concentrations. This configuration can suppress a phenomenon in which a strong electric field is applied locally to the $N^+$ type semiconductor region 13_nla_2 (13_nlb_2), and thus can improve the yield and reliability of the semiconductor integrated circuit device.

With this embodiment 4, too, it is possible to embodiment 2.

(Embodiment 5)

FIGS. 40 to 54 show cross sections of a semiconductor integrated circuit device of a further embodiment of this invention during the process of manufacture. FIGS. 55 to 58 are graphs showing impurity concentration distributions in various parts of the semiconductor integrated circuit device of this embodiment.

Figure 40:
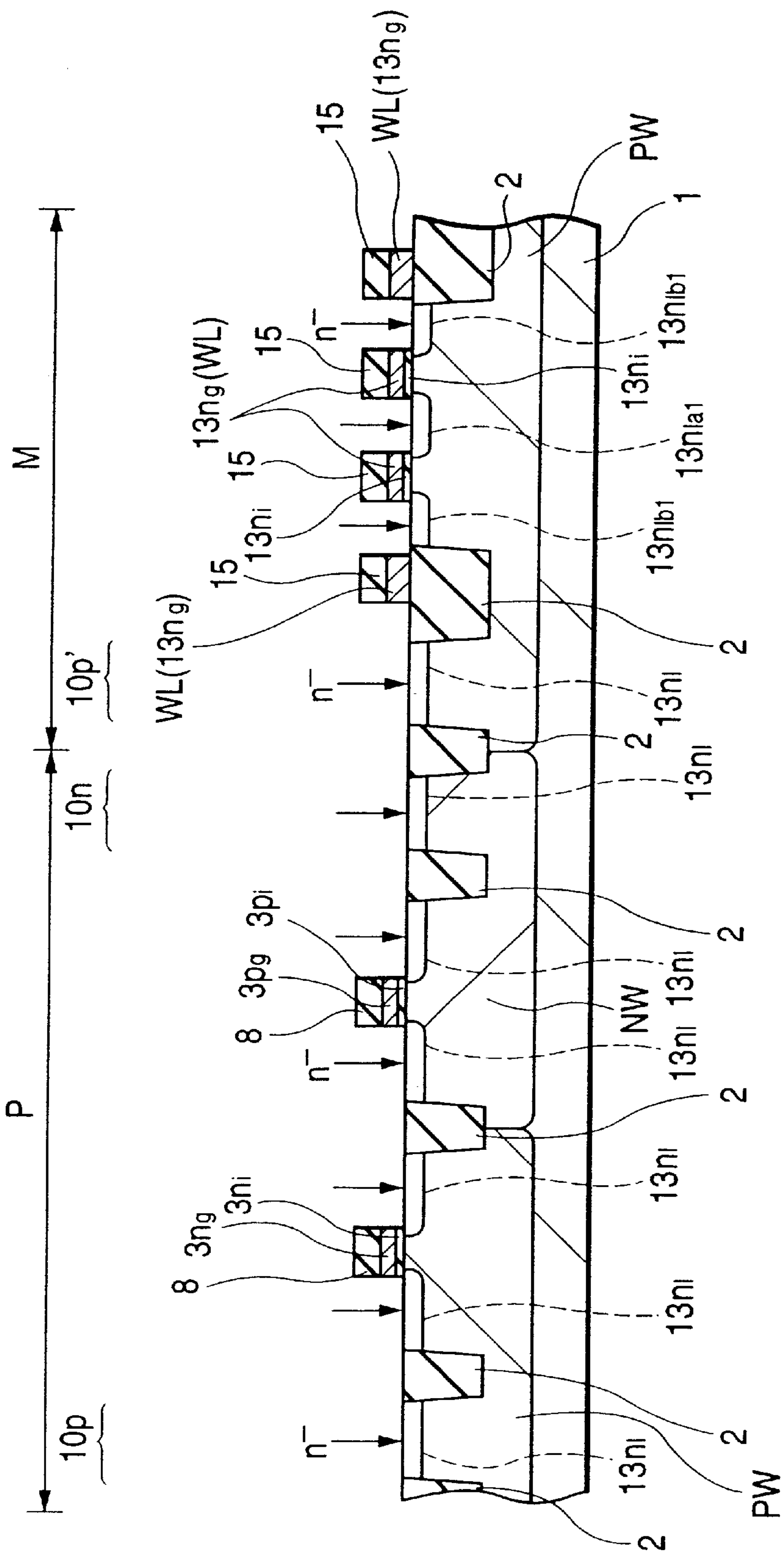
FIG. 40 is a cross section of a semiconductor integrated circuit device of a further embodiment of this invention during the process of manufacture.

FIG. 40 is a cross section of the semiconductor integrated circuit device of the embodiment 5 at a step in the manufacturing process. The semiconductor substrate 1 is already formed with a p-well PW, an n-well NW, device isolation portions 2, gate electrodes 3_ng_, 3_pg_, 13_ng_, and cap insulation films 8, 15. The gate electrodes 3_ng_, 3_pg_, 13_ng_ are formed of a single film of, say, low-resistance polysilicon. Alternatively, they may also be formed in a so-called polycide structure having a silicide film of, say, tungsten silicide laminated over the low-resistance polysilicon film, or in a so-called polymetal structure in which a metal film, such as a tungsten film, is laminated over the low-resistance polysilicon film with a barrier metal film of titanium nitride or tungsten nitride interposed therebetween. The cap insulation film 8 may be formed of silicon nitride.

First, the semiconductor substrate 1 described above is ion-implanted with an n type impurity, such as phosphorus or arsenic, self-aligningly with respect to the gate electrodes 3_ng_, 3_pg_, 13_ng_ and the cap insulation films 8, 15. The dose of impurity is around $2\times10^{13}$ ions/cm$^2$. This impurity injection process is a process to form the $n^-$ type semiconductor regions 13_nla_1, 13_nlb_1 for the memory cell selection MOSFET and is carried out over the entire principal surface of the semiconductor: substrate 1 without using a mask. Hence, this n type impurity is injected also into the peripheral circuit area P (including pMOS region and p-well power supply region) as well as the memory cell area. In the p-well power supply regions in the peripheral circuit area P and the memory cell area M, the semiconductor regions formed by this impurity implantation process are represented as the $n^-$ type semiconductor region 13_nl_. Although the $n^-$ type semiconductor regions 13_nl_, 13_nla_1, 13_nlb_1 are not formed yet at this stage of the manufacturing process. since the heat treatment to activate the impurity has not been performed, these semiconductor regions are illustrated to facilitate understanding.

Figure 41:
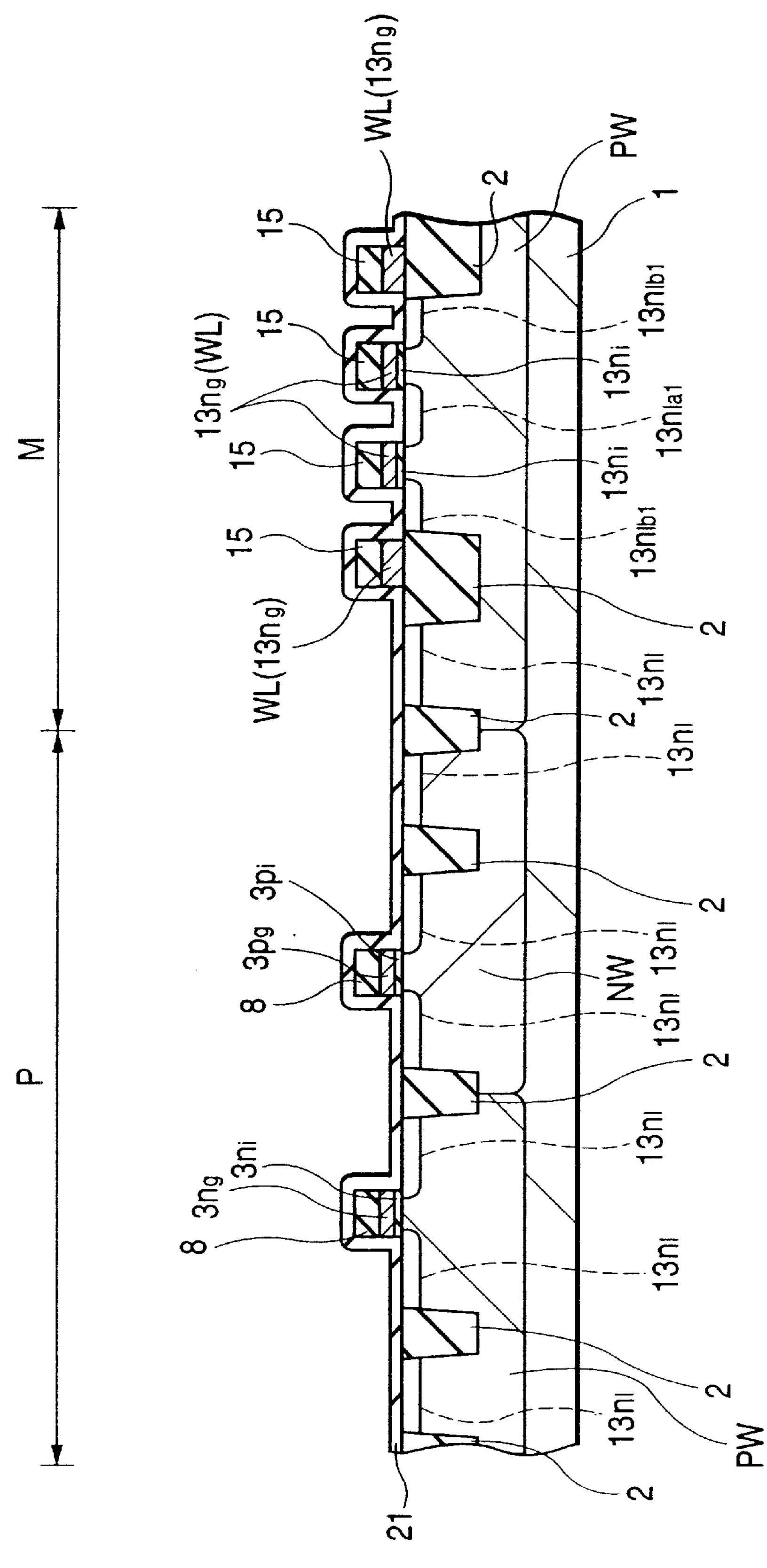
FIG. 41 is a cross section of the semiconductor integrated circuit device of FIG. 40 during the process of manufacture.

Next, as shown in FIG. 41, the semiconductor substrate 1 is provided, by CVD method, with an insulation film 21 of, say, silicon nitride to cover the upper surface of the semiconductor substrate 1, including the device isolation portions 2, and the surfaces (side and upper surfaces) of the gate electrodes 3_ng_, 3_pg_, cap insulation film 8, gate electrode 13_ng_ (word line WL) and cap insulation film 15.

Figure 42:
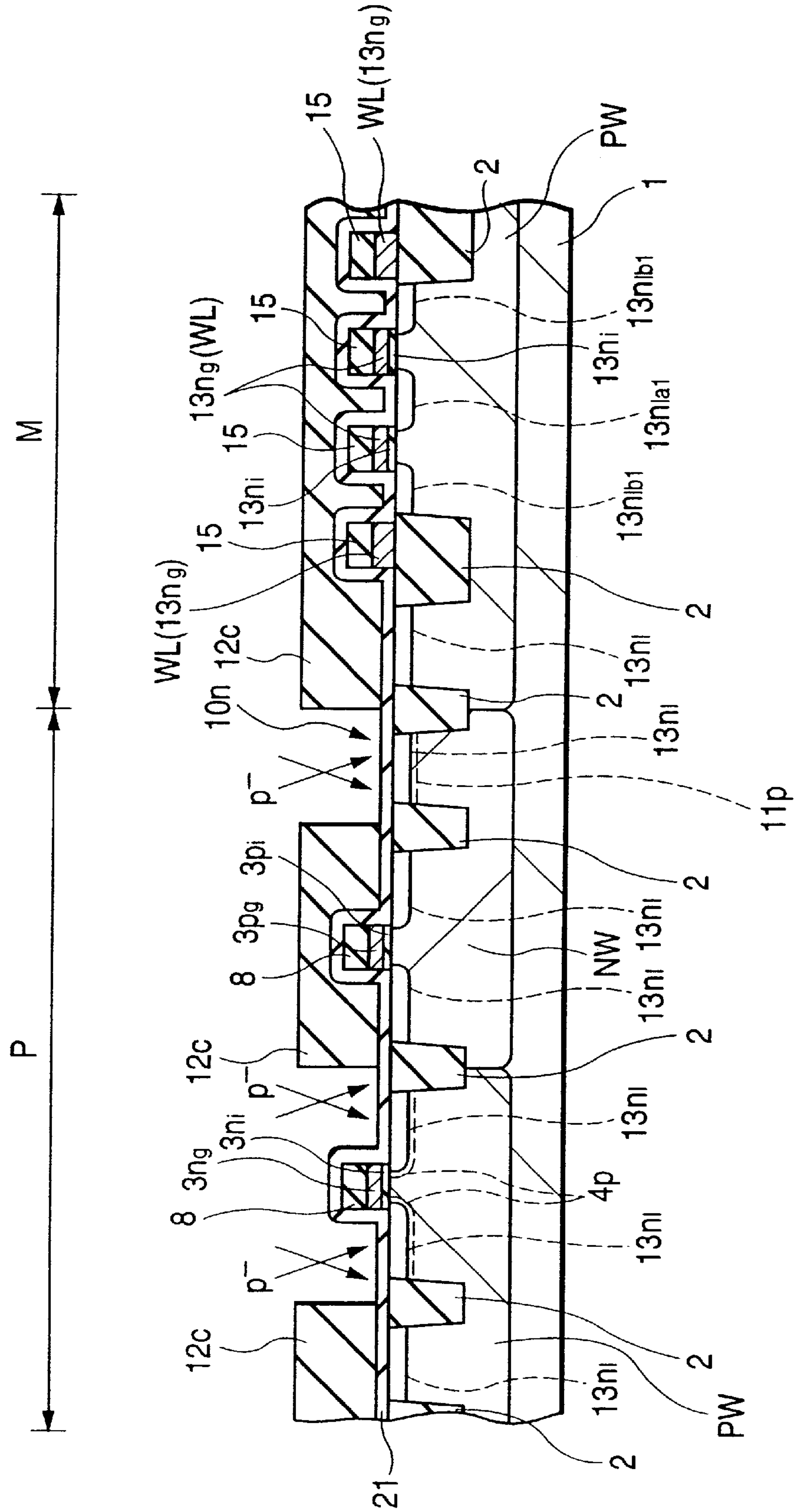
FIG. 42 is a cross section of the semiconductor integrated circuit device during the process of manufacture following the step of FIG. 41.

Then, the insulation film 21, without being subjected to anisotropic etching, is formed by photolithography with a photoresist (first mask) 12_c_ that, as shown in FIG. 42, exposes the nMOS formation region and n-well power supply region 10_n_ in the peripheral circuit area P on the insulation film 21 and covers the pMOS formation region in the peripheral circuit area P, the p-well power supply regions 10_p_, 10_p_' in the peripheral circuit area P and memory cell area M and also the memory cell area M.

That is, those parts of the insulation film 21 on the side surfaces of the gate electrodes 3_ng_, 3_pg_, cap insulation film 8, gate electrode 13_ng_ (word line WL) and cap insulation film 15 serve as sidewalls, which were explained in connection with the embodiment 4. This eliminates the need for processes of forming the sidewalls. Elimination of the dry etching process and the cleaning and drying processes for making the sidewalls can not only reduce the manufacturing time and cost of the semiconductor integrated circuit device, but also lower the failure rate resulting from foreign matter, which in turn leads to improved yield and reliability of the semiconductor integrated circuit device.

Next, as in the embodiment 1, using the photoresist 12_c_ as a mask, a p type impurity, such as boron, is ion-implanted into the semiconductor substrate 1 through the insulation film 21. The dose of the impurity is around $4\times10^{12}$ ions/cm$^2$. This impurity introducing process is a process to form the $p^-$ type semiconductor region 4_p_ for suppressing the short channel effect on the nMOS in the peripheral circuit area P.

During this process, the semiconductor substrate 1 is tilted to inject the impurity at an inclined angle into the principal surface of the semiconductor substrate 1. This is to ensure that the impurity can reach the edge of the gate electrode and that the shadowing effect caused by the gate electrode can be prevented. With this method, it is possible to introduce the impurity below the edge of the gate electrode 3_ng_ in the nMOS formation region and, in the n-well power supply region 10_n_, to form the $p^-$ type semiconductor region 11_p_ relatively shallow. The impurity may be implanted in four or more directions.

Although the semiconductor regions 4_p_, 11_p_, 13_nl_, 13_nla_1, 13_nlb_1 are not formed yet at this stage of the manufacturing process, since the heat treatment to activate the impurity has not been performed, these semiconductor regions are illustrated to facilitate understanding.

Figure 43:
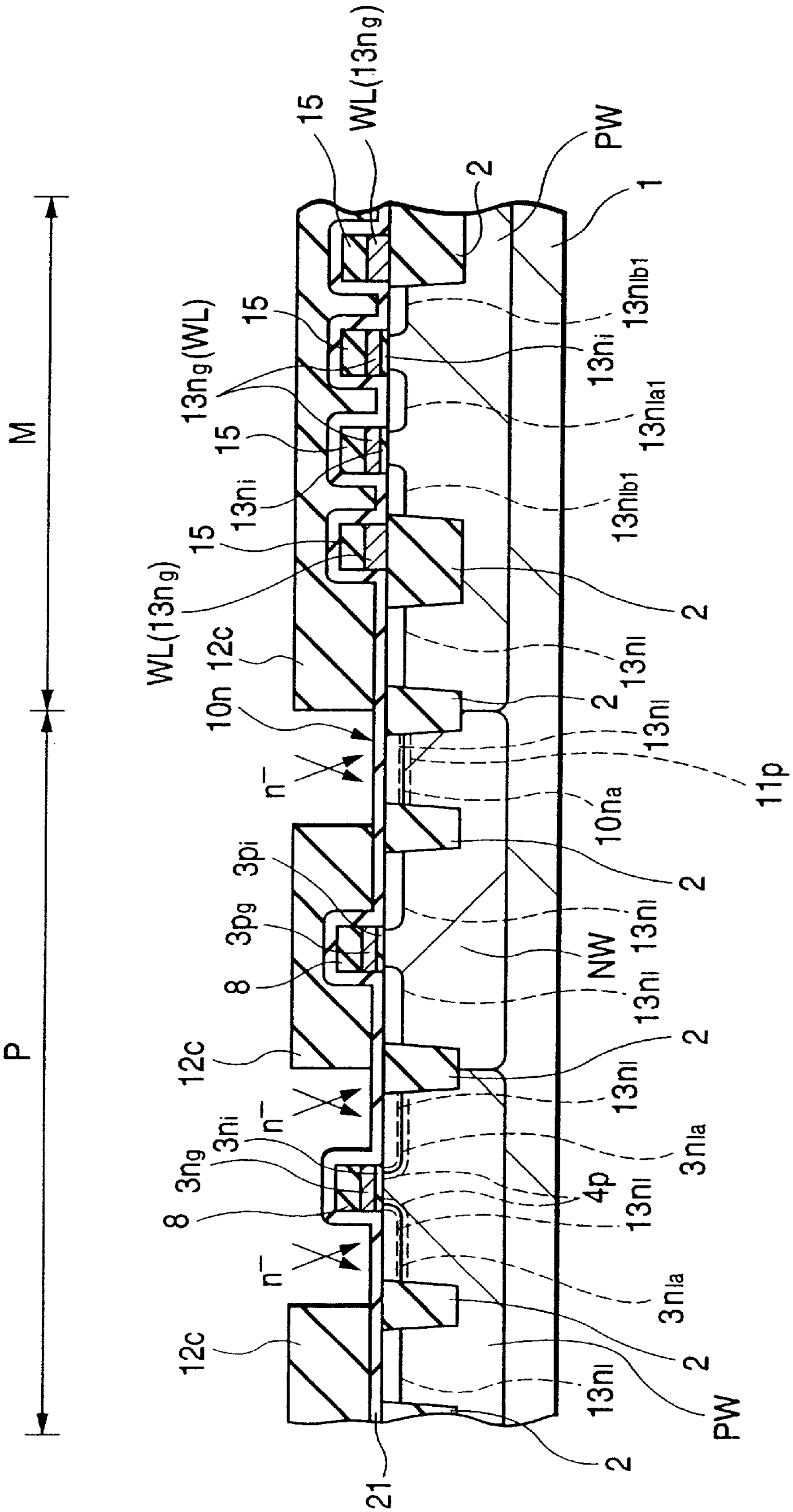
FIG. 43 is an essential-part cross section of the semiconductor integrated circuit device during the process of manufacture following the step of FIG. 42.

Then, as shown in FIG. 43, by using as a mask the photoresist 12_c_ that was used when introducing the impurity for making the $p^-$ type semiconductor regions 4_p_, 11_p_, an n type impurity, such as phosphorus or arsenic, is ion-implanted into the semiconductor substrate 1 through the insulation film 21. The dose of impurity is around $1\times10^{14}$ ions/cm$^2$. This impurity introducing process is a process to form the $n^-$ type semiconductor region 3_nla_ of the nMOS and the $n^-$ type semiconductor region 10_na_ of the n-well power supply region.

In this process, the n type impurity is injected at an inclined angle with respect to the principal surface of the semiconductor substrate 1 to prevent the shadowing effect caused by the gate electrode and to ensure that the n type impurity remains at the channel-side end of the $n^+$ type semiconductor region for the source and drain (described later). The angle of injection of the impurity is set to be equal to that used when forming the $p^-$ type semiconductor regions 4_p_, 11_p_. That is, when the n type impurity is injected (to form a low impurity concentration region), the semiconductor substrate 1 is kept at the same inclination angle as that when the p type impurity (for suppressing the short channel effect) was injected. The n type impurity may be injected in four or more directions.

With such an ion implantation, the $p^-$ type semiconductor region 4_p_ can be formed at the channel-side end of the $n^-$ type semiconductor region 3*nla* because, in the nMOS formation region, the p-type impurity has a greater diffusion coefficient than the n type impurity. In the n-well power supply region, the $n^-$ type semiconductor region 10*na* is formed to be shallower than the $p^-$ type semiconductor region 11*p*.

Although the semiconductor regions 4*p*, 11*p*, 13*nla*, 10*na*, 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 44:
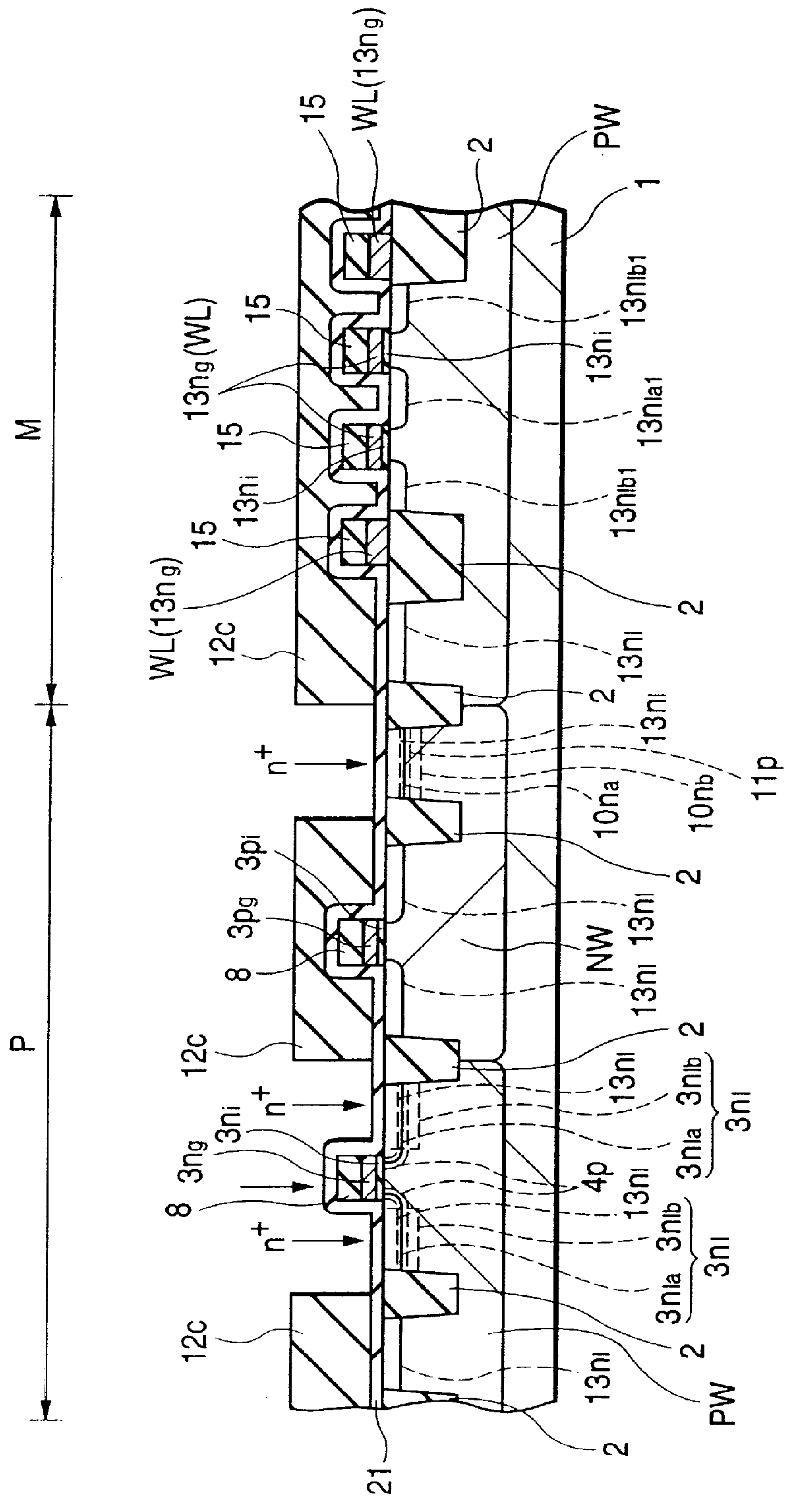
FIG. 44 is a cross section of the semiconductor integrated circuit device during the process of manufacture following the step of FIG. 43.

Then, as shown in FIG. 44, the semiconductor substrate 1 is ion-implanted with an n type impurity, such as phosphorus and arsenic, through the insulation film 21 by using as a mask the same photoresist 12*c* that was used when introducing the impurity for making the $p^-$ type semiconductor regions 4*p*, 11*p* and when introducing the impurity for making the $n^-$ type semiconductor regions 3*nla*, 10*na*. The dose of this impurity is approximately $3\times10^{15}$ ions/$cm^2$. This impurity injection process is a process to form the $n^+$ type semiconductor region 3*nlb* of the nMOS and the $N^+$ type semiconductor region 10*nb* of the n-well power supply region.

In this process, the n type impurity is implanted vertically relative to the principal surface of the semiconductor substrate 1. Furthermore, the n type impurity is also implanted to a depth greater than that of the $p^-$ type semiconductor region 11*p* of the n-well power supply region 10*n* and to a depth that allows separation from the adjoining devices. The reason why the n type impurity is injected deeper than the $p^-$ type semiconductor region 11*p* is as follows. In the n-well power supply region 10*n*, the $p^-$ type semiconductor region 11*p*, whose conduction type is inverse to that of the n-well NW, is formed deeper than the $n^-$ type semiconductor region 10*na*, which makes a satisfactory well connection impossible. Thus, injecting the n type impurity deeper than the $p^-$ type semiconductor region 11*p* prevents the $p^-$ type semiconductor region 11*p* from being formed in the n-well power supply region 10*n* when introducing the n type impurity and, therefore, enables a good well connection.

Although the semiconductor regions 4*p*, 11*p*, 3*nla*, 3*nlb*, 10*na*, 10*nb*, 13*nl*, 13*nla*1, 13*nlb*1 are not formed yet at this stage of the manufacturing process, since the heat treatment to activate the impurity has not been performed, these semiconductor regions are illustrated to facilitate understanding.

With this embodiment 5, the n type semiconductor regions 3*nl* and the $p^-$ type semiconductor region 4*p* required by the nMOS 3*n* and the n-well power supply region 10*n* can be formed by ion implantation processes that use the same photoresist as a mask. This greatly reduces the number of photolithographic processes,such as application, exposure and development of the photoresist film and the number of photomasks used.

Figure 45:
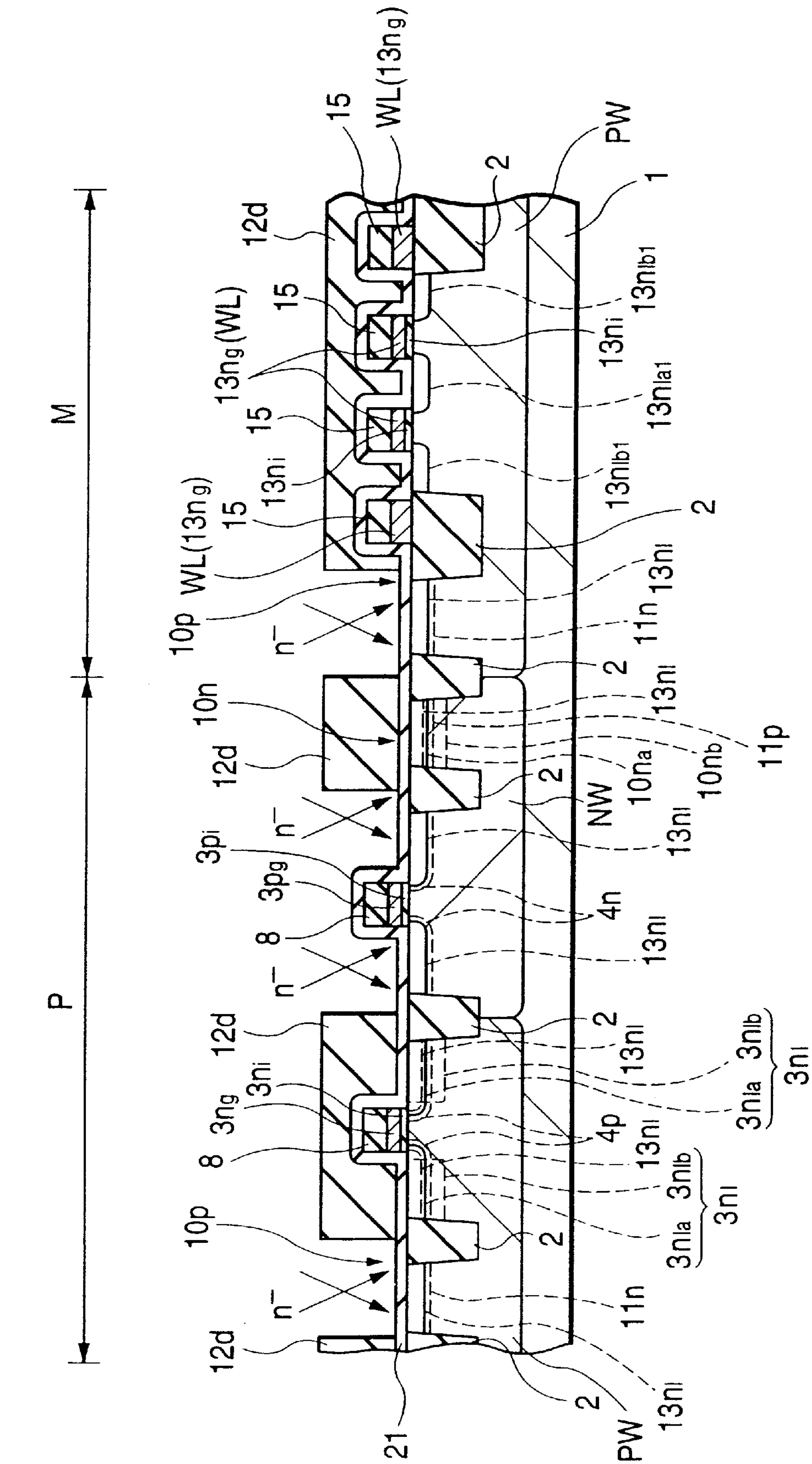
FIG. 45 is a cross section of the semiconductor integrated circuit device during the process of manufacture following the step-of FIG. 44.

Next, with the photoresist 12*c* removed, the semiconductor substrate 1 is formed, by photolithography, with a photoresist (second mask) 12*d* which, as shown in FIG. 45, exposes the pMOS formation region and the p-well power supply region 10*p* of the peripheral circuit area P and the p-well power supply region 10*p*' of the memory cell area M and which covers the nMOS formation region and n-well power supply region 10*n* of the peripheral circuit area P and also the memory cell area M.

Then, using the photoresist 12*d* as a mask, an n type impurity, such as phosphorus or arsenic, is ion-implanted to the semiconductor substrate 1 through the insulation film 21 in a manner similar to the embodiment 1. The dose of impurity is around $3\times10^{12}$ ions/$cm^2$. This impurity introducing process is a process to form the $n^-$ type semiconductor region 4*n* for suppressing the short channel effect on the pMOS in the peripheral circuit area P.

During this process, the semiconductor substrate 1 is tilted to inject the impurity at an inclined angle into the principal surface of the semiconductor substrate 1. This is to ensure that the impurity can reach the edge of the gate electrode and that the shadowing effect caused by the gate electrode can be prevented. With this method, it is possible to introduce the impurity below the edge of the gate electrode 3*pg* in the pMOS formation region and, in the p-well power supply regions 10*p*, 10*p*', to form the $n^-$ type semiconductor region 11*n* relatively shallow. The impurity may be implanted in four or more directions.

Although the semiconductor regions 4*p*, 11*p*, 4*n*, 11*n*, 3*nla*, 3*nlb*, 10*na*, 10*nb*, 13*nl*, 13*nla* l, 13*nlb*1 are not formed yet at this stage of the manufacturing process, since the heat treatment to activate the impurity has not been performed, these semiconductor regions are illustrated to facilitate understanding.

Figure 46:
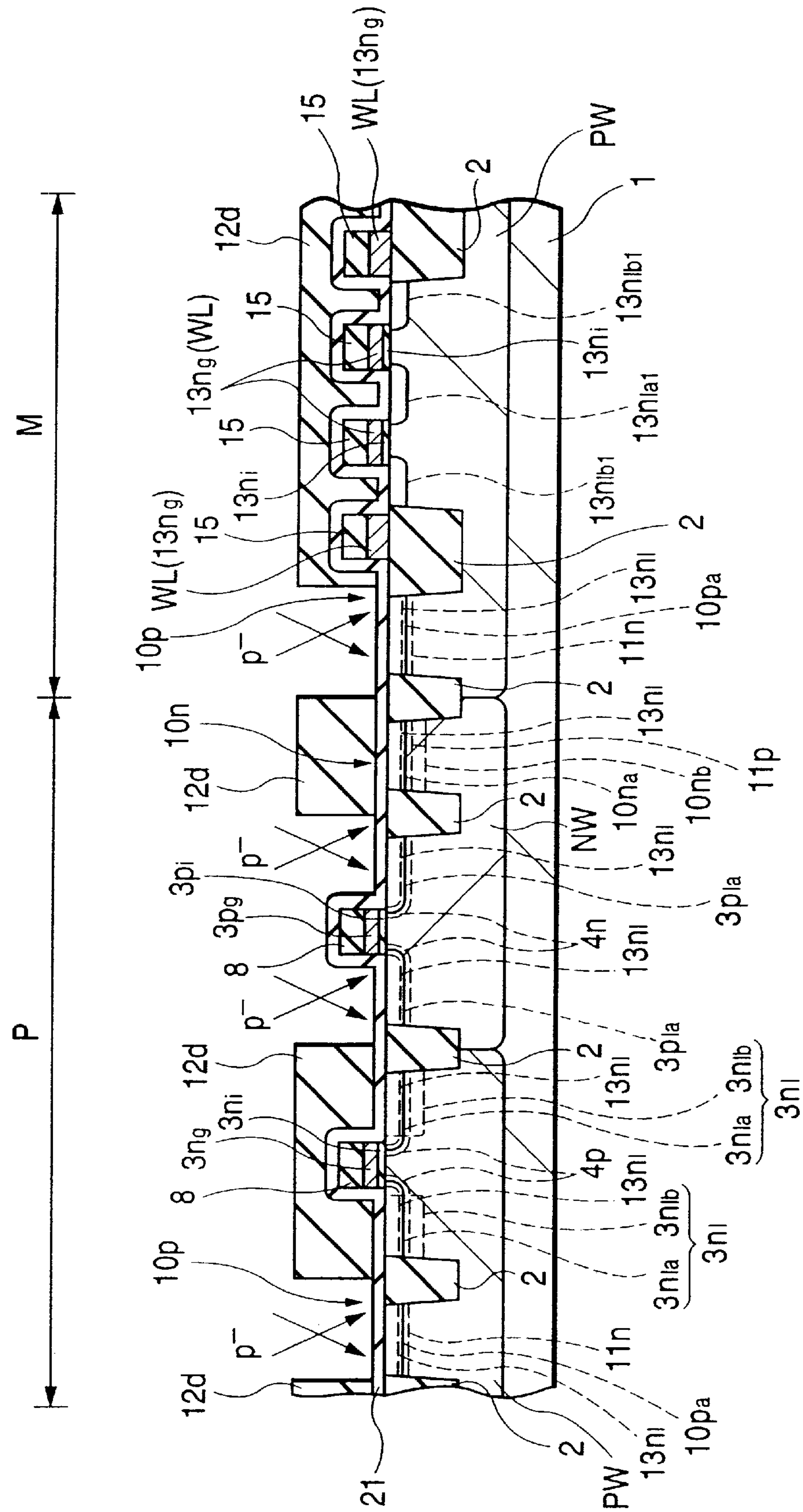
FIG. 46 is a cross section of the semiconductor integrated circuit device during the process of manufacture following the step of FIG. 45.

Then, as shown in FIG. 46, by using as a mask the photoresist 12*d* that was used when introducing the impurity for making the $n^-$ type semiconductor regions 4*n*, 11*n*, a p type impurity, such as boron, is ion-implanted into the semiconductor substrate 1 through the insulation film 21.

The dose of this impurity is set to be greater than the dose of the impurity for the $n^-$ type semiconductor region 13*nl* in order to cancel the conduction type of the $n^-$ type semiconductor region 13*nl*, and is set at about $3\times10^{13}$ ions/$cm^2$. This impurity introducing process is a process to form the $p^-$ type semiconductor region 3*pla* of the pMOS and the $p^-$ type semiconductor region 10*pa* of the p-well power supply region.

In this process, the p type impurity is injected at an inclined angle with respect to the principal surface of the semiconductor substrate 1 to prevent the shadowing effect caused by the gate electrode and to ensure that the p type impurity remains at the channel-side end of the $p^+$ type semiconductor region for the source and drain (described later). The angle of injection of the impurity is set to be equal to that used when forming the $n^-$ type semiconductor regions 4*n*, 11*n*. That is, when the p type impurity is injected (to form a low impurity concentration region), the semiconductor substrate 1 is kept at the same inclination angle as that when the n type impurity (for suppressing the short channel effect) was injected. The n type impurity may be injected in four or more directions.

Here, the energy of ion implantation is so set that in the pMOs formation region the extent of infiltration of the p type impurity under the edge of the gate electrode 3*pg* is smaller than the $n^-$ type semiconductor region 4*n*. Therefore, in the pMOS formation region the $n^-$ type semiconductor region 4*n* remains at the channel-side end of the $p^-$ type semiconductor region 3*pla* and, in the p-well power supply region, the $p^-$ type semiconductor region 10*pa* is formed to be shallower than the $n^-$ type semiconductor region 11*n*.

Although the semiconductor regions 4*p*, 4*n*, 11*p*, 11*n*, 3*nla*, 3*nlb*, 3*pla*, 10*na*, 10*nb*, 10*pa*, 13*nl*, 13*nla*1, 13*nlb*1 are not formed yet at this stage of the manufacturing process, since the heat treatment to activate the impurity has not been performed, these semiconductor regions are illustrated to facilitate understanding.

Figure 47:
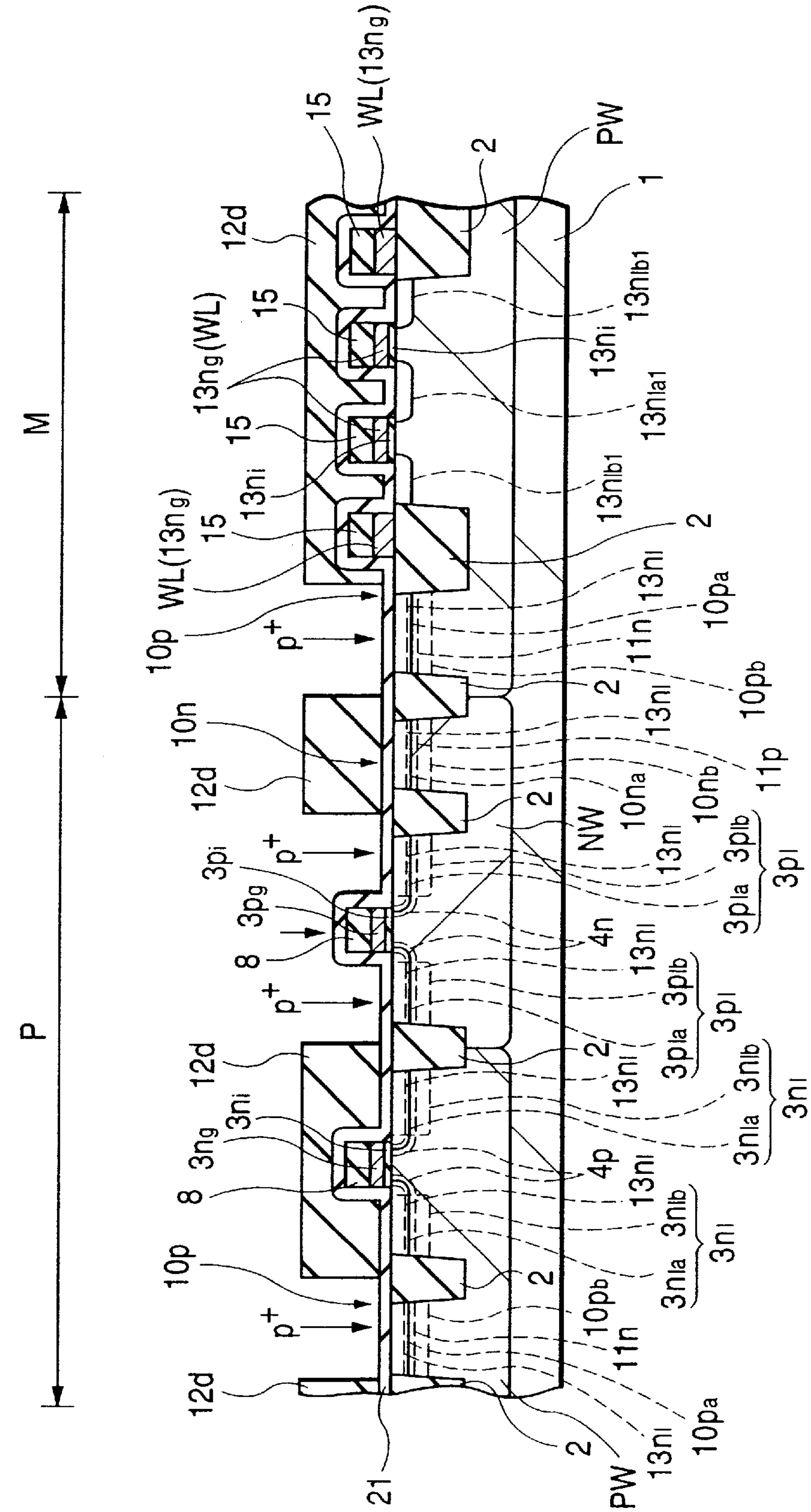
FIG. 47 is a cross section of the semiconductor integrated circuit device during the process of manufacture following the step of FIG. 46.

Then, as shown in FIG. 47, the semiconductor substrate 1 is ion-implanted with a p type impurity, such as boron, through the insulation film 21 by using as a mask the same photoresist 12*d* that was used when introducing the impurity for making the $n^-$ type semiconductor regions 4*n*, 11*n* and when introducing the impurity for making the $p^-$ type semiconductor regions 3*pla*, 10*pa*. The dose of this impurity is approximately $3\times10^{15}$ ions/$cm^2$ This impurity injection process is a process to form the $p^+$ type semiconductor region 3*plb* of the pMOS 3*p* and the $p^+$ type semiconductor region 10*pb* of the p-well power supply region.

In this process, the p type impurity is injected vertically relative to the principal surface of the semiconductor substrate 1. Furthermore, the ion implantation is performed so that the p type impurity is injected to a depth that is greater than the $n^-$ type semiconductor region 11*n* of the p-well power supply regions 10*p*, 10*p*' sufficient to isolate the device from the adjacent devices. The reason why the p type impurity is injected deeper than the $n^-$ type semiconductor region 11*n* is as follows. In the p-well power supply regions 10*p*, 10*p*' the $n^-$ type semiconductor region 11*n*, whose conduction type is inverse to that of the p-well PW, is formed to be deeper than the $p^-$ type semiconductor region 10*pa*, which makes satisfactory well connection impossible. Thus injecting the p type impurity deeper than the $n^-$ type semiconductor region 11*n* prevents the $n^-$ type semiconductor region 11*n* from being formed in the p-well power supply regions 10*p*, 10*p*' when introducing the p type impurity and therefore enables a good well connection.

Although the semiconductor regions 4*p*, 4*n*, 11*p*, 11*n*, 3*nla*, 3*nlb*, 3*pla*, 3*plb*, 10*na*, 10*nb*, 10*pa*, 10*pb*, 13*nl*, 13*nla*1, 13*nlb*1 are not formed yet at this stage of the manufacturing process, since the heat treatment to activate the impurity has not been performed, these semiconductor regions are illustrated to facilitate understanding.

With this embodiment 5, the p type semiconductor regions 3*pl* and $n^-$ type semiconductor region 4*n* required by the pMOS 3*p* and the p-well power supply region 10*p* can be formed by ion implantation processes that use the same photoresist as a mask. This greatly reduces the number of photolithographic processes, such as application, exposure and development of the photoresist film and the number of photomasks used.

Figure 48:
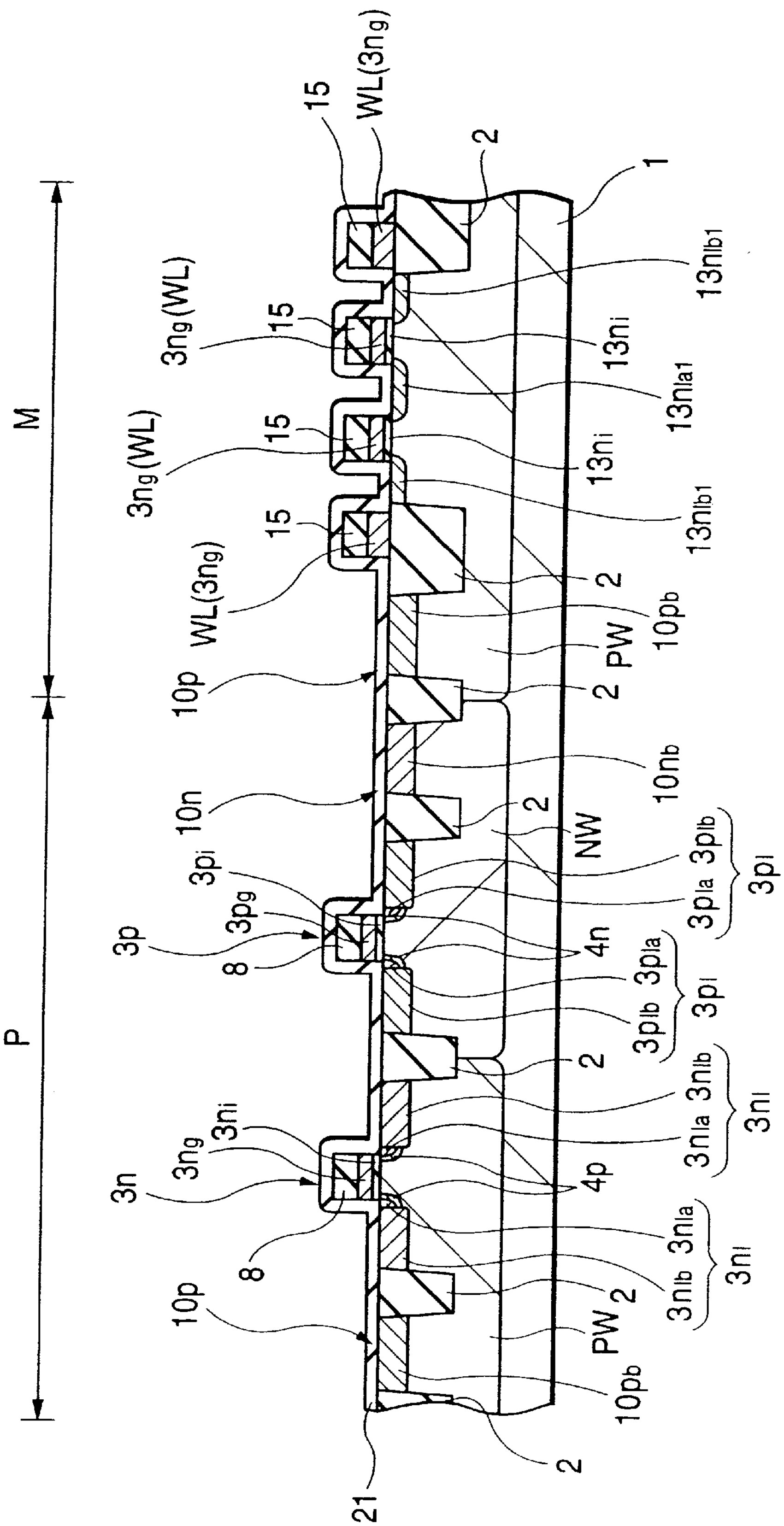
FIG. 48 is a cross section of the semiconductor integrated circuit device during the process of manufacture following the step of FIG. 47.

Next, with the photoresist 12*d* removed, the semiconductor substrate 1 is heat-treated to activate and diffuse the impurity introduced into the semiconductor substrate 1 to form, as shown in FIG. 48, the $n^-$ type semiconductor region 3*nla*, the $n^+$ type semiconductor region 3*nlb* and the $p^-$ type semiconductor region 4*p*, all constituting the nMOS 3*n*; the $p^-$ type semiconductor region 3*pla*, the $p^+$ type semiconductor region 3*plb* and the $n^-$ type semiconductor region 4*n*, all constituting the pMOS 3*p*; the $p^+$ type semiconductor region 10*pb* in the p-well power supply regions 10*p*, 10*p*'; the $n^+$ type semiconductor region 10*nb* in the n-well power supply region 10*n;* and the $n^-$ type semiconductor regions 13*nla*1, 13*nlb*1 in the memory cell area M.

Figure 49:
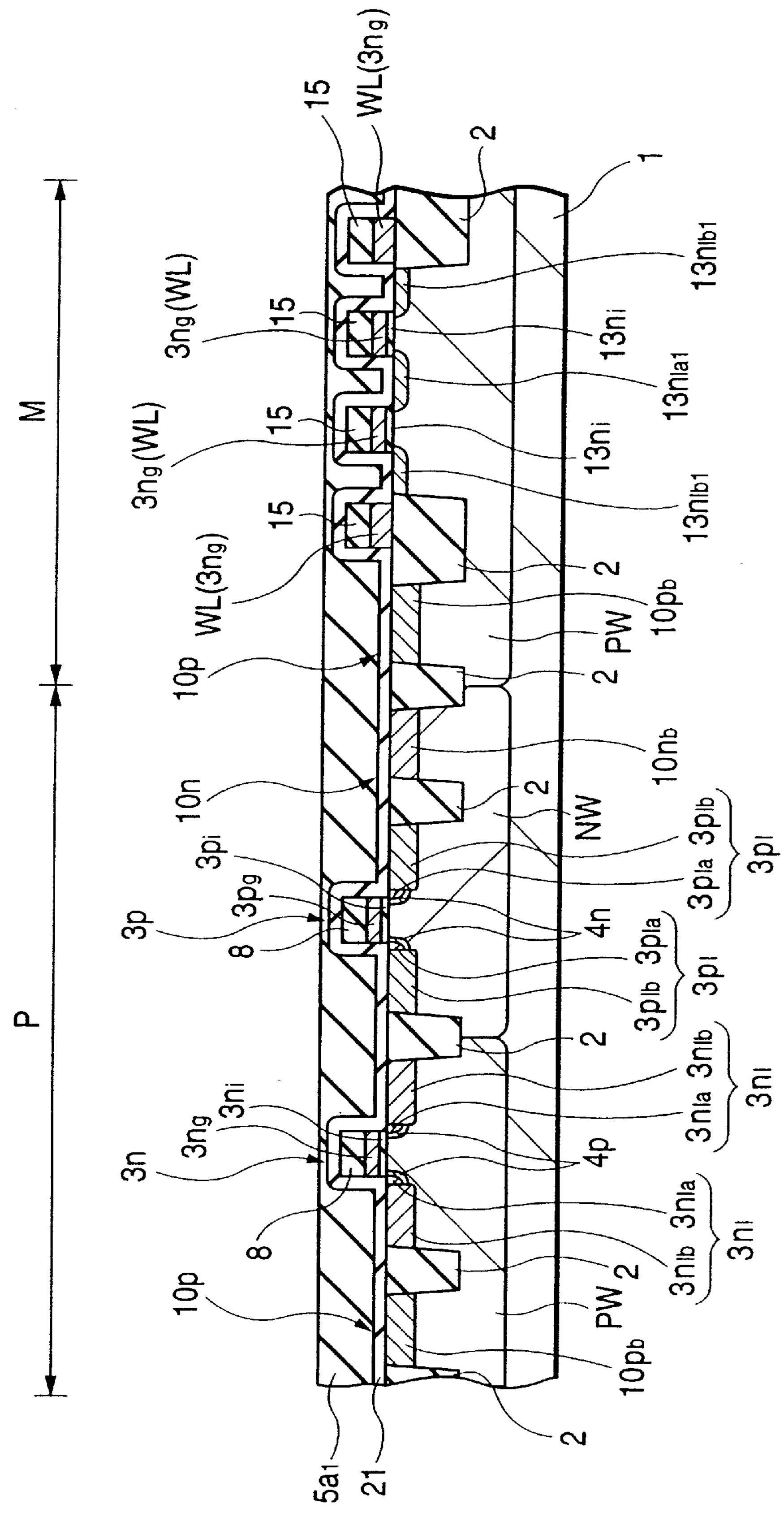
FIG. 49 is a cross section of the semiconductor integrated circuit device during the process of manufacture following the step of FIG. 48.
Figure 50:
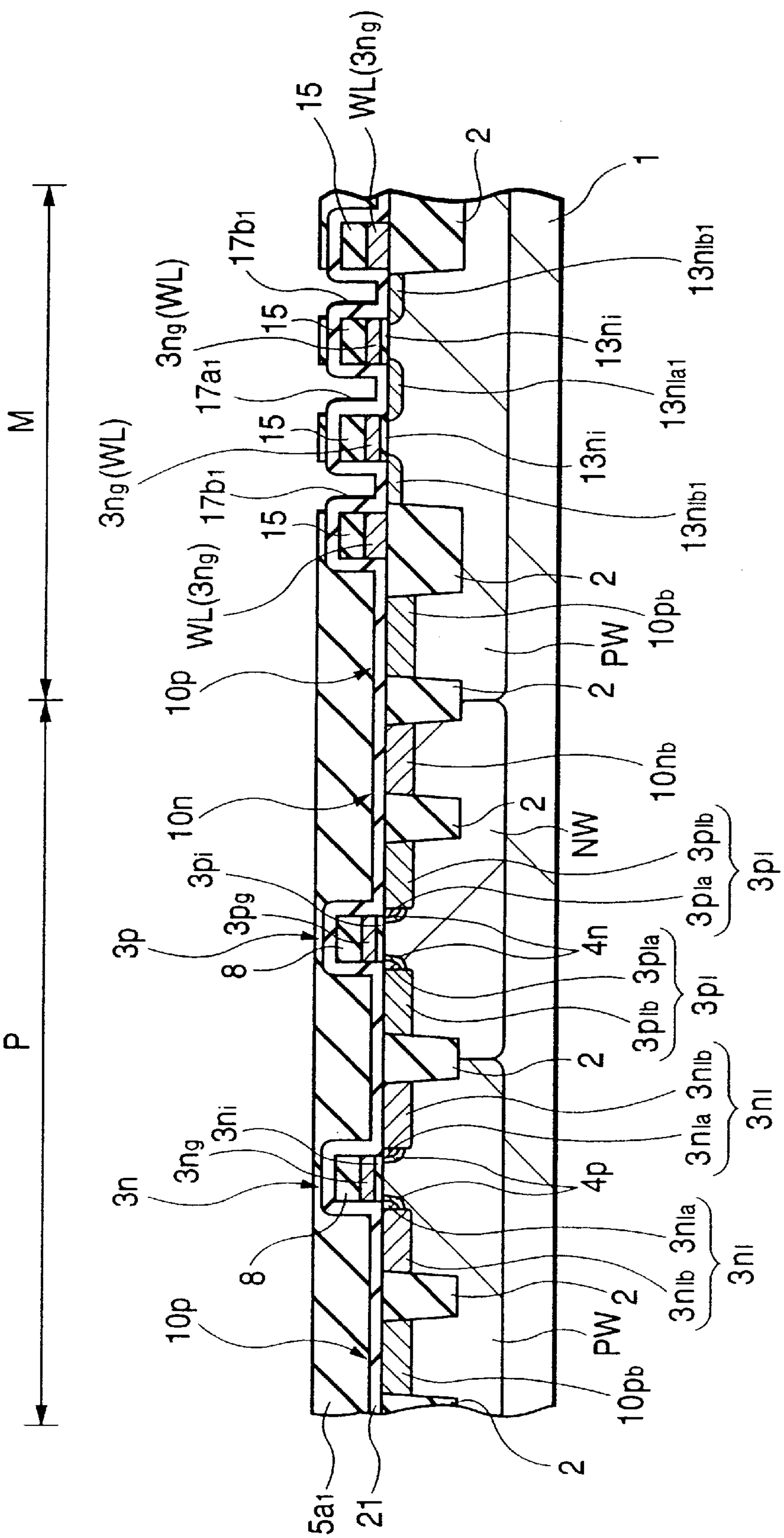
FIG. 50 is a cross section of the semiconductor integrated circuit device during the process of manufacture following the step of FIG. 49.

Next, as shown in FIG. 49, the semiconductor substrate 1 is deposited by CVD method with an interlayer insulation film 5*a*1 of, say, $SiO_2$, which is then formed with connecting holes 17*a*, 17*b* in the memory cell area M by photolithography and dry etching with the insulation film 21 and the cap insulation film 15 used as etch stoppers until the upper surface of the insulation film 21 is exposed, as shown in FIG. 50. Here, the etching is carried out with a high etch selection ratio so that the etch rate of $SiO_2$ is faster than that of silicon nitride.

Figure 51:
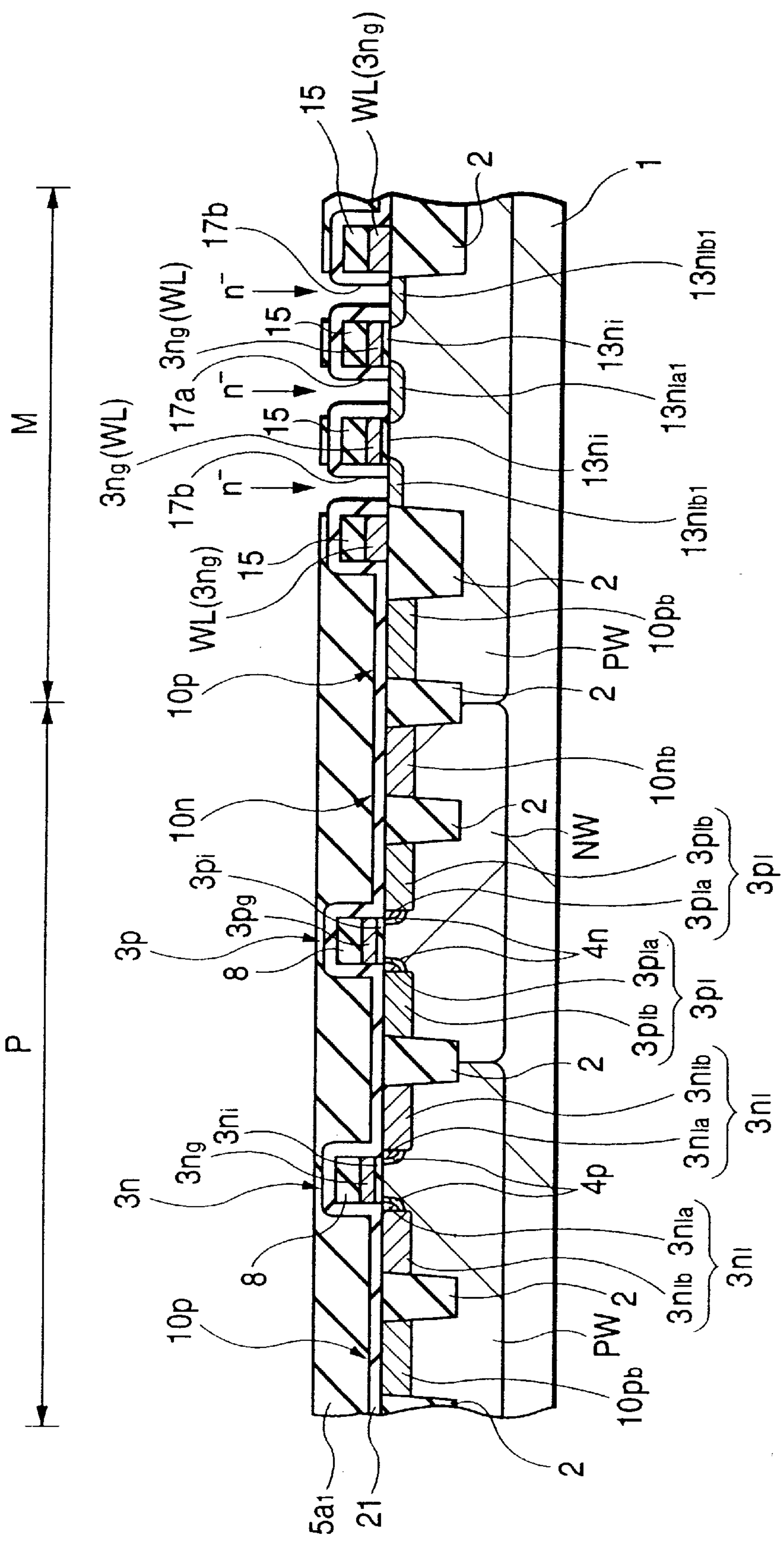
FIG. 51 is a cross section of the semiconductor integrated circuit device during the process of manufacture following the step of FIG. 50.

Now, the etching condition is changed to provide a high etch selection ratio so that the etch rate of silicon nitride is f aster than that of $SiO_2$, and the insulation film 21 remaining at the bottom of the connecting holes 17*a*, 17*b* is removed to form the connecting holes 17*a*, 17*b* that exposes the upper surface of the semiconductor substrate 1, as shown in FIG. 51. Why the etching is performed in two processes is as follows. In a structure where the insulation film 21 is not provided, when the connecting holes 17*a*, 17*b* that expose the upper surface of the semiconductor substrate 1 are formed under a condition that facilitates the etching of $SiO_2$ and if the isolating insulation film (usually $SiO_2$) of the device isolation portion 2 is exposed from the bottom of the connecting holes 17*a*, 17*b*, the isolating insulation film may also be removed, leading to a device failure. To prevent this problem, the etching is divided into two processes.

Then, the semiconductor substrate 1 is ion-implanted with an n type impurity, such as phosphorus or arsenic, through the connecting holes 17*a*, 17*b*. This impurity introducing process is a process to form the $n^-$ type semiconductor region for alleviating an electric field. In this process, the impurity is injected vertically relative to the principal surface of the semiconductor substrate 1 and to a depth greater than the $n^-$ type semiconductor regions 13*nla*1, 13*nlb*1.

Figure 52:
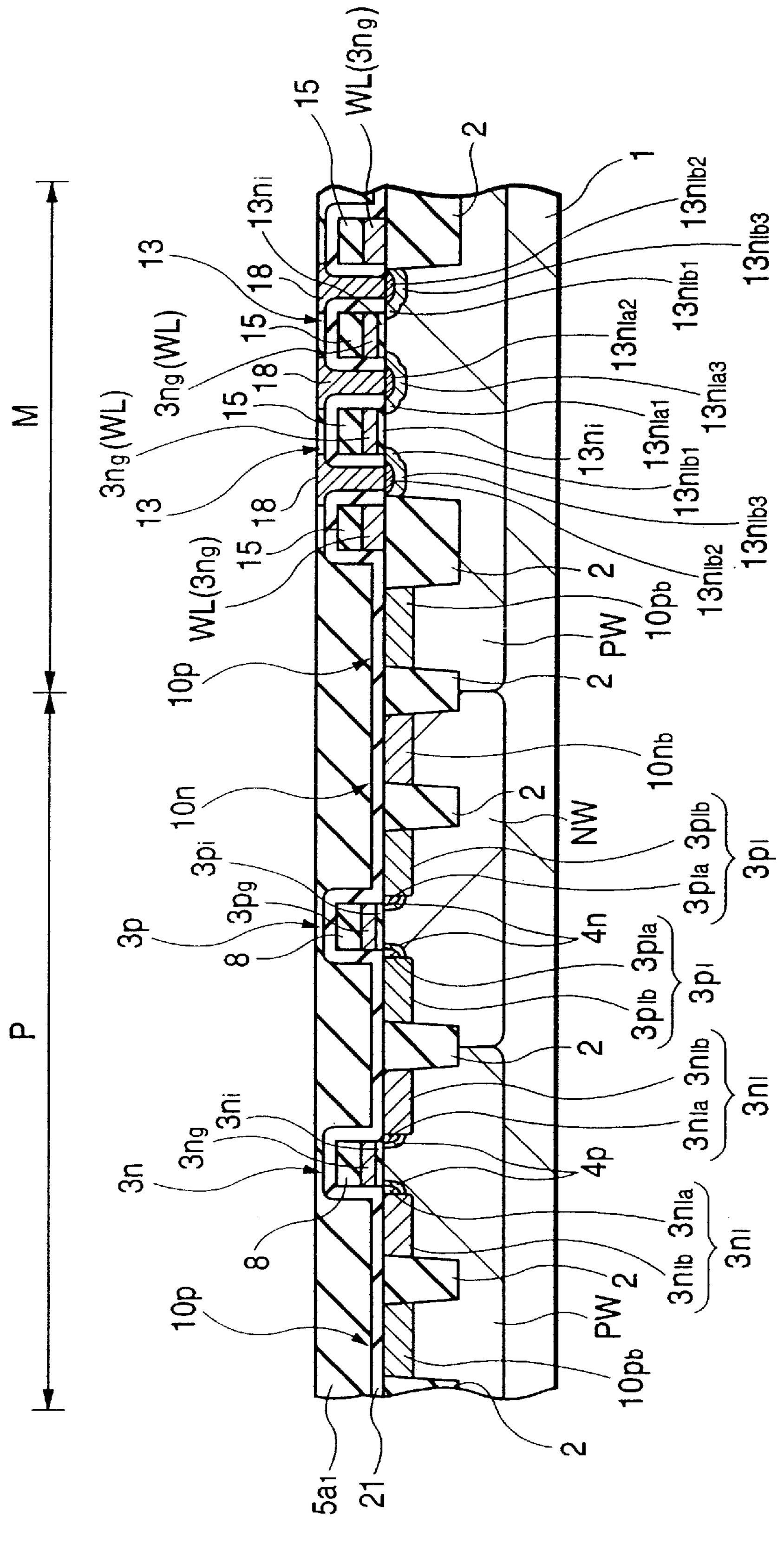
FIG. 52 is a cross section of the semiconductor integrated circuit device during the process of manufacture following the step of FIG. 51.

Next, the semiconductor substrate 1 is deposited by CVD method with a low-resistance polysilicon containing an n type impurity, such as phosphorus, which is then etched back by anisotropic dry etching or CMP (chemical mechanical polishing) to embed a conductive film 18 of low-resistance polysilicon containing an n type impurity, such as phosphorus, in the connecting holes 17*a*, 17*b*, as shown in FIG. 52. Then, the semiconductor substrate 1 is subjected to heat treatment to activate and diffuse the n type impurity injected in the semiconductor substrate 1 to form $n^-$ type semiconductor regions 13*nla*3, 13*nlb*3 for alleviating an electric field and also to diffuse the n type impurity, phosphorus, contained in the conductive film 18 into the semiconductor substrate 1 to form $n^+$ type semiconductor regions 13*nla*2, 13*nlb*2. Now, the selection MOS 13 is formed.

The method of forming the conductive film 18 is not limited to the above method and the following method may be used, for example. First, the connecting holes 17*a*, 17*b* are formed and then the semiconductor substrate 1 is provided by CVD method with a non-doped polysilicon, the upper part of which is then etched back in a manner described above to embed a non-doped polysilicon film in the connecting holes 17*a*, 17*b*. Next, an n type impurity, such as phosphorus or arsenic, is ion-implanted into the non-doped polysilicon film. Then, the semiconductor substrate 1 is heat-treated to activate the impurity implanted in the non-doped polysilicon film and thereby form the conductive film 18.

Figure 53:
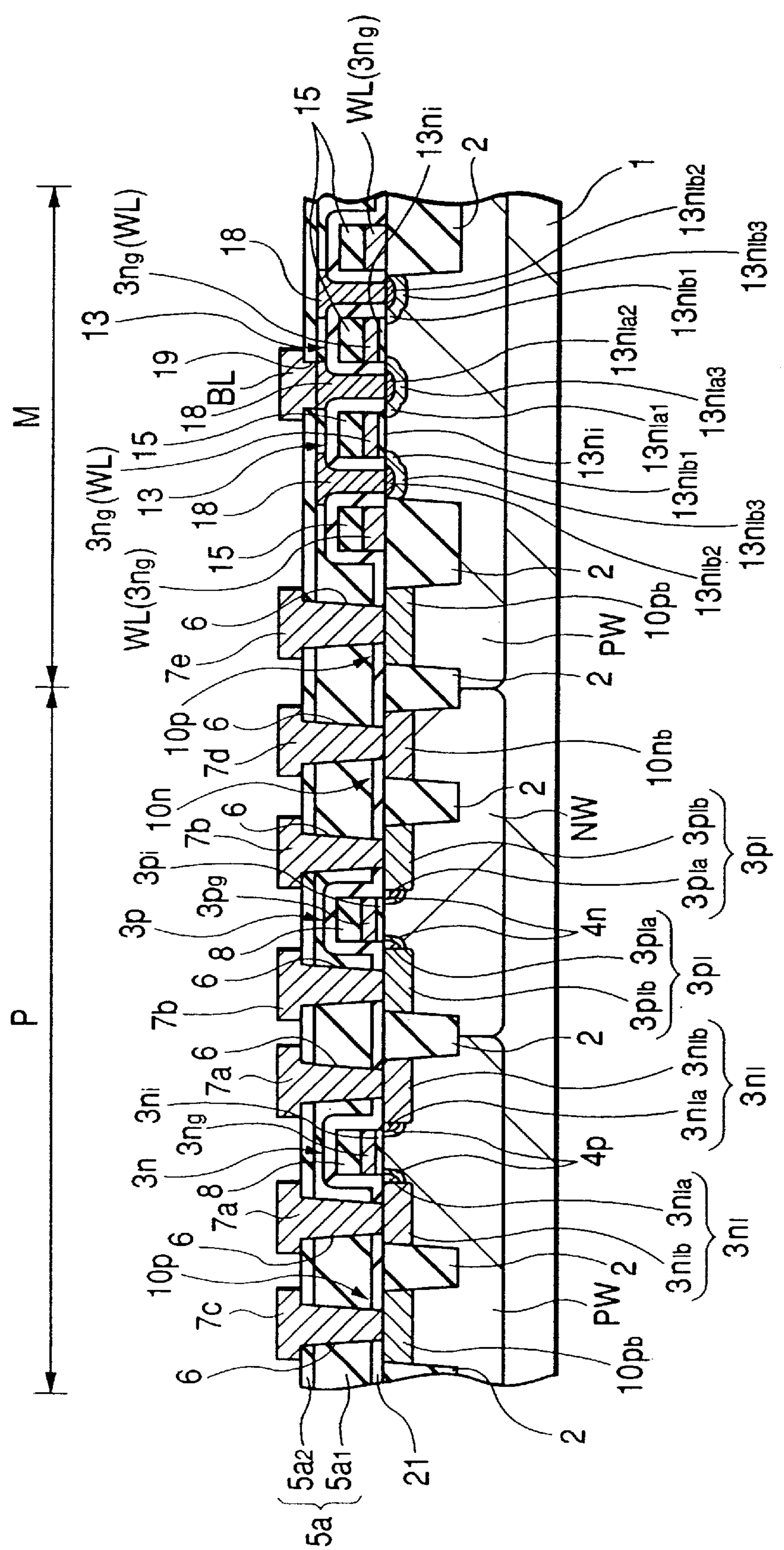
FIG. 53 is a cross section of the semiconductor integrated circuit device during the process of manufacture following the step of FIG. 52.

Next, as shown in FIG. 53, the semiconductor substrate 1 is provided by the CVD method with an interlayer insulation film 5*a*2 of, say, $SiO_2$. Then, a part of the interlayer insulation film 5*a* (5*a*1, 5*a*2) is formed, by photolithography and dry etching, with the connecting holes 6 that reach the principal surface of the semiconductor substrate 1 and with the connecting holes 19 that reach the upper part of the conductive film 18.

After this, the interlayer insulation film 5*a* is deposited by sputtering with a conductive film, such as a single layer of tungsten or a Ti/TiN/W laminated film, which is then patterned by photolithography and dry etching to form electrodes 7*a*–7*e* and the bit line BL.

Figure 54:
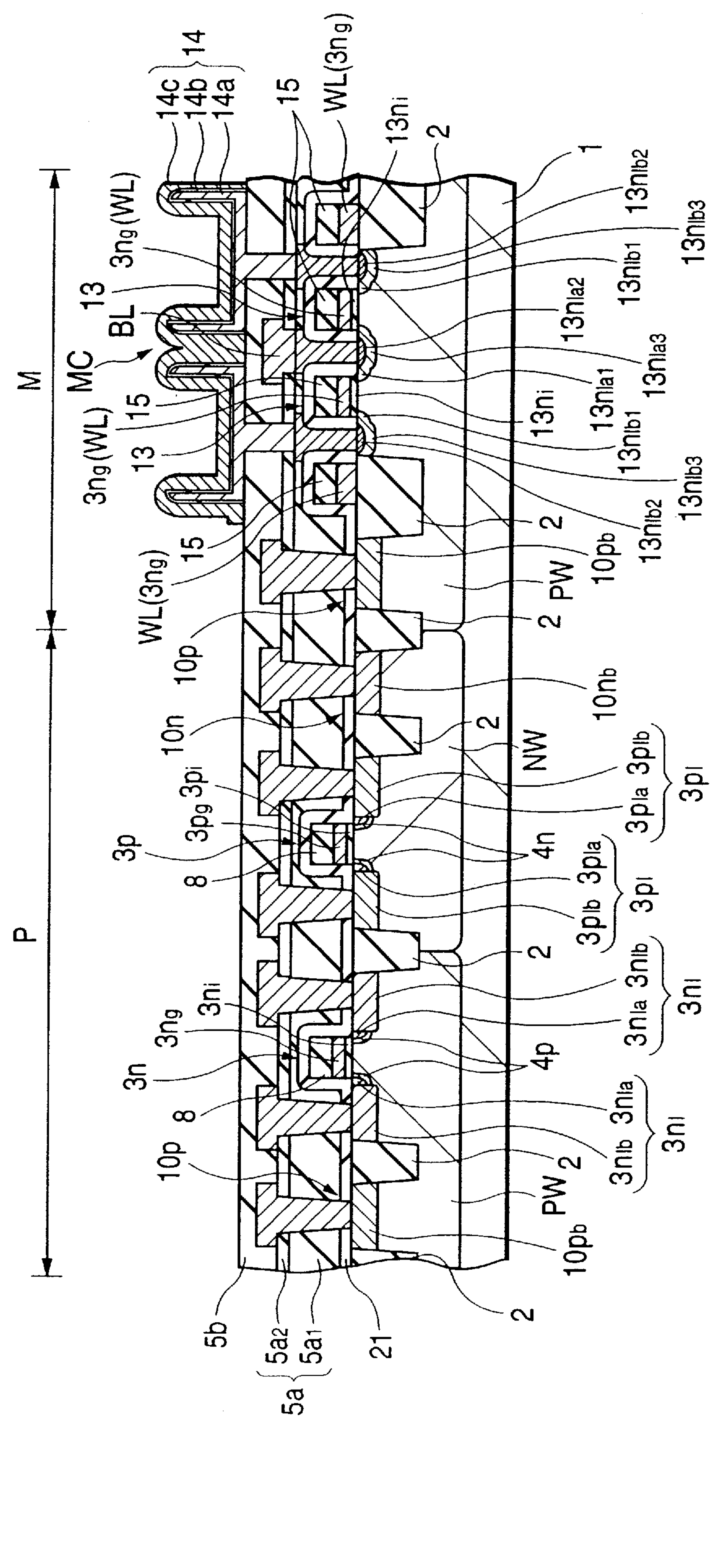
FIG. 54 is a cross section of the semiconductor integrated circuit device during the process of manufacture following the step of FIG. 53.

Then, as shown in FIG. 54, the semiconductor substrate 1 is provided by the CVD method with an interlayer insulation film 5*b* of, say, $SiO_2$ to cover the electrodes 7*a*–7*e* and the bit line BL, after which a crown-shaped capacitor 14 is formed.

Next, the impurity concentration distributions in various parts of the semiconductor integrated circuit device of the embodiment 5 will be explained by referring to FIGS. 55 to 58.

Figure 55:
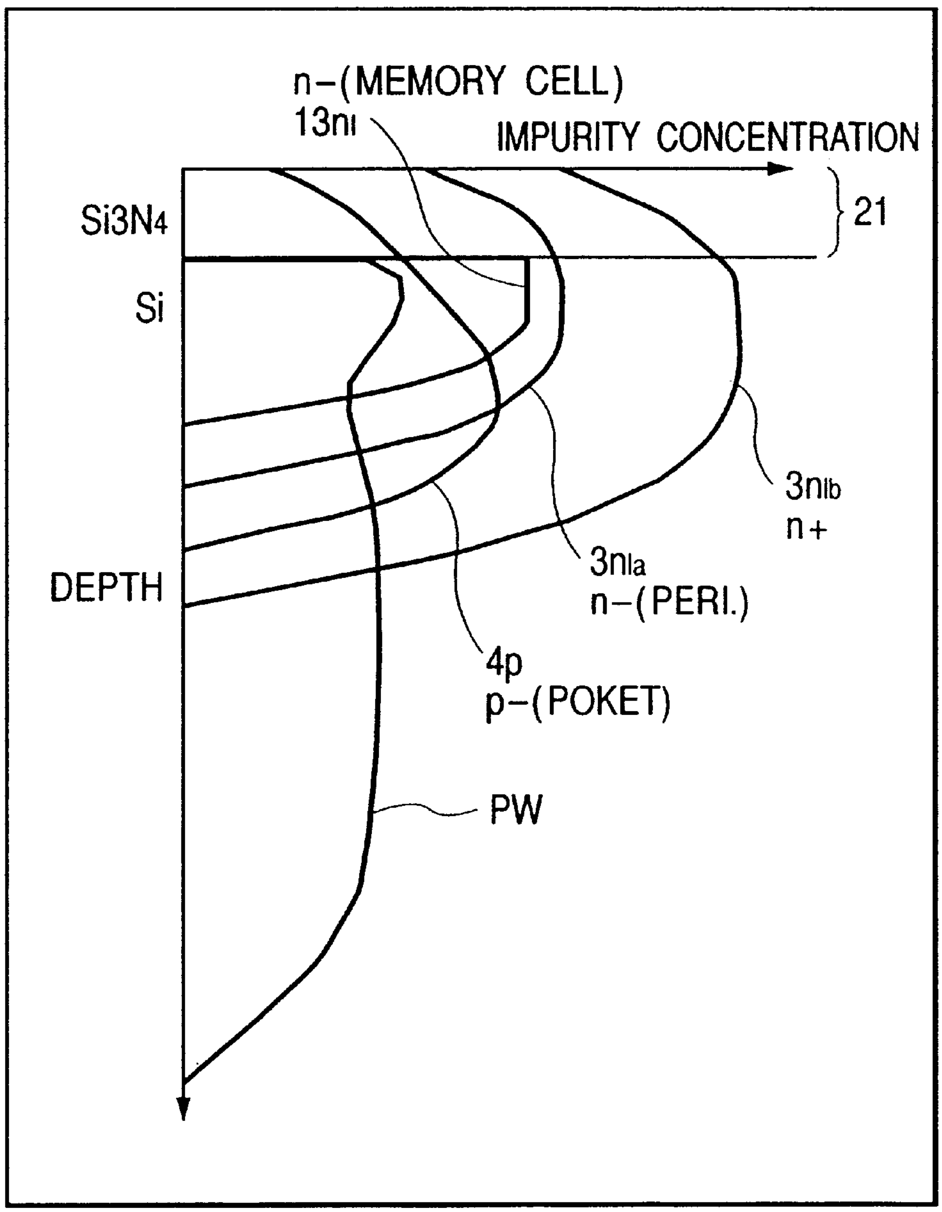
FIG. 55 is a graph showing an impurity concentration distribution in an essential part of the semiconductor integrated circuit device of this embodiment.

FIG. 55 shows the impurity concentration distributions in the source and the drain regions of the nMOS 3*n*. The impurity concentration distribution in the $n^-$ type semiconductor region 3*nla* extends to a greater depth and has a higher concentration than the impurity distribution of the $n^-$ type semiconductor region 13*nl* of the memory cell. The impurity concentration distribution of the $p^-$ type semiconductor region 4*p* for suppressing the short channel effect extends to a greater depth than the impurity concentration distribution of the $n^-$ type semiconductor region 3*nla*. Further, the $N^+$ type semiconductor region 3*nlb* has a higher concentration and extends deeper than the impurity concentration distributions of the $n^-$ type semiconductor region 3*nla* and the $p^-$ type semiconductor region 4*p*. The impurity concentration distributions of the $n^-$ type semiconductor region 3*nla*, the $p^-$ type semiconductor region 4*p* for suppressing the short channel effect, and the $n^+$ type semiconductor region 3*nlb* exist also in the insulation film 21 because the impurities for these regions are injected into the semiconductor substrate 1 through the insulation film 21.

Figure 56:
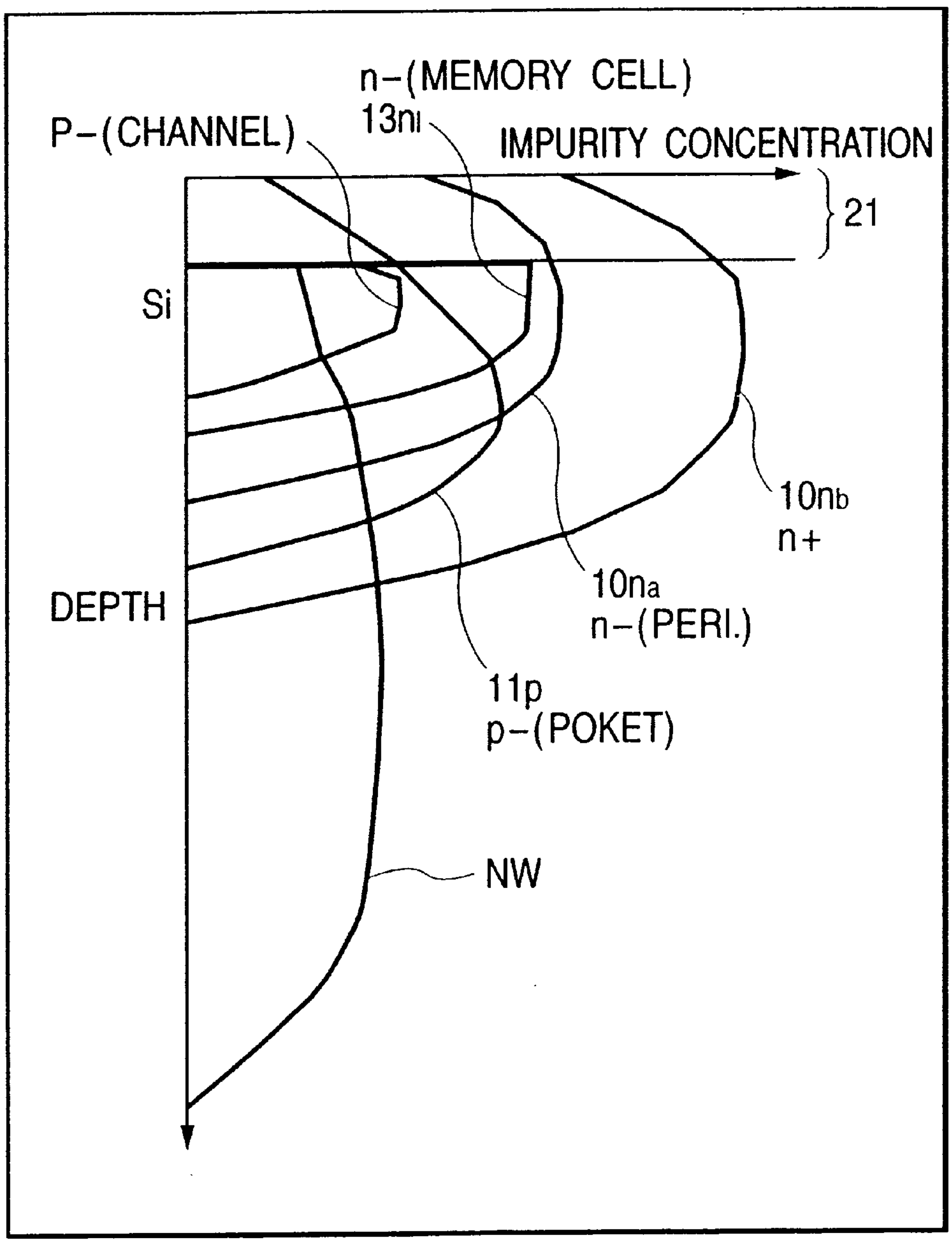
FIG. 56 is a graph showing an impurity concentration distribution in an essential part of the semiconductor integrated circuit device of this embodiment.

FIG. 56 shows impurity concentration distributions in the n-well power supply region 10*n*. The impurity distribution of the $p^-$ type semiconductor region 11*p* extends deeper than the impurity distribution of the $n^-$ type semiconductor region 10*na*. The $n^+$ type semiconductor region 10*nb* has a higher concentration and extends deeper than the $p^-$ type semiconductor region 11*p*. Thus, it is possible to supply the well voltage to the n-well NW in a satisfactory condition. The $p^-$ (Channel) represents the concentration distribution of the impurity introduced into the channel to set the threshold voltage of the pMOS 3*p*. The impurity concentration distributions of the $n^-$ type semiconductor region 10*na*, the $p^-$ type semiconductor region 11*p*, and the $n^+$ type semiconductor region 10*nb* exist also in the insulation film 21 because the impurities for these regions are injected into the semiconductor substrate 1 through the insulation film 21.

Figure 57:
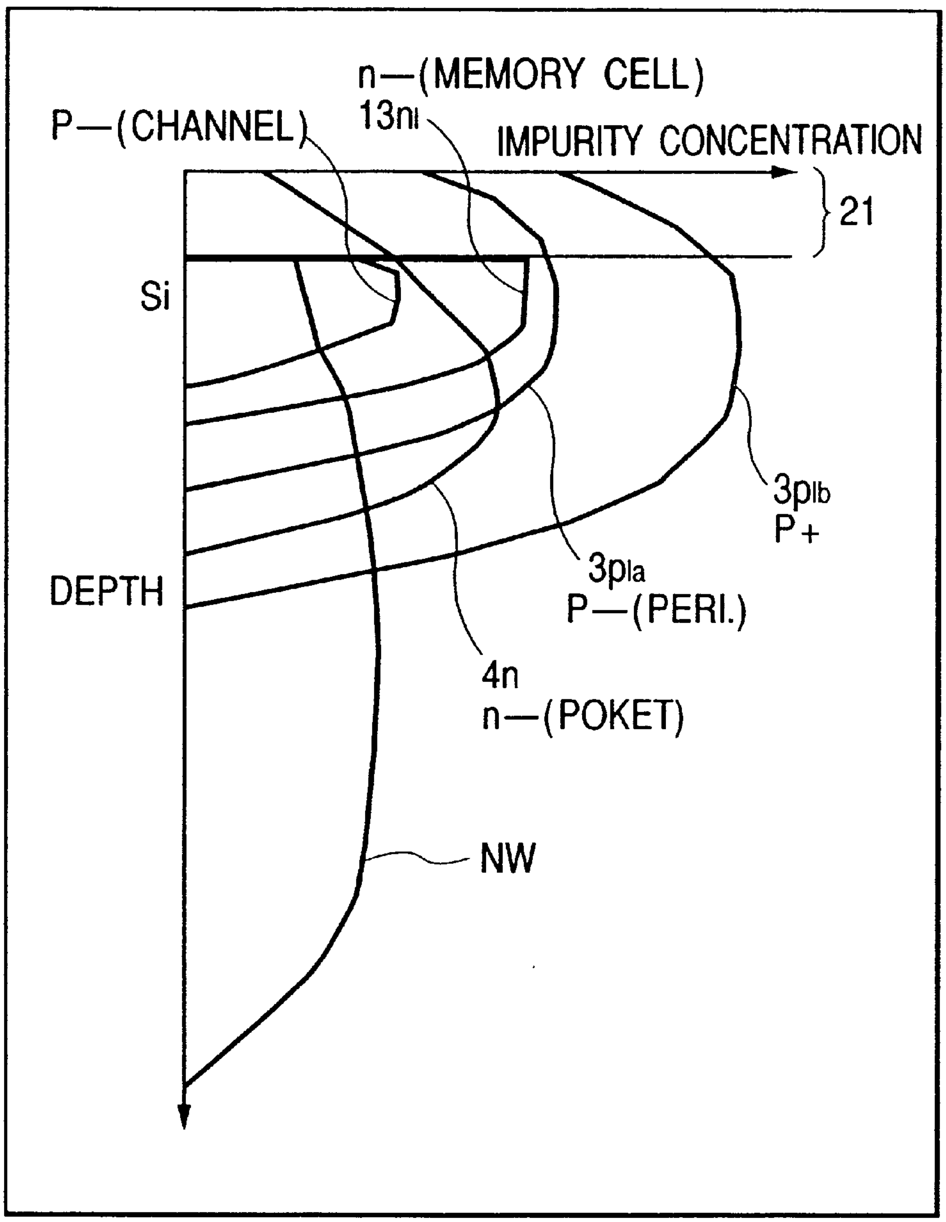
FIG. 57 is a graph showing an impurity concentration distribution in an essential part of the semiconductor integrated circuit device of this embodiment.

FIG. 57 shows the impurity concentration distributions in the source and the drain of the pMOS 3*p*. The impurity concentration distribution of the $p^-$ type semiconductor region 3*pla* has a higher concentration and extends deeper than the impurity distribution of the $n^-$ type semiconductor region 13*nl* of the memory cell. The impurity concentration distribution of the $n^-$ type semiconductor region 4*n* for suppressing the short channel effect extends deeper than the impurity concentration distribution of the $p^-$ type semiconductor region 3*pla*. Further, the $p^+$ type semiconductor region 3*plb* has a higher concentration and extends deeper than the impurity concentration distribution of the $p^-$ type semiconductor region 3*pla* and the $n^-$ type semiconductor region 4*n*. The $p^-$ (Channel) represents the concentration distribution of the impurity introduced into the channel to set the threshold voltage of the pMOS 3*p*. The impurity concentration distributions of the $p^-$ type semiconductor region 3*pla*, the $n^-$ type semiconductor region 4*n* for suppressing the short channel effect, and the $p^+$ type semiconductor region 3*plb* exist also in the insulation film 21 because the impurities for these regions are injected into the semiconductor substrate 1 through the insulation film 21.

Figure 58:
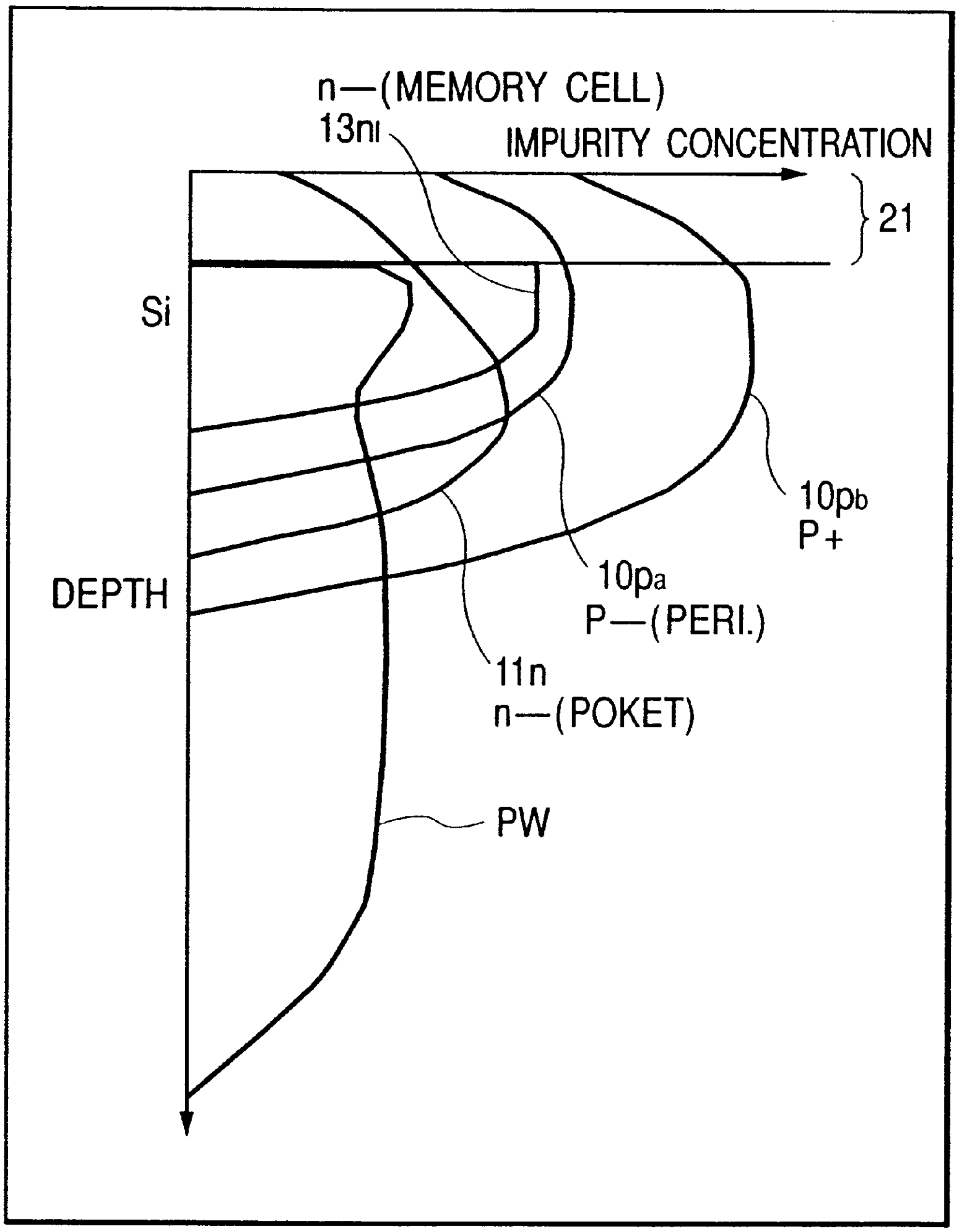
FIG. 58 is a graph showing an impurity concentration distribution in an essential part of the semiconductor integrated circuit device of this embodiment.

FIG. 58 shows impurity concentration distributions in the p-well power supply region 10*p*. The impurity distribution of the $n^-$ type semiconductor region 11*n* extends deeper than the impurity distribution of the $p^-$ type semiconductor region 10*pa*. The $p^+$ type semiconductor region 10*pb* has a higher concentration and extends deeper than the impurity distribution of the $n^-$ type semiconductor region 11*n*. Thus, the p-well PW, too, can be supplied with a well voltage in good condition. The impurity concentration distributions of the $p^-$ type semiconductor region 10*pa*, the $n^-$ type semiconductor region 11*n*, and the $p^+$ type semiconductor region 10*pb* exist also in the insulation film 21 because the impurities for these regions are injected into the semiconductor substrate 1 through the insulation film 21.

The structure and the impurity concentration distributions of the memory cell area M are similar to those of the embodiment 4, except that the insulation film 21 is provided in the embodiment 5. So, explanations thereof are omitted.

The embodiment 5 of the above configuration can provide the following advantages in addition to those offered by the embodiments 1, 2 and 4.

(1) Because the dry etching process and the cleaning and drying process for making sidewalls on the side surfaces of the gate electrodes 3*ng*, the cap insulation film 8, the gate electrode 13*ng* (word line WL) and the cap insulation film 15 are eliminated, it is possible not only to shorten the manufacturing time and reduce the manufacturing cost of semiconductor integrated circuit devices, but it is possible also to lower the failure rate resulting from foreign substances and improve the yield and reliability of the semiconductor integrated circuit devices.

(2) Because the connecting holes 17*a*, 17*b* to expose the semiconductor regions 13*nla*, 13*nlb* of the selection MOS 13 are formed in two separate processes, the upper part of the isolation insulation film of the device isolation portion 2 in the upper part of the semiconductor substrate 1 can be prevented from being partially removed when forming the connecting holes 17*a*, 17*b*. It is therefore possible to prevent degradation of the characteristic of the memory cell resulting from this unwanted removal of the semiconductor substrate 1.

(3) Because the feature (2) can reduce the margin for horizontal positional alignment of the connecting holes 17*a*, 17*b*, the memory cell can be reduced in size, thereby improving the level of circuit integration and the functions of the semiconductor integrated circuit device.

(Embodiment 6)

Figure 78:
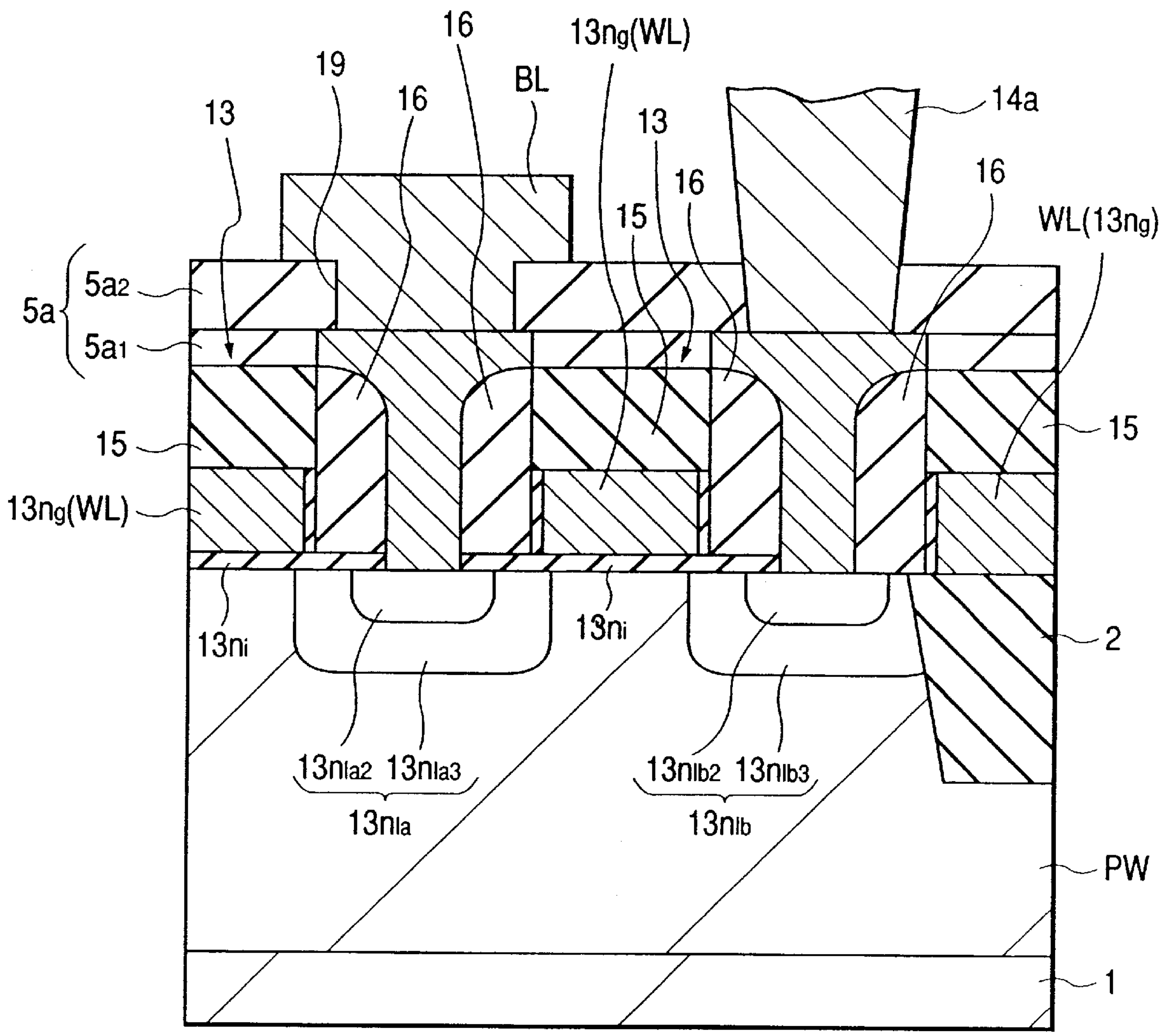
FIG. 78 is an enlarged cross section of a memory cell region in the semiconductor integrated circuit device of this embodiment.
Figure 79:
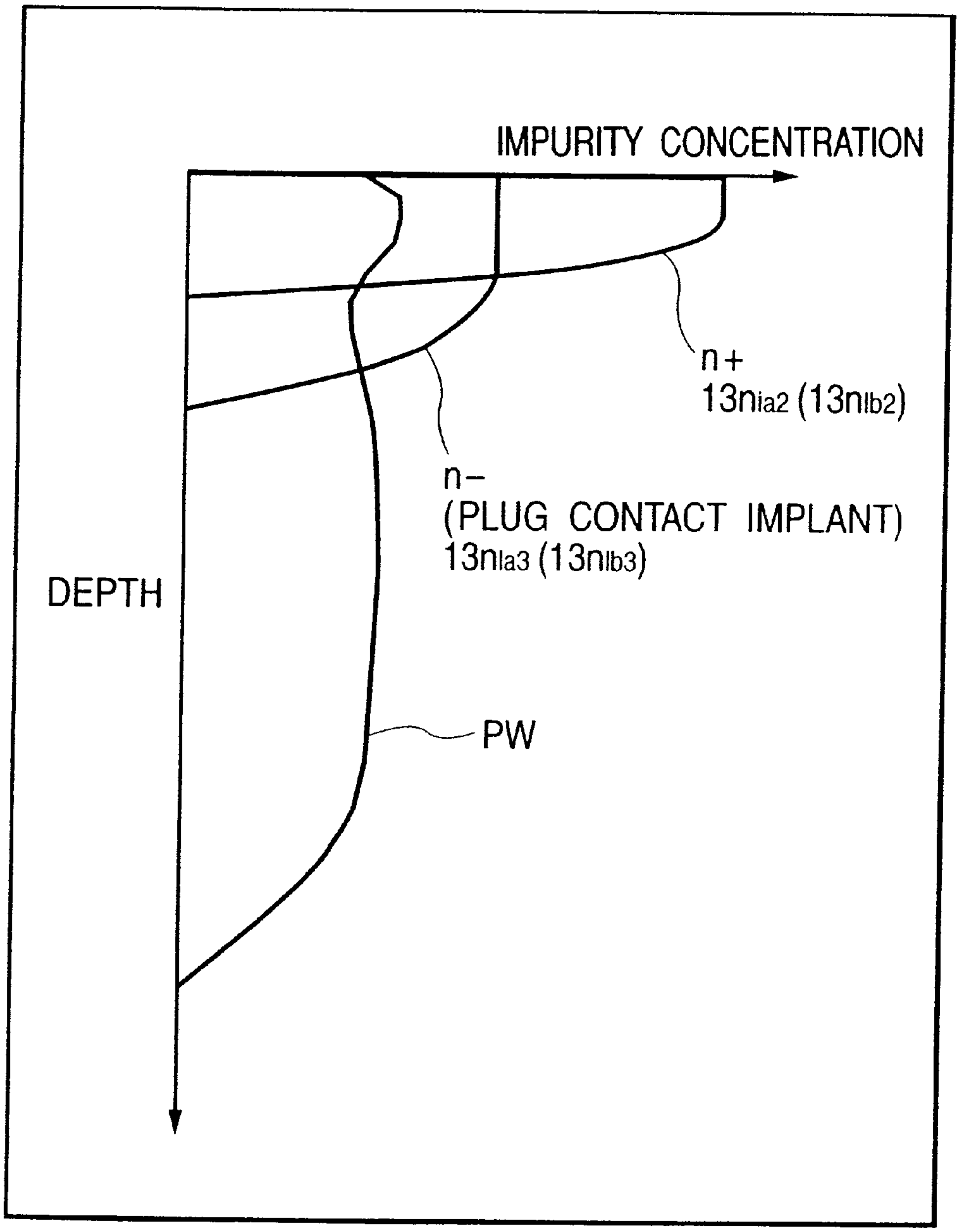
FIG. 79 is a graph showing an impurity concentration distribution in the source and drain of the memory cell selection MOSFET of FIG. 78.

FIGS. 59 to 73 are cross sections of a semiconductor integrated circuit device of a further embodiment of this invention. FIGS. 74 to 77 are graphs showing impurity concentration distributions in various parts of the semiconductor integrated circuit device of this embodiment. FIG. 78 is an enlarged cross section of the memory cell area in the semiconductor integrated circuit device of this embodiment. FIG. 79 is a graph showing the impurity concentration distribution in the source and the drain of the memory cell selection MOSFET of FIG. 78.

Figure 59:
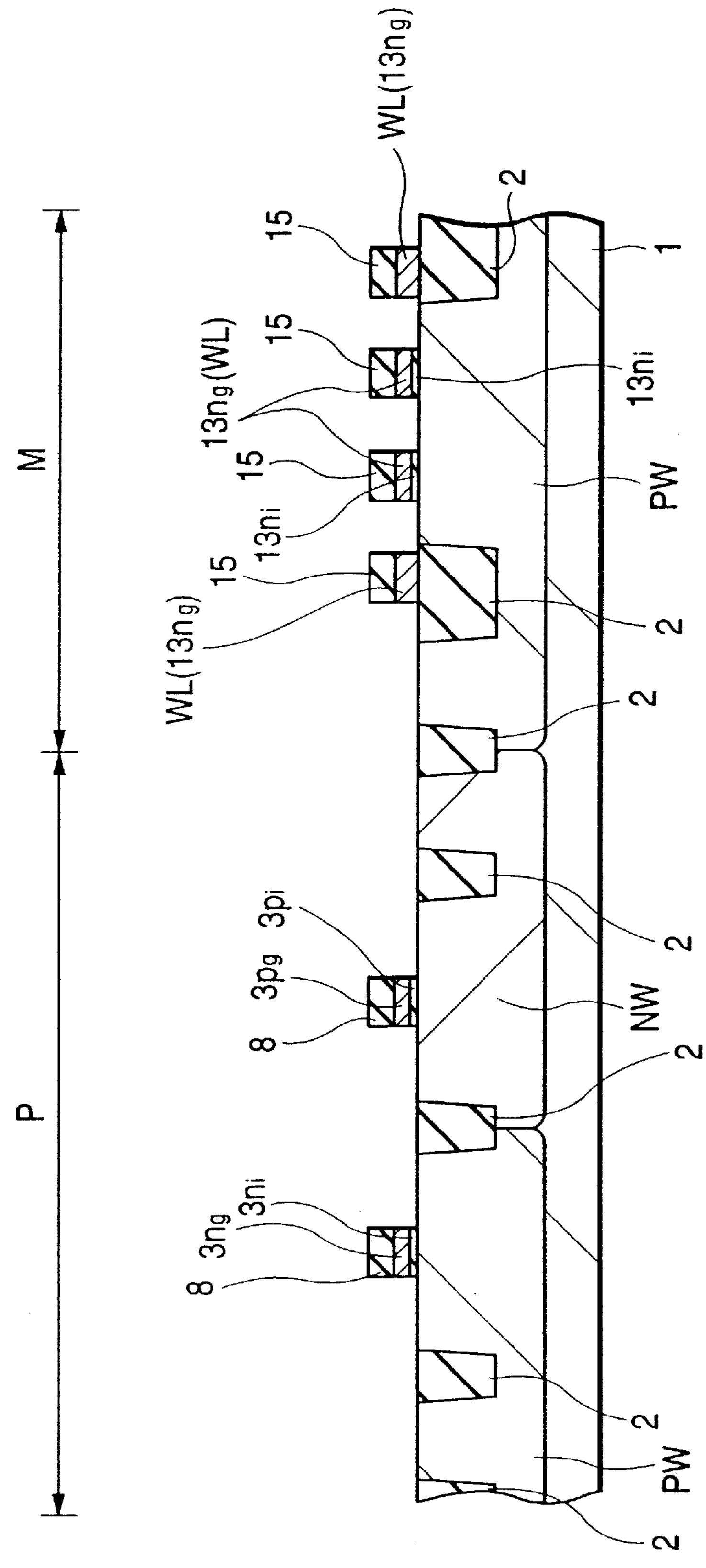
FIG. 59 is a cross section of a semiconductor integrated circuit device of a further embodiment of this invention during the process of manufacture.

FIG. 59 shows the cross section of the semiconductor integrated circuit device of the embodiment 6. The semiconductor substrate 1 is already formed with a p-well PW, an n-well NW, a device isolation portion 2, gate electrodes 3*ng*, 3*pg*, 13*ng* and cap insulation films 8, 15. The gate electrodes 3*ng*, 3*pg*, 13*ng* are formed of a single film of, say, low-resistance polysilicon. Alternatively, they may also be formed in a so-called polycide structure having a silicide film of, say, tungsten silicide laminated over the low-resistance polysilicon film, or in a so-called polymetal structure in which a metal film, such as a tungsten film, is laminated over the low-resistance polysilicon film with a barrier metal film of titanium nitride or tungsten nitride interposed therebetween. The cap insulation film 8 may be formed of silicon nitride.

The cap insulation film 8 is made, for example, of silicon nitride. At this stage, the impurity implantation process to form the $n^-$ type semiconductor regions 13*nla*1, 13*nlb*1 for the memory cell selection MOSFET, described in the previous embodiment 4 and 5, is not performed yet.

Figure 60:
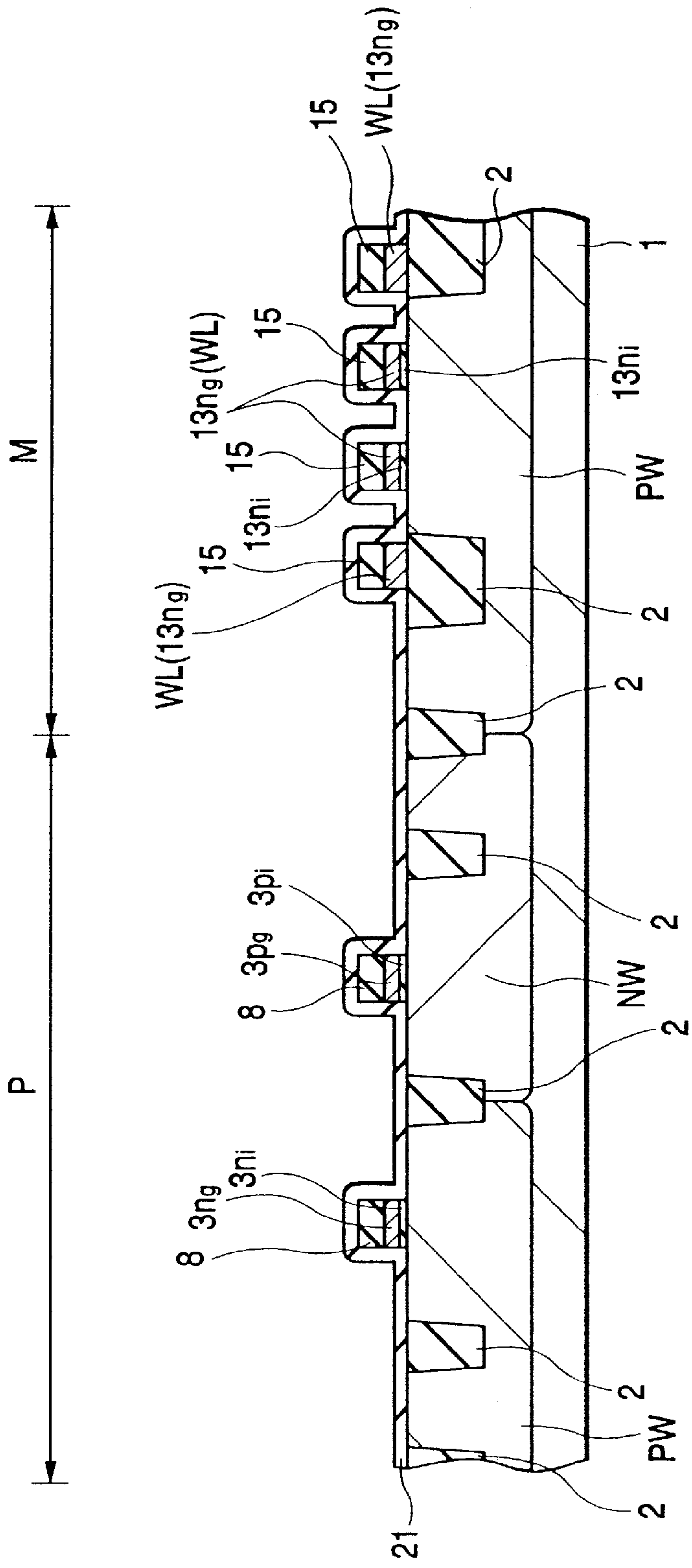
FIG. 60 is a cross section of the semiconductor integrated circuit device of FIG. 59 during the process of manufacture.

First, as shown in FIG. 60, the semiconductor substrate 1 is provided, by CVD method, with an insulation film 21 of, say, silicon nitride to cover the upper surface of the semiconductor substrate 1, including the device isolation portion 2 and the surfaces (side and upper surfaces) of the gate electrodes 3*ng*, 3*pg*, the cap insulation film 8, the gate electrode 13*ng* (word line WL) and the cap insulation film 15.

Figure 61:
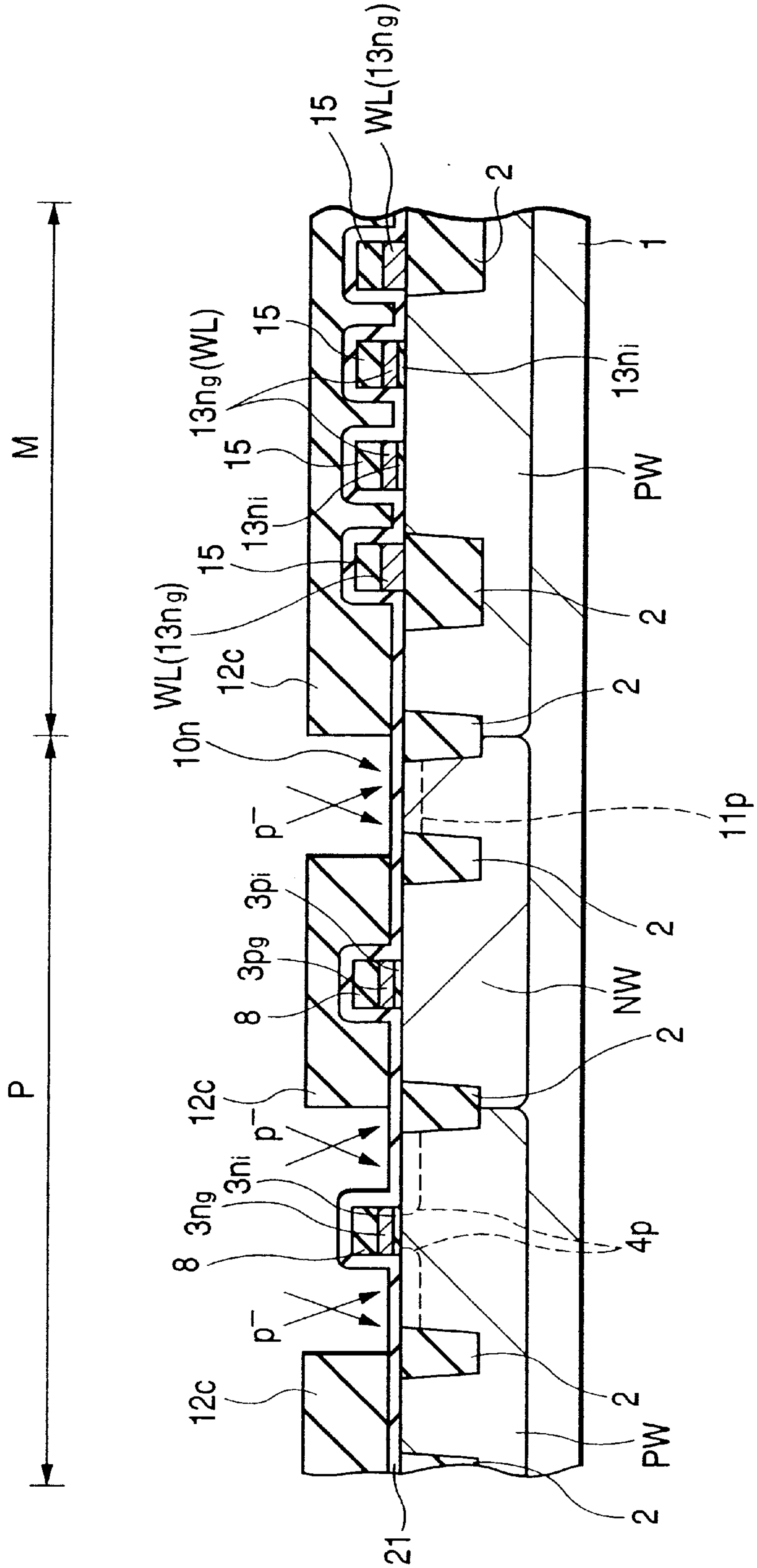
FIG. 61 is a cross section of the semiconductor integrated circuit device during the process of manufacture following the step of FIG. 60.

Without performing the impurity implantation process for making the $n^-$ type semiconductor regions 13*nla*1, 13*nlb*1 of the memory cell selection MOSFET nor the process of forming sidewalls on the side surfaces of the gate electrodes 3*ng*, 3*pg*, the cap insulation film 8, the gate electrode 13*ng* (word line WL) and the cap insulation film 15, the insulation film 21 is formed by photolithography, with a photoresist (first mask) 12*c* that, as shown in FIG. 61, exposes the nMOS formation region and n-well power supply region 10*n* in the peripheral circuit area P and covers the pMOS formation region in the peripheral circuit area P, the p-well power supply regions 10*p*, 10*p*' in the peripheral circuit area P and the memory cell area M, and also the memory cell area M.

That is, by not performing the impurity introducing process for making the $n^-$ type semiconductor regions 13*nla*1, 13*nlb*1 for the memory cell selection MOSFET, the manufacturing time and cost of the semiconductor integrated circuit device can be reduced. Because the concentration of the impurity introduced into the semiconductor substrate 1 can be reduced, the junction capacitance can be reduced, improving the operation speed of the semiconductor integrated circuit device. Further, the short channel characteristic of the memory cell selection MOSFET is improved allowing the use of shorter gate lengths.

Those parts of the insulation film 21 on the side surfaces of the gate electrodes 3*ng*, 3*pg*, the cap insulation film 8, the gate electrode 13*ng* (word line WL) and the cap insulation film 15 serve as sidewalls, which were explained in connection with the embodiment 4. This eliminates the need for the processes for forming the sidewalls. Elimination of the dry etching process and the cleaning and drying processes for making the sidewalls can not only reduce the manufacturing time of the semiconductor integrated circuit device, but it will also lower the failure rate resulting from foreign matter, which in turn leads to improved yield and reliability of the semiconductor integrated circuit device.

Next, as in the embodiment 5, using the photoresist 12*c* as a mask, a p type impurity, such as boron, is ion-implanted into the semiconductor substrate 1 through the insulation film 21. The dose of the impurity is around $4\times10^{12}$ ions/cm$^2$. This impurity introducing process is a process to form the $p^-$ type semiconductor region 4*p* for suppressing the short channel effect on the nMOS in the peripheral circuit area P.

During this process, the semiconductor substrate 1 is tilted to inject the impurity at an inclined angle into the principal surface of the semiconductor substrate 1. This is to ensure that the impurity can reach the edge of the gate electrode and that the shadowing effect caused by the gate electrode can be prevented. With this method, it is possible to introduce the impurity below the edge of the gate electrode 3*ng* in the nMOS formation region and, in the n-well power supply region 10*n*, to form the $p^-$ type semiconductor region 11*p* so as to be relatively shallow. The impurity may be implanted in four or more directions.

Although the semiconductor regions 4*p*, 11*p* are not formed yet at this stage of the manufacturing process, since the heat treatment to activate the impurity has not been performed, these semiconductor regions are illustrated to facilitate understanding.

Figure 62:
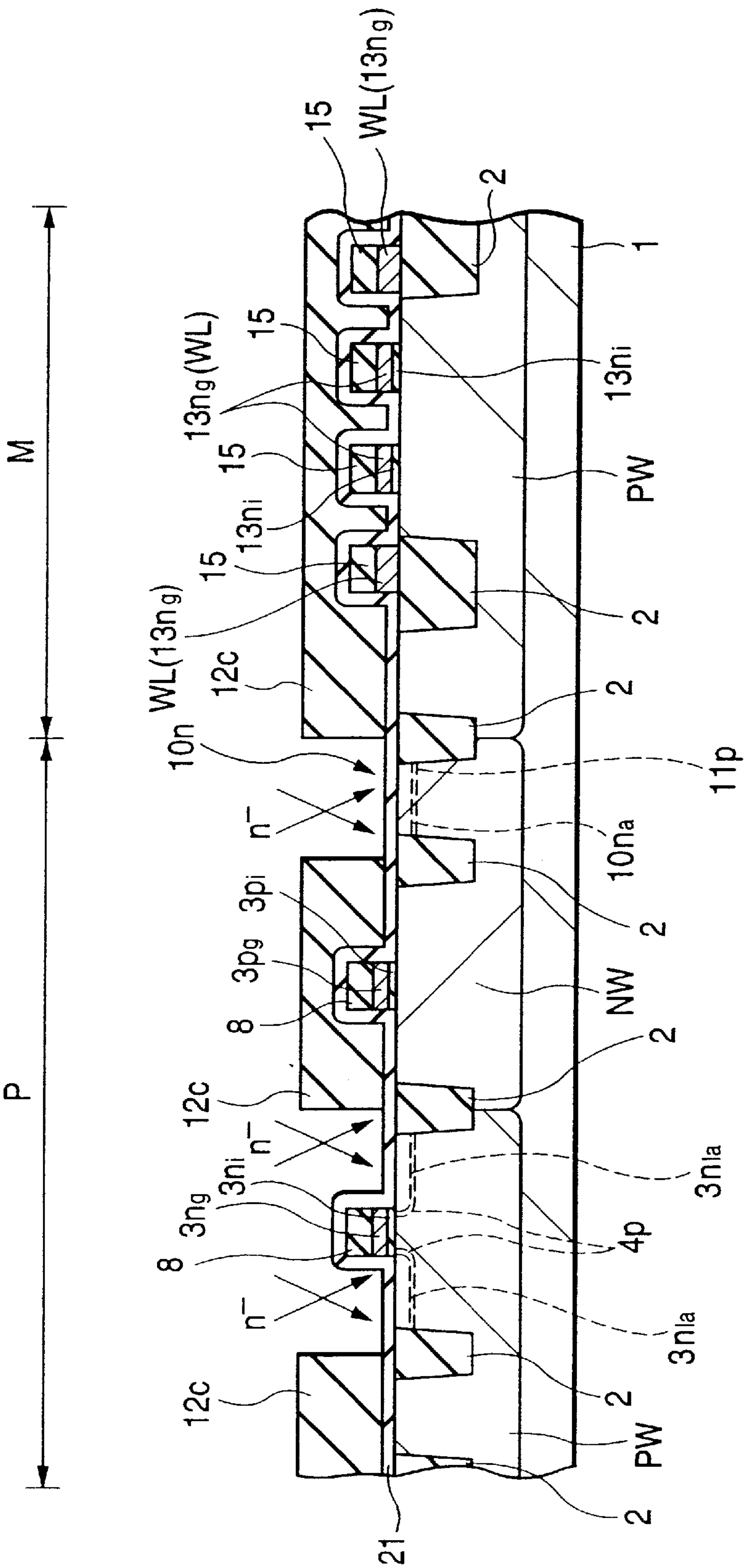
FIG. 62 is a cross section of the semiconductor integrated circuit device during the process of manufacture following the step of FIG. 61.

Then, as shown in FIG. 62, by using as a mask the photoresist 12*c* that was used when introducing the impurity for making the $p^-$ type semiconductor regions 4*p*, 11*p*, an n type impurity, such as phosphorus or arsenic, is ion-implanted into the semiconductor substrate 1 through the insulation film 21. The dose of the impurity is around $1\times10^{14}$ ions/cm$^2$. This impurity introducing process is a process to form the $n^-$ type semiconductor region 3*nla* of the nMOS and the $n^-$ type semiconductor region 10*na* of the n-well power supply region.

In this process, the n type impurity is injected at an inclined angle with respect to the principal surface of the semiconductor substrate 1 to ensure that the n type impurity reaches the edge of the gate electrode to prevent the shadowing effect caused by the gate electrode. The angle of injection of the impurity is set to be equal to that used when forming the $p^-$ type semiconductor regions 4*p*, 11*p*. That is, when the n type impurity is injected (to form a low impurity concentration region), the semiconductor substrate 1 is kept at the same inclination angle as that when the p type impurity (for suppressing the short channel effect) was injected. The n type impurity may be injected in. four or more directions.

With such an ion implantation, the $p^-$ type semiconductor region 4*p* can be formed at the channel-side end of the $n^-$ type semiconductor region 3*nla* because, in the nMOS formation region, the $p^-$ type impurity has a greater diffusion coefficient than the n type impurity. In the n-well power supply region, the $n^-$ type semiconductor region 10*na* is formed to be shallower than the $p^-$ type semiconductor region 11*p*.

Although the semiconductor regions 4*p*, 11*p*, 3*nla*, 10*na* are not formed yet at this stage of the manufacturing process,since the heat treatment to activate the impurity has not been performed, these semiconductor regions are illustrated to facilitate understanding.

Figure 63:
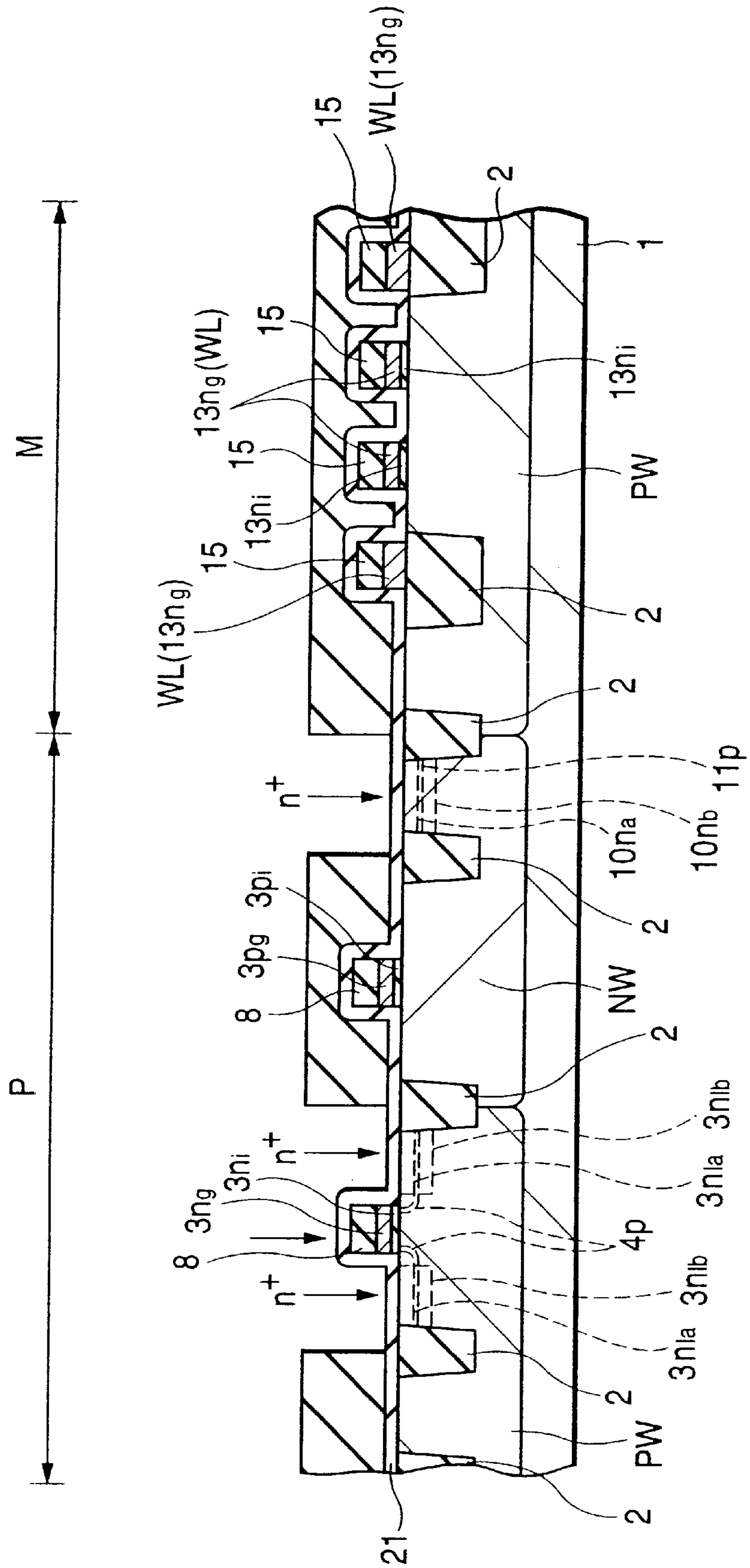
FIG. 63 is a cross section of the semiconductor integrated circuit device during the process of manufacture following the step of FIG. 62.

Then, as shown in FIG. 63, the semiconductor substrate 1 is ion-implanted with an n type impurity, such as phosphorus and arsenic, by using as a mask the same photoresist 12*c* that was used when introducing the impurity for making the $p^-$ type semiconductor regions 4*p*, 11*p* and when introducing the impurity for making the $n^-$ type semiconductor regions 3*nla*, 10*na*. The dose of this impurity is approximately $3\times10^{15}$ ions/cm$^2$. This impurity injection process is a process to form the $n^+$ type semiconductor region 3*nlb* of the nMOS and the $n^+$ type semiconductor region 10*nb* of the n-well power supply region.

In this process, the n type impurity is implanted vertically relative to the principal surface of the semiconductor substrate 1. Furthermore, the n type impurity is also implanted to a depth greater than that of the $p^-$ type semiconductor region 11*p* of the n-well power supply region 10*n* and to a depth that allows separation from the adjoining devices. The reason why the n type impurity is injected deeper than the $p^-$ type semiconductor region 11*p* is as follows. In the n-well power supply region 10*n* the $p^-$ type semiconductor region 11*p*, whose conduction type is inverse to that of the n-well NW, is formed to be deeper than the $n^-$ type semiconductor region 10*na*, which makes satisfactory well connection impossible. Thus, injecting the n type impurity deeper than the $p^-$ type semiconductor region 11*p* prevents the $p^-$ type semiconductor region 11*p* from being formed in the n-well power supply region 10*n* when introducing the n type impurity and, therefore, enables a good well connection.

Although the semiconductor regions 4*p*, 11*p*, 3*nla*, 3*nlb*, 10*na*, 10*nb* are not formed yet at this stage of the manufacturing process, since the heat treatment to activate the impurity has not been performed, these semiconductor regions are illustrated to facilitate understanding.

With this embodiment 6, the n type semiconductor regions 3nl and $p^-$ type semiconductor region 4p required by the nMOS 3n and the n-well power supply region 10n can be formed by ion implantation processes that use the same photoresist as a mask. This greatly reduces the number of photolithographic processes, such as application, exposure and development of the photoresist film and the number of photomasks used.

Figure 64:
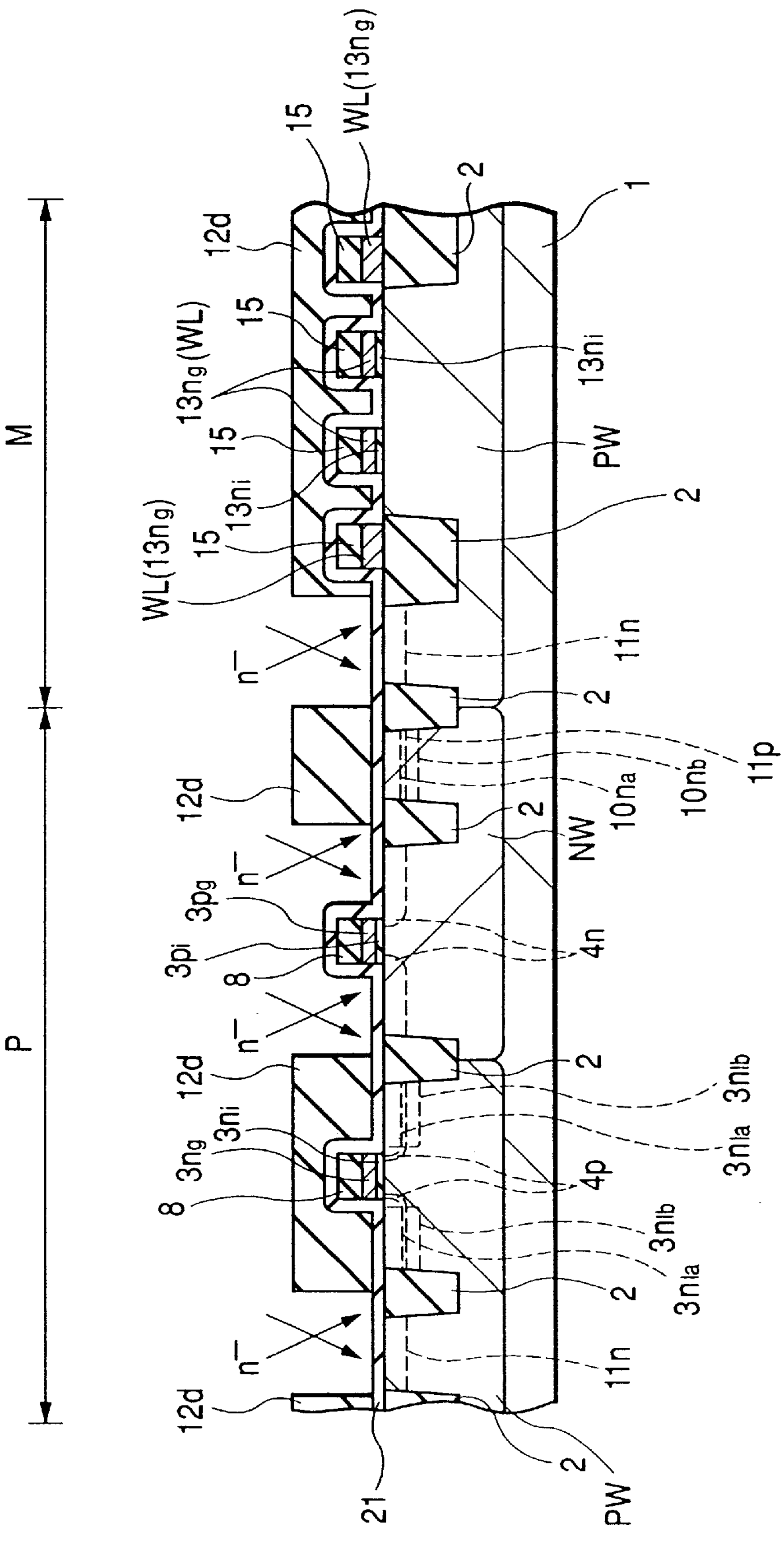
FIG. 64 is a cross section of the semiconductor integrated circuit device during the process of manufacture following the step of FIG. 63.

Next, with the photoresist 12c removed, the semiconductor substrate 1 is provided, by photolithography, with a photoresist (second mask) 12d which, as shown in FIG. 64, exposes the pMOS formation region and the p-well power supply region lop of the peripheral circuit area P and the p-well power supply region 10p' of the memory cell area M and which covers the nMOS formation region and the n-well power supply region 10n of the peripheral circuit area P.

Then, using the photoresist 12d as a mask, an n type impurity, such as phosphorus or arsenic, is ion-implanted to the semiconductor substrate 1 through the insulation film 21 in a manner similar to the embodiment 5. The dose of impurity is around $3\times10^{12}$ ions/cm$^2$. This impurity introducing process is a process to form the $n^-$ type semiconductor region 4n for suppressing the short channel effect on the pMOS in the peripheral circuit area P.

During this process, the semiconductor substrate 1 is tilted to inject the impurity at an inclined angle into the principal surface of the semiconductor substrate 1. This is to ensure that the impurity can reach the edge of the gate electrode and that the shadowing effect caused by the gate electrode can be prevented. With this method, it is possible to introduce the impurity below the edge of the gate electrode 3pg in the pMOS formation region and, in the p-well power supply regions 10p, 10p', to form the $n^-$ type semiconductor region 11n relatively shallow. The impurity may be implanted in four or more directions.

Although the semiconductor regions 4p, 11p, 4n, 11n, 3nla, 3nlb, 10na, 10nb are not formed yet at this stage of the manufacturing process, since the heat treatment to activate the impurity has not been performed, these semiconductor regions are illustrated to facilitate understanding.

Figure 65:
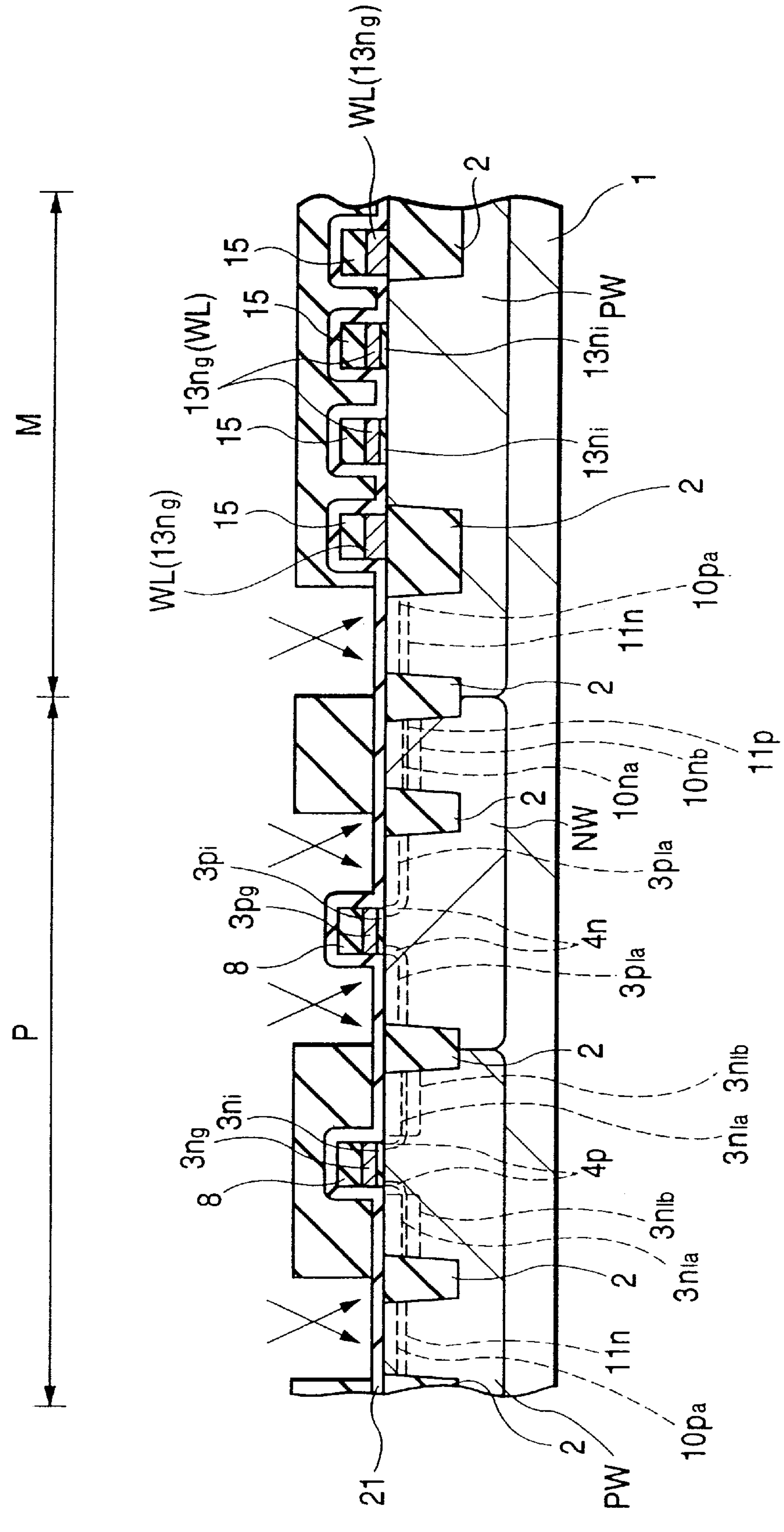
FIG. 65 is a cross section of the semiconductor integrated circuit device during the process of manufacture following the step of FIG. 64.

Then, as shown in FIG. 65, by using as a mask the photoresist 12d that was used when introducing the impurity for making the $n^-$ type semiconductor regions 4n, 11n, a p type impurity, such as boron is ion-implanted into the semiconductor substrate 1 through the insulation film 21. The dose of this impurity is set at about $3\times10^{13}$ ions/cm$^2$. This impurity introducing process is a process to form the $p^-$ type semiconductor region 3pla of the pMOS and the $p^-$ type semiconductor region 10pa of the p-well power supply region.

In this process, the p type impurity is injected at an inclined angle with respect to the principal surface of the semiconductor substrate 1 to ensure that the p type impurity reaches the edge of the gate electrode and that the shadowing effect caused by the gate electrode can be prevented. The angle of injection of the impurity is set equal to that used when forming the $n^-$ type semiconductor regions 4n, 11n. That is, when the p type impurity is injected (to form a low impurity concentration region), the semiconductor substrate 1 is kept at the same inclination angle as that when the n type impurity (for suppressing the short channel effect) was injected. The p type impurity may be injected in four or more directions.

Here, the energy of ion implantation is so set that in the pMOs formation region the extent of infiltration of the p type impurity under the edge of the gate electrode 3pg is smaller than in the $n^-$ type semiconductor region 4n. Therefore, in the pMOS formation region the $n^-$ type semiconductor region 4n remains at the channel-side end of the $p^-$ type semiconductor region 3pla and, in the p-well power supply region, the $p^-$ type semiconductor region 10pa is formed so as to be shallower than the $n^-$ type semiconductor region 11n.

Although the semiconductor regions 4p, 4n, 11p, 11n, 3nla, 3nlb, 3pla, 10na, 10nb, 10pa are not formed yet at this stage of the manufacturing process, since the heat treatment to activate the impurity has not been performed, these semiconductor regions are illustrated to facilitate understanding.

Figure 66:
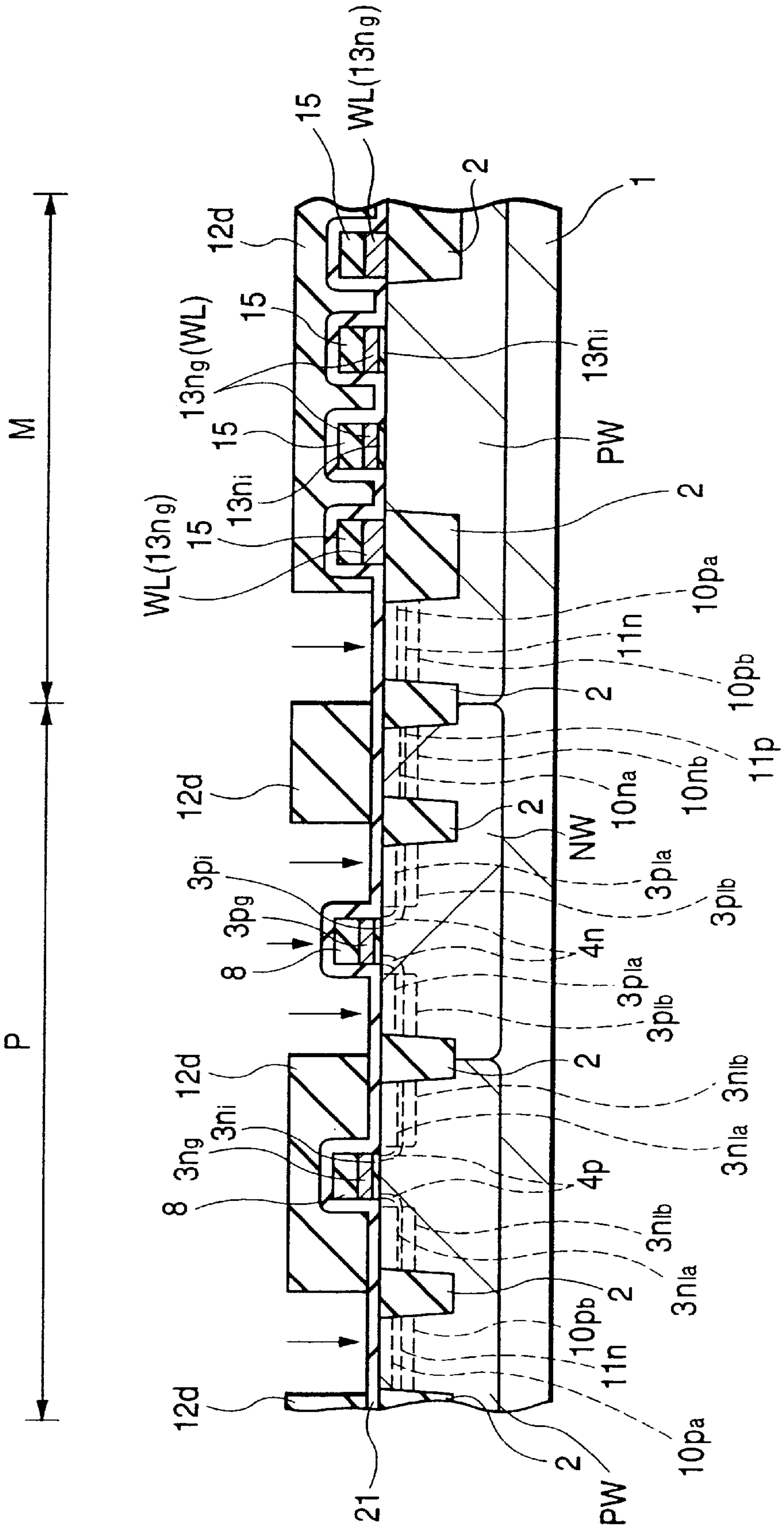
FIG. 66 is a cross section of the semiconductor integrated circuit device during the process of manufacture following the step of FIG. 65.

Then, as shown in FIG. 66, the semiconductor substrate 1 is ion-implanted with a p type impurity, such as boron, through the insulation film 21 by using as a mask the same photoresist 12d that was used when introducing the impurity for making the $n^-$ type semiconductor regions 4n, 11n and when introducing the impurity for making the $p^-$ type semiconductor regions 3pla, 10pa. The dose of this impurity is approximately $3\times10^{15}$ ions/cm$^2$. This impurity injection process is a process to form the $p^+$ type semiconductor region 3plb of the pMOS 3p and the $p^+$ type semiconductor region 10pb of the p-well power supply region.

In this process, the p type impurity is injected vertically relative to the principal surface of the semiconductor substrate 1. Furthermore, the ion implantation is performed so that the p type impurity is injected to a depth that is greater than the $n^-$ type semiconductor region 11n of the p-well power supply region 10p sufficient to isolate the device from the adjacent devices. The reason why the p type impurity is injected deeper than the $n^-$ type semiconductor region 11n is as follows. In the p-well power supply regions 10p, 10p' the $n^-$ type semiconductor region 11n, whose conduction type is inverse to that of the p-well PW, is formed to be deeper than the $p^-$ type semiconductor region 10pa, which makes satisfactory well connection impossible. Thus, injecting the p type impurity deeper than the $n^-$ type semiconductor region 11n prevents the $n^-$ type semiconductor region 11n from being formed in the p-well power supply regions 10p, 10p' when introducing the p type impurity and, therefore, enables a good well connection.

Although the semiconductor regions 4p, 4n, 11p, 11n, 3nla, 3nlb, 3pla, 3plb, 10na, 10nb, 10pa, 10pb are not formed yet at this stage of the manufacturing process, since the heat treatment to activate the impurity has not been performed, these semiconductor regions are illustrated to facilitate understanding.

With this embodiment 6, therefore, the p type semiconductor region 3pl and the $n^-$ type semiconductor region 4n required by the pMOS 3p and the p-well power supply regions 10p, 10p' can be formed by ion implantation processes that use the same photoresist as a mask. This greatly reduces the number of photolithographic processes, such as application, exposure and development of the photoresist film and the number of photomasks used.

Figure 67:
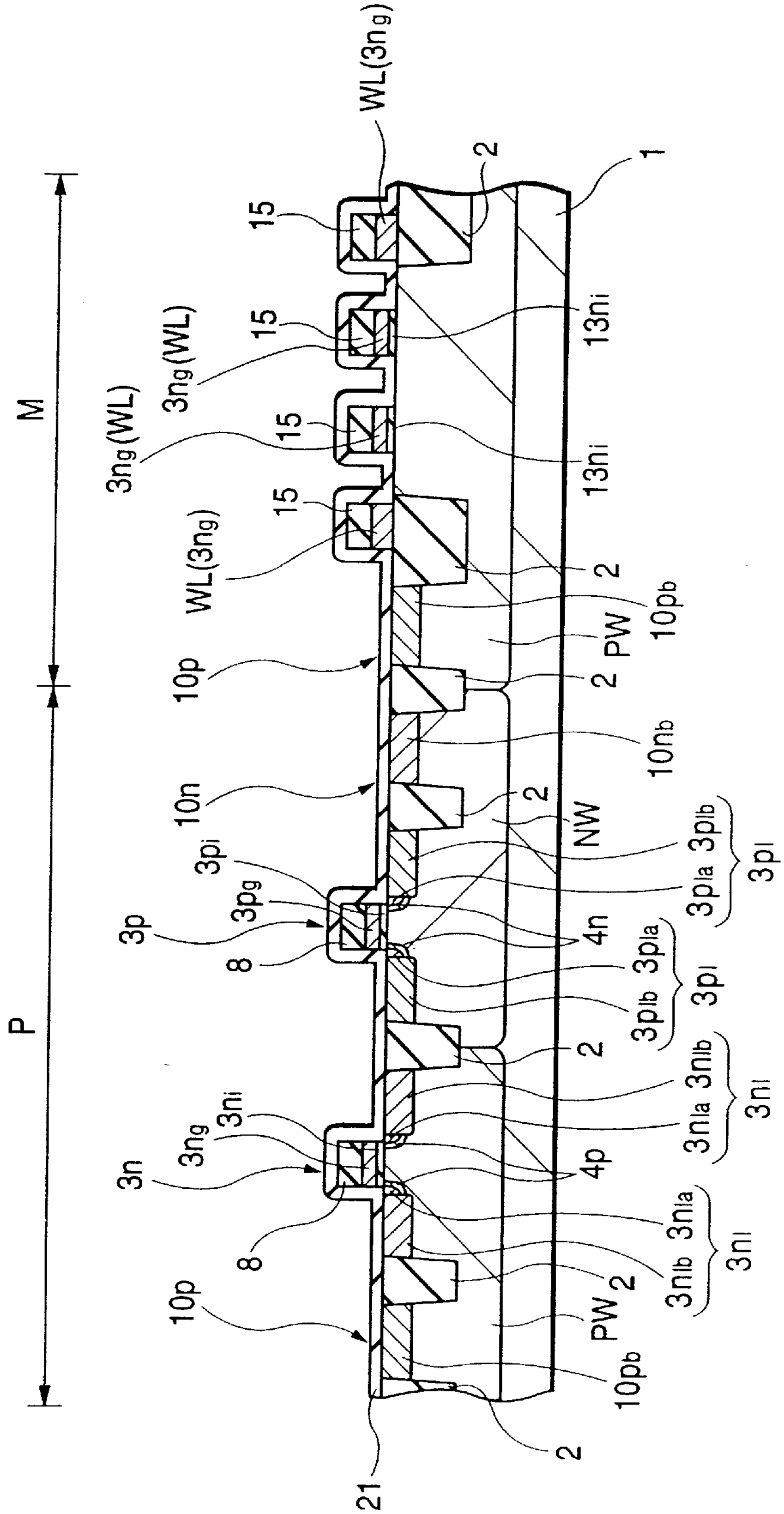
FIG. 67 is a cross section of the semiconductor integrated circuit device during the process of manufacture following the step of FIG. 66.

Next, with the photoresist 12d removed, the semiconductor substrate 1 is heat-treated to activate and diffuse the impurity introduced in the semiconductor substrate 1 to form, as shown in FIG. 67, the $n^-$ type semiconductor region 3nla, the $n^+$ type semiconductor region 3nlb and the $p^-$ type semiconductor region 4p, all constituting the nMOS 3n; the $p^-$ type semiconductor region 3pla, the $p^+$ type semiconductor region 3plb and the $n^-$ type semiconductor region 4n, all constituting the pMOS 3p; the $p^+$ type semiconductor region 10pb in the p-well power supply region 10p; and the $n^+$ type semiconductor region 10_nb_ in the n-well power supply region 10_n_.

Figure 68:
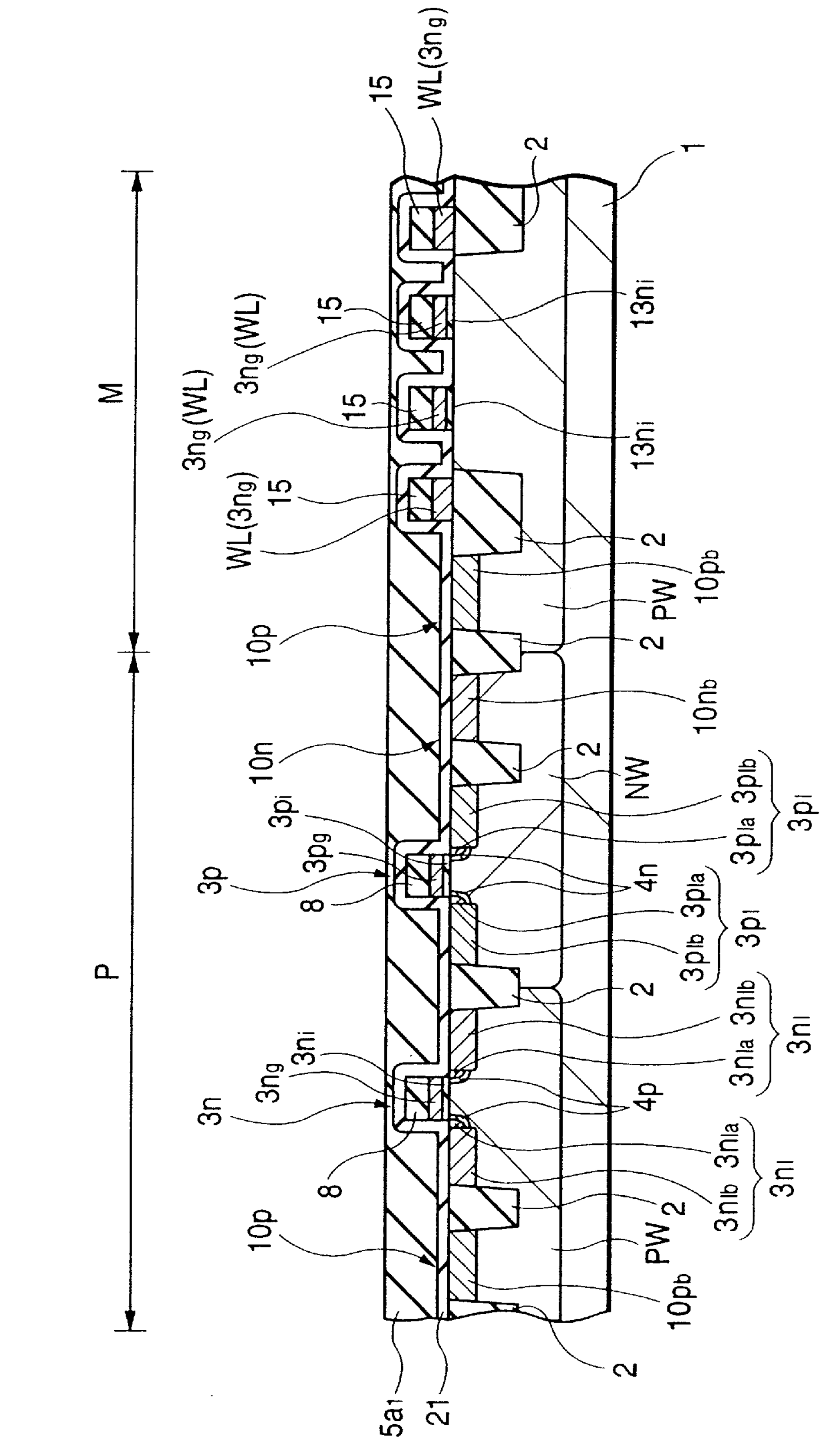
FIG. 68 is a cross section of the semiconductor integrated circuit device during the process of manufacture following the step of FIG. 67.
Figure 69:
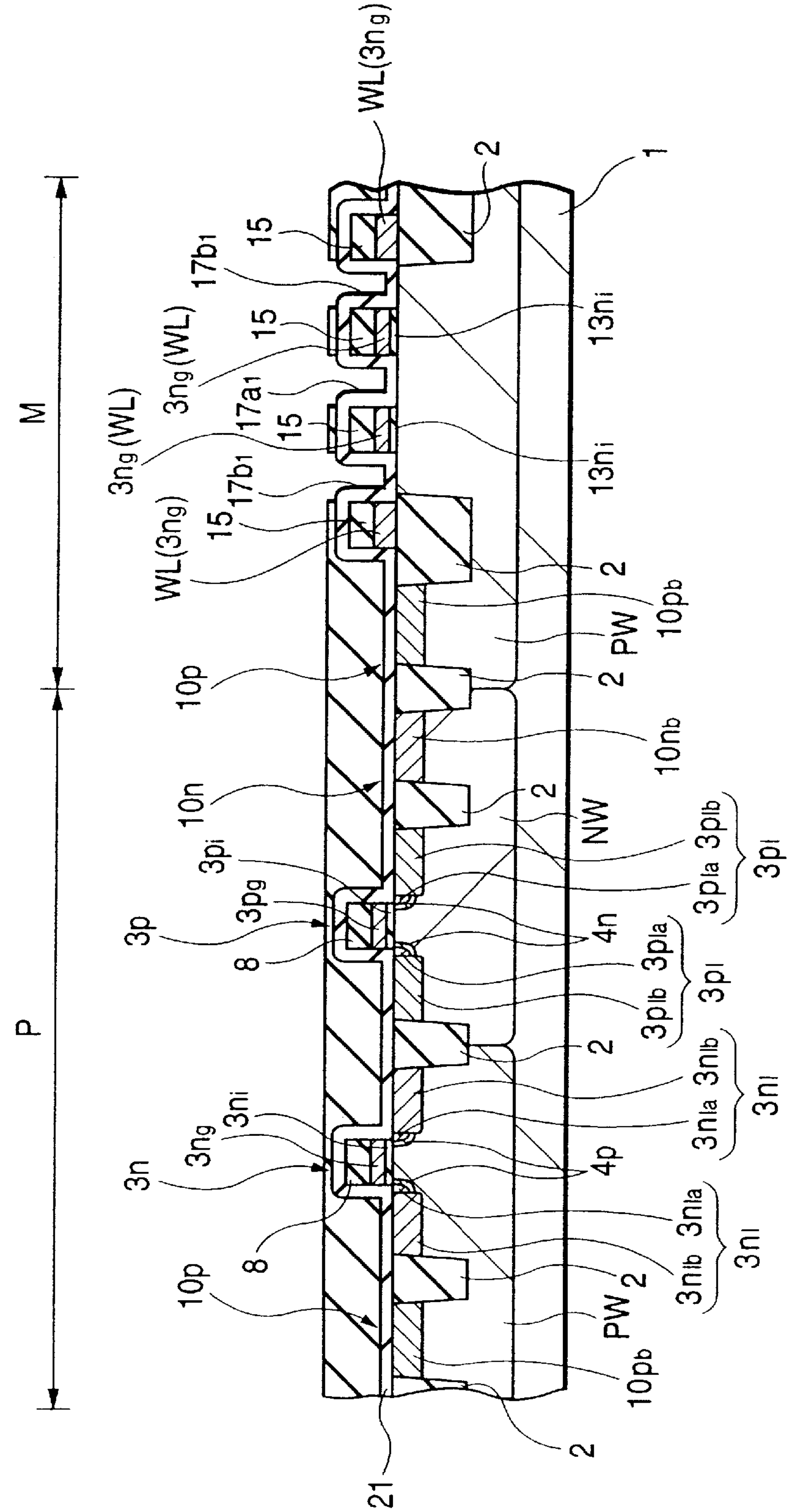
FIG. 69 is a cross section of the semiconductor integrated circuit device during the process of manufacture following the step of FIG. 68.

Next, as shown in FIG. 68, the semiconductor substrate 1 is provided by CVD method with an interlayer insulation film 5_a_1 of, say, $SiO_2$, which is then formed with connecting holes 17_a_1, 17_b_1 in the memory cell area M by photolithography and dry etching with the insulation film 21 and the cap insulation film 15 used as etch stoppers until the upper surface of the insulation film 21 is exposed, as shown in FIG. 69. Here, the etching is carried out with a high etch selection ratio so that the etch rate of $SiO_2$ is faster than that of silicon nitride.

Figure 70:
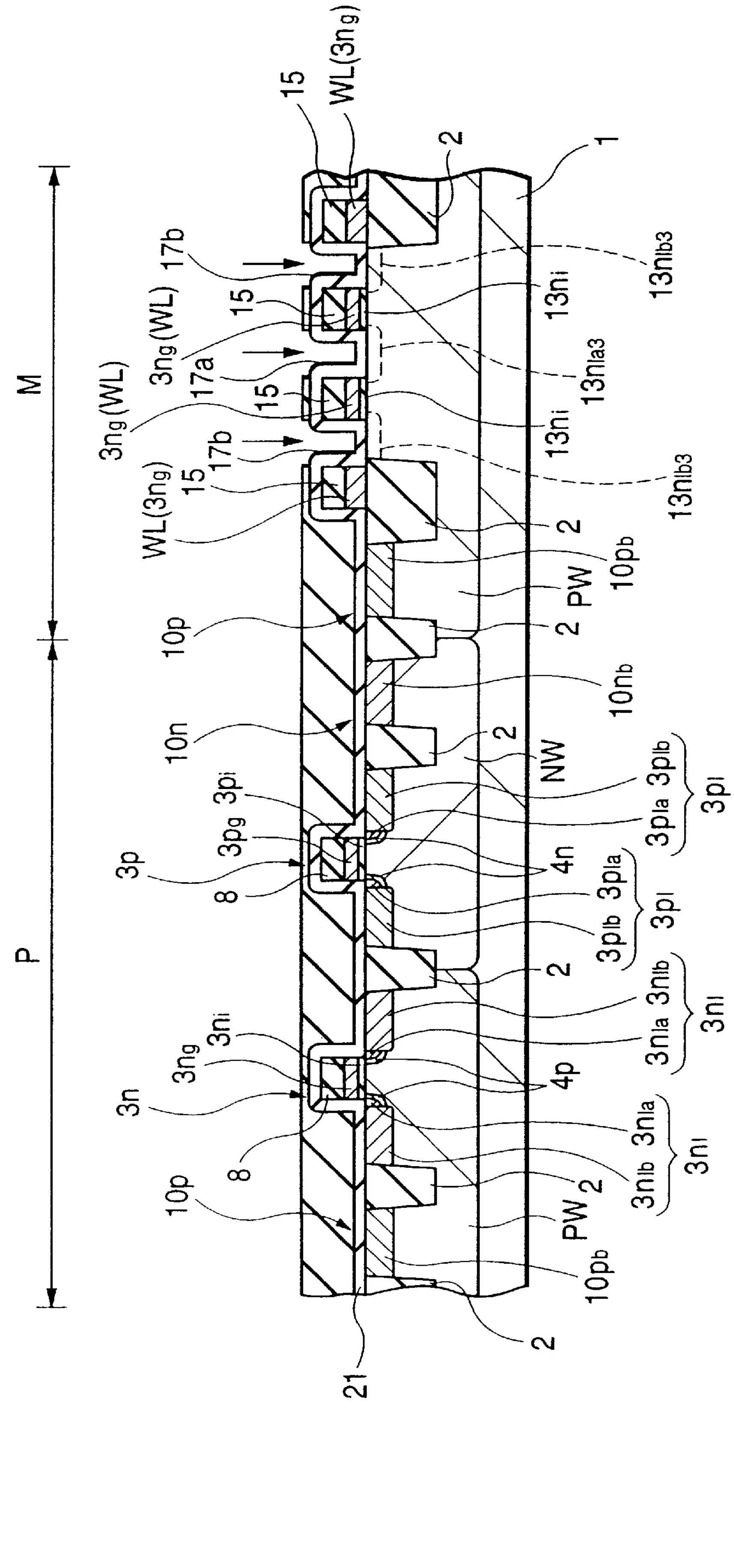
FIG. 70 is a cross section of the semiconductor integrated circuit device during the process of manufacture following the step of FIG. 69.

Now, the etching condition is changed to provide a high etch selection ratio so that the etch rate of silicon nitride is faster than that of $SiO_2$, and the insulation film 21 remaining at the bottom of the connecting holes 17_a_1, 17_b_1 is removed to form the connecting holes 17_a_, 17_b_ that exposes the upper surface of the semiconductor substrate 1, as shown in FIG. 70. Why the etching is performed in two processes is as follows. In a structure where the insulation film 21 is not provided, when the connecting holes 17_a_, 17_b_ that expose the upper surface of the semiconductor substrate 1 are formed under the condition that facilitates the etching of $SiO_2$ and if the isolating insulation film (usually $SiO_2$) of the device isolation portion 2 is exposed from the bottom of the connecting holes 17_a_, 17_b_, the isolating insulation film may also be removed, leading to a device failure. To prevent this problem, the etching is divided into two processes.

Then, the semiconductor substrate 1 is ion-implanted with an n type impurity, such as phosphorus or arsenic, through the connecting holes 17_a_, 17_b_. This impurity introducing process is a process to form the $n^-$ type semiconductor region (11th semiconductor region) 13_nla_3, 13_nlb_3 for alleviating an electric field. In this process, the impurity is injected vertically relative to the principal surface of the semiconductor substrate 1. Although the $n^-$ type semiconductor regions 13_nla_3, 13_nlb_3 are not formed yet at this stage of the manufacturing process, since the heat treatment to activate the impurity has not been performed, these semiconductor regions are illustrated to facilitate understanding.

Figure 71:
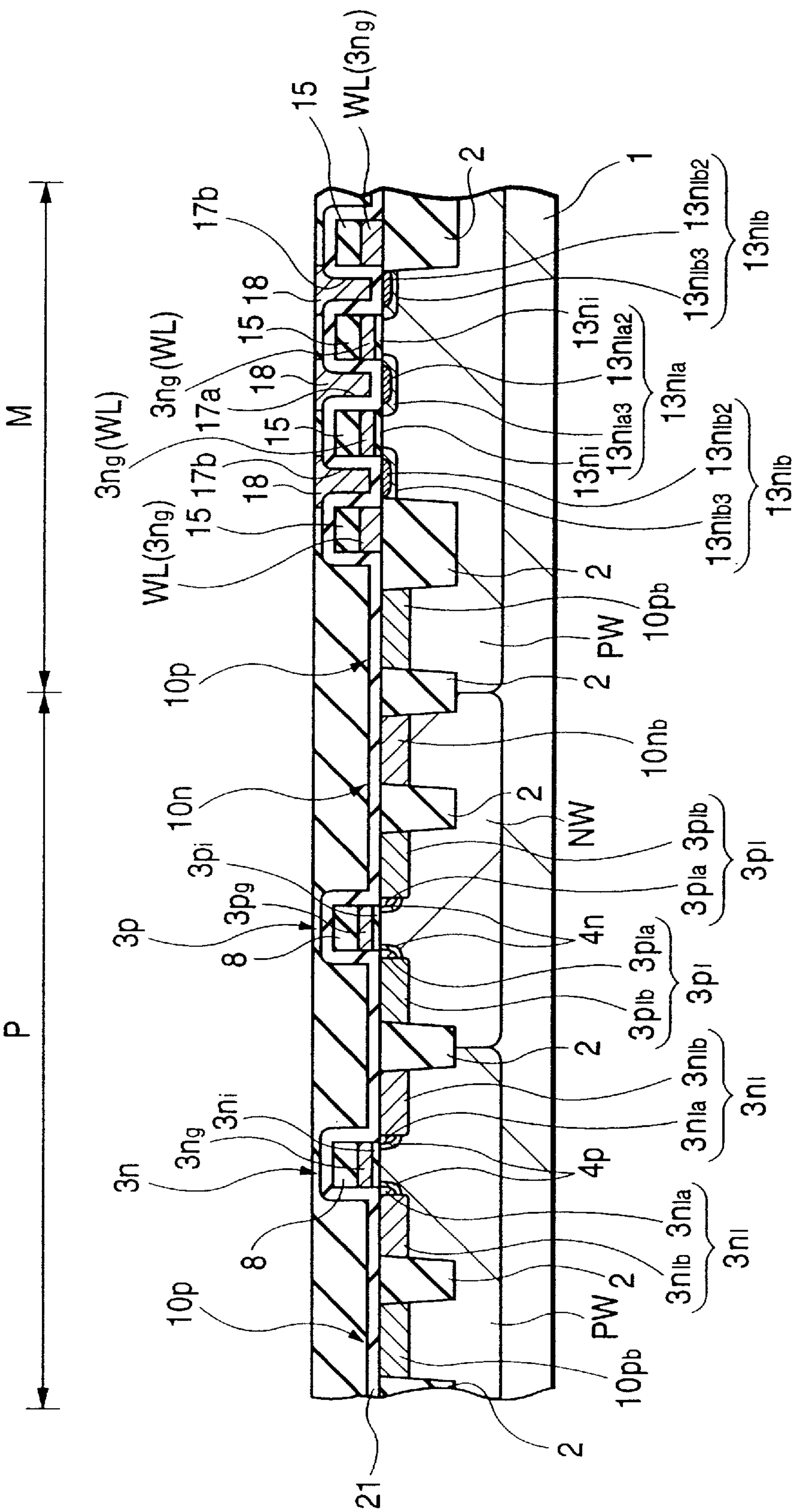
FIG. 71 is a cross section of the semiconductor integrated circuit device during the process of manufacture following the step of FIG. 70.

Next, the semiconductor substrate 1 is provided by CVD method with a low-resistance polysilicon containing an n type impurity, such as phosphorus, which is then etched back by anisotropic dry etching or CMP (chemical mechanical polishing) to embed a conductive film 18 of low-resistance polysilicon containing an n type impurity, such as phosphorus, in the connecting holes 17_a_, 17_b_, as shown in FIG. 71. Then, the semiconductor substrate 1 is subjected to heat treatment to activate and diffuse the n type impurity injected in the semiconductor substrate 1 to form $n^-$ type semiconductor regions 13_nla_3, 13_nlb_3 for alleviating an electric field and also to diffuse the n type impurity, phosphorus, contained in the conductive film 18 into the semiconductor substrate 1 to form $N^+$ type semiconductor regions 13_nla_2, 13_nlb_2. Now, the selection MOS 13 is formed.

The method of forming the conductive film 18 is not limited to the above method and the following method may be used, for example. First, the connecting holes 17_a_, 17_b_ are formed and then the semiconductor substrate 1 is provided by CVD method with a non-doped polysilicon, the upper part of which is then etched back in a manner described above to embed a non-doped polysilicon film in the connecting holes 17_a_, 17_b_. Next, an n type impurity, such as phosphorus or arsenic, is ion-implanted into the non-doped polysilicon film. Then, the semiconductor substrate 1 is heat-treated to activate the impurity implanted in the non-doped polysilicon film and, thereby, form the conductive film 18.

Figure 72:
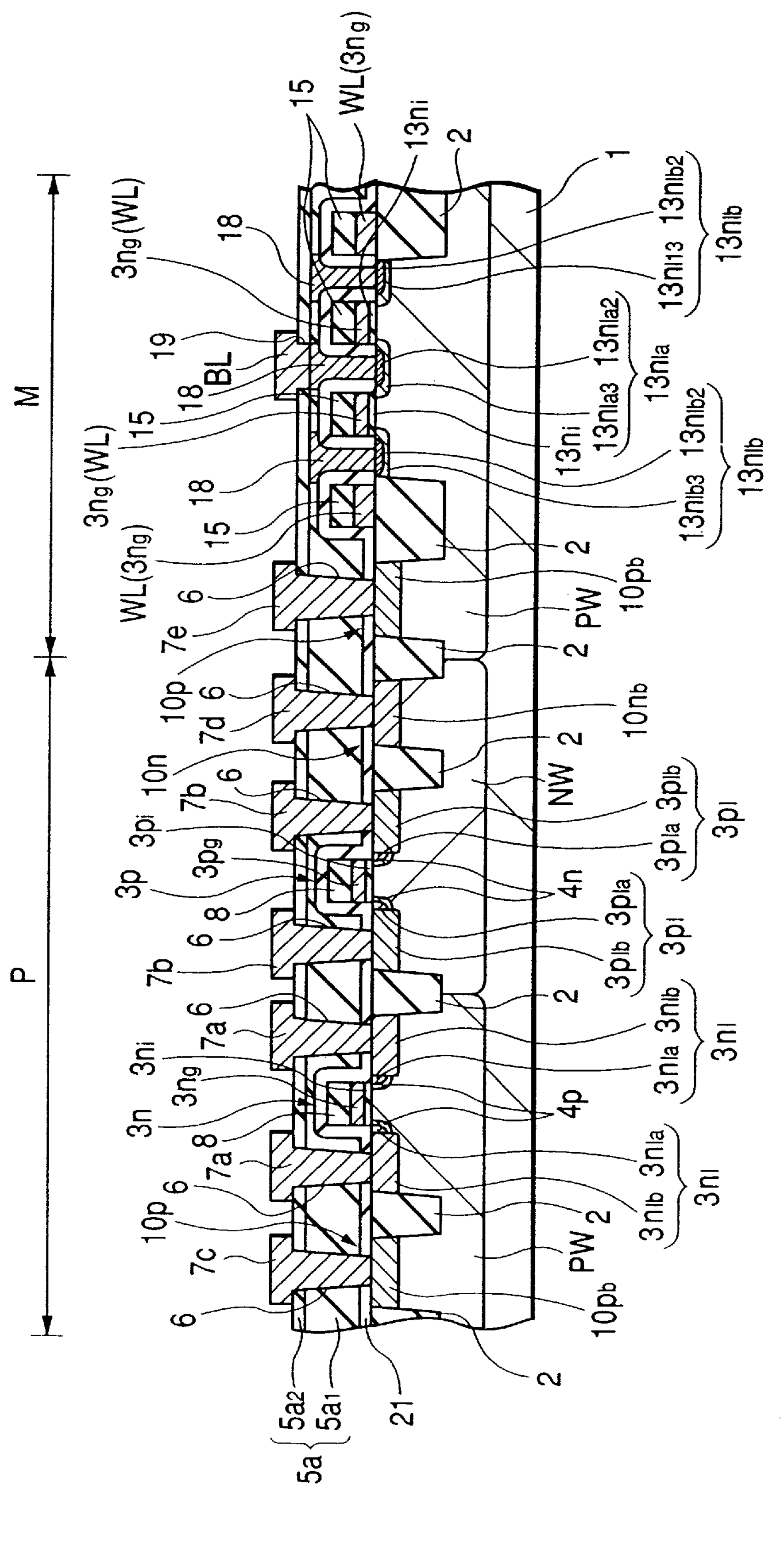
FIG. 72 is a cross section of the semiconductor integrated circuit device during the process of manufacture following the step of FIG. 71.

Next, as shown in FIG. 72, the semiconductor substrate 1 is provided by the CVD method with an interlayer insulation film 5_a_2 of, say, $SiO_2$. Then, a part of the interlayer insulation film 5_a_ (5_a_1, 5_a_2) is formed, by photolithography and dry etching, with the connecting holes 6 that reach the principal surface of the semiconductor substrate 1 and with the connecting holes 19 that reach the upper part of the conductive film 18.

After this, the interlayer insulation film 5_a_ is deposited by sputtering with a conductive film, such as a single layer of tungsten or a Ti/TiN/W laminated film, which is then patterned by photolithography and dry etching to form electrodes 7_a_–7_e_ and the bit line BL.

Figure 73:
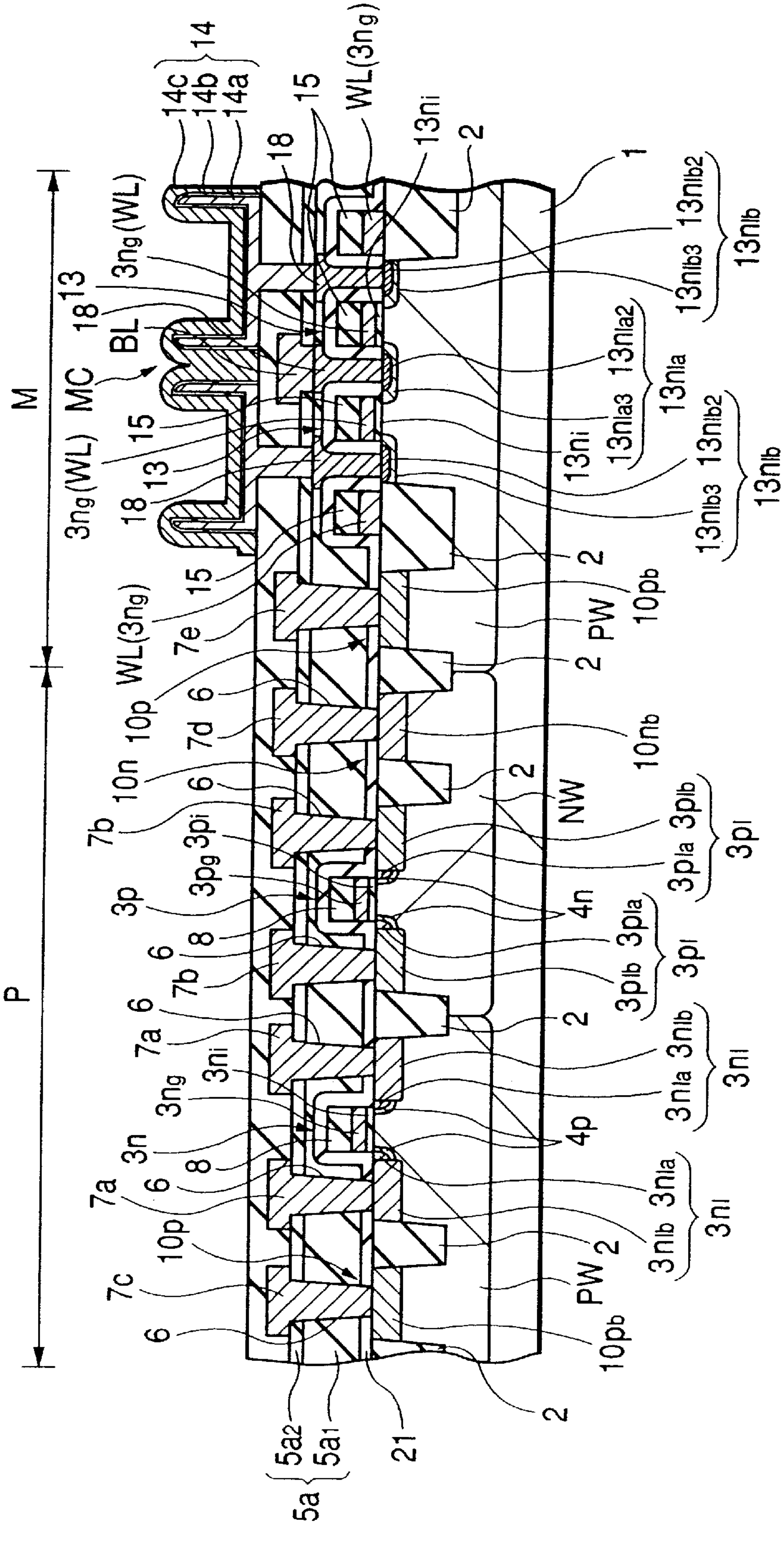
FIG. 73 is a cross section of the semiconductor integrated circuit device during the process of manufacture following the step of FIG. 72.

Then, as shown in FIG. 73, the semiconductor substrate 1 is provided by the CVD method with an interlayer insulation film 5_b_ of, say, $SiO_2$ to cover the electrodes 7_a_–7_e_ and the bit line BL, after which a crown-shaped capacitor 14 is formed.

Next, the impurity concentration distributions in various parts of the semiconductor integrated circuit device of the embodiment 6 will be explained by referring to FIGS. 74 to 79.

Figure 74:
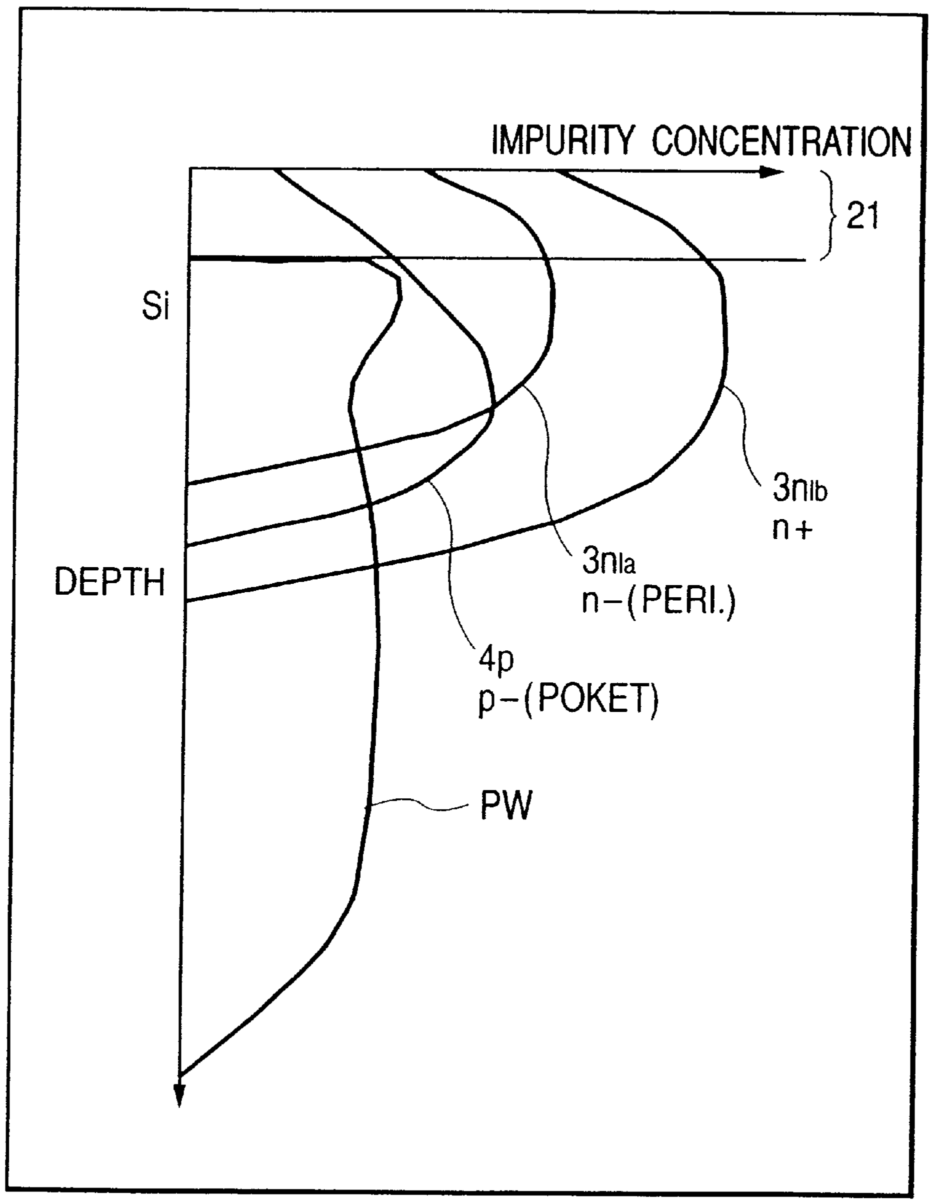
FIG. 74 is a graph showing an impurity concentration distribution in an essential part of the semiconductor integrated circuit device of this embodiment.

FIG. 74 shows that impurity concentration distributions in the $p^-$ type semiconductor region 4_p_ for suppressing the short channel effect extend deeper than that of the $n^-$ type semiconductor region 3_nla_. The $n^+$ type semiconductor region 3_nlb_ has a higher concentration and extends deeper than the impurity concentration distributions of the $n^-$ type semiconductor region 3_nla_ and the $p^-$ type semiconductor region 4_p_. The impurity concentration distributions of the n type semiconductor region 3_nla_, the $p^-$ type semiconductor region 4_p_ for suppressing the short channel effect, and the $n^+$ type semiconductor region 3_nlb_ exist also in the insulation film 21, because the impurities for these regions are injected into the semiconductor substrate 1 through the insulation film 21.

Figure 75:
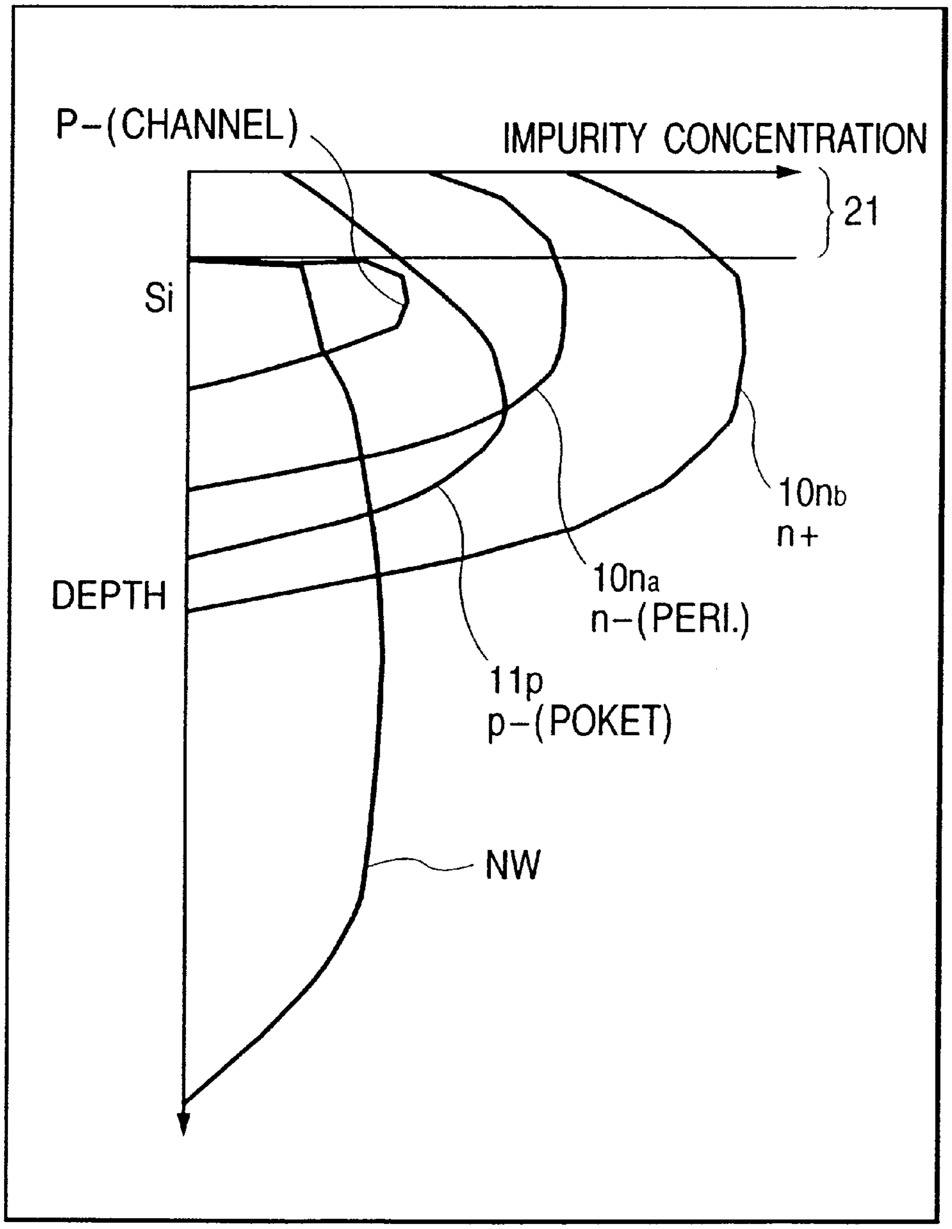
FIG. 75 is a graph showing an impurity concentration distribution in an essential part of the semiconductor integrated circuit device of this embodiment.

FIG. 75 shows the impurity concentration distributions in the n-well power supply region 10_n_. The impurity distribution of the $p^-$ type semiconductor region 11_p_ extends deeper than the impurity distribution of the $n^-$ type semiconductor region 10_na_. The $n^+$ type semiconductor region 10_nb_ has a higher concentration and extends deeper than the $p^-$ type semiconductor region 11_p_. Thus, it is possible to supply the well voltage to the n-well NW in a satisfactory condition. The $p^-$ (Channel) represents the concentration distribution of the impurity introduced into the channel to set the threshold voltage of the pMOS 3_p_. The impurity concentration distributions of the $n^-$ type semiconductor region 10_na_, the $p^-$ type semiconductor region 11_p_, and the $n^+$ type semiconductor region 10_nb_ exist also in the insulation film 21 because the impurities for these regions are injected into the semiconductor substrate 1 through the insulation film 21.

Figure 76:
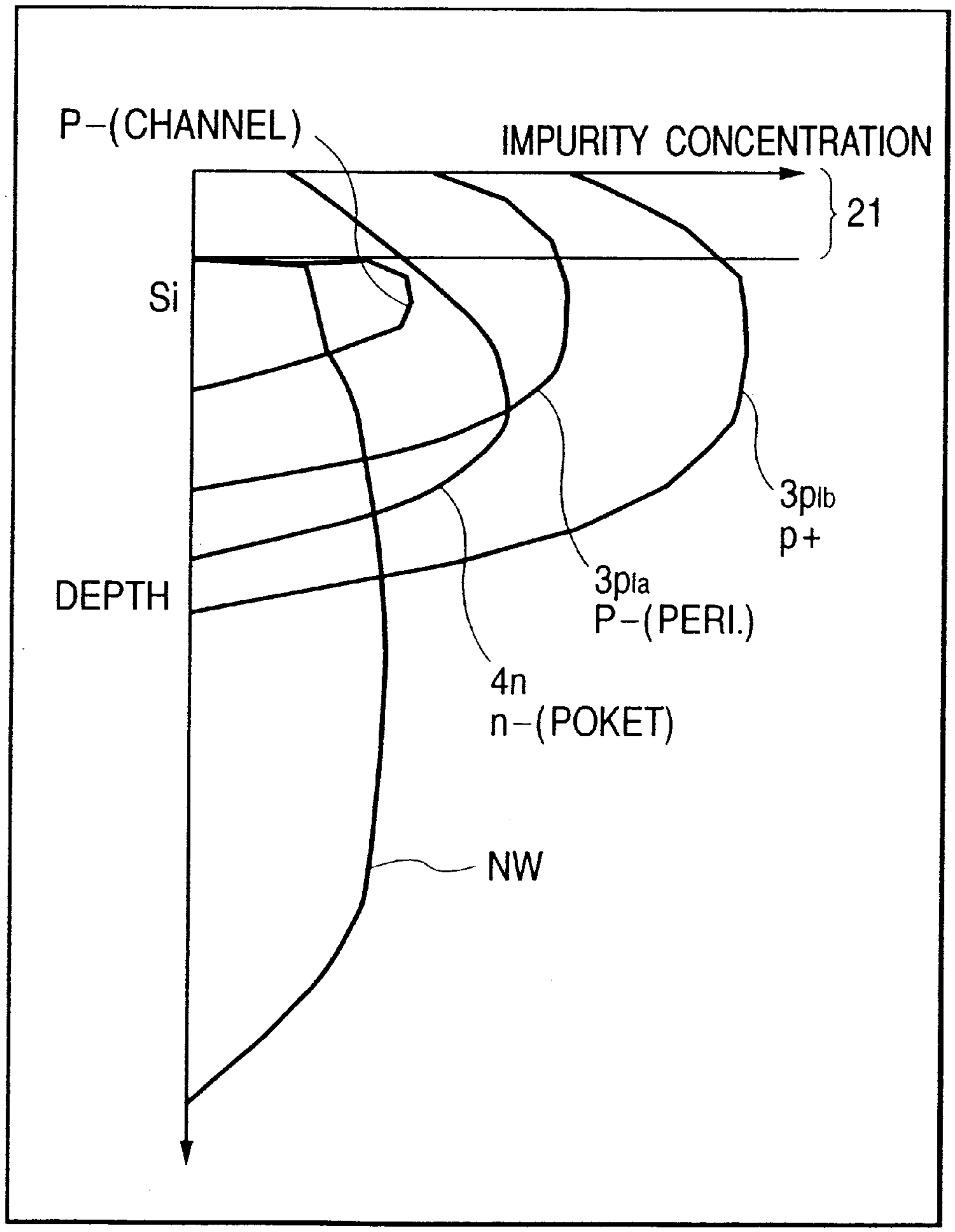
FIG. 76 is a graph showing an impurity concentration distribution in an essential part of the semiconductor integrated circuit device of this embodiment.

FIG. 76 shows the impurity concentration distributions in the source and drain of the pMOS 3_p_. The impurity concentration distribution of the $n^-$ type semiconductor region 4_n_ extends deeper than that of the $p^-$ type semiconductor region 3_pla_. The $p^+$ type semiconductor region 3_plb_ has a higher concentration and extends deeper than the impurity concentration distributions of the $p^-$ type semiconductor region 3_pla_ and the $n^-$ type semiconductor region 4_n_. The $p^-$ (Channel) represents the concentration distribution of the impurity introduced into the channel to set the threshold voltage of the pMOS 3_p_. The impurity concentration distributions of the $p^-$ type semiconductor region 3_pla_, the $n^-$ type semiconductor region 4*n* for suppressing the short channel effect, and the $p^+$ type semiconductor region 3*plb* exist also in the insulation film 21 because the impurities for these regions are injected into the semiconductor substrate 1 through the insulation film 21.

Figure 77:
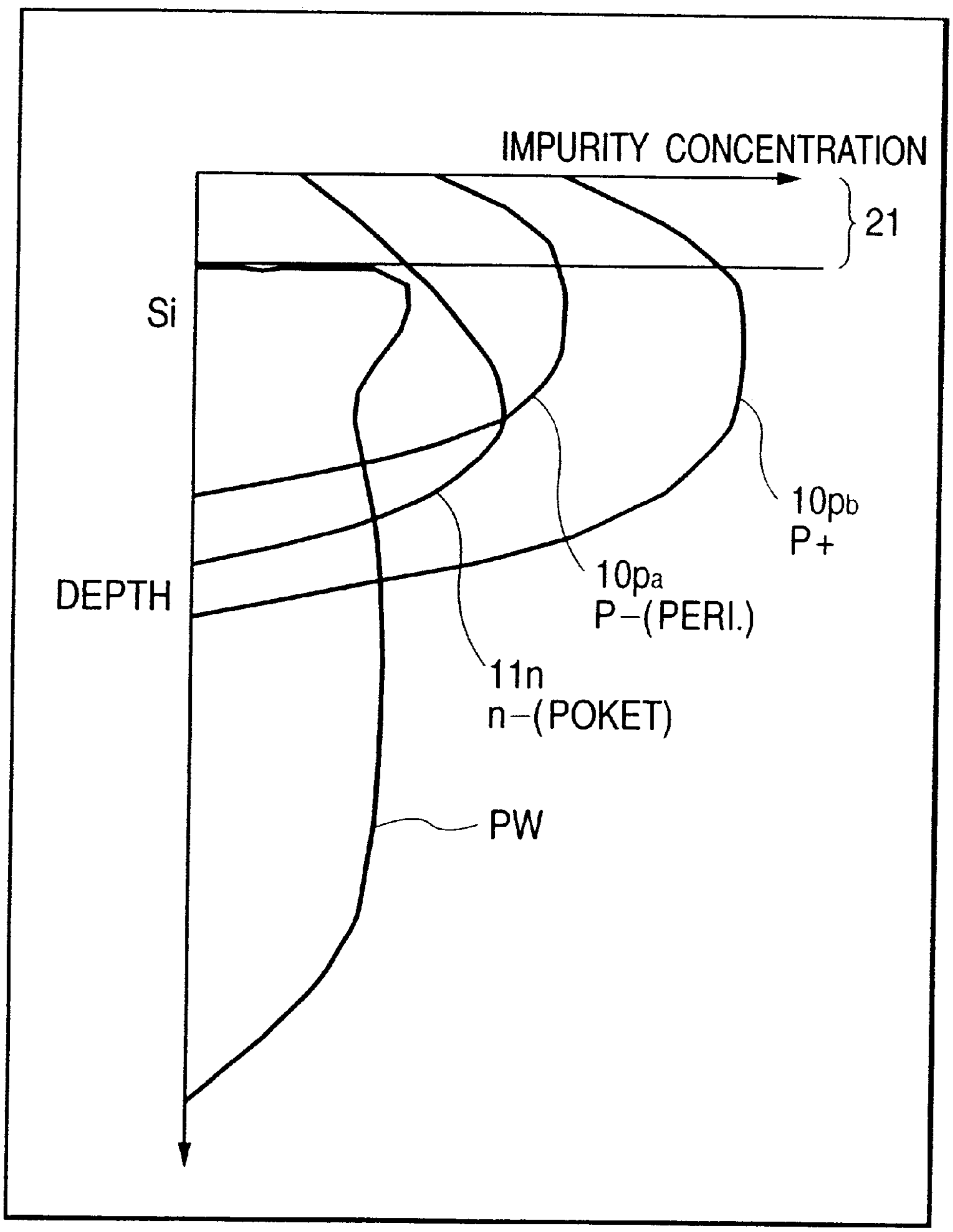
FIG. 77 is a graph showing an impurity concentration distribution in an essential part of the semiconductor integrated circuit device of this embodiment.

FIG. 77 shows the impurity concentration distributions in the p-well power supply. region 10*p*. The impurity distribution of the $n^-$ type semiconductor region 11*n* extends deeper than the impurity distribution of the $p^-$ type semiconductor region 10*pa*. The $p^+$ type semiconductor region 10*pb* has a higher concentration and extends deeper than the impurity distribution of the $n^-$ type semiconductor region 11*n*. Thus, the p-well PW, too, can be supplied with a well voltage in good condition. The impurity concentration distributions of the $p^-$ type semiconductor region 10*pa*, the $n^-$ type semiconductor region 11*n*, and the $p^+$ type semiconductor region 10*pb* exist also in the insulation film 21 because the impurities for these regions are injected into the semiconductor substrate 1 through the insulation film 21.

FIG. 78 shows a schematic, enlarged cross section of essential parts of the memory cell area M of FIG. 73. FIG. 79 shows the impurity concentration distributions in the source and the drain of the selection MOS 13 of FIG. 78. For easy understanding of FIG. 78, the semiconductor regions 13*nla*, 13*nlb* are not hatched.

The $n^-$ type semiconductor region 13*nla*3 (13*nlb*3), as shown in FIG. 78, has an impurity concentration distribution extending in the lateral and thickness directions of the semiconductor substrate 1. The $N^+$ type semiconductor region 13*nla*2 (13*nlb*2) has a higher impurity concentration than the $n^-$ type semiconductor region 13*nla*3 (13*nlb*3), but is wholly enclosed by the $n^-$ type semiconductor region 13*nla*3 (13*nlb*3), which has a relatively low impurity concentration. This configuration can suppress a phenomenon in which a strong electric field is applied locally to the $n^+$ type semiconductor region 13*nla*2 (13*nlb*2), and thus can improve the yield and reliability of the semiconductor integrated circuit device.

The embodiment 6 of the above configuration can provide the following advantages in addition to those offered by the embodiments 1, 2, 4 and 5.

(1) By not performing the impurity injection process for making the $n^-$ type semiconductor regions 13*nla*1, 13*nlb*1 for the memory cell selection MOSFET, the manufacturing time and cost of the semiconductor integrated circuit device can be reduced.

(2) Because the concentration of the impurity introduced into the semiconductor substrate 1 can be reduced by not performing the impurity injection process for making the $n^-$ type semiconductor regions 13*nla*1, 13*nlb*1 for the memory cell selection MOSFET, the junction capacitance can be reduced, thereby improving the operation speed of the semiconductor integrated circuit device.

The invention accomplished by the inventor of this invention has been described in detail in conjunction with various embodiments. It should be noted that this invention is not limited to the foregoing embodiments and that various modifications may be made without departing from the spirit of the invention.

For example, while the configurations in the embodiments 1 to 6 described above provide device isolation portions of a ditch-embedded type, the device isolation portions may be formed of a field insulation film.

While the embodiments 1 to 3 described above use a laminated structure of polysilicon and silicide for the gate electrodes, the gate electrodes may be formed as a single film of polysilicon, or a so-called polymetal structure in which a metal film, such as tungsten, is laminated over the low-resistance polysilicon film through a barrier metal film of titanium nitride or tungsten nitride.

Although the embodiments 1 to 3 employ a structure having a p-well and an n-well in the semiconductor substrate, this invention can also be applied to other structures, such as one in which the semiconductor substrate has either a p-well or an n-well and in which both an n-channel MOSFET and a p-channel MOSFET are provided in the same semiconductor substrate.

Although the foregoing description mainly concerns cases where the invention has been applied to DRAM manufacturing technology—the field of application in which the invention has originated—it is noted that the invention is not limited to these applications and may also be applied to a technology for manufacturing a FRAM (ferroelectric RAM) that uses a ferroelectric film as an insulation film of an information storage capacitor. The FRAM structure is the same as that of the DRAM explained in embodiments 1 to 6. In this case, the capacitor electrode is formed of a material, such as platinum (Pt), which has high acid resistance, low reactivity and good processability. The capacitor insulation film may be made of a $PbZr_xTi_{1-x}O_3$ dielectric material. The plate electrode (the electrode that contacts the capacitor's insulation film) is formed of Pt for the same reason as the capacitor electrode.

Representative features and advantages of this invention may be summarized as follows.

(1) With the semiconductor integrated circuit device manufacturing method of this invention, the impurity introducing processes to form an $n^+$ type semiconductor region for the source and the drain of the n-channel MIS transistor, a $p^-$ type semiconductor region for suppressing the short channel effect on the n-channel MIS transistor, and an n-well power supply region use a single first mask. Further, a single second mask is used in the impurity introducing processes to form a $p^+$ type semiconductor region for the source and the drain of the p-channel MIS transistor, an $n^-$ type semiconductor region for suppressing the short channel effect on the p-channel MIS transistor, and a p-well power supply region. This impurity introducing method can reduce the number of photoresist forming and removing processes substantially, which in turn reduces the number of manufacturing processes of the semiconductor integrated circuit device, that has a structure in which both the n-channel MIS transistor and p-channel MIS transistor are provided in the same semiconductor substrate.

(2) With the semiconductor integrated circuit device manufacturing method of this invention, the impurity ion introducing processes to form an $n^+$ type semiconductor region and an $n^-$ type semiconductor region for the source and drain of the n-channel MIS transistor, a $p^-$ type semiconductor region for suppressing the short channel effect on the n-channel MIS transistor, and an n-well power supply region use a single first mask. Further, a single second mask is used in the impurity ion introducing processes to form a $p^+$ type semiconductor region and a $p^-$ type semiconductor region for the source and drain of the p-channel MIS transistor, an $n^-$ type semiconductor region for suppressing the short channel effect on the p-channel MIS transistor, and a p-well power supply region. This impurity introducing method can reduce the number of photoresist forming and removing processes substantially, which in turn reduces the number of manufacturing processes of the semiconductor integrated circuit device, that has a structure in which both the n-channel MIS transistor and p-channel MIS transistor are provided in the same semiconductor substrate.

(3) With the semiconductor integrated circuit device manufacturing device of this invention, a single first mask that exposes the n-channel MISFET formation region is used in the impurity introducing processes to form a third semiconductor region, a fourth semiconductor region and a fifth semiconductor region. Also a single second mask that exposes the p-channel MISFET formation region is used in the impurity introducing processes to form a sixth semiconductor region, a seventh semiconductor region and an eighth semiconductor region. This impurity introducing method greatly reduces the number of photoresist forming and removing processes when the n-channel MISFET and the p-channel MISFET are formed in the same semiconductor substrate. It is therefore possible to reduce the number of processes for manufacturing the semiconductor integrated circuit device having a structure in which the n-channel MIS transistor and the p-channel MIS transistor are provided on the same semiconductor substrate.

(4) With the semiconductor integrated circuit device manufacturing device of this invention, a single first mask that exposes the n-channel MISFET formation region and the second power supply region is used in the impurity introducing processes to form a third semiconductor region, a fourth semiconductor region and a fifth semiconductor region. Also, a single second mask that exposes the p-channel MISFET formation region and the first power supply region is used in the impurity introducing processes to form a sixth semiconductor region, a seventh semiconductor region and an eighth semiconductor region. When the n-channel MISFET and the p-channel MISFET are formed in the same semiconductor substrate, this impurity introducing method can form a semiconductor region constituting the first power supply region and the second power supply region simultaneously with the formation of the semiconductor region constituting the n-channel MISFET and the p-channel MISFET. This impurity introducing method can also reduce the number of photoresist forming and removing processes substantially. It is therefore possible to reduce the number of processes for manufacturing the semiconductor integrated circuit device having a structure in which the n-channel MIS transistor, the p-channel MIS transistor and the first and second power supply regions are provided on the same semiconductor substrate.

(5) With the semiconductor integrated circuit device manufacturing method of this invention, the n type third impurity is ion-implanted to the principal surface of the semiconductor substrate at a first inclination with respect to the direction vertical to the principal surface. The p type first impurity and the n type second impurity are ion-implanted to the principal surface of the semiconductor substrate at a second inclination with respect to the direction vertical to the principal surface. The second inclination is greater than the first inclination. The p type sixth impurity is ion-implanted to the principal surface of the semiconductor substrate at a third inclination with respect to the direction vertical to the principal surface. The n type fourth impurity and the p type fifth impurity are ion-implanted to the principal surface of the semiconductor substrate at a fourth inclination with respect to the direction vertical to the principal surface. The fourth inclination is greater than the third inclination. This impurity introducing method can form a semiconductor region constituting the first and second power supply regions without causing a junction failure in the first and second power supply regions.

(6) With the semiconductor integrated circuit device manufacturing method of this invention, in the first power supply region and the third power supply region, the eighth semiconductor region is formed to cover the sixth semiconductor region and the seventh semiconductor region; and in the second power supply region,the fifth semiconductor region is formed to cover the third semiconductor region and the fourth semiconductor region. This manufacturing method can form a semiconductor region constituting the first and second power supply regions without causing a junction failure in the first and second power supply regions.

(7) The above features (1), (2), (3) or (4) can simplify the process of manufacturing the semiconductor integrated circuit device, while shortening the manufacturing time and reducing the manufacturing cost. These features can also reduce the adhesion rate of foreign matter, thereby improving the yield and reliability of the semiconductor integrated circuit device.

(8) The above feature (1), (2), (3) or (4) can reduce the number of photomasks used in the process of manufacturing the semiconductor integrated circuit device, that has a structure in which the n-channel MIS transistor and the p-channel MIS transistor are provided on the same semiconductor substrate. This, in turn, reduces the cost of manufacture of the semiconductor integrated circuit device.

(9) In the process of introducing impurity ions into the p-channel MIS transistor and the n-channel MIS transistor, the semiconductor integrated circuit device manufacturing method of this invention forms a mask over the memory cell area to minimize an increase in junction leakage in the memory cell and degradation of refresh characteristic caused by the junction leakage. The method of this invention can also suppress the short channel effect in the peripheral circuit area and improve the current drive capability.

I claim:

1. A semiconductor integrated circuit device formed on a semiconductor substrate comprising:

an n-channel MIS transistor having a plurality of semiconductor regions formed on a p-type well region, and a p-type semiconductor region formed on the p-type well region;

a p-channel MIS transistor having a plurality of semiconductor regions formed on an n-type well region, and an n-type semiconductor region formed on the n-type well region;

a first conductor layer formed on the p-type semiconductor region electrically connected with the p-type well region;

a second conductor layer formed on the n-type semiconductor region electrically connected with the n-type well region;

n-type impurity implanted regions and p-type impurity implanted regions formed in the plurality of semiconductor regions of the n-channel MIS transistor and in the n-type semiconductor region of the n-type well region, wherein the n-type and p-type impurity implanted regions of the plurality of semiconductor regions of the n-channel MIS transistor have the same impurity concentration distribution of depth as the n-type and p-type impurity implanted region of the n-type semiconductor region of the n-type well region; and n-type impurity implanted regions and p-type impurity implanted regions formed in the plurality of semiconductor regions of the p-channel MIS transistor and in the p-type semiconductor region of the p-type well region, wherein the n-type and p-type impurity implanted regions of the plurality of semiconductor regions of the p-channel MIS transistor have the same impurity concentration distribution of depth as the n-type and p-type impurity implanted region of the p-type semiconductor region of the p-type well region, the p-type impurity implanted regions of the plurality of semiconductor regions of the n-channel MIS transistor extend wider than the n-type impurity implanted regions of the plurality of semiconductor regions of the n-channel MIS transistor, the n-type impurity implanted region of the n-type semiconductor region extends deeper than the p-type impurity implanted region of the n-type semiconductor region, the n-type impurity implanted regions of the plurality of semiconductor regions of the p-channel MIS transistor extend wider than the p-type impurity implanted regions of the plurality of semiconductor regions of the p-channel MIS transistor, and the p-type impurity implanted region of the p-type semiconductor region extends deeper than the n-type impurity implanted region of the p-type semiconductor region.

2. A semiconductor integrated circuit device according to claim 1, further comprising:

a device isolation portion formed around the periphery of the n-type impurity implanted region of the n-type semiconductor region.

3. A semiconductor integrated circuit device according to claim 1, further comprising:

a device isolation portion formed around the periphery of the p-type impurity implanted region of the p-type semiconductor region.

4. A semiconductor integrated circuit device according to claim 1, wherein the source and drain regions are comprised of the n-type impurity implanted regions in the plurality of semiconductor regions of the n-channel MIS transistor, and the source and drain regions are comprised of the p-type impurity implanted regions in the plurality of semiconductor regions of the p-channel MIS transistor.

5. A semiconductor integrated circuit device comprising:

an n-channel MIS transistor having a first gate electrode, a first source and a first drain formed in a p-well of a semiconductor substrate;

a p-channel MIS transistor having a second gate electrode, a second source and a second drain formed in an n-well of the semiconductor substrate;

two first p-type semiconductor regions formed between the first source and the first drain of the n-channel MIS transistor, which contact with the first source and the first drain respectively;

an n-well power supply region formed in the n-well; and a second p-type semiconductor region formed in the n-well power supply region, wherein the n-well power supply region is electrically connected with the n-well region, wherein the impurity concentration distribution in the direction of depth of the first source and the first drain of the n-channel MIS transistor is the same as that of the n-well power supply region;

wherein the impurity concentration distribution in the direction of depth of the first p-type semiconductor regions is the same as that of the second p-type semiconductor region; and the n-well power supply region extends deeper than the second p-type semiconductor region.

6. A semiconductor integrated circuit device comprising:

an n-channel MIS transistor having a first gate electrode, a first source and a first drain formed in a p-well of a semiconductor substrate;

a p-channel MIS transistor having a second gate electrode, a second source and a second drain formed in an n-well of the semiconductor substrate;

two first n-type semiconductor regions formed between the second source and the second drain of the p-channel MIS transistor, which contact with the second source and the second drain respectively; and a p-well power supply region formed in the p-well, a second n-type semiconductor region formed in the p-well power supply region, wherein the p-well power supply region is electrically connected with the p-well region;

wherein the impurity concentration distribution in the direction of depth of the second source and the second drain of the n-channel MIS transistor is the same as that of the p-well power supply region;

wherein the impurity concentration distribution in the direction of depth of the first n-type semiconductor regions is the same. as that of the second n-type semiconductor region; and the p-well power supply region extends deeper than the second n-type semiconductor region.

7. A semiconductor integrated circuit device formed on a semiconductor substrate comprising:

an n-channel MIS transistor having a plurality of semiconductor regions formed on a p-type well region, and a p-type semiconductor region formed on the p-type well region;

a p-channel MIS transistor having a plurality of semiconductor regions formed on an n-type well region, and an n-type semiconductor region formed on the n-type well region;

a first conductor layer formed on the p-type semiconductor region electrically connected with the p-type well region;

a second conductor layer formed on the n-type semiconductor region electrically connected with the n-type well region;

n-type impurity implanted regions and p-type impurity implanted regions formed in the plurality of semiconductor regions of the n-channel MIS transistor and in the n-type semiconductor region of the n-type well region, wherein the n-type and p-type impurity implanted regions of the plurality of semiconductor regions of the n-channel MIS transistor have the same impurity concentration distribution of depth as the n-type and p-type impurity implanted region of the n-type semiconductor region of the n-type well region; and n-type impurity implanted regions and p-type impurity implanted regions formed in the plurality of semiconductor regions of the p-channel MIS transistor and in the p-type semiconductor region of the p-type well region, wherein the n-type and p-type impurity implanted regions of the plurality of semiconductor regions of the p-channel MIS transistor have the same impurity concentration distribution of depth as the n-type and p-type impurity implanted region of the p-type semiconductor region of the p-type well region, the p-type impurity implanted regions of the plurality of semiconductor regions of the n-channel MIS transistor extend wider than the n-type impurity implanted regions of the plurality of semiconductor regions of the n-channel MIS transistor, and the n-type impurity implanted region of the $n^-$ type semiconductor region extends deeper than the p-type impurity implanted region of the n-type semiconductor region.

8. A semiconductor integrated circuit device according to claim 7, further comprising:

a device isolation portion formed around the periphery of the n-type impurity implanted region of the n-type semiconductor region.

9. A semiconductor integrated circuit device according to claim 7, wherein the source and drain regions are comprised of the n-type impurity implanted regions in the plurality of semiconductor regions of the n-channel MIS transistor, and the source and drain regions are comprised of the p-type impurity implanted regions in the plurality of semiconductor regions of the p-channel MIS transistor.

10. A semiconductor integrated circuit device formed on a semiconductor substrate comprising:

an n-channel MIS transistor having a plurality of semiconductor regions formed on a p-type well region, and a p-type semiconductor region formed on the p-type well region;

a p-channel MIS transistor having a plurality of semiconductor regions formed on an n-type well region, and an n-type semiconductor region formed on the $n^-$ type well region;

n-type impurity implanted regions and p-type impurity implanted regions formed in the plurality of semiconductor regions of the n-channel MIS transistor and in the n-type semiconductor region of the n-type well region, wherein the n-type and p-type impurity implanted regions of the plurality of semiconductor regions of the n-channel MIS transistor have the same impurity concentration distribution of depth as the $n^-$ type and p-type impurity implanted region of the n-type semiconductor region of the n-type well region; and n-type impurity implanted regions and p-type impurity implanted regions formed in the plurality of semiconductor regions of the p-channel MIS transistor and in the p-type semiconductor region of the p-type well region, wherein the n-type and p-type impurity implanted regions of the plurality of semiconductor regions of the p-channel MIS transistor have the same impurity concentration distribution of depth as the n-type and p-type impurity implanted region of the p-type semiconductor region of the p-type well region, the n-type impurity implanted regions of the plurality of semiconductor regions of the p-channel MIS transistor extend wider than the p-type impurity implanted regions of the plurality of semiconductor regions of the p-channel MIS transistor, and the p-type impurity implanted region of the p-type semiconductor region extends deeper than the n-type impurity implanted region of the p-type semiconductor region.

11. A semiconductor integrated circuit device according to claim 10, further comprising:

a device isolation portion formed around the periphery of the p-type impurity implanted region of the p-type semiconductor region.

12. A semiconductor integrated circuit device according to claim 10, wherein the source and drain regions are comprised of the n-type impurity implanted regions in the plurality of semiconductor regions of the n-channel MIS transistor, and the source and drain regions are comprised of the p-type impurity implanted regions in the plurality of semiconductor regions of the p-channel MIS transistor.

* * * * *